US011498937B2

(12) United States Patent
Zhang et al.

(10) Patent No.: US 11,498,937 B2
(45) Date of Patent: Nov. 15, 2022

(54) ORGANIC LUMINESCENT MATERIAL INCLUDING 3-DEUTERIUM-SUBSTITUTED ISOQUINOLINE LIGAND

(71) Applicant: BEIJING SUMMER SPROUT TECHNOLOGY CO., LTD., Beijing (CN)

(72) Inventors: Qi Zhang, Beijing (CN); Cuifang Zhang, Beijing (CN); Chi Yuen Raymond Kwong, Beijing (CN); Chuanjun Xia, Beijing (CN)

(73) Assignee: BEIJING SUMMER SPROUT TECHNOLOGY CO., LTD., Beijing (CN)

( * ) Notice: Subject to any disclaimer, the term of this patent is extended or adjusted under 35 U.S.C. 154(b) by 259 days.

(21) Appl. No.: 16/870,281

(22) Filed: May 8, 2020

(65) Prior Publication Data

US 2020/0354391 A1 Nov. 12, 2020

(30) Foreign Application Priority Data

May 9, 2019 (CN) ......................... 201910374628.0

(51) Int. Cl.
*H01L 51/00* (2006.01)
*C07F 15/00* (2006.01)

(52) U.S. Cl.
CPC ...... *C07F 15/0033* (2013.01); *H01L 51/0085* (2013.01)

(58) Field of Classification Search
CPC ......................... H01L 51/0085; C07F 15/0033
USPC ............................................................ 257/40
See application file for complete search history.

(56) References Cited

U.S. PATENT DOCUMENTS 5,703,436 A 12/1997 Forrest et al.
5,707,745 A 1/1998 Forrest et al.
5,844,363 A 12/1998 Gu et al.
6,097,147 A 8/2000 Baldo et al.
6,303,238 B1 10/2001 Thompson et al.
7,279,704 B2 10/2007 Walters et al.
7,968,146 B2 6/2011 Wagner et al.
(Continued)

FOREIGN PATENT DOCUMENTS

CN 103159798 A 6/2013
CN 103204880 A 7/2013
(Continued)

OTHER PUBLICATIONS

Office action dated May 24, 2022 from corresponding Korean Application No. 10-2020-0055449 with English translation.
(Continued)

*Primary Examiner* — Igwe U Anya
(74) *Attorney, Agent, or Firm* — Sandberg Phoenix & von Gontard PC

(57) ABSTRACT

Disclosed is an organic light-emitting material including a 3-deuterium-substituted isoquinoline ligand. The organic light-emitting material is a metal complex including a 3-deuterium-substituted isoquinoline ligand and an acetylacetonate ligand, which can be used as a light-emitting material in a light-emitting layer of an organic electroluminescent device. These novel complexes can effectively prolong device lifetime. Further disclosed is an electroluminescent device including the metal complex and a compound formulation.

19 Claims, 2 Drawing Sheets

(56) References Cited

U.S. PATENT DOCUMENTS

| | | | |
|---|---|---|---|
| 2003/0072964 | A1 | 4/2003 | Kwong et al. |
| 2003/0096138 | A1 | 5/2003 | Lecloux et al. |
| 2003/0230980 | A1 | 12/2003 | Forrest et al. |
| 2004/0174116 | A1 | 9/2004 | Lu et al. |
| 2004/0241495 | A1 | 12/2004 | Kwong et al. |
| 2006/0008671 | A1 | 1/2006 | Kwong et al. |
| 2006/0008673 | A1 | 1/2006 | Kwong et al. |
| 2007/0259205 | A1 | 11/2007 | Ionkin et al. |
| 2007/0278936 | A1 | 12/2007 | Herron et al. |
| 2008/0074033 | A1 | 3/2008 | Ionkin et al. |
| 2008/0194853 | A1 | 8/2008 | Kim et al. |
| 2008/0261076 | A1 | 10/2008 | Kwong et al. |
| 2010/0051869 | A1 | 3/2010 | Chichak et al. |
| 2010/0090591 | A1 | 4/2010 | Alleyne et al. |
| 2010/0270916 | A1 | 10/2010 | Xia et al. |
| 2012/0119190 | A1 | 5/2012 | Alleyne et al. |
| 2012/0181511 | A1 | 7/2012 | Ma et al. |
| 2012/0217868 | A1 | 8/2012 | Ma et al. |
| 2013/0032785 | A1* | 2/2013 | Ma ..................... H01L 51/0085 546/4 |
| 2013/0146848 | A1 | 6/2013 | Ma et al. |
| 2013/0299795 | A1 | 11/2013 | Xia et al. |
| 2013/0328019 | A1 | 12/2013 | Xia et al. |
| 2015/0001472 | A1* | 1/2015 | Boudreault ........... C09K 11/06 546/4 |
| 2015/0053939 | A1 | 2/2015 | Adamovich et al. |
| 2015/0171348 | A1 | 6/2015 | Stoessel et al. |
| 2015/0188061 | A1 | 7/2015 | Xia et al. |
| 2015/0214494 | A1 | 7/2015 | Xia et al. |
| 2015/0236277 | A1 | 8/2015 | Boudreault et al. |
| 2015/0287933 | A1 | 10/2015 | Kottas et al. |
| 2015/0295187 | A1 | 10/2015 | Boudreault et al. |
| 2015/0315222 | A1 | 11/2015 | Boudreault et al. |
| 2015/0349273 | A1 | 12/2015 | Hung et al. |
| 2015/0357587 | A1 | 12/2015 | Kishino et al. |
| 2015/0364701 | A1 | 12/2015 | Horiuchi et al. |
| 2016/0093808 | A1 | 3/2016 | Adamovich et al. |
| 2016/0104848 | A1 | 4/2016 | Boudreault et al. |
| 2016/0111661 | A1 | 4/2016 | Boudreault et al. |
| 2016/0028023 | A1 | 6/2016 | Boudreault et al. |
| 2016/0190486 | A1 | 6/2016 | Lin et al. |
| 2016/0359122 | A1 | 12/2016 | Boudreault et al. |
| 2017/0084849 | A1 | 3/2017 | Tsai et al. |
| 2017/0092880 | A1 | 3/2017 | Boudreault et al. |
| 2017/0098788 | A1 | 4/2017 | Lee et al. |
| 2017/0098789 | A1 | 4/2017 | Boudreault et al. |
| 2017/0229663 | A1 | 8/2017 | Tsai et al. |
| 2017/0288157 | A1 | 10/2017 | Joseph et al. |
| 2017/0365799 | A1 | 12/2017 | Ji et al. |
| 2017/0365800 | A1 | 12/2017 | Tsai et al. |
| 2017/0365801 | A1 | 12/2017 | Margulies et al. |
| 2018/0013077 | A1 | 1/2018 | Boudreault et al. |
| 2018/0134954 | A1 | 5/2018 | Tsai et al. |
| 2018/0190914 | A1 | 7/2018 | Tsai et al. |
| 2018/0190915 | A1 | 7/2018 | Ji et al. |
| 2018/0277774 | A1 | 9/2018 | Boudreault et al. |
| 2019/0067598 | A1 | 2/2019 | Li et al. |
| 2019/0077818 | A1 | 3/2019 | Xia |
| 2019/0103574 | A1 | 4/2019 | Xia |
| 2019/0127406 | A1 | 5/2019 | Xia |
| 2019/0194234 | A1 | 6/2019 | Xia |
| 2019/0237683 | A1 | 8/2019 | Boudreault et al. |
| 2019/0248818 | A1 | 8/2019 | Boudreault |
| 2019/0251619 | A1 | 8/2019 | Kuchenski et al. |
| 2019/0252627 | A1 | 8/2019 | Joseph et al. |
| 2019/0312218 | A1* | 10/2019 | Kim ....................... C09K 11/06 |
| 2019/0319199 | A1* | 10/2019 | Beers .................. H01L 51/0085 |
| 2020/0099000 | A1 | 3/2020 | Zhang et al. |
| 2020/0251666 | A1 | 8/2020 | Cai et al. |
| 2020/0354391 | A1 | 11/2020 | Zhang et al. |
| 2020/0358010 | A1 | 11/2020 | Lu et al. |
| 2020/0358011 | A1 | 11/2020 | Lu et al. |
| 2021/0115069 | A1 | 4/2021 | Dai et al. |
| 2021/0242411 | A1 | 8/2021 | Liu |
| 2022/0131093 | A1 | 4/2022 | Zhang et al. |

FOREIGN PATENT DOCUMENTS

| | | | |
|---|---|---|---|
| CN | 104022232 | A | 9/2014 |
| CN | 108191916 | A | 6/2018 |
| CN | 109438521 | A | 3/2019 |
| CN | 109467575 | A | 3/2019 |
| CN | 109575083 | A | 4/2019 |
| CN | 109651444 | A | 4/2019 |
| CN | 110283216 | A | 9/2019 |
| EP | 2907820 | A1 | 8/2015 |
| EP | 2940098 | A1 | 11/2015 |
| EP | 3007244 | A1 | 4/2016 |
| JP | 1998158639 | A | 6/1998 |
| JP | 2005508437 | A | 3/2005 |
| JP | 2008532998 | A | 8/2008 |
| JP | 2009539768 | A | 11/2009 |
| JP | 2010516622 | A | 5/2010 |
| JP | 2012525405 | A | 10/2012 |
| JP | 2013121957 | A | 6/2013 |
| JP | 2015010093 | A | 1/2015 |
| JP | 2015530982 | A | 10/2015 |
| JP | 2020186234 | A | 11/2020 |
| JP | 2020186235 | A | 11/2020 |
| KR | 10-2006-0097320 | A | 9/2006 |
| KR | 20090039464 | A | 4/2009 |
| KR | 20110077350 | A | 7/2011 |
| KR | 20130110934 | A | 10/2013 |
| KR | 20160041771 | A | 4/2016 |
| KR | 20170142949 | | 12/2017 |
| KR | 10-2018-0065353 | A | 6/2018 |
| KR | 20200130661 | A | 11/2020 |
| WO | 02044189 | A | 6/2002 |
| WO | 2006095951 | A | 9/2006 |
| WO | 2007143201 | A1 | 12/2007 |
| WO | 2018084189 | A1 | 5/2018 |
| WO | 2018105986 | A | 6/2018 |
| WO | 2018124697 | A1 | 7/2018 |

OTHER PUBLICATIONS

Office action dated May 13, 2021 from corresponding Chinese Application No. 201910374628.0 with English translation.

Search Report dated May 9, 2021 from corresponding Chinese Application No. 201910374628.0 with English translation.

Japanese Office action dated May 27, 2021 from corresponding Japanese Application No. 2020-082882 with English translation.

C.W. Tang et al.; Organic Electroluminescent Diodes; Applied Physics Letters; 1987, 51 (12): pp. 913-915.

The non-final office action cited in U.S. Appl. No. 16/869,770, dated Jul. 11, 2022.

Yuji Kawanishi, Tetsu Miyzawa, Taichi Abe, Deuterium Compounds for Electronic Devices, Organic Square 36 (2011), pp. 2-3.

Koko Sugiyama, Development of Deuterium phosphorescent Probe, Taiyo Nippon Sanso Technical Report, No. 36 (2017), pp. 1-4.

* cited by examiner

ORGANIC LUMINESCENT MATERIAL INCLUDING 3-DEUTERIUM-SUBSTITUTED ISOQUINOLINE LIGAND

CROSS-REFERENCE TO RELATED APPLICATIONS

This application claims the benefit of the earlier filing date of Chinese Patent Application No. 201910374628.0, filed on May 9, 2019 to the China National Intellectual Property Administration, the contents of which are incorporated by reference herein in its entirety.

TECHNICAL FIELD

The present disclosure discloses a metal complex including a 3-deuterium-substituted isoquinoline ligand, which can be used as a light-emitting material in a light-emitting layer of an organic electroluminescent device. These novel ligands can effectively enhance device lifetime. The present disclosure further discloses an electroluminescent device and a compound formulation.

BACKGROUND

Organic electronic devices include, but are not limited to, the following types: organic light-emitting diodes (OLEDs), organic field-effect transistors (O-FETs), organic light-emitting transistors (OLETs), organic photovoltaic devices (OPVs), dye-sensitized solar cells (DSSCs), organic optical detectors, organic photoreceptors, organic field-quench devices (OFQDs), light-emitting electrochemical cells (LECs), organic laser diodes and organic plasmon emitting devices.

In 1987, Tang and Van Slyke of Eastman Kodak reported a bilayer organic electroluminescent device, which comprises an arylamine hole transporting layer and a tris-8-hydroxyquinolato-aluminum layer as the electron and emitting layer (Applied Physics Letters, 1987, 51 (12): 913-915). Once a bias is applied to the device, green light was emitted from the device. The device laid the foundation for the development of modern organic light-emitting diodes (OLEDs). State-of-the-art OLEDs may comprise multiple layers such as charge injection and transporting layers, charge and exciton blocking layers, and one or multiple emissive layers between the cathode and anode. Since OLED is a self-emitting solid state device, it offers tremendous potential for display and lighting applications. In addition, the inherent properties of organic materials, such as their flexibility, may make them well suited for particular applications such as fabrication on flexible substrates.

OLED can be categorized as three different types according to its emitting mechanism. The OLED invented by Tang and van Slyke is a fluorescent OLED. It only utilizes singlet emission. The triplets generated in the device are wasted through nonradiative decay channels. Therefore, the internal quantum efficiency (IQE) of a fluorescent OLED is only 25%. This limitation hindered the commercialization of OLED. In 1997, Forrest and Thompson reported phosphorescent OLED, which uses triplet emission from heave metal containing complexes as the emitter. As a result, both singlet and triplets can be harvested, achieving 100% IQE. The discovery and development of phosphorescent OLED contributed directly to the commercialization of active-matrix OLED (AMOLED) due to its high efficiency. Recently, Adachi achieved high efficiency through thermally activated delayed fluorescence (TADF) of organic compounds. These emitters have small singlet-triplet gap that makes the transition from triplet back to singlet possible. In the TADF device, the triplet excitons can go through reverse intersystem crossing to generate singlet excitons, resulting in high IQE.

OLEDs can also be classified as small molecule and polymer OLEDs according to the forms of the materials used. Small molecule refers to any organic or organometallic material that is not a polymer. The molecular weight of a small molecule can be large as long as it has well defined structure. Dendrimers with well-defined structures are considered as small molecules. Polymer OLEDs include conjugated polymers and non-conjugated polymers with pendant emitting groups. Small molecule OLED can become a polymer OLED if post polymerization occurred during the fabrication process.

There are various methods for OLED fabrication. Small molecule OLEDs are generally fabricated by vacuum thermal evaporation. Polymer OLEDs are fabricated by solution process such as spin-coating, inkjet printing, and slit printing. If the material can be dissolved or dispersed in a solvent, the small molecule OLED can also be produced by solution process.

The emitting color of an OLED can be achieved by emitter structural design. An OLED may comprise one emitting layer or a plurality of emitting layers to achieve desired spectrum. In the case of green, yellow, and red OLEDs, phosphorescent emitters have successfully reached commercialization. Blue phosphorescent device still suffers from non-saturated blue color, short device lifetime, and high operating voltage. Commercial full-color OLED displays normally adopt a hybrid strategy, using fluorescent blue and phosphorescent yellow, or red and green. At present, efficiency roll-off of phosphorescent OLEDs at high brightness remains a problem. In addition, it is desirable to have more saturated emitting color, higher efficiency, and longer device lifetime.

US 20150171348A1 discloses a compound having the following structure:

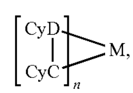

which includes a condensed ring structure having the following structure:

(formula 3)

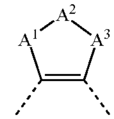

and (formula 4)

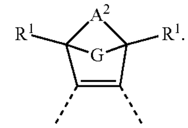

Specific examples of this compound include

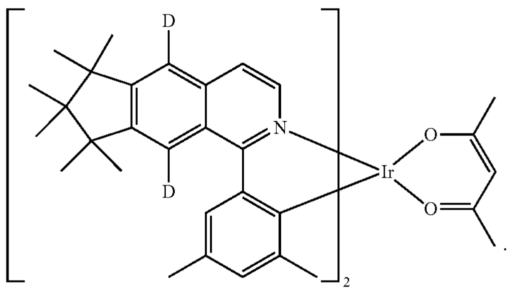

This disclosure focuses on performance changes brought about by the introduction of the condensed ring structure in a ligand. Although this application mentions related complexes of isoquinoline with two deuterium atoms introduced at 5,8-positions, no study is made on the effect of deuteration, let alone the change in the metal complex properties brought about by the introduction of deuteration at a specific 3-position on the isoquinoline ring.

US20080194853A1 discloses an iridium complex having the following structure:

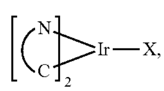

wherein

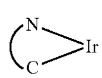

may be selected from a phenylisoquinoline structure, and the ligand X may be selected from an acetylacetone ligand. Specific examples of this compound include

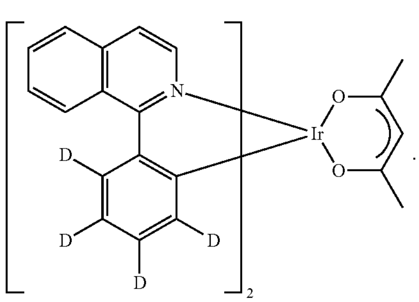

The inventors of this application note the improvement in device efficiency brought about by the introduction of multiple deuterium atoms into the iridium complex ligand, but they do not notice the particular advantage of increasing device lifetime brought about by the introduction of deuterium atom substitution at the specific 3-position on the isoquinoline ring.

US20030096138A1 discloses an active layer including a compound of the following $IrL_3$ formula: $IrL_2Z$, wherein the ligand L may be selected from the following formula:

(1X)

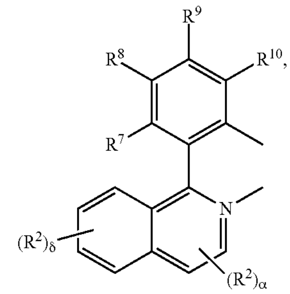

wherein $R^2$ and $R^7$ to $R^{10}$ are each independently selected from H, D, an alkyl group, a hydroxyl group, an alkoxy group, a sulfanyl group, an alkylthio group, an amino group and the like, α is 0, 1 or 2, and 6 is 0 or an integer from 1 to 4. Examples in this application all are cases when α and δ are equal to 0, and no examples with $R^2$ substituents on the isoquinoline ring are disclosed, nor are there any discussions on the effects achieved by the iridium complex due to the introduction of deuterium atoms.

WO2018124697A1 discloses an organic electroluminescent compound with the following structure:

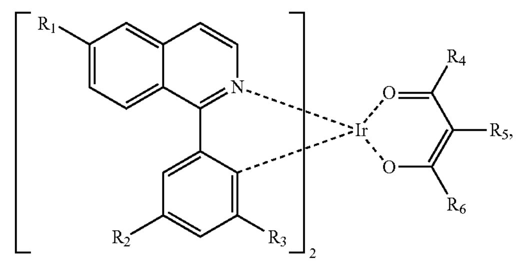

wherein $R_1$ to $R_3$ are selected from alkyl/deuterylalkyl. The inventors of this application notice the improvement in efficiency of the iridium complex brought about by an alkyl/deuterylalkyl substituted phenylisoquinoline ligand, but they do not notice the improvement in metal complex properties, particularly the improvement in lifetime, brought about by direct deuteration on the isoquinoline ring.

US20100051869A1 discloses a composition including at least one organic iridium complex having the structure of the following formula:

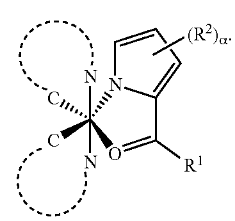

The inventors of this application focus on the ligand of a 2-carbonylpyrrole structure. Although the perdeuterated phenylisoquinoline ligand is mentioned, they do not notice the application of the cooperation with the acetylacetone ligand in the complex, which is obviously different from the overall structure of the metal complex of the present disclosure.

CN109438521A discloses a complex having the following structure:

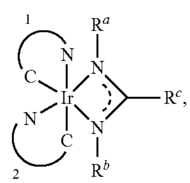

I wherein one or more hydrogens in this complex may be substituted by deuterium, and the C^N ligand disclosed may have the structure of phenylisoquinoline or phenylquinazoline. Specific examples of this complex include:

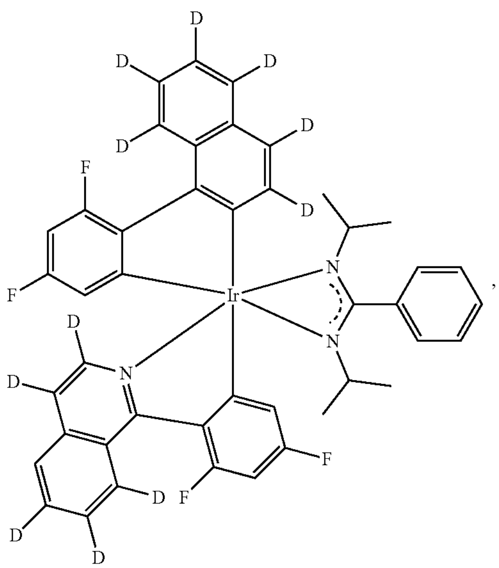

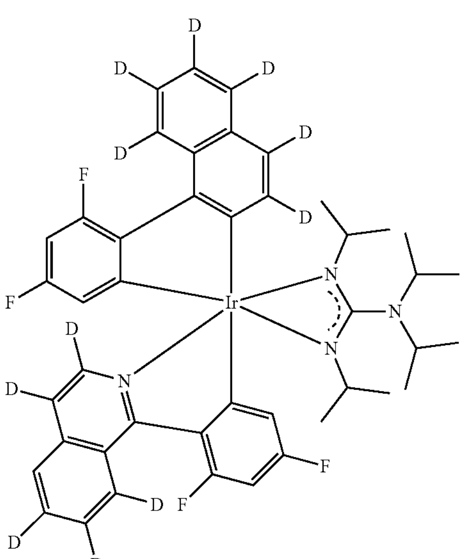

and

-continued

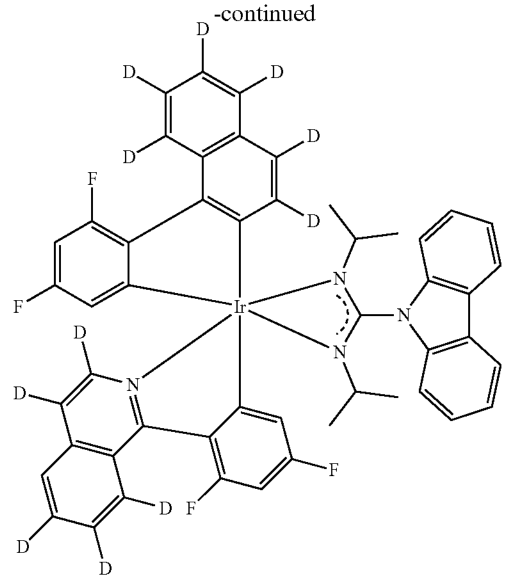

The inventors of this application mainly focus on dinitrogen coordination amidinate and guanidine ligands. Although the perdeuterated isoquinoline ligand is mentioned, they do not notice the application of the cooperation with the acetylacetone ligand in the complex, which is obviously different from the overall structure of the metal complex of the present disclosure.

Although iridium complexes including perdeuterated and 5,8-dideuterated phenylisoquinoline structural ligands are reported in the literature, these examples involving deuteration are only a few of the many disclosed examples of the iridium complex with isoquinoline ligands in the corresponding literatures, and these cases do not involve the use of acetylacetone ligands in metal complexes, or do not study the deuteration effect and the influence of deuteration positions on device lifetime. Research in related art still needs to be performed further. Through further study, the inventors of the present disclosure have surprisingly found that when a metal complex with deuterium atoms introduced into the specific position of the isoquinoline ligand of the metal complex is used as a luminescent material in the organic light-emitting device, the device lifetime can be greatly enhanced.

SUMMARY

The present disclosure aims to provide a series of metal complex including a 3-deuterium-substituted isoquinoline ligand and an acetylacetone ligand. The complex may be used as a light-emitting material in a light-emitting layer of an organic electroluminescent device. These novel metal complexes can effectively prolong device lifetime.

According to an embodiment of the present disclosure, a metal complex is disclosed. The metal complex has a general structure of $M(L_a)_m(L_b)_n(L_c)_q$, wherein $L_a$, $L_b$ and $L_c$ are the first ligand, the second ligand and the third ligand coordinated to a metal M respectively; wherein the metal M is a metal whose atomic number is more than 40;

wherein $L_a$, $L_b$ and $L_c$ may be optionally joined to form a multi-dentate ligand;

wherein m is 1 or 2, n is 1 or 2, q is 0 or 1, and m+n+q equals to the oxidation state of the metal M;

When m is greater than 1, $L_a$ may be the same or different; and when n is greater than 1, $L_b$ may be the same or different;

wherein the first ligand $L_a$ has a structure represented by Formula 1;

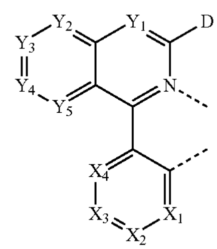

(Formula 1)

wherein, $X_1$ to $X_4$ are each independently selected from $CR_1$ or N; and wherein, $Y_1$ to $Y_5$ are each independently selected from $CR_2$ or N;

wherein, $R_1$ and $R_2$ are each independently selected from a group consisting of: hydrogen, deuterium, halogen, substituted or unsubstituted alkyl group having 1 to 20 carbon atoms, substituted or unsubstituted cycloalkyl group having 3 to 20 ring carbon atoms, substituted or unsubstituted heteroalkyl group having 1 to 20 carbon atoms, substituted or unsubstituted aralkyl group having 7 to 30 carbon atoms, substituted or unsubstituted alkoxy group having 1 to 20 carbon atoms, substituted or unsubstituted aryloxy group having 6 to 30 carbon atoms, substituted or unsubstituted alkenyl group having 2 to 20 carbon atoms, substituted or unsubstituted aryl group having 6 to 30 carbon atoms, substituted or unsubstituted heteroaryl group having 3 to 30 carbon atoms, substituted or unsubstituted alkylsilyl group having 3 to 20 carbon atoms, substituted or unsubstituted arylsilyl group having 6 to 20 carbon atoms, substituted or unsubstituted amino group having 0 to 20 carbon atoms, an acyl group, a carbonyl group, a carboxylic acid group, an ester group, a cyano group, an isocyano group, a thio group, a sulfinyl group, a sulfonyl group, a phosphino group, and combinations thereof;

In Formula 1, for substituents $R_1$ and $R_2$, adjacent substituents can be optionally joined to form a ring;

Wherein, $L_b$ has a structure represented by Formula 2;

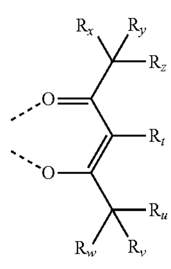

(Formula 2)

wherein $R_t$ to $R_z$ are each independently selected from a group consisting of: hydrogen, deuterium, halogen, substituted or unsubstituted alkyl group having 1 to 20 carbon atoms, substituted or unsubstituted cycloalkyl group having 3 to 20 ring carbon atoms, substituted or unsubstituted heteroalkyl group having 1 to 20 carbon atoms, substituted or unsubstituted aralkyl group having 7 to 30 carbon atoms, substituted or unsubstituted alkoxy group having 1 to 20 carbon atoms, substituted or unsubstituted aryloxy group having 6 to 30 carbon atoms, substituted or unsubstituted alkenyl group having 2 to 20 carbon atoms, substituted or unsubstituted aryl group having 6 to 30 carbon atoms, substituted or unsubstituted heteroaryl group having 3 to 30 carbon atoms, substituted or unsubstituted alkylsilyl group having 3 to 20 carbon atoms, substituted or unsubstituted arylsilyl group having 6 to 20 carbon atoms, substituted or unsubstituted amino group having 0 to 20 carbon atoms, an acyl group, a carbonyl group, a carboxylic acid group, an ester group, a cyano group, an isocyano group, a thio group, a sulfinyl group, a sulfonyl group, a phosphino group, and combinations thereof;

In Formula 2, for substituents $R_x$, $R_y$, $R_z$, $R_t$, $R_u$, $R_v$ and $R_w$, adjacent substituents are optionally joined to form a ring;

Wherein, $L_c$ is a monoanionic bidentate ligand.

According to another embodiment of the present disclosure, an electroluminescent device is further disclosed. The electroluminescent device includes an anode, a cathode and an organic layer disposed between the anode and the cathode, wherein the organic layer includes the metal complex described above.

According to another embodiment of the present disclosure, a compound formulation including the metal complex described above is further disclosed.

The novel metal complex including a 3-deuterium-substituted isoquinoline ligand and an acetylacetone ligand disclosed in the present disclosure can be used as the light-emitting material in the light-emitting layer of the electroluminescent device. Compared with corresponding complexes without deuterium substitution, these novel phosphorescent iridium complexes including the above ligands can greatly prolong device lifetime while maintaining other device performance.

DETAILED DESCRIPTION

Figure 1:
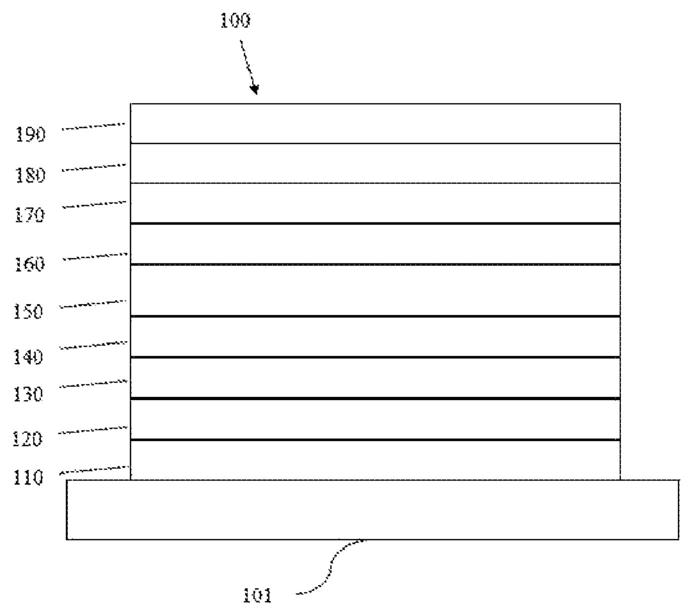
FIG. 1 is a schematic diagram of an organic light-emitting device including a compound and a compound formulation disclosed by the present disclosure.

OLEDs can be fabricated on various types of substrates such as glass, plastic, and metal foil. FIG. 1 schematically shows the organic light emitting device 100 without limitation. The figures are not necessarily drawn to scale. Some of the layers in the figures can also be omitted as needed. Device 100 may include a substrate 101, an anode 110, a hole injection layer 120, a hole transport layer 130, an electron blocking layer 140, an emissive layer 150, a hole blocking layer 160, an electron transport layer 170, an electron injection layer 180 and a cathode 190. Device 100 may be fabricated by depositing the layers described in order. The properties and functions of these various layers, as well as example materials, are described in more detail in U.S. Pat. No. 7,279,704 at cols. 6-10, the contents of which are incorporated by reference herein in its entirety.

More examples for each of these layers are available. For example, a flexible and transparent substrate-anode combination is disclosed in U.S. Pat. No. 5,844,363, which is incorporated by reference herein in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference herein in its entirety. Examples of host materials are disclosed in U.S. Pat. No. 6,303,238 to Thompson et al., which is incorporated by reference herein in its entirety. An example of an n-doped electron transport layer is BPhen doped with Li at a molar ratio of 1:1, as disclosed in U.S. Patent Application Publication No. 2003/0230980, which is incorporated by reference herein in its entirety. U.S. Pat. Nos. 5,703,436 and 5,707,745, which are incorporated by reference herein in their entireties, disclose examples of cathodes including composite cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference herein in their entireties. Examples of injection layers are provided in U.S. Patent Application Publication No. 2004/0174116, which is incorporated by reference herein in its entirety. A description of protective layers may be found in U.S. Patent Application Publication No. 2004/0174116, which is incorporated by reference herein in its entirety.

The layered structure described above is provided by way of non-limiting example. Functional OLEDs may be achieved by combining the various layers described in different ways, or layers may be omitted entirely. It may also include other layers not specifically described. Within each layer, a single material or a mixture of multiple materials can be used to achieve optimum performance. Any functional layer may include several sublayers. For example, the emissive layer may have two layers of different emitting materials to achieve desired emission spectrum.

In one embodiment, an OLED may be described as having an "organic layer" disposed between a cathode and an anode. This organic layer may comprise a single layer or multiple layers.

Figure 2:
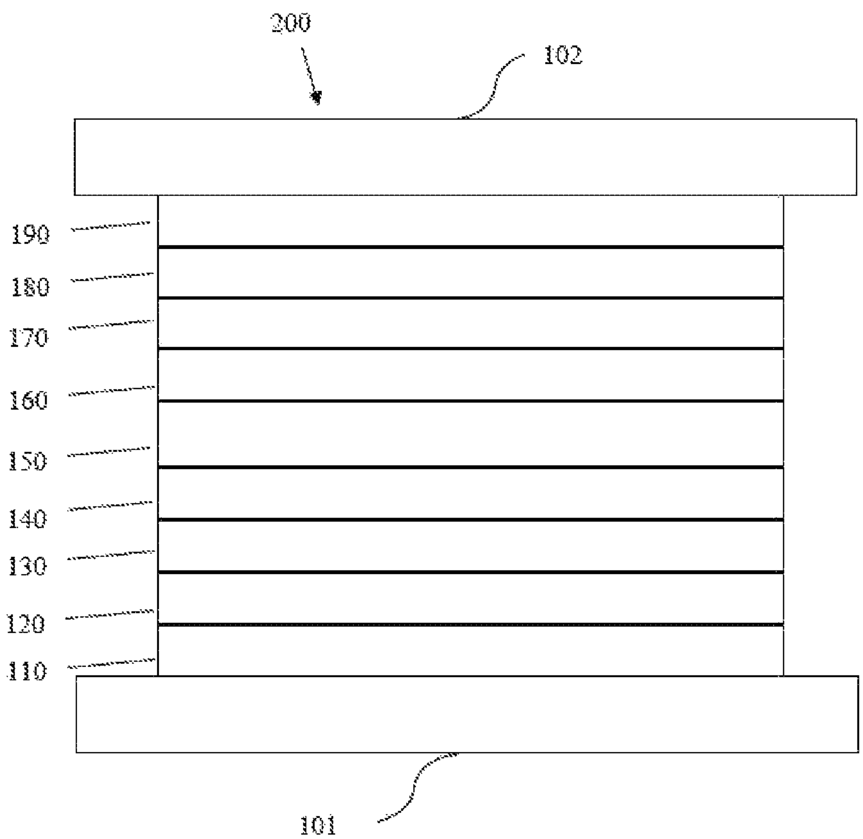
FIG. 2 is a schematic diagram of another organic light-emitting device including a compound and a compound formulation disclosed by the present disclosure.

An OLED can be encapsulated by a barrier layer. FIG. 2 schematically shows the organic light emitting device 200 without limitation. FIG. 2 differs from FIG. 1 in that the organic light emitting device include a barrier layer 102, which is above the cathode 190, to protect it from harmful species from the environment such as moisture and oxygen. Any material that can provide the barrier function can be used as the barrier layer such as glass and organic-inorganic hybrid layers. The barrier layer should be placed directly or indirectly outside of the OLED device. Multilayer thin film encapsulation was described in U.S. Pat. No. 7,968,146, which is herein incorporated by reference in its entirety.

Devices fabricated in accordance with embodiments of the present disclosure can be incorporated into a wide variety of consumer products that have one or more of the electronic component modules (or units) incorporated therein. Some examples of such consumer products include flat panel displays, monitors, medical monitors, televisions, billboards, lights for interior or exterior illumination and/or signaling, heads-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The materials and structures described herein may be used in other organic electronic devices listed above.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the transition between the triplet states and the singlet excited states. Compounds that are capable of generating E-type delayed fluorescence are required to have very small singlet-triplet gaps to convert between energy states. Thermal energy can activate the transition from the triplet state back to the singlet state. This type of delayed fluorescence is also known as thermally activated delayed fluorescence (TADF). A distinctive feature of TADF is that the delayed component increases as temperature rises. If the reverse intersystem crossing rate is fast enough to minimize the non-radiative decay from the triplet state, the fraction of back populated singlet excited states can potentially reach 75%. The total singlet fraction can be 100%, far exceeding 25% of the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap ($\Delta E_{S-T}$). Organic, non-metal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small $\Delta E_{S-T}$. These states may involve CT states. Often, donor-acceptor luminescent materials are constructed by connecting an electron donor moiety such as amino- or carbazole-derivatives and an electron acceptor moiety such as N-containing six-membered aromatic rings.

Definition of Terms of Substituents

Halogen or halide—as used herein includes fluorine, chlorine, bromine, and iodine.

Alkyl—contemplates both straight and branched chain alkyl groups. Examples of the alkyl group include methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, 1-methylpentyl group, 2-methylpentyl group, 1-pentylhexyl group, 1-butylpentyl group, 1-heptyloctyl group, and 3-methylpentyl group. Additionally, the alkyl group may be optionally substituted. The carbons in the alkyl chain can be replaced by other hetero atoms. Of the above, preferred are methyl group, ethyl group, propyl group, isopropyl group, n-butyl group, s-butyl group, isobutyl group, t-butyl group, n-pentyl group, and neopentyl group.

Cycloalkyl—as used herein contemplates cyclic alkyl groups. Preferred cycloalkyl groups are those containing 4 to 10 ring carbon atoms and includes cyclobutyl, cyclopentyl, cyclohexyl, 4-methylcyclohexyl, 4,4-dimethylcyclohexyl, 1-adamantyl, 2-adamantyl, 1-norbornyl, 2-norbornyl and the like. Additionally, the cycloalkyl group may be optionally substituted. The carbons in the ring can be replaced by other hetero atoms.

Alkenyl—as used herein contemplates both straight and branched chain alkene groups. Preferred alkenyl groups are those containing 2 to 15 carbon atoms. Examples of the alkenyl group include vinyl group, allyl group, 1-butenyl group, 2-butenyl group, 3-butenyl group, 1,3-butandienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl1-butenyl group, and 3-phenyl-1-butenyl group. Additionally, the alkenyl group may be optionally substituted.

Alkynyl—as used herein contemplates both straight and branched chain alkyne groups. Preferred alkynyl groups are those containing 2 to 15 carbon atoms. Additionally, the alkynyl group may be optionally substituted.

Aryl or aromatic group—as used herein includes noncondensed and condensed systems. Preferred aryl groups are those containing six to sixty carbon atoms, preferably six to twenty carbon atoms, more preferably six to twelve carbon atoms. Examples of the aryl group include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Additionally, the aryl group may be optionally substituted. Examples of the non-condensed aryl group include phenyl group, biphenyl-2-yl group, biphenyl-3-yl group, biphenyl-4-yl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 4'-methylbiphenylyl group, 4"-t-butyl p-terphenyl-4-yl group, o-cumenyl group, m-cumenyl group, p-cumenyl group, 2,3-xylyl group, 3,4-xylyl group, 2,5-xylyl group, mesityl group, and m-quarterphenyl group.

Heterocyclic group or heterocycle—as used herein includes aromatic and non-aromatic cyclic groups. Heteroaromatic also means heteroaryl. Preferred non-aromatic heterocyclic groups are those containing 3 to 7 ring atoms which include at least one hetero atom such as nitrogen, oxygen, and sulfur. The heterocyclic group can also be an aromatic heterocyclic group having at least one heteroatom selected from nitrogen atom, oxygen atom, sulfur atom, and selenium atom.

Heteroaryl—as used herein includes noncondensed and condensed hetero-aromatic groups that may include from one to five heteroatoms. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—it is represented by —O-Alkyl. Examples and preferred examples thereof are the same as those described above. Examples of the alkoxy group having 1 to 20 carbon atoms, preferably 1 to 6 carbon atoms include methoxy group, ethoxy group, propoxy group, butoxy group, pentyloxy group, and hexyloxy group. The alkoxy group having 3 or more carbon atoms may be linear, cyclic or branched.

Aryloxy—it is represented by —O-Aryl or —O-heteroaryl. Examples and preferred examples thereof are the same as those described above. Examples of the aryloxy group having 6 to 40 carbon atoms include phenoxy group and biphenyloxy group.

Arylalkyl—as used herein contemplates an alkyl group that has an aryl substituent. Additionally, the arylalkyl group may be optionally substituted. Examples of the arylalkyl group include benzyl group, 1-phenylethyl group, 2-phenylethyl group, 1-phenylisopropyl group, 2-phenylisopropyl group, phenyl-t-butyl group, alpha.-naphthylmethyl group, 1-alpha.-naphthylethyl group, 2-alpha-naphthylethyl group, 1-alpha-naphthylisopropyl group, 2-alpha-naphthylisopropyl group, beta-naphthylmethyl group, 1-beta-naphthylethyl group, 2-beta-naphthylethyl group, 1-beta-naphthylisopropyl group, 2-beta-naphthylisopropyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group, and 1-chloro-2-phenylisopropyl group. Of the above, preferred are benzyl group, p-cyanobenzyl group, m-cyanobenzyl group, o-cyanobenzyl group, 1-phenylethyl group, 2-phenylethyl group, 1-phenylisopropyl group, and 2-phenylisopropyl group.

The term "aza" in azadibenzofuran, aza-dibenzothiophene, etc. means that one or more of the C—H groups in the respective aromatic fragment are replaced by a nitrogen atom. For example, azatriphenylene encompasses dibenzo[f,h]quinoxaline, dibenzo[f,h]quinoline and other analogues with two or more nitrogens in the ring system. One of ordinary skill in the art can readily envision other nitrogen analogs of the aza-derivatives described above, and all such analogs are intended to be encompassed by the terms as set forth herein.

In the present disclosure, unless otherwise defined, when any term of the group consisting of substituted alkyl, substituted cycloalkyl, substituted heteroalkyl, substituted aralkyl, substituted alkoxy, substituted aryloxy, substituted alkenyl, substituted aryl, substituted heteroaryl, substituted alkylsilyl, substituted arylsilyl, substituted amine, substituted acyl, substituted carbonyl, substituted carboxylic acid group, substituted ester group, substituted sulfinyl, substituted sulfonyl and substituted phosphino is used, it means that any group of alkyl, cycloalkyl, heteroalkyl, aralkyl, alkoxy, aryloxy, alkenyl, aryl, heteroaryl, alkylsilyl, arylsilyl, amine, acyl, carbonyl, carboxylic acid group, ester group, sulfinyl, sulfonyl and phosphino may be substituted with one or more groups selected from the group consisting of deuterium, a halogen, an unsubstituted alkyl group having 1 to 20 carbon atoms, an unsubstituted cycloalkyl group having 3 to 20 ring carbon atoms, an unsubstituted heteroalkyl group having 1 to 20 carbon atoms, an unsubstituted aralkyl group having 7 to 30 carbon atoms, an unsubstituted alkoxy group having 1 to 20 carbon atoms, an unsubstituted aryloxy group having 6 to 30 carbon atoms, an unsubstituted alkenyl group having 2 to 20 carbon atoms, an unsubstituted aryl group having 6 to 30 carbon atoms, an unsubstituted heteroaryl group having 3 to 30 carbon atoms, an unsubstituted alkylsilyl group having 3 to 20 carbon atoms, an unsubstituted arylsilyl group having 6 to 20 carbon atoms, an unsubstituted amino group having 0 to 20 carbon atoms, an acyl group, a carbonyl group, a carboxylic acid group, an ester group, a cyano group, an isocyano group, a thio group, a sulfinyl group, a sulfonyl group and a phosphino group, and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In the compounds mentioned in this disclosure, multiple substitutions refer to a range that includes a double substitution, up to the maximum available substitutions. When a substitution in the compounds mentioned in this disclosure represents multiple substitutions (including di, tri, tetra substitutions etc.), that means the substituent may exist at a plurality of available substitution positions on its linking structure, the substituents present at a plurality of available substitution positions may be the same structure or different structures.

In the compounds mentioned in the present disclosure, adjacent substituents in the compounds cannot be joined to form a ring unless otherwise explicitly defined, for example, adjacent substituents can be optionally joined to form a ring. In the compounds mentioned in the present disclosure, when adjacent substituents can be optionally joined to form a ring, the ring formed may be monocyclic or polycyclic, as well as alicyclic, heteroalicyclic, aromatic or heteroaromatic. In such expression, adjacent substituents may refer to substituents bonded to the same atom, substituents bonded to carbon atoms which are directly bonded to each other, or substituents bonded to carbon atoms which are more distant from each other. Preferably, adjacent substituents refer to substituents bonded to the same carbon atom and substituents bonded to carbon atoms which are directly bonded to each other.

The expression that adjacent substituents can be optionally joined to form a ring is also intended to mean that two substituents bonded to the same carbon atom are joined to each other via a chemical bond to form a ring, which can be exemplified by the following formula:

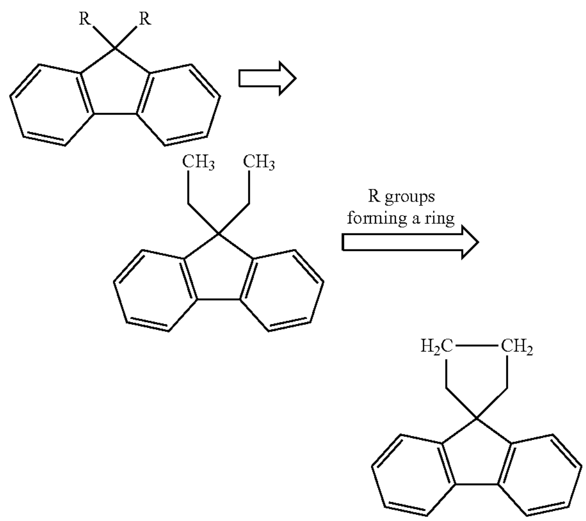

The expression that adjacent substituents can be optionally joined to form a ring is also intended to mean that two substituents bonded to carbon atoms which are directly bonded to each other are joined to each other via a chemical bond to form a ring, which can be exemplified by the following formula:

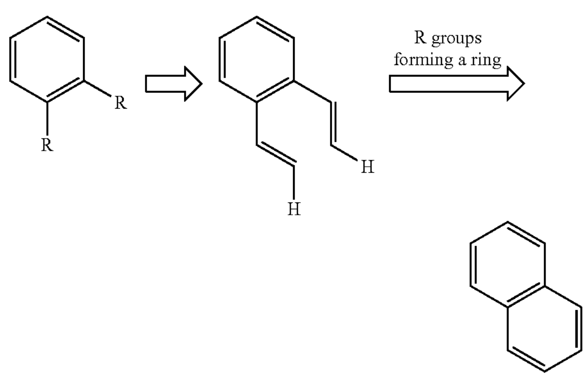

Furthermore, the expression that adjacent substituents can be optionally joined to form a ring is also intended to mean that, in the case where one of the two substituents bonded to carbon atoms which are directly bonded to each other represents hydrogen, the second substituent is bonded at a position at which the hydrogen atom is bonded, thereby forming a ring. This is exemplified by the following formula:

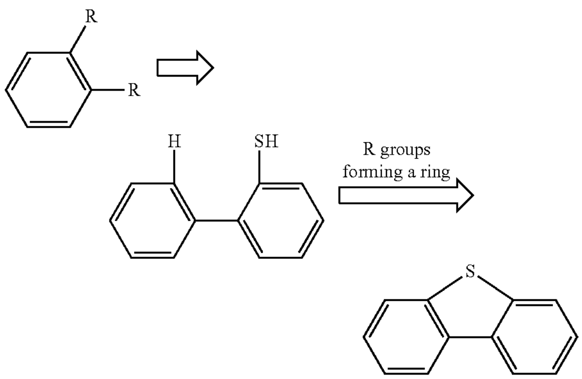

An embodiment of the present disclosure discloses a metal complex. The metal complex has a structure of $M(L_a)_m(L_b)_n(L_c)_q$, wherein $L_a$, $L_b$ and $L_c$ are the first ligand, the second ligand and the third ligand coordinated to a metal M respectively; wherein the metal M is a metal whose atomic number is more than 40;

Wherein, $L_a$, $L_b$ and $L_c$ may be optionally joined to form a multi-dentate ligand;

wherein m is 1 or 2, n is 1 or 2, q is 0 or 1, and m+n+q equals to the oxidation state of the metal M;

When m is greater than 1, each $L_a$ may be the same or different; and when n is greater than 1, each $L_b$ may be the same or different;

wherein the first ligand $L_a$ has a structure represented by Formula 1;

(Formula 1)

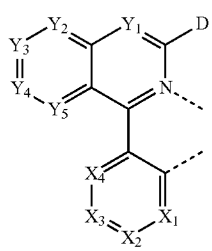

wherein, $X_1$ to $X_4$ are each independently selected from $CR_1$ or N; and wherein $Y_1$ to $Y_5$ are each independently selected from $CR_2$ or N;

wherein, $R_1$ and $R_2$ are each independently selected from a group consisting of: hydrogen, deuterium, halogen, substituted or unsubstituted alkyl group having 1 to 20 carbon atoms, substituted or unsubstituted cycloalkyl group having 3 to 20 ring carbon atoms, substituted or unsubstituted heteroalkyl group having 1 to 20 carbon atoms, substituted or unsubstituted aralkyl group having 7 to 30 carbon atoms, substituted or unsubstituted alkoxy group having 1 to 20 carbon atoms, substituted or unsubstituted aryloxy group having 6 to 30 carbon atoms, substituted or unsubstituted alkenyl group having 2 to 20 carbon atoms, substituted or unsubstituted aryl group having 6 to 30 carbon atoms, substituted or unsubstituted heteroaryl group having 3 to 30 carbon atoms, substituted or unsubstituted alkylsilyl group having 3 to 20 carbon atoms, substituted or unsubstituted arylsilyl group having 6 to 20 carbon atoms, substituted or unsubstituted amino group having 0 to 20 carbon atoms, an acyl group, a carbonyl group, a carboxylic acid group, an ester group, a cyano group, an isocyano group, a thio group, a sulfinyl group, a sulfonyl group, a phosphino group, and combinations thereof;

In Formula 1, for substituents $R_1$ and $R_2$, adjacent substituents can be optionally joined to form a ring;

Wherein, $L_b$ has a structure represented by Formula 2;

(Formula 2)

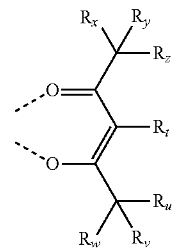

wherein $R_t$ to $R_z$ are each independently selected from a group consisting of: a hydrogen, deuterium, a halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted aralkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a cyano group, an isocyano group, a thio group, a sulfinyl group, a sulfonyl group, a phosphino group, and combinations thereof;

In Formula 2, for substituents $R_x$, $R_y$, $R_z$, $R_t$, $R_u$, $R_v$ and $R_w$, adjacent substituents can be optionally joined to form a ring;

Wherein, $L_c$ is a monoanionic bidentate ligand.

In embodiments of the present disclosure, the expression in Formula 1 that "for substituents $R_1$ and $R_2$, adjacent substituents can be optionally joined to form a ring" refers to that in the structure of Formula 1, adjacent substituents $R_1$ can be optionally joined to form a ring, and/or adjacent substituents $R_2$ can be optionally joined to form a ring, and/or adjacent substituents $R_1$ and $R_2$ can also be optionally joined to form a ring. Meanwhile, in some embodiments, adjacent substituents $R_1$ are not joined to form a ring, and/or adjacent substituents $R_2$ are not joined to form a ring, and/or adjacent substituents $R_1$ and $R_2$ are not joined to form a ring.

According to an embodiment of the present disclosure, the metal M is selected from a group consisting of Cu, Ag, Au, Ru, Rh, Pd, Os, Ir and Pt.

According to an embodiment of the present disclosure, the metal M is selected from Pt or Ir.

According to an embodiment of the present disclosure, the metal M is selected from Ir.

According to an embodiment of the present disclosure, at least one of $X_1$ to $X_4$ is selected from $CR_1$.

According to an embodiment of the present disclosure, $X_1$ to $X_4$ are each independently selected from $CR_1$.

According to an embodiment of the present disclosure, $Y_1$ to $Y_5$ are each independently selected from $CR_2$.

According to an embodiment of the present disclosure, $R_2$ is each independently selected from a group consisting of: hydrogen, halogen, substituted or unsubstituted alkyl group having 1 to 20 carbon atoms, substituted or unsubstituted cycloalkyl group having 3 to 20 ring carbon atoms, substituted or unsubstituted heteroalkyl group having 1 to 20 carbon atoms, substituted or unsubstituted aralkyl group having 7 to 30 carbon atoms, substituted or unsubstituted alkoxy group having 1 to 20 carbon atoms, substituted or unsubstituted aryloxy group having 6 to 30 carbon atoms, substituted or unsubstituted alkenyl group having 2 to 20 carbon atoms, substituted or unsubstituted aryl group having 6 to 30 carbon atoms, substituted or unsubstituted heteroaryl group having 3 to 30 carbon atoms, substituted or unsubstituted alkylsilyl group having 3 to 20 carbon atoms, substituted or unsubstituted arylsilyl group having 6 to 20 carbon atoms, substituted or unsubstituted amino group having 0 to 20 carbon atoms, an acyl group, a carbonyl group, a carboxylic acid group, an ester group, a cyano group, an isocyano group, a thio group, a sulfinyl group, a sulfonyl group, a phosphino group, and combinations thereof.

According to an embodiment of the present disclosure, $X_1$ is each independently $CR_1$ and/or $X_3$ is each independently $CR_1$, and $R_1$ is each independently selected from a group consisting of: deuterium, halogen, substituted or unsubstituted alkyl group having 1 to 20 carbon atoms, substituted or unsubstituted cycloalkyl group having 3 to 20 ring carbon atoms, substituted or unsubstituted heteroalkyl group having 1 to 20 carbon atoms, substituted or unsubstituted aralkyl group having 7 to 30 carbon atoms, substituted or unsubstituted alkoxy group having 1 to 20 carbon atoms, substituted or unsubstituted aryloxy group having 6 to 30 carbon atoms, substituted or unsubstituted alkenyl group having 2 to 20 carbon atoms, substituted or unsubstituted aryl group having 6 to 30 carbon atoms, substituted or unsubstituted heteroaryl group having 3 to 30 carbon atoms, substituted or unsubstituted alkylsilyl group having 3 to 20 carbon atoms, substituted or unsubstituted arylsilyl group having 6 to 20 carbon atoms, substituted or unsubstituted amino group having 0 to 20 carbon atoms, an acyl group, a carbonyl group, a carboxylic acid group, an ester group, a cyano group, an isocyano group, a thio group, a sulfinyl group, a sulfonyl group, a phosphino group, and combinations thereof.

According to an embodiment of the present disclosure, $X_1$ and $X_3$ are each independently selected from $CR_1$, and $R_1$ is each independently selected from a group consisting of: hydrogen, deuterium, halogen, substituted or unsubstituted alkyl group having 1 to 20 carbon atoms, substituted or unsubstituted cycloalkyl group having 3 to 20 ring carbon atoms, substituted or unsubstituted aryl group having 6 to 30 carbon atoms, substituted or unsubstituted heteroaryl group having 3 to 30 carbon atoms, and substituted or unsubstituted alkylsilyl group having 3 to 20 carbon atoms.

According to an embodiment of the present disclosure, $X_1$ and $X_3$ are each independently selected from $CR_1$, and $R_1$ is each independently selected from substituted or unsubstituted alkyl group having 1 to 20 carbon atoms, and $X_2$ and $X_4$ are CH.

According to an embodiment of the present disclosure, $X_1$ and $X_4$ each are CH, and $X_2$ and $X_3$ are each independently selected from $CR_1$.

According to an embodiment of the present disclosure, $X_1$, $X_3$ and $X_4$ are CH, and $X_2$ is selected from N or $CR_1$.

According to an embodiment of the present disclosure, $X_1$, $X_2$ and $X_4$ are CH, and $X_3$ is selected from N or $CR_1$.

According to an embodiment of the present disclosure, $X_1$, $X_2$ and $X_3$ are CH, and $X_4$ is selected from $CR_1$.

According to an embodiment of the present disclosure, $X_2$ is CH, and $X_1$, $X_3$ and $X_4$ are each independently selected from $CR_1$.

According to an embodiment of the present disclosure, $X_4$ is CH, and $X_1$, $X_2$ and $X_3$ are each independently selected from $CR_1$.

According to an embodiment of the present disclosure, $Y_3$ is $CR_2$, and $R_2$ is independently selected from a group consisting of: halogen, substituted or unsubstituted alkyl group having 1 to 20 carbon atoms, substituted or unsubstituted cycloalkyl group having 3 to 20 ring carbon atoms, substituted or unsubstituted heteroalkyl group having 1 to 20 carbon atoms, substituted or unsubstituted aralkyl group having 7 to 30 carbon atoms, substituted or unsubstituted alkoxy group having 1 to 20 carbon atoms, substituted or unsubstituted aryloxy group having 6 to 30 carbon atoms, substituted or unsubstituted alkenyl group having 2 to 20 carbon atoms, substituted or unsubstituted aryl group having 6 to 30 carbon atoms, substituted or unsubstituted heteroaryl group having 3 to 30 carbon atoms, substituted or unsubstituted alkylsilyl group having 3 to 20 carbon atoms, substituted or unsubstituted arylsilyl group having 6 to 20 carbon atoms, substituted or unsubstituted amino group having 0 to 20 carbon atoms, an acyl group, a carbonyl group, a carboxylic acid group, an ester group, a cyano group, an isocyano group, a thio group, a sulfinyl group, a sulfonyl group, a phosphino group, and combinations thereof.

According to an embodiment of the present disclosure, $Y_3$ is $CR_2$, and $R_2$ is independently selected from a group consisting of: halogen, substituted or unsubstituted alkyl group having 1 to 20 carbon atoms, substituted or unsubstituted cycloalkyl group having 3 to 20 ring carbon atoms, substituted or unsubstituted aryl group having 6 to 30 carbon atoms, substituted or unsubstituted heteroaryl group having 3 to 30 carbon atoms, and substituted or unsubstituted alkylsilyl group having 3 to 20 carbon atoms.

According to an embodiment of the present disclosure, $Y_3$ is $CR_2$, $R_2$ is independently selected from substituted or unsubstituted alkyl group having 1 to 20 carbon atoms, or substituted or unsubstituted alkylsilyl group having 3 to 20 carbon atoms, and $Y_1$, $Y_2$, $Y_4$ and $Y_5$ are CH.

According to an embodiment of the present disclosure, $Y_4$ is $CR_2$, $R_2$ is independently selected from substituted or unsubstituted alkyl group having 1 to 20 carbon atoms, or substituted or unsubstituted alkylsilyl group having 3 to 20 carbon atoms, and $Y_1$, $Y_2$, $Y_3$ and $Y_5$ are CH.

According to an embodiment of the present disclosure, $Y_1$, $Y_3$, $Y_4$ and $Y_5$ are CH, $Y_2$ is $CR_2$, and $R_2$ is selected from substituted or unsubstituted alkyl group having 1 to 20 carbon atoms, or substituted or unsubstituted alkylsilyl group having 3 to 20 carbon atoms.

According to an embodiment of the present disclosure, $Y_2$, $Y_3$, $Y_4$ and $Y_5$ are CH, $Y_1$ is $CR_2$, and $R_2$ is selected from substituted or unsubstituted alkyl group having 1 to 20 carbon atoms, or substituted or unsubstituted alkylsilyl group having 3 to 20 carbon atoms.

According to an embodiment of the present disclosure, $Y_1$, $Y_2$ and $Y_5$ are CH, $Y_3$ and $Y_4$ are each independently $CR_2$, and $R_2$ is independently selected from substituted or unsubstituted alkyl group having 1 to 20 carbon atoms, or substituted or unsubstituted alkylsilyl group having 3 to 20 carbon atoms.

According to an embodiment of the present disclosure, $Y_2$, $Y_4$ and $Y_5$ are CH, $Y_1$ and $Y_3$ are each independently $CR_2$, and $R_2$ is independently selected from substituted or unsubstituted alkyl group having 1 to 20 carbon atoms, or substituted or unsubstituted alkylsilyl group having 3 to 20 carbon atoms.

According to an embodiment of the present disclosure, $Y_2$, $Y_4$ and $Y_5$ are CH, $Y_1$ is N, $Y_3$ is $CR_2$, and $R_2$ is independently selected from substituted or unsubstituted alkyl group having 1 to 20 carbon atoms, or substituted or unsubstituted alkylsilyl group having 3 to 20 carbon atoms.

According to an embodiment of the present disclosure, $Y_1$, $Y_4$ and $Y_5$ are CH, $Y_2$ is N, $Y_3$ is $CR_2$, and $R_2$ is independently selected from substituted or unsubstituted alkyl group having 1 to 20 carbon atoms, or substituted or unsubstituted alkylsilyl group having 3 to 20 carbon atoms.

According to an embodiment of the present disclosure, $R_2$ is independently selected from a group consisting of hydrogen, methyl group, isopropyl group, 2-butyl group, isobutyl group, t-butyl group, pentan-3-yl group, cyclopentyl group, cyclohexyl group, 4,4-dimethylcyclohexyl group, neopentyl group, 2,4-dimethylpent-3-yl group, 1,1-dimethylsilacyclohex-4-yl group, cyclopentylmethyl group, cyano group, trifluoromethyl group, fluorine, trimethylsilyl group, phenyldimethylsilyl group, bicyclo[2,2,1]pentyl group, adamantyl group, phenyl group and 3-pyridyl group.

According to an embodiment of the present disclosure, the ligand $L_a$ is selected from any one or two of structures in a group consisting of $L_{a1}$ to $L_{a1036}$. For specific structures of $L_{a1}$ to $L_{a1036}$, reference is made to claim 9.

According to an embodiment of the present disclosure, in Formula 2, $R_t$ to $R_z$ are each independently selected from a group consisting of: hydrogen, deuterium, halogen, substituted or unsubstituted alkyl group having 1 to 20 carbon atoms, substituted or unsubstituted cycloalkyl group having 3 to 20 ring carbon atoms, and combinations thereof.

According to an embodiment of the present disclosure, in the metal complex, in Formula 2, $R_t$ is selected from hydrogen, deuterium or methyl group, $R_u$ to $R_z$ are each independently selected from hydrogen, deuterium, fluorine, methyl group, ethyl group, propyl group, cyclobutyl group, cyclopentyl group, cyclohexyl group, 3-methylbutyl group, 3-ethylpentyl group, trifluoromethyl group, and combinations thereof.

According to an embodiment of the present disclosure, the second ligand $L_b$ is each independently selected from any one or two of structures in a group consisting of $L_{b1}$ to $L_{b365}$. For specific structures of $L_{b1}$ to $L_{b365}$, reference is made to claim 11.

According to an embodiment of the present disclosure, the hydrogen in the first ligand $L_{a1}$ to $L_{a1036}$ and/or the second ligand $L_{b1}$ to $L_{b365}$ may be partially or fully substituted by deuterium.

According to an embodiment of the present disclosure, in the metal complex, the third ligand $L_c$ is selected from any one of the following structures:

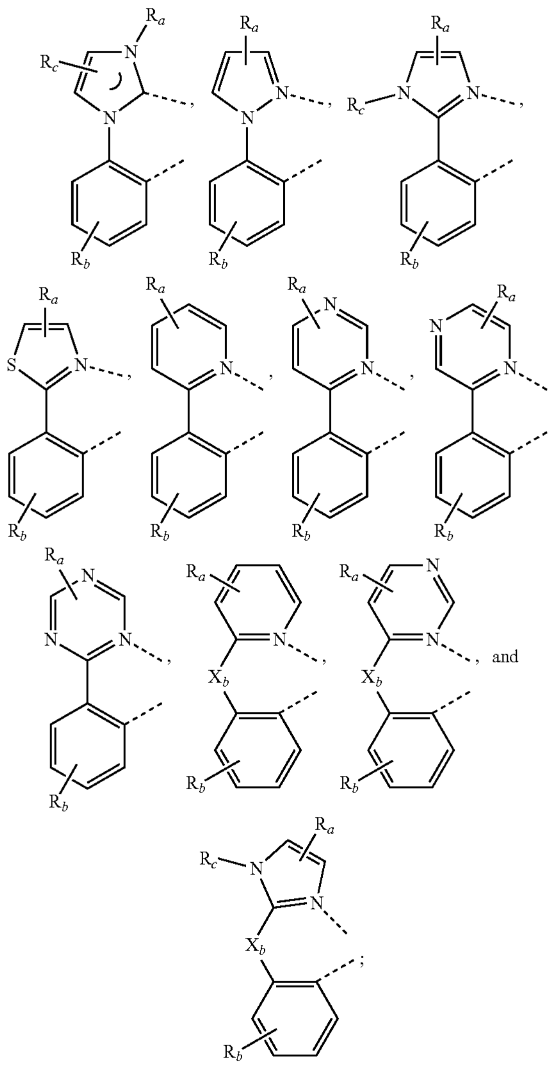

wherein $R_a$, $R_b$ and $R_c$ may represent mono substitution, multiple substitutions or no substitution;

$X_b$ is selected from a group consisting of: O, S, Se, $NR_{N1}$ and $CR_{C1}R_{C2}$; and $R_a$, $R_b$, $R_e$, $R_{N1}$, $R_{C1}$ and $R_{C2}$ are each independently selected from a group consisting of: hydrogen, deuterium, halogen, substituted or unsubstituted alkyl group having 1 to 20 carbon atoms, substituted or unsubstituted cycloalkyl group having 3 to 20 ring carbon atoms, substituted or unsubstituted heteroalkyl group having 1 to 20 carbon atoms, substituted or unsubstituted aralkyl group having 7 to 30 carbon atoms, substituted or unsubstituted alkoxy group having 1 to 20 carbon atoms, substituted or unsubstituted aryloxy group having 6 to 30 carbon atoms, substituted or unsubstituted alkenyl group having 2 to 20 carbon atoms, substituted or unsubstituted aryl group having 6 to 30 carbon atoms, substituted or unsubstituted heteroaryl group having 3 to 30 carbon atoms, substituted or unsubstituted alkylsilyl group having 3 to 20 carbon atoms, substituted or unsubstituted arylsilyl group having 6 to 20 carbon atoms, substituted or unsubstituted amino group having 0 to 20 carbon atoms, an acyl group, a carbonyl group, a carboxylic acid group, an ester group, a cyano group, an isocyano group, a thio group, a sulfinyl group, a sulfonyl group, a phosphino group, and combinations thereof;

in the structure of $L_c$, adjacent substituents can be optionally joined to form a ring.

In this embodiment, that in the structure of $L_c$, adjacent substituents can be optionally joined to form a ring refers to, taking

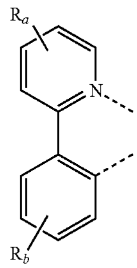

as an example, in the structure of $L_c$, adjacent substituents $R_a$ can be optionally joined to form a ring, adjacent substituents $R_b$ can be optionally joined to form a ring, and adjacent substituents $R_a$ and $R_b$ can be optionally joined to form a ring. Meanwhile, there are other cases in which adjacent substituents are not joined to form a ring, for example, adjacent substituents $R_a$ are not joined to form a ring, and/or adjacent substituents $R_b$ are not joined to form a ring, and/or adjacent substituents $R_a$ and $R_b$ are not joined to form a ring. The other structures of $L_c$ is similar to those in this example.

According to an embodiment of the present disclosure, in the metal complex, the third ligand $L_c$ is each independently selected from a group consisting of $L_{c1}$ to $L_{c118}$. For specific structures of $L_{c1}$ to $L_{c118}$, reference is made to claim 14.

According to an embodiment of the present disclosure, the metal complex is $Ir(L_a)_2(L_b)$, wherein $L_a$ is selected from any one or two of $L_{a1}$ to $L_{a1036}$, and $L_b$ is selected from any one of $L_{b1}$ to $L_{b365}$. Further, the hydrogen in $Ir(L_a)_2(L_b)$ can be optionally partially or fully substituted by deuterium.

According to an embodiment of the present disclosure, the metal complex is $Ir(L_a)(L_b)(L_c)$, wherein $L_a$ is selected from any one of $L_{a1}$ to $L_{a1036}$, $L_b$ is selected from any one of $L_{b1}$ to $L_{b365}$, and $L_c$ is selected from any one of $L_{c1}$ to $L_{c118}$. Further, the hydrogen in $Ir(L_a)(L_b)(L_c)$ can be optionally partially or fully substituted by deuterium.

According to an embodiment of the present disclosure, the metal complex is selected from a group consisting of the following:

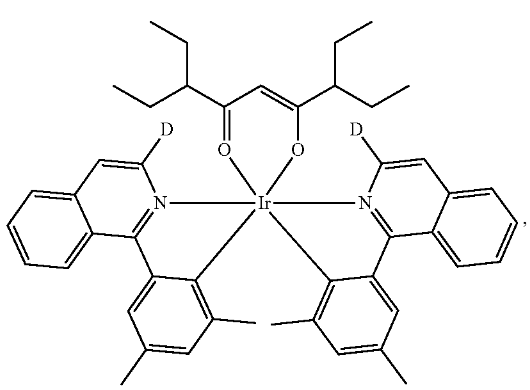

$Ir(L_{a3})_2(L_{b31})$

-continued

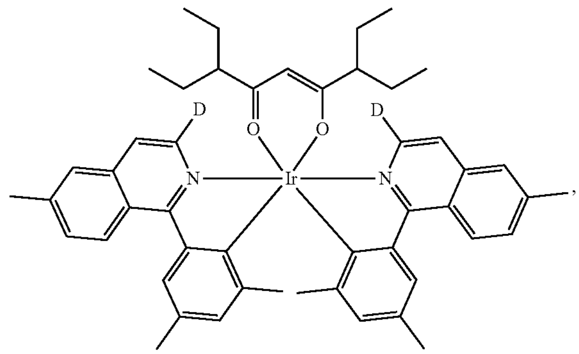

$Ir(L_{a44})_2(L_{b31})$

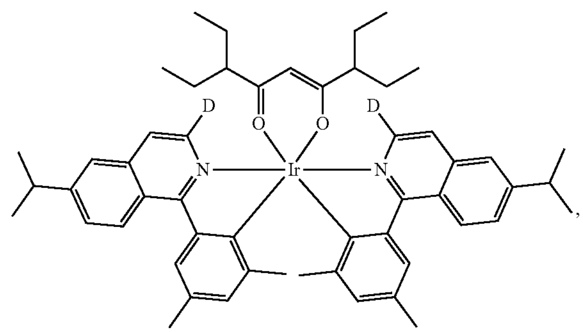

$Ir(L_{a126})_2(L_{b31})$

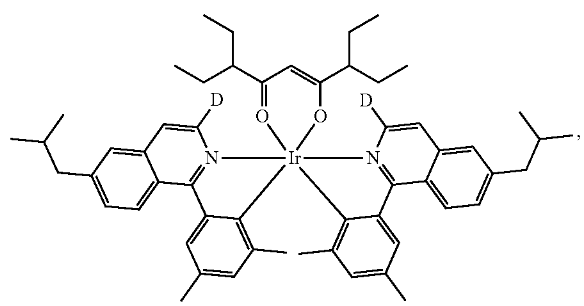

$Ir(L_{a167})_2(L_{b31})$

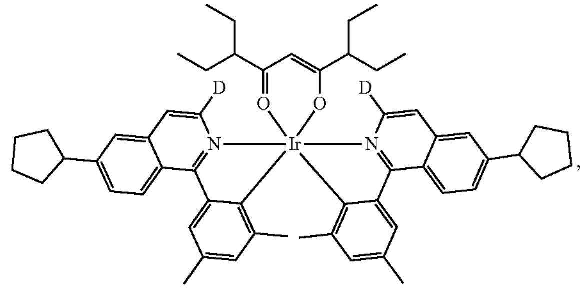

$Ir(L_{a331})_2(L_{b31})$

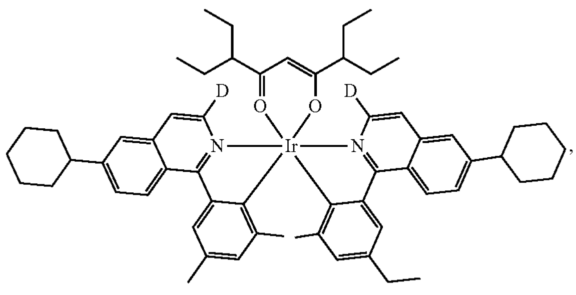
$Ir(L_{a372})_2(L_{b31})$
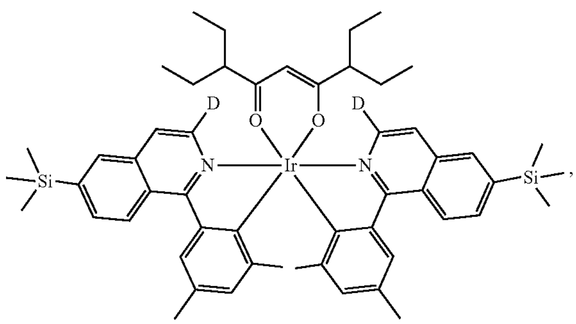
$Ir(L_{a659})_2(L_{b31})$
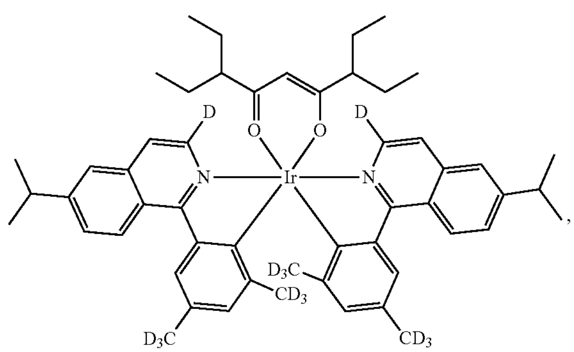
$Ir(L_{a159})_2(L_{b31})$
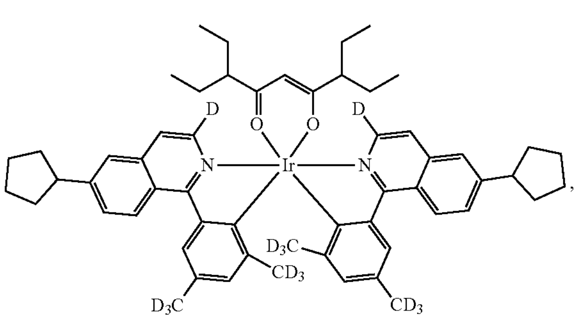
$Ir(L_{a364})_2(L_{b31})$
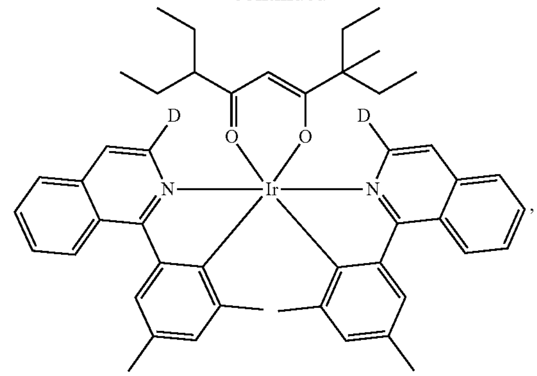
$Ir(L_{a3})_2(L_{b101})$
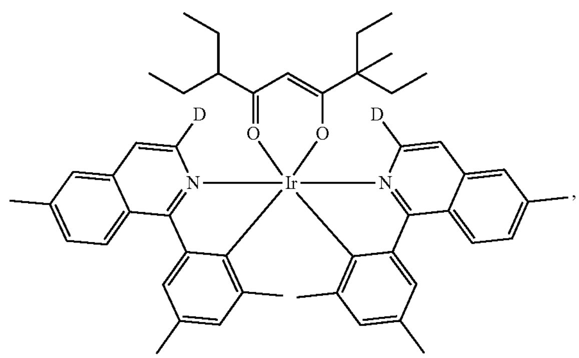
$Ir(L_{a44})_2(L_{b101})$
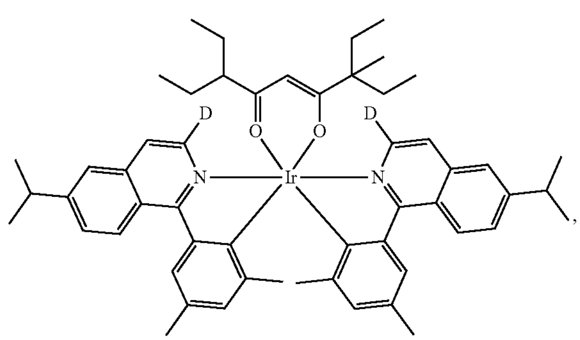
$Ir(L_{a126})_2(L_{b101})$
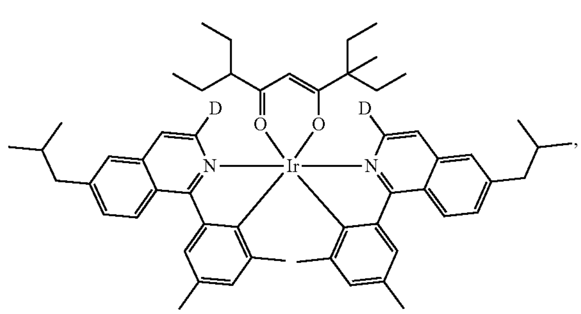
$Ir(L_{a167})_2(L_{b101})$ -continued
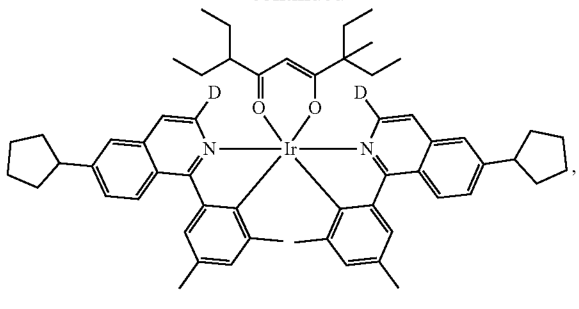
$Ir(L_{a331})_2(L_{b101})$
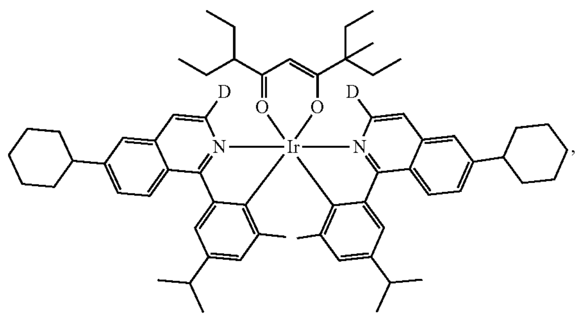
$Ir(L_{a372})_2(L_{b101})$
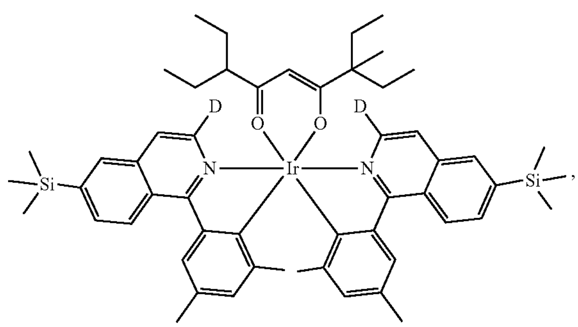
$Ir(L_{a659})_2(L_{b101})$
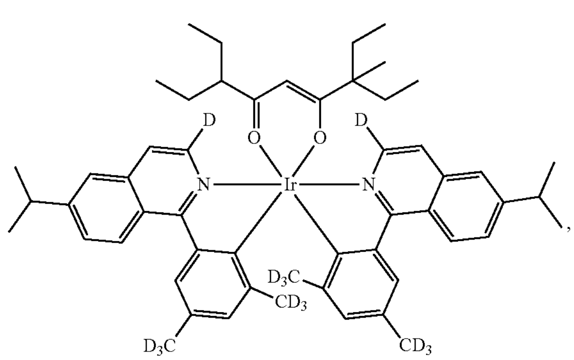
$Ir(L_{a159})_2(L_{b101})$
-continued
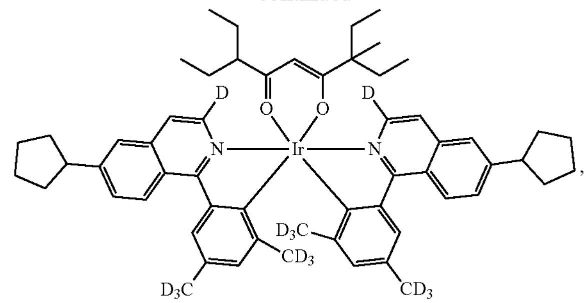
$Ir(L_{a364})_2(L_{b101})$
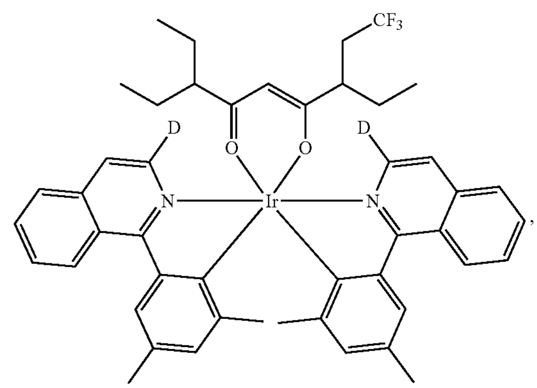
$Ir(L_{a3})_2(L_{b361})$
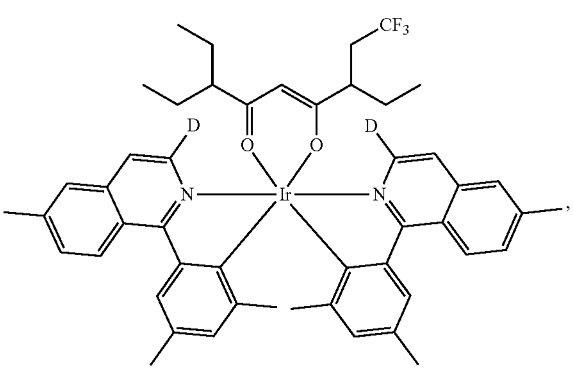
$Ir(L_{a44})_2(L_{b361})$
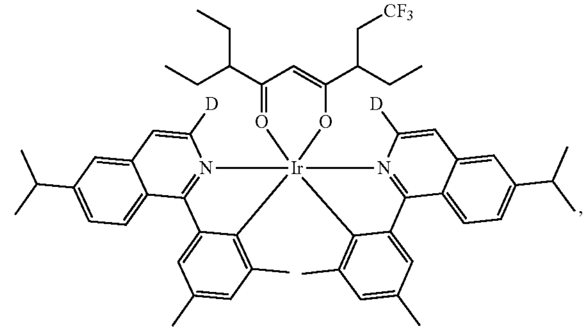
$Ir(L_{a126})_2(L_{b361})$ -continued
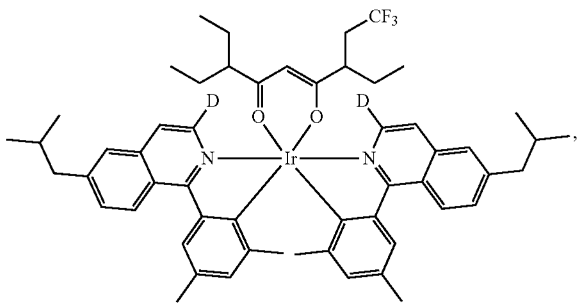
$Ir(L_{a167})_2(L_{b361})$
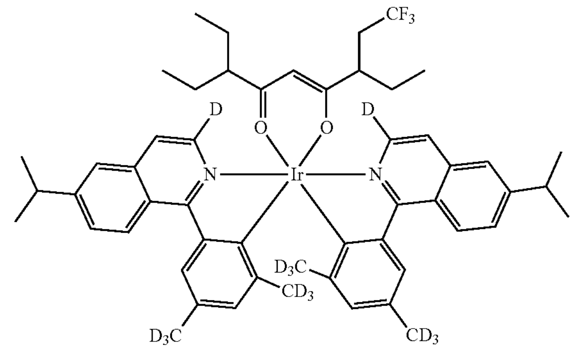
$Ir(L_{a159})_2(L_{b361})$
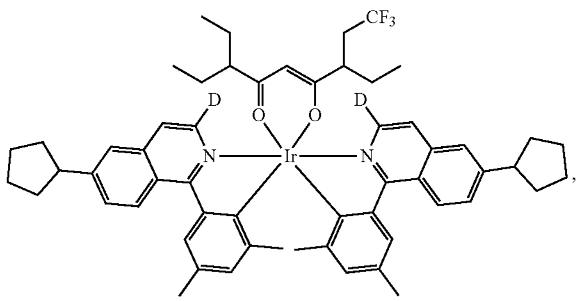
$Ir(L_{a331})_2(L_{b361})$
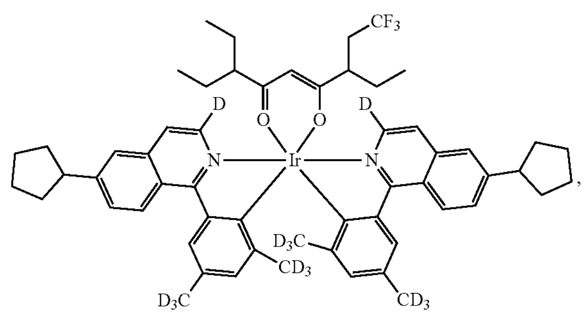
$Ir(L_{a364})_2(L_{b361})$
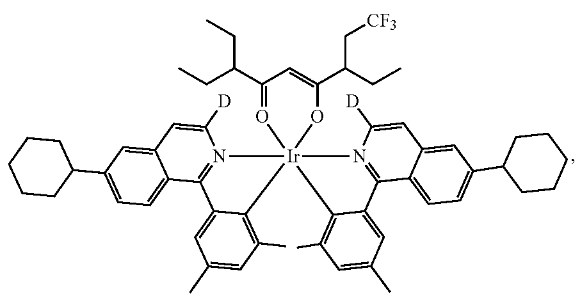
$Ir(L_{a372})_2(L_{b361})$
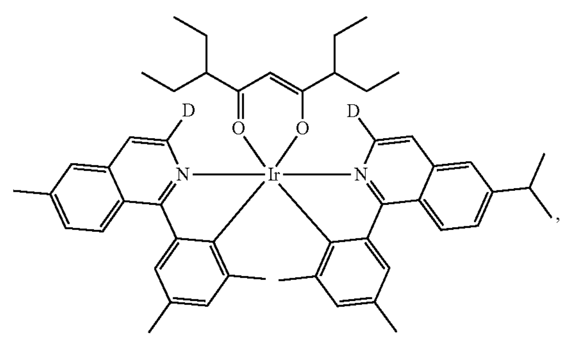
$Ir(L_{a44})(L_{a126})(L_{b31})$
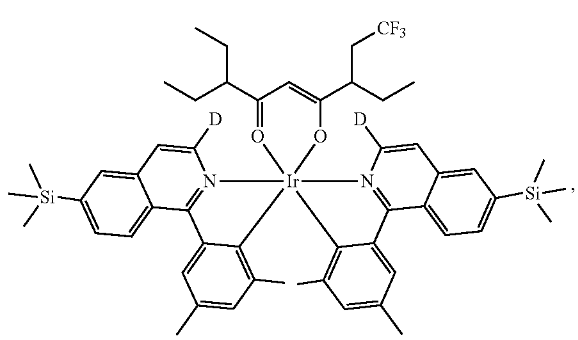
$Ir(L_{a659})_2(L_{b361})$
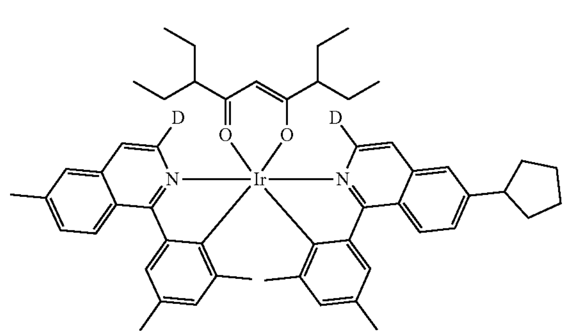
$Ir(L_{a44})(L_{a331})(L_{b31})$ -continued
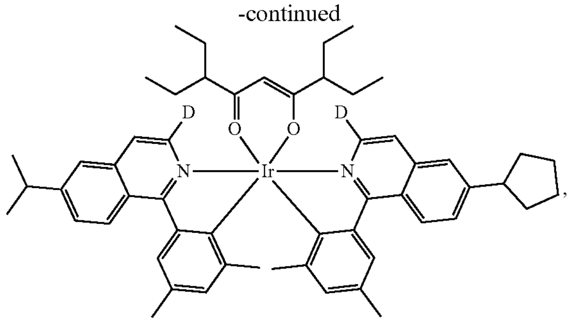
Ir(L$_{a126}$)(L$_{a331}$)(L$_{b31}$)
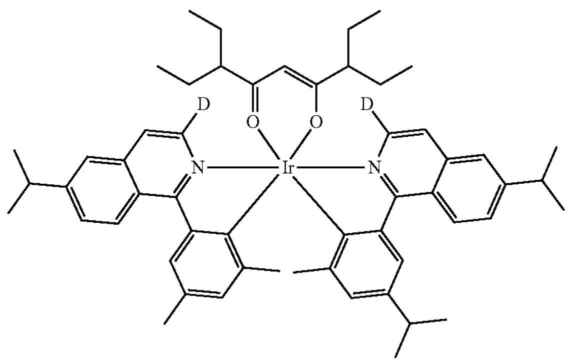
Ir(L$_{a126}$)(L$_{a130}$)(L$_{b31}$)
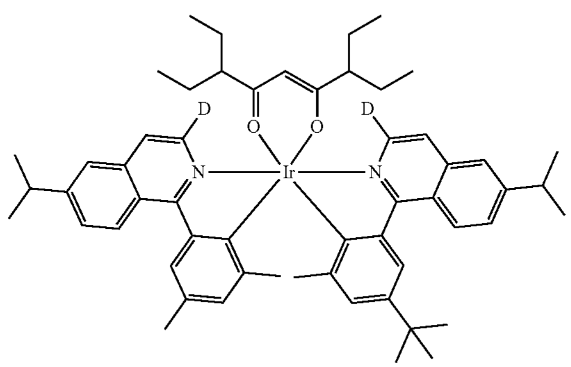
Ir(L$_{a126}$)(L$_{a133}$)(L$_{b31}$)
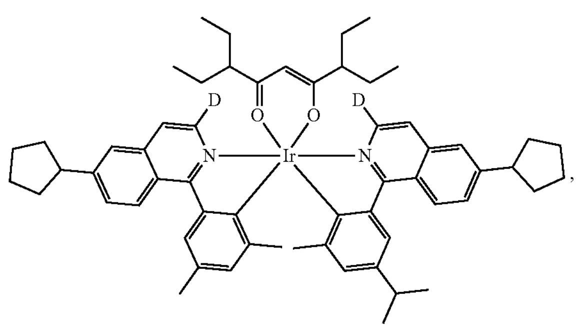
Ir(L$_{a331}$)(L$_{a376}$)(L$_{b31}$)
-continued
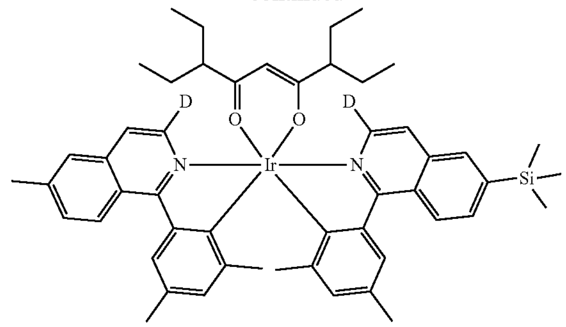
Ir(L$_{a44}$)(L$_{a659}$)(L$_{b31}$)
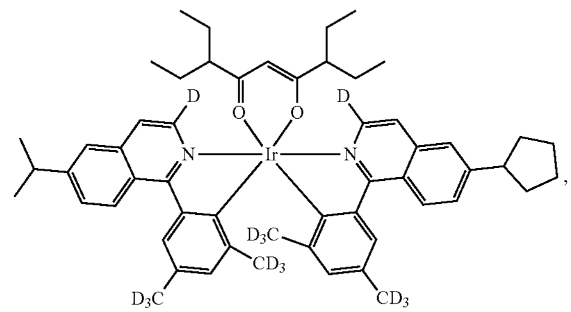
Ir(L$_{a159}$)(L$_{a364}$)(L$_{b31}$)
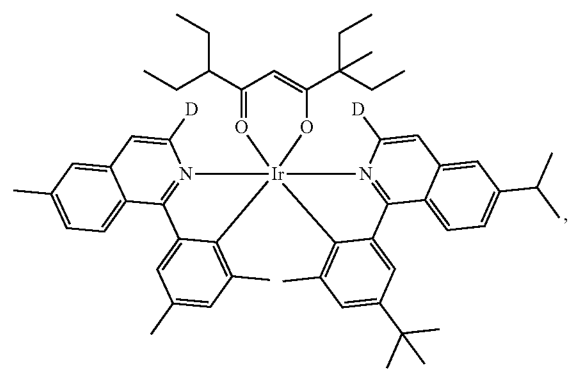
Ir(L$_{a44}$)(L$_{a126}$)(L$_{b101}$)
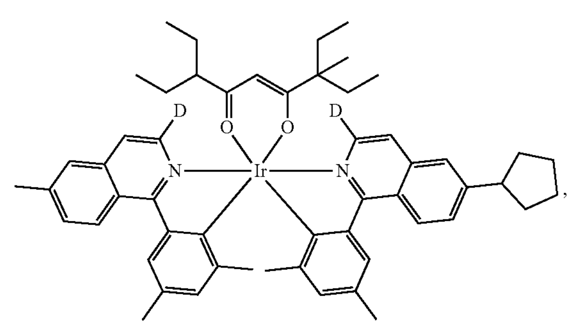
Ir(L$_{a44}$)(L$_{a331}$)(L$_{b101}$)

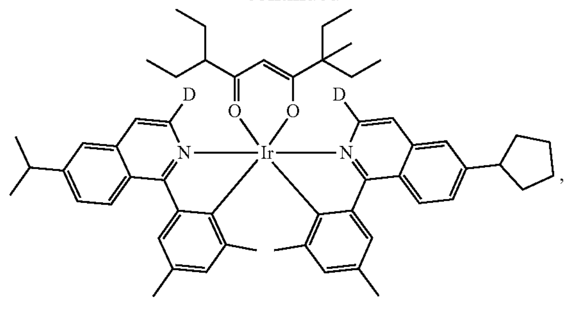
Ir($L_{a126}$)($L_{a331}$)($L_{b101}$)
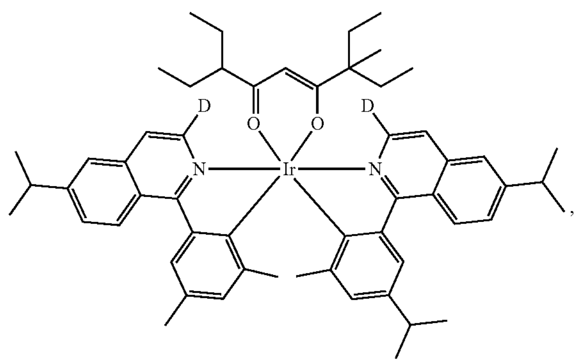
Ir($L_{a126}$)($L_{a130}$)($L_{b101}$)
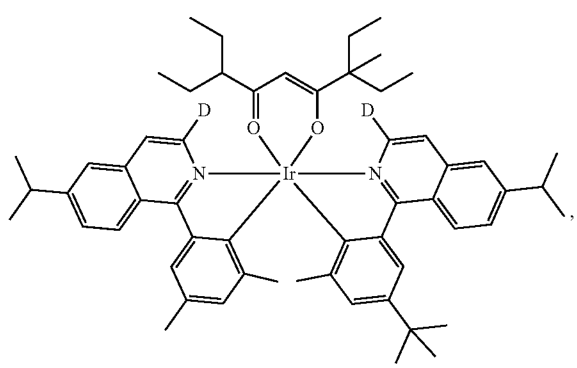
Ir($L_{a126}$)($L_{a133}$)($L_{b101}$)
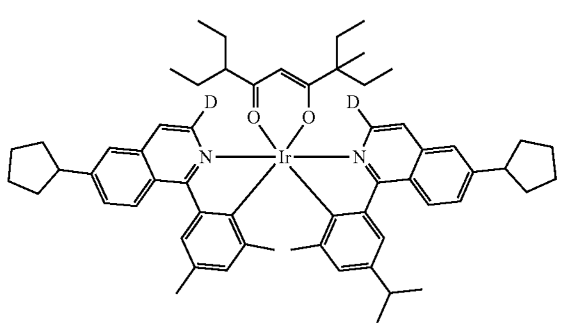
Ir($L_{a331}$)($L_{a376}$)($L_{b101}$)
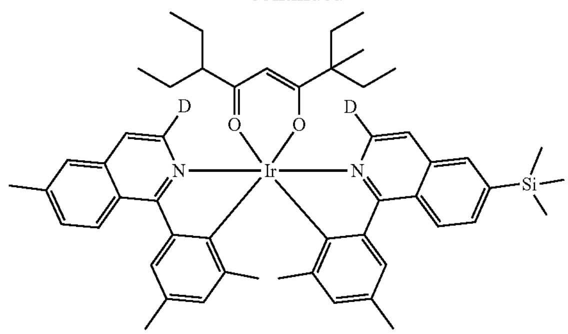
Ir($L_{a44}$)($L_{a659}$)($L_{b101}$)
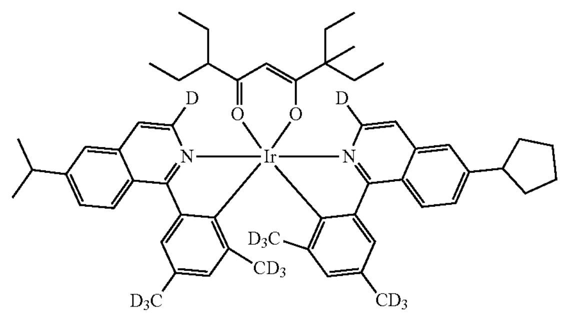
Ir($L_{a159}$)($L_{a364}$)($L_{b101}$)
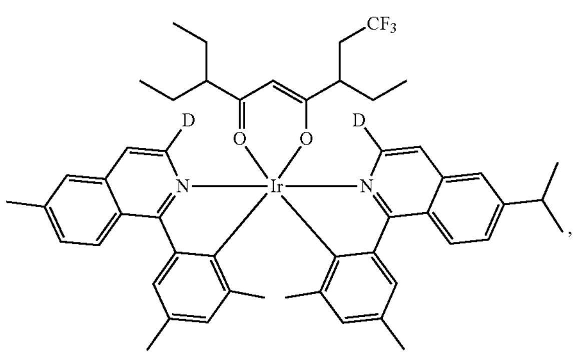
Ir($L_{a44}$)($L_{a126}$)($L_{b361}$)
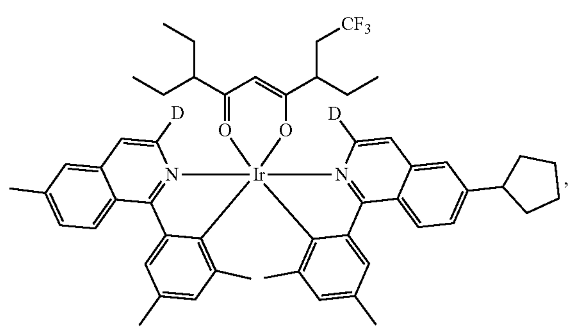
Ir($L_{a44}$)($L_{a331}$)($L_{b361}$)

-continued
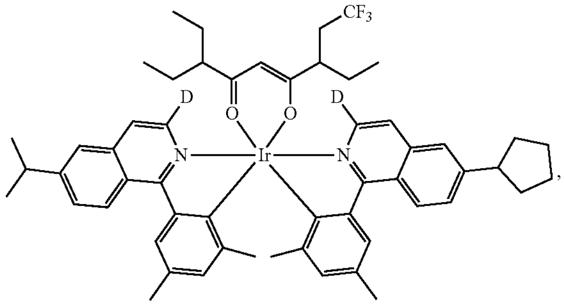
$Ir(L_{a126})(L_{a331})(L_{b361})$
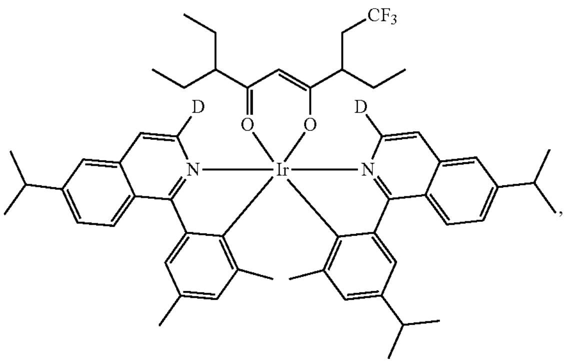
$Ir(L_{a126})(L_{a130})(L_{b361})$
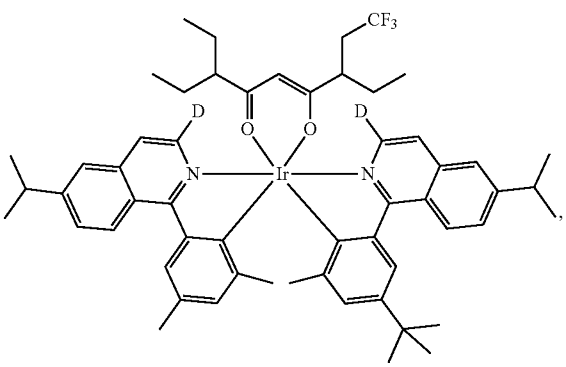
$Ir(L_{a126})(L_{a133})(L_{b361})$
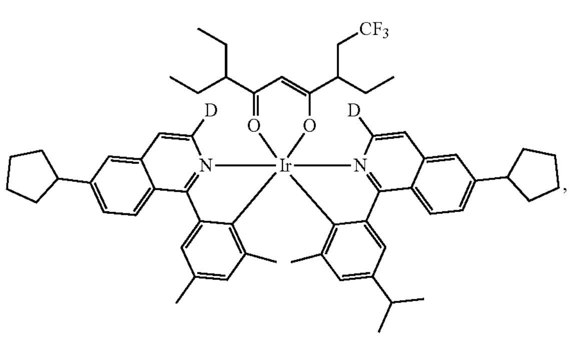
$Ir(L_{a331})(L_{a376})(L_{b361})$
-continued
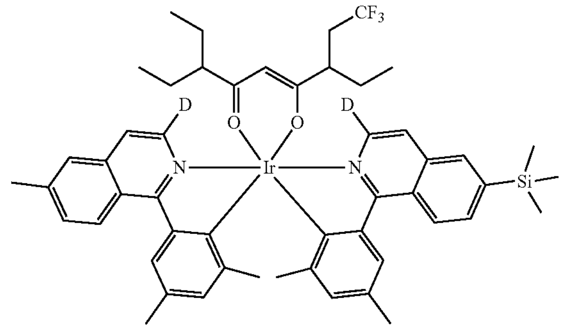
$Ir(L_{a44})(L_{a659})(L_{b361})$
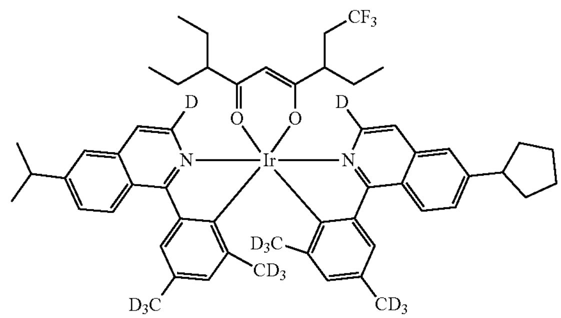
$Ir(L_{a159})(L_{a364})(L_{b361})$
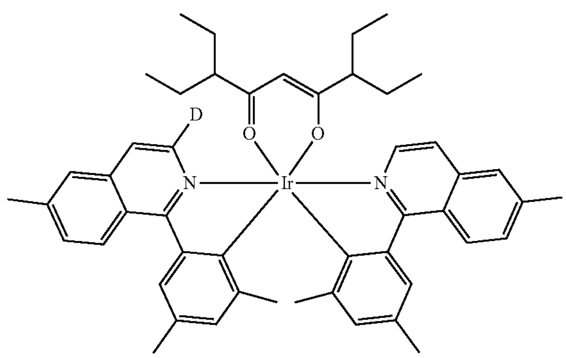
$Ir(L_{a44})(L_{b31})(L_{c31})$
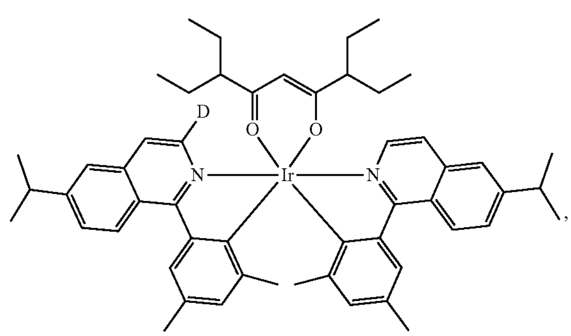
$Ir(L_{a126})(L_{b31})(L_{c41})$ -continued
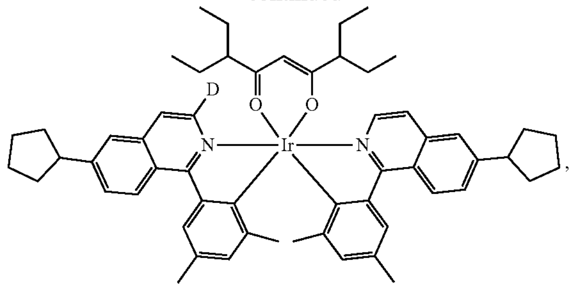
$Ir(L_{a331})(L_{b31})(L_{c61})$
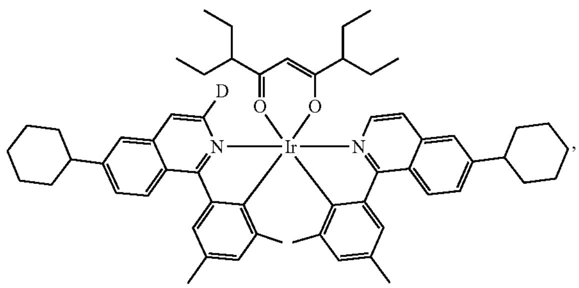
$Ir(L_{a372})(L_{b31})(L_{c71})$
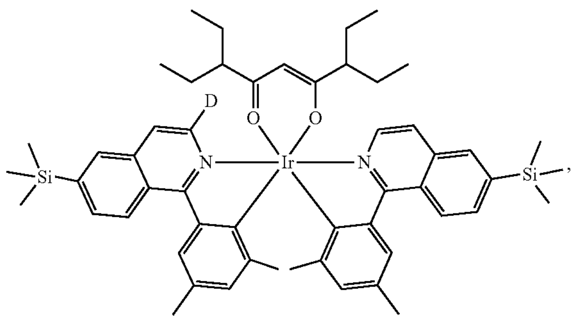
$Ir(L_{a659})(L_{b31})(L_{c81})$
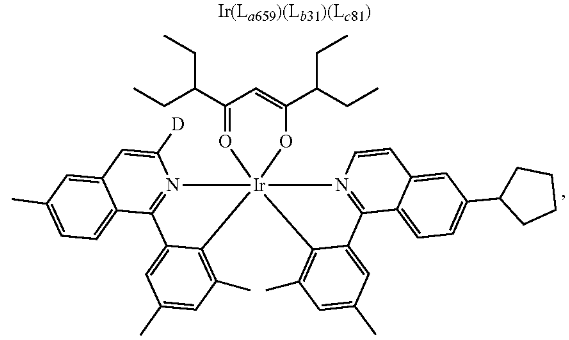
$Ir(L_{a44})(L_{b31})(L_{c61})$
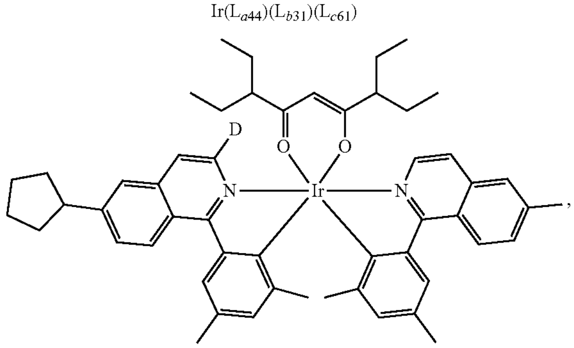
$Ir(L_{a331})(L_{b31})(L_{c31})$
-continued
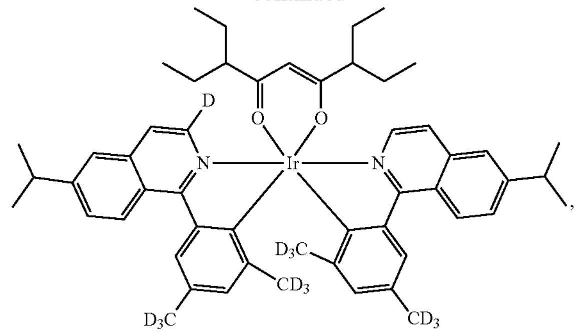
$Ir(L_{a159})(L_{b31})(L_{c48})$
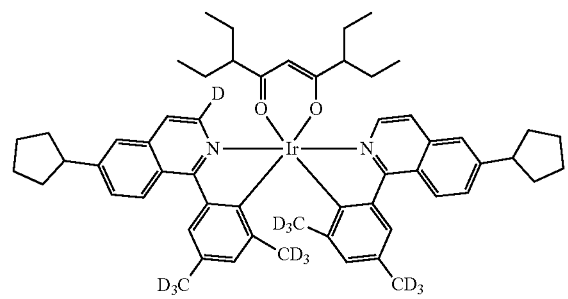
$Ir(L_{a364})(L_{b31})(L_{c68})$
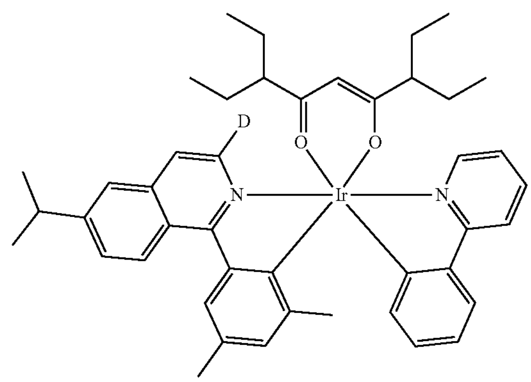
$Ir(L_{a126})(L_{b31})(L_{c1})$
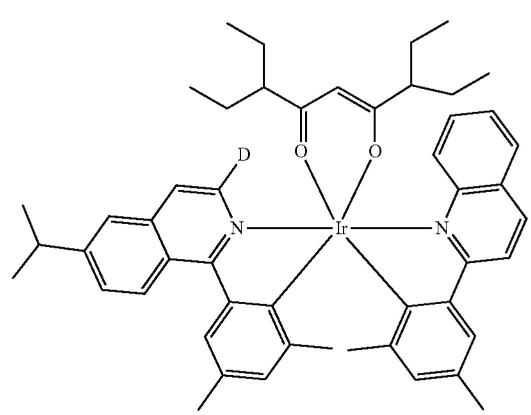
$Ir(L_{a126})(L_{b31})(L_{c19})$ -continued
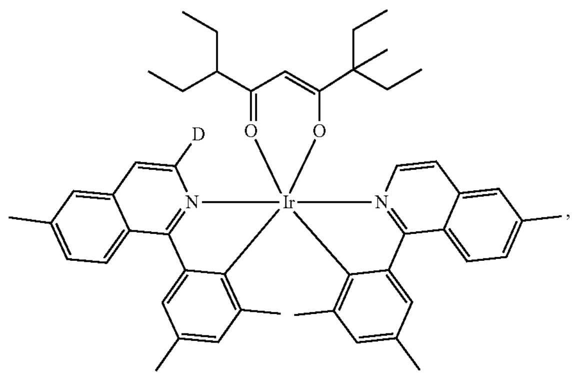
$Ir(L_{a44})(L_{b101})(L_{c31})$
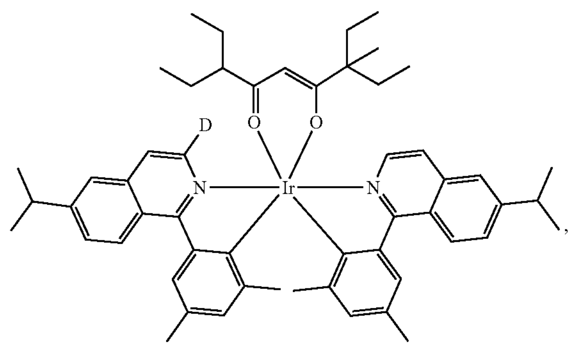
$Ir(L_{a126})(L_{b101})(L_{c41})$
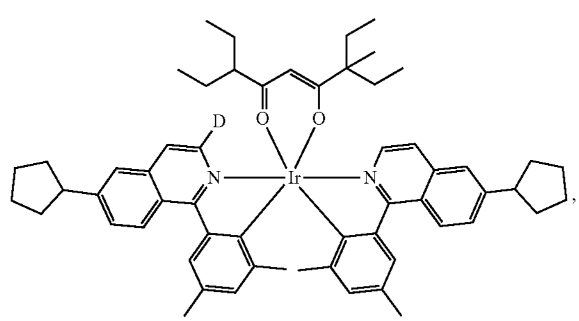
$Ir(L_{a331})(L_{b101})(L_{c61})$
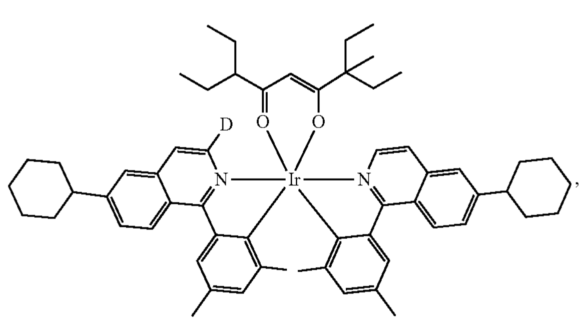
$Ir(L_{a372})(L_{b101})(L_{c71})$
-continued
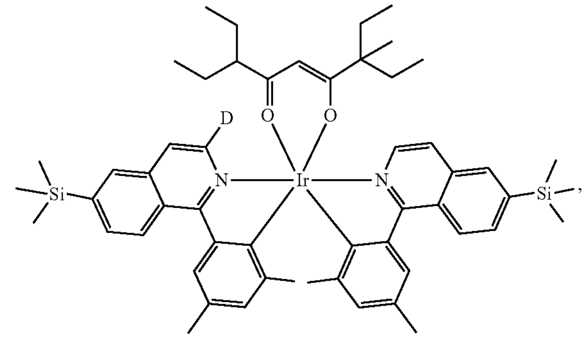
$Ir(L_{a659})(L_{b101})(L_{c81})$
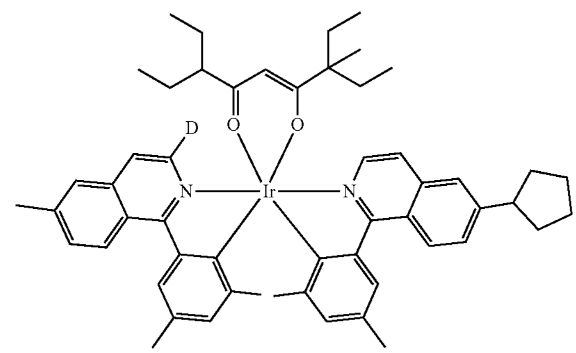
$Ir(L_{a44})(L_{b101})(L_{c61})$
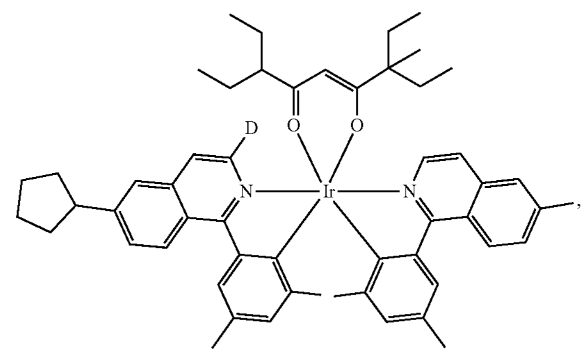
$Ir(L_{a331})(L_{b101})(L_{c31})$
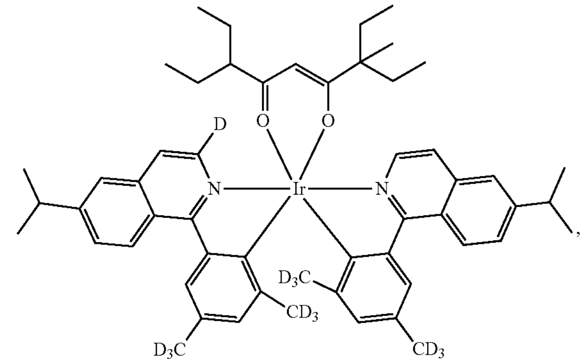
$Ir(L_{a159})(L_{b101})(L_{c48})$ -continued
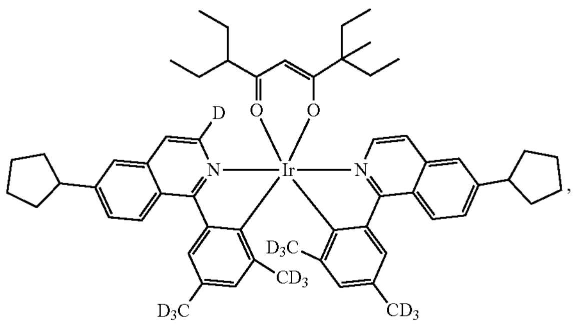
$Ir(L_{a364})(L_{b101})(L_{c68})$
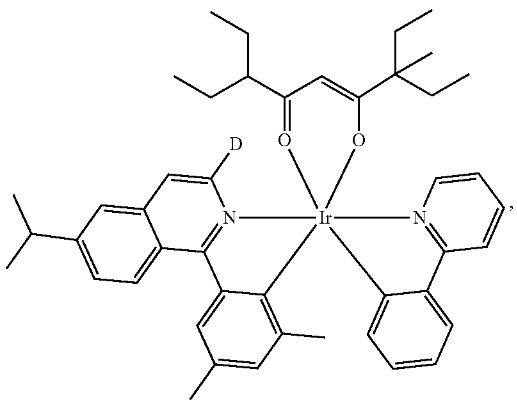
$Ir(L_{a126})(L_{b101})(L_{c1})$
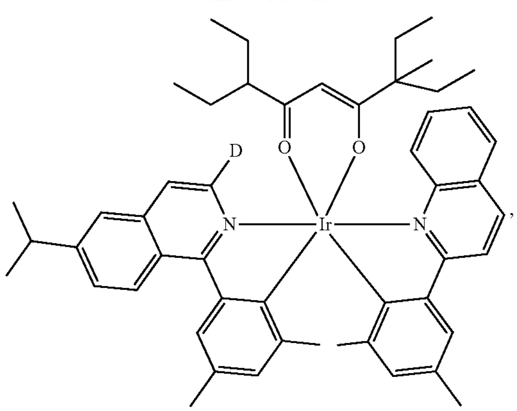
$Ir(L_{a126})(L_{b101})(L_{c19})$
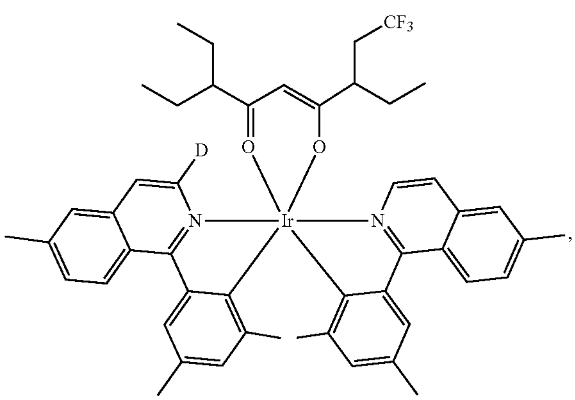
$Ir(L_{a44})(L_{b361})(L_{c31})$
-continued
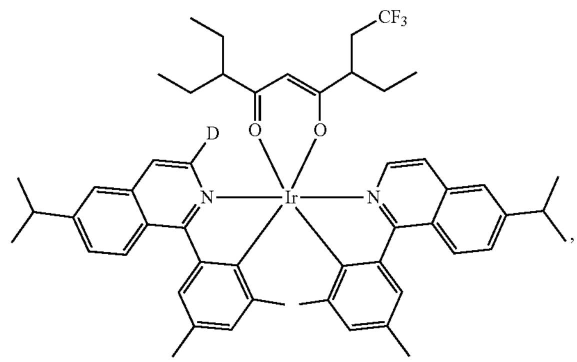
$Ir(L_{a126})(L_{b361})(L_{c41})$
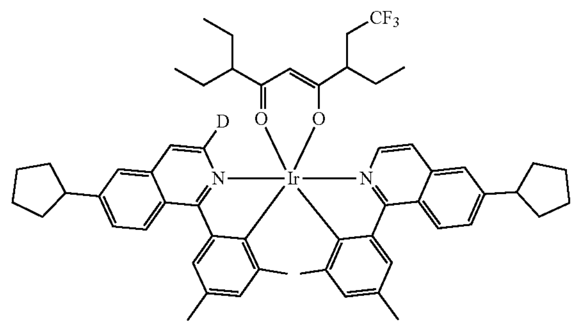
$Ir(L_{a331})(L_{b361})(L_{c61})$
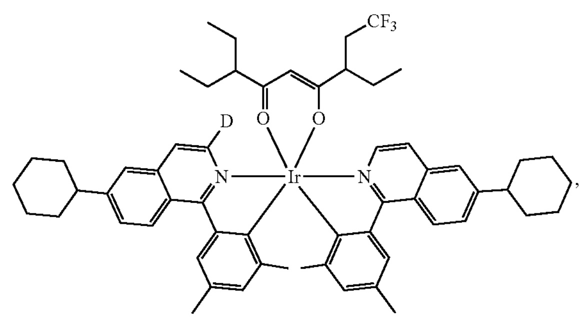
$Ir(L_{a372})(L_{b361})(L_{c71})$
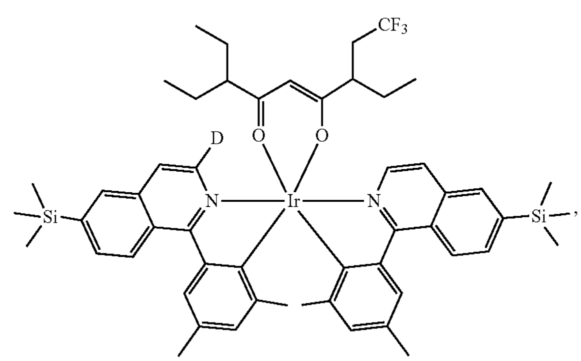
$Ir(L_{a659})(L_{b361})(L_{c81})$ -continued

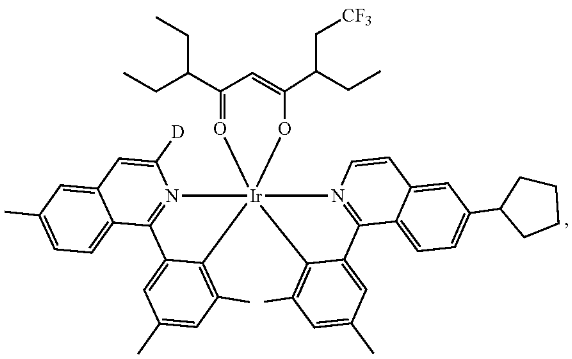

$Ir(L_{a44})(L_{b361})(L_{c61})$

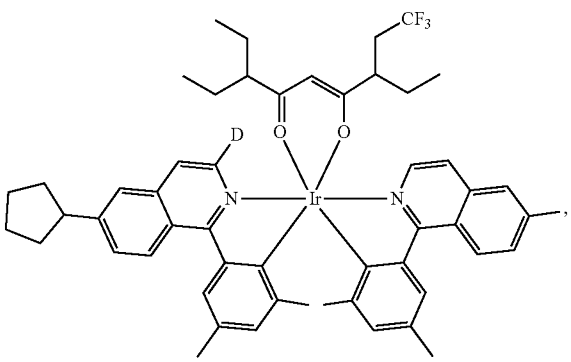

$Ir(L_{a331})(L_{b361})(L_{c31})$

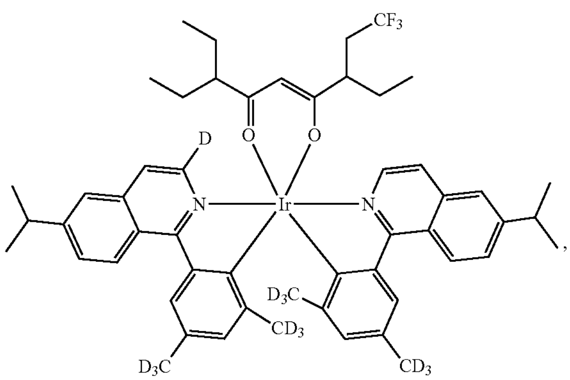

$Ir(L_{a159})(L_{b361})(L_{c48})$

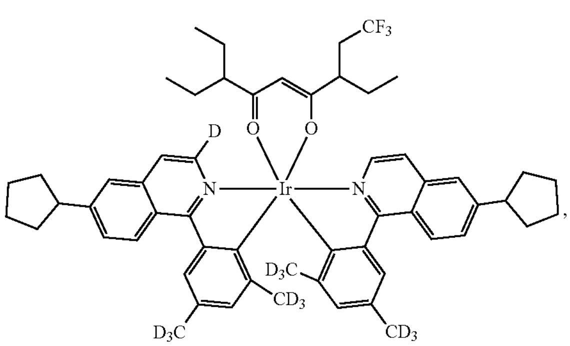

$Ir(L_{a364})(L_{b361})(L_{c68})$

-continued

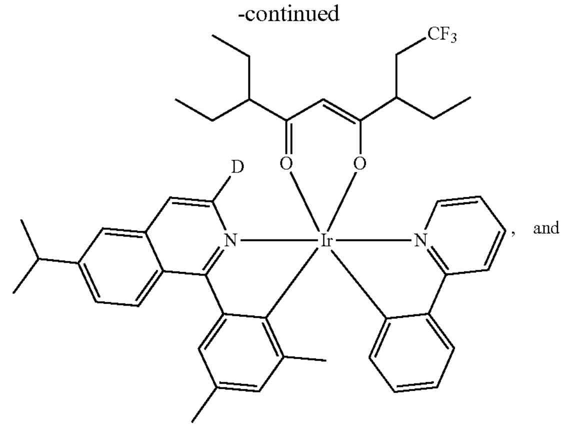

$Ir(L_{a126})(L_{b361})(L_{c1})$

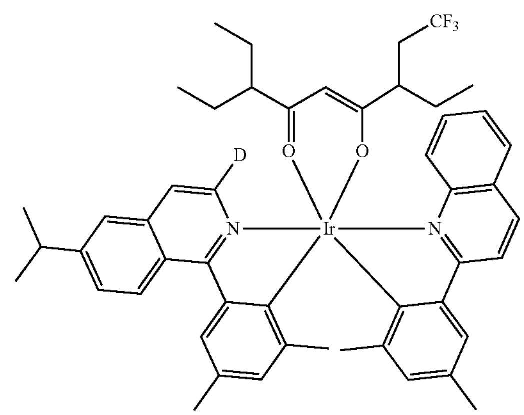

$Ir(L_{a126})(L_{b361})(L_{c19})$

According to an embodiment of the present disclosure, an electroluminescent device is further provided, which includes:

an anode, a cathode, and an organic layer disposed between the anode and the cathode, wherein the organic layer includes a metal complex, the metal complex has a structure of $M(L_a)_m(L_b)_n(L_c)_q$, wherein $L_a$, $L_b$ and $L_c$ are the first ligand, the second ligand and the third ligand coordinated to a metal M respectively; wherein the metal M is a metal whose atomic number is more than 40;

$L_a$, $L_b$ and $L_c$ may be optionally joined to form a multidentate ligand;

wherein, m is 1 or 2, n is 1 or 2, q is 0 or 1, and m+n+q equals to the oxidation state of the metal M.

When m is greater than 1, $L_a$ may be the same or different; and when n is greater than 1, $L_b$ may be the same or different.

Wherein, the first ligand $L_a$ has a structure represented by Formula 1.

(Formula 1)

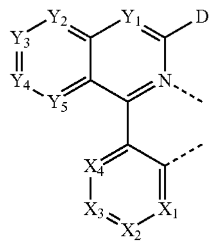

wherein, $X_1$ to $X_4$ are each independently selected from $CR_1$ or N;

wherein, $Y_1$ to $Y_5$ are each independently selected from $CR_2$ or N;

wherein, $R_1$ and $R_2$ are each independently selected from a group consisting of: hydrogen, deuterium, halogen, substituted or unsubstituted alkyl group having 1 to 20 carbon atoms, substituted or unsubstituted cycloalkyl group having 3 to 20 ring carbon atoms, substituted or unsubstituted heteroalkyl group having 1 to 20 carbon atoms, substituted or unsubstituted aralkyl group having 7 to 30 carbon atoms, substituted or unsubstituted alkoxy group having 1 to 20 carbon atoms, substituted or unsubstituted aryloxy group having 6 to 30 carbon atoms, substituted or unsubstituted alkenyl group having 2 to 20 carbon atoms, substituted or unsubstituted aryl group having 6 to 30 carbon atoms, substituted or unsubstituted heteroaryl group having 3 to 30 carbon atoms, substituted or unsubstituted alkylsilyl group having 3 to 20 carbon atoms, substituted or unsubstituted arylsilyl group having 6 to 20 carbon atoms, substituted or unsubstituted amino group having 0 to 20 carbon atoms, an acyl group, a carbonyl group, a carboxylic acid group, an ester group, a cyano group, an isocyano group, a thio group, a sulfinyl group, a sulfonyl group, a phosphino group, and combinations thereof;

In Formula 1, for substituents $R_1$ and $R_2$, adjacent substituents can be optionally joined to form a ring.

wherein, $L_b$ has a structure represented by Formula 2.

(Formula 2)

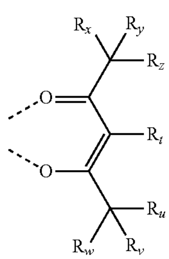

wherein $R_t$ to $R_z$ are each independently selected from a group consisting of: hydrogen, deuterium, halogen, substituted or unsubstituted alkyl group having 1 to 20 carbon atoms, substituted or unsubstituted cycloalkyl group having 3 to 20 ring carbon atoms, substituted or unsubstituted heteroalkyl group having 1 to 20 carbon atoms, substituted or unsubstituted aralkyl group having 7 to 30 carbon atoms, substituted or unsubstituted alkoxy group having 1 to 20 carbon atoms, substituted or unsubstituted aryloxy group having 6 to 30 carbon atoms, substituted or unsubstituted alkenyl group having 2 to 20 carbon atoms, substituted or unsubstituted aryl group having 6 to 30 carbon atoms, substituted or unsubstituted heteroaryl group having 3 to 30 carbon atoms, substituted or unsubstituted alkylsilyl group having 3 to 20 carbon atoms, substituted or unsubstituted arylsilyl group having 6 to 20 carbon atoms, substituted or unsubstituted amino group having 0 to 20 carbon atoms, an acyl group, a carbonyl group, a carboxylic acid group, an ester group, a cyano group, an isocyano group, a thio group, a sulfinyl group, a sulfonyl group, a phosphino group, and combinations thereof;

In Formula 2, for substituents $R_x$, $R_y$, $R_z$, $R_t$, $R_u$, $R_v$ and $R_w$, adjacent substituents can be optionally joined to form a ring;

wherein, $L_c$ is a monoanionic bidentate ligand.

According to an embodiment of the present disclosure, the device emits red light.

According to an embodiment of the present disclosure, the device emits white light.

According to an embodiment of the present disclosure, in the device, the organic layer is a light-emitting layer, and the metal complex is a light-emitting material.

According to an embodiment of the present disclosure, in the device, the organic layer further includes a host material.

According to an embodiment of the present disclosure, the host material includes at least one chemical group selected from a group consisting of: benzene, pyridine, pyrimidine, triazine, carbazole, azacarbazole, indolocarbazole, dibenzothiophene, aza-dibenzothiophene, dibenzofuran, azadibenzofuran, dibenzoselenophene, triphenylene, azatriphenylene, fluorene, silafluorene, naphthalene, quinoline, isoquinoline, quinazoline, quinoxaline, phenanthrene, azaphenanthrene, and combinations thereof.

According to another embodiment of the present disclosure, a compound formulation including the metal complex shown in any one of embodiments described above is further disclosed.

Combination with Other Materials

The materials described in the present disclosure for a particular layer in an organic light emitting device can be used in combination with various other materials present in the device. The combinations of these materials are described in more detail in U.S. Pat. App. No. 20160359122 at paragraphs 0132-0161, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

The materials described herein as useful for a particular layer in an organic light emitting device may be used in combination with a variety of other materials present in the device. For example, dopants disclosed herein may be used in combination with a wide variety of hosts, transport layers, blocking layers, injection layers, electrodes and other layers that may be present. The combination of these materials is described in detail in paragraphs 0080-0101 of U.S. Pat. App. No. 20150349273, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

In the embodiments of material synthesis, all reactions were performed under nitrogen protection unless otherwise stated. All reaction solvents were anhydrous and used as received from commercial sources. Synthetic products were structurally confirmed and tested for properties using one or more conventional equipment in the art (including, but not limited to, nuclear magnetic resonance instrument produced by BRUKER, liquid chromatograph produced by SHIMADZU, liquid chromatograph-mass spectrometry produced by SHIMADZU, gas chromatograph-mass spectrometry produced by SHIMADZU, differential Scanning calorimeters produced by SHIMADZU, fluorescence spectrophotometer produced by SHANGHAI LENGGUANG TECH., electrochemical workstation produced by WUHAN CORRTEST, and sublimation apparatus produced by ANHUI BEQ, etc.) by methods well known to the persons skilled in the art. In the embodiments of the device, the characteristics of the device were also tested using conventional equipment in the art (including, but not limited to, evaporator produced by ANGSTROM ENGINEERING, optical testing system produced by SUZHOU FATAR, life testing system produced by SUZHOU FATAR, and ellipsometer produced by BEIJING ELLITOP, etc.) by methods well known to the persons skilled in the art. As the persons skilled in the art are aware of the above-mentioned equipment use, test methods and other related contents, the inherent data of the sample can be obtained with certainty and without influence, so the above related contents are not further described in this patent.

Material Synthesis Embodiment

The preparation method for the compound in the present disclosure is not limited herein. Typically, the following compounds are, but is not limited to, taken as examples, and the synthesis routes and preparations method of these compounds are as follows.

Synthesis Embodiment 1: Synthesis of Compound $Ir(L_{a126})_2(L_{b101})$

Step 1: Synthesis of Intermediate 1

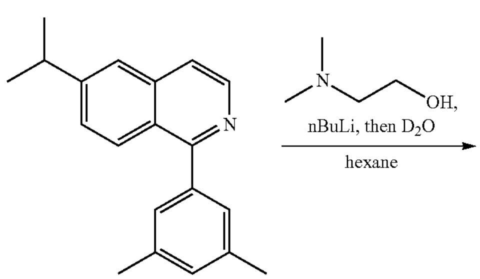

-continued

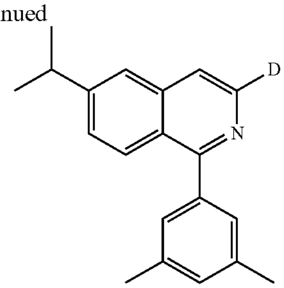

1

N,N-dimethylethanolamine (8.4 g, 94.8 mmol) was added into a 500 mL round bottom flask, and then 105 mL of ultra-dry n-hexane was added into the flask and stirred to dissolve it. The given mixture was then bubbled with nitrogen for 5 minutes, and the reaction was cooled to 0° C. A solution of n-butyllithium in hexane (75.7 mL, 189.6 mmol) was added dropwise into the solution under nitrogen protection. This reaction continued to be held at this temperature for minutes after the dropwise addition. A solution of 1-(3,5-dimethylphenyl)-6-isopropylisoquinoline (8.7 g, 31.6 mmol) in n-hexane (53 mL) was added dropwise, and the reaction continued to be stirred at this temperature for 60 minutes. Heavy water (2.3 g, 113 mmol) was added into the reaction, and the reaction was warmed to room temperature and stirred overnight. A saturated ammonium chloride solution was added into the solution. The solution was separated. The organic phase was collected, and was combined after the aqueous phase was extracted several times with petroleum ether. The organic phase was dried over anhydrous sodium sulphate and then rotary evaporated to dryness to give a crude as a yellow oily liquid. The yellow oily liquid was purified by silica gel column chromatography with ethyl acetate/petroleum ether=1:50 (v:v) as eluent to give a pale yellow oil liquid intermediate 1 (4.2 g, 48% yield).

Step 2: Synthesis of Iridium Dimer

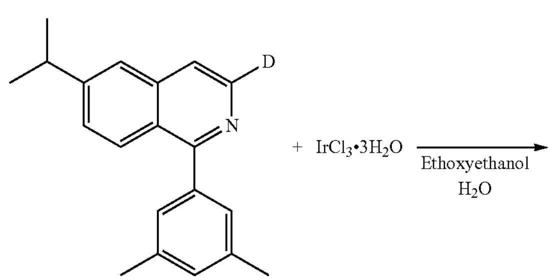

1

-continued

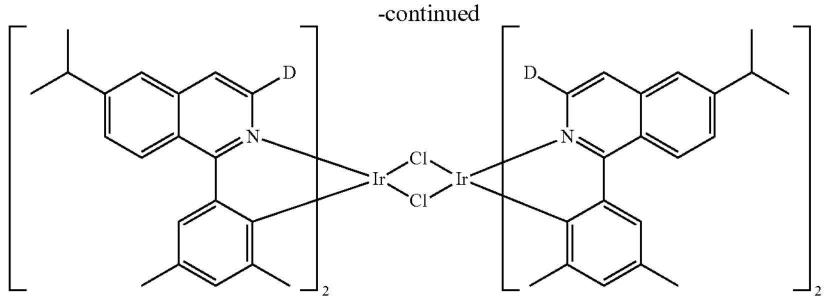

Intermediate 1 (1.92 g, 6.94 mmol), iridium trichloride trihydrate (699 mg, 1.98 mmol), ethoxyethanol (21 mL) and water (7 mL) were added into a 100 mL round bottom flask. The given reaction mixture was bubbled with nitrogen for 3 minutes. The reaction was heated to reflux under nitrogen protection for 24 hours, and the reaction solution changed from yellow-green to dark red. The reaction was cooled to room temperature and filtered. The filtered solid was washed several times with methanol and then dried to give the dimer (1.14 g, 74% yield).

Step 3: Synthesis of Compound $Ir(L_{a126})_2(L_{b101})$

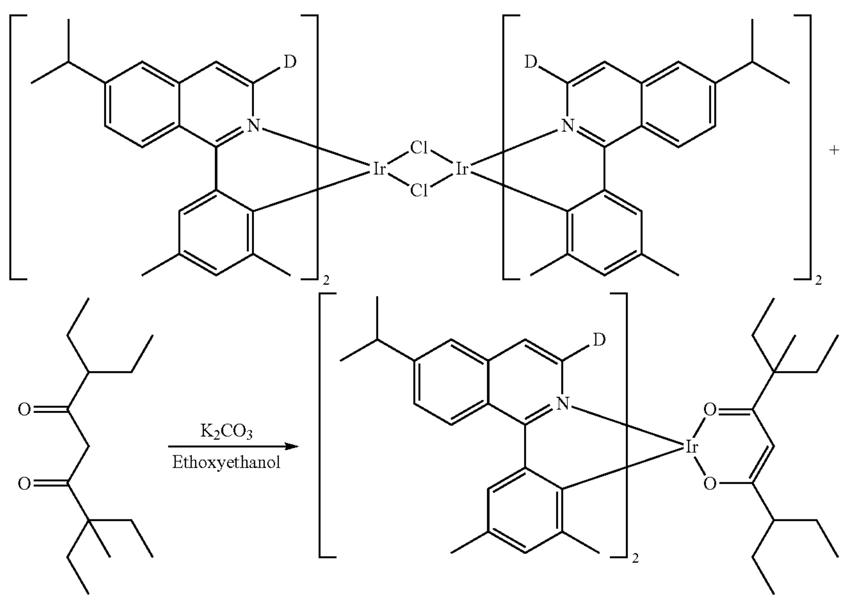

A mixture of the iridium dimer (1.14 g, 0.73 mmol) given in last step, 3,7-diethyl-3-methyl-nonane-4,6-dione (661 mg, 2.92 mmol), potassium carbonate (1 g, 7.3 mmol) and 2-ethoxyethanol (20 mL) was stirred at room temperature under nitrogen protection for 24 hours. After the TLC showed that the reaction was completed, Celite was added into a funnel and the reaction mixture was poured into it. The mixture was filtered, and the filter cake was washed several times with ethanol. The product in the filter cake was washed with dichloromethane into a solution. A certain amount of ethanol was added into the solution, and dichloromethane in the solution was carefully removed on a rotary evaporator. A red solid was precipitated from the solution, the solution was filtered, and the given solid was washed several times with ethanol and suction-dried to give the red solid product $Ir(L_{a126})_2(L_{b101})$ (1.06 g, 75% yield). The given product was confirmed as the target product with molecular weight of 968.

Synthesis Embodiment 2: Synthesis of Compound $Ir(L_{a126})_2(L_{b361})$

Step 1: Synthesis of Iridium Dimer

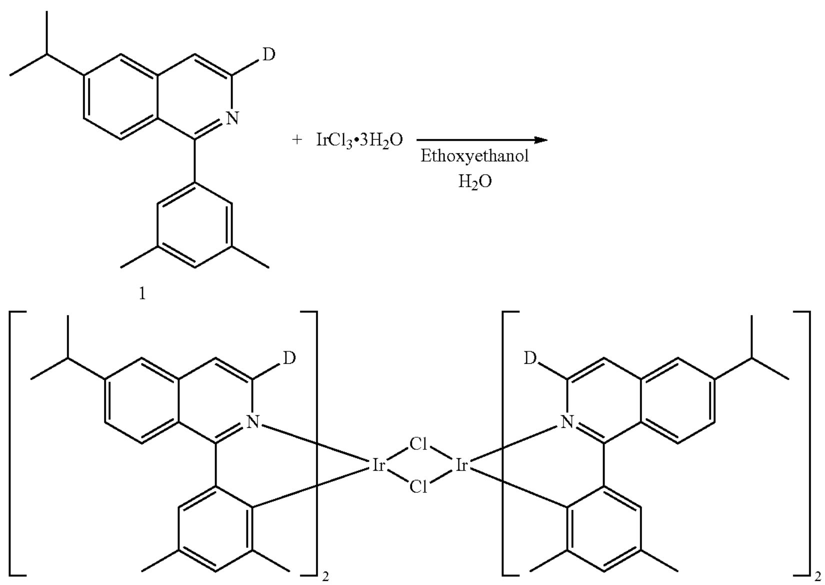

Intermediate 1 (1.5 g, 5.43 mmol), iridium trichloride trihydrate (547 mg, 1.55 mmol), ethoxyethanol (21 mL) and water (7 mL) were added into a 100 mL round bottom flask. The given reaction mixture was bubbled with nitrogen for 3 minutes. The reaction was heated to reflux under nitrogen protection for 24 hours, and the reaction solution changed from yellow green to dark red. The reaction was cooled to room temperature and filtered. The filtered solid was washed several times with methanol and then dried to give iridium dimer (0.97 g, 80% yield).

Step 2: Synthesis of Compound $Ir(L_{a126})_2(L_{b361})$

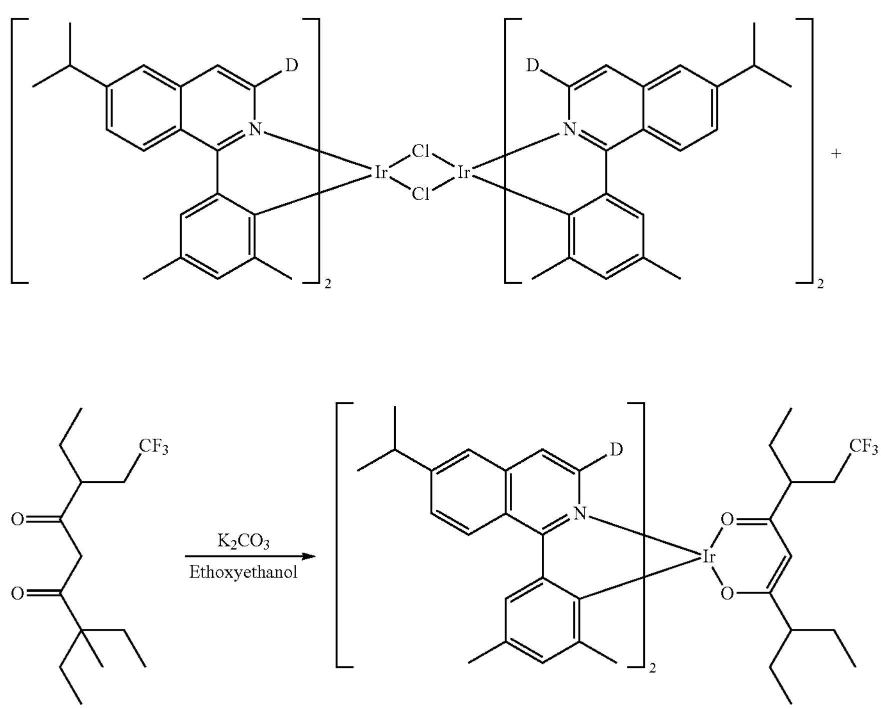

$Ir(L_{a126})_2(L_{b361})$

A mixture of the iridium dimer (0.97 g, 0.62 mmol) given in last step, 3,7-diethyl-1,1,1-trifluoromethylnonane-4,6-dione (497 mg, 1.87 mmol), potassium carbonate (0.857 g, 6.2 mmol) and 2-ethoxyethanol (20 mL) was stirred at room temperature under nitrogen protection for 24 hours. After the TLC showed that the reaction was completed, the reaction mixture was filtered through Celite. The filter cake was washed several times with ethanol. The product in the filter cake was washed with dichloromethane into a solution. A certain amount of ethanol was added into the solution, and dichloromethane in the solution was carefully removed on a rotary evaporator. A red solid was precipitated from the solution, the solution was filtered, and the given solid was washed several times with ethanol and suction-dried to give the red solid product $Ir(L_{a126})_2(L_{b361})$ (0.89 g, 71% yield). The given product was confirmed as the target product with molecular weight of 1008.

Those skilled in the art will appreciate that the above preparation method is merely illustrative, and those skilled in the art can obtain other compound structures of the present disclosure through the improvement of the preparation method.

Device Embodiment 1

First, a glass substrate having a 120 nm thick Indium Tin Oxide (ITO) anode was cleaned, and then treated with oxygen plasma and UV ozone. After the treatment, the substrate was dried in a glove box to remove water. The substrate was mounted on a substrate holder and loaded in a vacuum chamber. Organic layers specified below were sequentially deposited through vacuum thermal evaporation on the ITO anode at a rate of 0.2 to 2 Angstroms(Å) per second at a vacuum degree of about $10^{-8}$ torr. A compound HI was used as a hole injection layer (HIL). A compound HI was used as a hole transporting layer (HTL). A compound EB was used as an electron blocking layer (EBL). The compound $Ir(L_{a126})_2(L_{b101})$ of the present disclosure was doped at 2% in a host compound RH to be used as an emissive layer (EML). A compound HB was used as a hole blocking layer (HBL). On HBL, a mixture of compound ET and 8-hydroxyquinolinolato-Lithium (Liq) was deposited as an electron transporting layer (ETL). Liq with a thickness of 1 nm was used as an electron injection layer, and Al with a thickness of 120 nm was used as a cathode. The device was transferred back to the glove box and encapsulated with glass lid and moisture getter to complete the device.

Preparation methods in Device Embodiments 2 and 3 are the same as that in Device Embodiment 1, except that the doping proportion of compound $Ir(L_{a126})_2(L_{b101})$ in the emissive layer (EML) was 3% and 5%, respectively.

Device Comparative Example 1

The preparation method in Device Comparative Example 1 is the same as that in Device Embodiment 1, except that the comparative compound RD1 was substituted for the compound $Ir(L_{a126})_2(L_{b101})$ of the present disclosure in the emissive layer (EML).

Preparation methods in Device Comparative Examples 2 and 3 are the same as that in Device Comparative Example 1, except that the doping proportion of compound RD1 in the emissive layer (EML) was 3% and 5%, respectively.

Device Embodiment 4

The Preparation method in Device Embodiment 4 is the same as that in Device Embodiment 2, except that the compound $Ir(L_{a126})_2(L_{b361})$ of the present disclosure was substituted for the compound $Ir(L_{a126})_2(L_{b101})$ of the present disclosure in the emissive layer (EML).

Device Comparative Example 4

The preparation method in Device Comparative Example 4 is the same as that in Device Embodiment 4, except that the comparative compound RD2 was substituted for the compound $Ir(L_{a126})_2(L_{b361})$ of the present disclosure in the emissive layer (EML).

The detail structures and thicknesses of device layers are shown as the following table. A layer using more than one material is obtained by doping different compounds in their described weight proportions.

TABLE 1

Part of device structures in device embodiments

| Device No. | HIL | HTL | EBL | EML | HBL | ETL |
|---|---|---|---|---|---|---|
| Embodiment 1 | Compound HI (100 Å) | Compound HT (400 Å) | Compound EB (50 Å) | Compound RH:Compound $Ir(L_{a126})_2(L_{b101})$ (98:2) (400 Å) | Compound HB (50 Å) | Compound ET:Liq (40:60) (350 Å) |
| Embodiment 2 | Compound HI (100 Å) | Compound HT (400 Å) | Compound EB (50 Å) | Compound RH:Compound $Ir(L_{a126})_2(L_{b101})$ (97:3) (400 Å) | Compound HB (50 Å) | Compound ET:Liq (40:60) (350 Å) |
| Embodiment 3 | Compound HI (100 Å) | Compound HT (400 Å) | Compound EB (50 Å) | Compound RH:Compound $Ir(L_{a126})_2(L_{b101})$ (95:5) (400 Å) | Compound HB (50 Å) | Compound ET:Liq (40:60) (350 Å) |
| Comparative Example 1 | Compound HI (100 Å) | Compound HT (400 Å) | Compound EB (50 Å) | Compound RH:Compound RD1 (98:2) (400 Å) | Compound HB (50 Å) | Compound ET:Liq (40:60) (350 Å) |
| Comparative Example 2 | Compound HI (100 Å) | Compound HT (400 Å) | Compound EB (50 Å) | Compound RH:Compound RD1 (97:3) (400 Å) | Compound HB (50 Å) | Compound ET:Liq (40:60) (350 Å) |

TABLE 1-continued

| Part of device structures in device embodiments | | | | | | |
|---|---|---|---|---|---|---|
| Device No. | HIL | HTL | EBL | EML | HBL | ETL |
| Comparative Example 3 | Compound HI (100 Å) | Compound HT (400 Å) | Compound EB (50 Å) | Compound RH:Compound RD1 (95:5) (400 Å) | Compound HB (50 Å) | Compound ET:Liq (40:60) (350 Å) |
| Embodiment 4 | Compound HI (100 Å) | Compound HT (400 Å) | Compound EB (50 Å) | Compound RH:Compound $Ir(L_{a126})_2(L_{b361})$ (97:3) (400 Å) | Compound HB (50 Å) | Compound ET:Liq (40:60) (350 Å) |
| Comparative Example 4 | Compound HI (100 Å) | Compound HT (400 Å) | Compound EB (50 Å) | Compound RH:Compound RD2 (97:3) (400 Å) | Compound HB (50 Å) | Compound ET:Liq (40:60) (350 Å) |

The structure of the material used in the device is shown as follows.

Compound HI

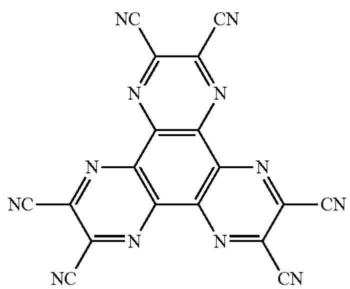

Compound HT

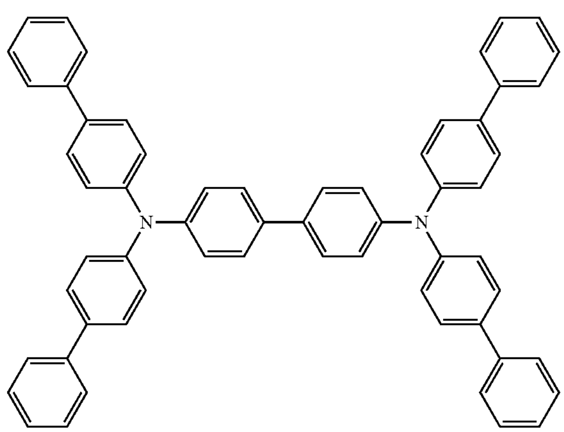

Compound EB

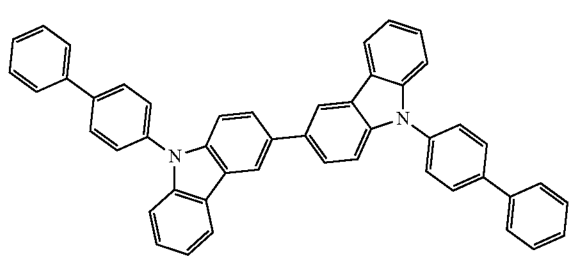

-continued

Compound HB

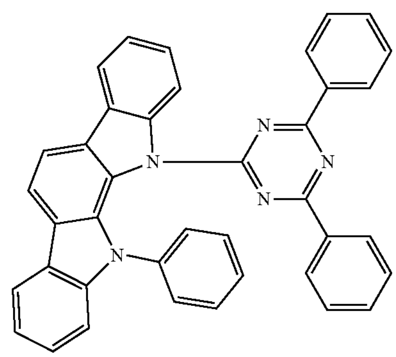

Compound RH

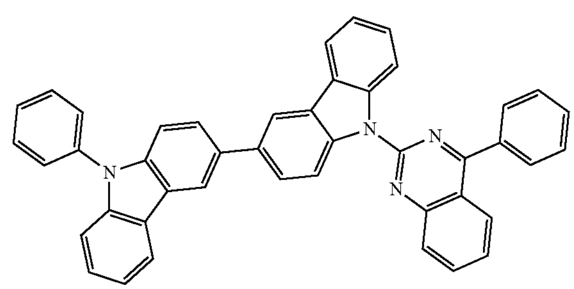

Compound ET

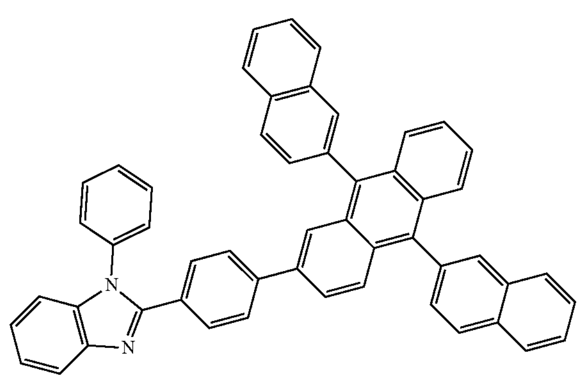

-continued

Compound $Ir(L_{a126})_2(L_{b101})$

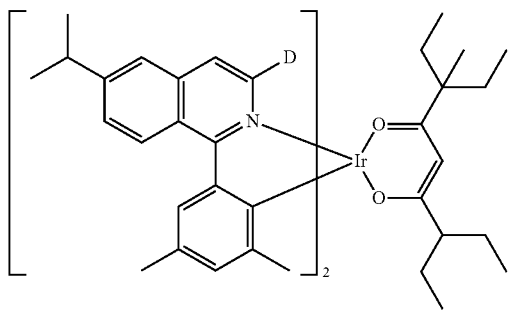

Compound RD1

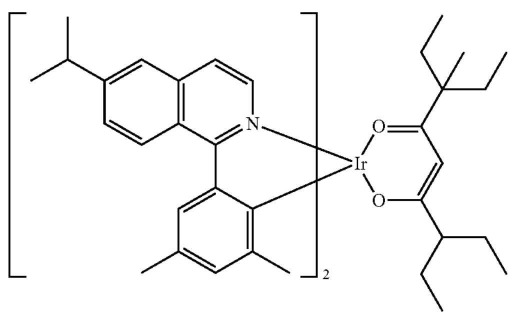

Compound $Ir(L_{a126})_2(L_{b361})$

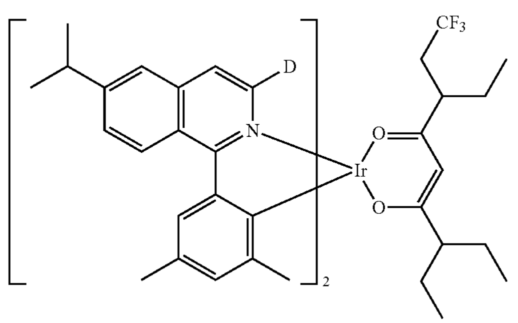

Compound RD2

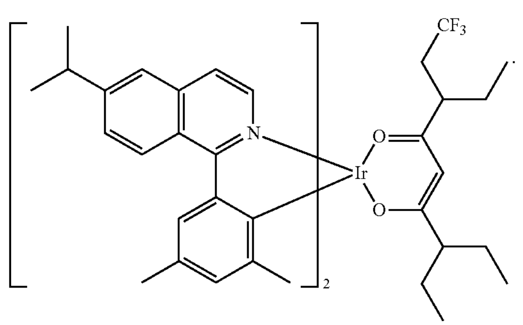

Table 2 shows data of chromaticity coordinates (CIE), emission wavelengths ($\lambda_{max}$), full width at half maximum (FWHM), voltage (V) and power efficiency (PE) tested at 1000 nits in Device Embodiments 1 to 3 and Comparative Examples 1 to 3. The lifetime LT97 of device was measured at a constant current density of 15 mA/cm$^2$.

TABLE 2

| Device data | | | | | | |
|---|---|---|---|---|---|---|
| Device No. | CIE (x, y) | λmax (nm) | FWHM (nm) | Voltage (V) | PE (lm/W) | LT97 (h) |
| Embodiment 1 | 0.682, 0.317 | 624 | 48.5 | 3.95 | 17.82 | 2330 |
| Embodiment 2 | 0.684, 0.315 | 626 | 49.5 | 4.00 | 16.70 | 2331 |
| Embodiment 3 | 0.687, 0.313 | 626 | 51.0 | 4.00 | 15.35 | 2265 |
| Comparative Example 1 | 0.682, 0.317 | 625 | 48.3 | 4.15 | 17.51 | 1902 |
| Comparative Example 2 | 0.684, 0.315 | 626 | 49.5 | 4.23 | 16.27 | 1864 |
| Comparative Example 3 | 0.687, 0.313 | 627 | 50.7 | 4.19 | 15.26 | 1789 |

Discussion

From the data shown in Table 2, in comparison of each set of devices (Embodiment 1 and Comparative Example 1, Embodiment 2 and Comparative Example 2, and Embodiment 3 and Comparative Example 3), the chromaticity coordinates, emission wavelengths and the full widths at half maximum are approximate, and the voltage of each embodiment is about 0.2 V lower than that of the corresponding comparative example, respectively, and the power efficiency is slightly higher. Most importantly, however, the lifetime of Embodiment 1 is 23% higher than that of Comparative Example 1, the lifetime of Embodiment 2 is 25% higher than that of Comparative Example 2, and the lifetime of Embodiment 3 is 27% higher than that of Comparative Example 3. That indicates that there is a great lifetime increase at different doping proportions of light-emitting materials, which is unexpected. That also proves the uniqueness and importance of the deuterium-substitution at the 3 position of the isoquinoline ligand in the metal complex of such structures.

Table 3 shows data of chromaticity coordinates (CIE), emission wavelengths ($\lambda_{max}$), full width at half maximum (FWHM), voltage (V) and power efficiency (PE) tested at 1000 nits in Device Embodiment 4 and Comparative Example 4. The lifetime LT97 of device was measured at a constant current density of 15 mA/cm$^2$.

TABLE 3

| Device data | | | | | | |
|---|---|---|---|---|---|---|
| Device No. | CIE (x, y) | λmax (nm) | FWHM (nm) | Voltage (V) | PE (lm/W) | LT97 (h) |
| Embodiment 4 | 0.677, 0.322 | 620 | 50.6 | 4.45 | 15.45 | 2125 |
| Comparative Example 4 | 0.678, 0.322 | 620 | 50.4 | 4.47 | 15.19 | 1799 |

Discussion

From the data shown in Table 3, it can be seen from the comparison of Embodiment 4 and Comparative Example 4, the chromaticity coordinates, emission wavelengths, the full widths at half maximum, the voltages and the power efficiency are approximate. Most importantly, however, the lifetime of Embodiment 4 is 18% higher than that of Comparative Example 4. That indicates that there is a great lifetime increase in different light-emitting material structures, which is unexpected. That also proves the uniqueness and importance of the deuterium-substitution at the 3 position of the isoquinoline ligand in the metal complex of such structures.

It should be understood that various embodiments described here are merely examples and are not intended to limit the scope of the present disclosure. Therefore, it is apparent to those skilled in the art that the present disclosure as claimed may include variations from specific embodiments and preferred embodiments described herein. Many of materials and structures described herein may be replaced with other materials and structures without departing from the principles of the present disclosure. It should be understood that various theories as to why the present disclosure works are not intended to be limiting.

What is claimed is:

1. A metal complex, having a structure of $M(L_a)_m(L_b)_n(L_c)_q$, wherein $L_a$, $L_b$ and $L_c$ are a first ligand, a second ligand and a third ligand coordinated to a metal M respectively; wherein the metal M is a metal whose atomic number is more than 40;

wherein $L_a$, $L_b$ and $L_c$ are optionally joined to form a multi-dentate ligand;

wherein m is 1 or 2, n is 1 or 2, q is 0 or 1, and m+n+q equals to the oxidation state of the metal M;

when m is greater than 1, $L_a$ may be the same or different; and when n is greater than 1, $L_b$ may be the same or different;

wherein the first ligand $L_a$ has a structure represented by Formula 1:

(Formula 1)

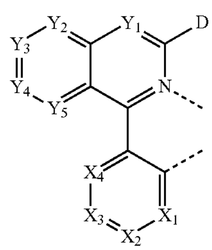

wherein $X_1$ to $X_4$ are each independently selected from $CR_1$ or N;

wherein $Y_1$ to $Y_5$ are each independently selected from $CR_2$ or N;

wherein $R_1$ and $R_2$ are each independently selected from a group consisting of: hydrogen, deuterium, halogen, substituted or unsubstituted alkyl group having 1 to 20 carbon atoms, substituted or unsubstituted cycloalkyl group having 3 to 20 ring carbon atoms, substituted or unsubstituted heteroalkyl group having 1 to 20 carbon atoms, substituted or unsubstituted aralkyl group having 7 to 30 carbon atoms, substituted or unsubstituted alkoxy group having 1 to 20 carbon atoms, substituted or unsubstituted aryloxy group having 6 to 30 carbon atoms, substituted or unsubstituted alkenyl group having 2 to 20 carbon atoms, substituted or unsubstituted aryl group having 6 to 30 carbon atoms, substituted or unsubstituted heteroaryl group having 3 to 30 carbon atoms, substituted or unsubstituted alkylsilyl group having 3 to 20 carbon atoms, substituted or unsubstituted arylsilyl group having 6 to 20 carbon atoms, substituted or unsubstituted amino group having 0 to 20 carbon atoms, an acyl group, a carbonyl group, a carboxylic acid group, an ester group, a cyano group, an isocyano group, a thio group, a sulfinyl group, a sulfonyl group, a phosphino group, and combinations thereof;

in Formula 1, for substituents $R_1$ and $R_2$, adjacent substituents can be optionally joined to form a ring;

wherein $L_b$ has a structure represented by Formula 2:

(Formula 2)

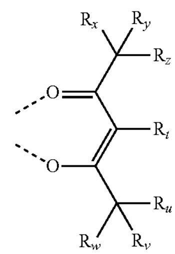

wherein $R_t$ to $R_z$ are each independently selected from a group consisting of: hydrogen, deuterium, halogen, substituted or unsubstituted alkyl group having 1 to 20 carbon atoms, substituted or unsubstituted cycloalkyl group having 3 to 20 ring carbon atoms, substituted or unsubstituted heteroalkyl group having 1 to 20 carbon atoms, substituted or unsubstituted aralkyl group having 7 to 30 carbon atoms, substituted or unsubstituted alkoxy group having 1 to 20 carbon atoms, substituted or unsubstituted aryloxy group having 6 to 30 carbon atoms, substituted or unsubstituted alkenyl group having 2 to 20 carbon atoms, substituted or unsubstituted aryl group having 6 to 30 carbon atoms, substituted or unsubstituted heteroaryl group having 3 to 30 carbon atoms, substituted or unsubstituted alkylsilyl group having 3 to 20 carbon atoms, substituted or unsubstituted arylsilyl group having 6 to 20 carbon atoms, substituted or unsubstituted amino group having 0 to 20 carbon atoms, an acyl group, a carbonyl group, a carboxylic acid group, an ester group, a cyano group, an isocyano group, a thio group, a sulfinyl group, a sulfonyl group, a phosphino group, and combinations thereof;

in Formula 2, for substituents $R_x$, $R_y$, $R_z$, $R_t$, $R_u$, $R_v$ and $R_w$, adjacent substituents can be optionally joined to form a ring;

wherein $L_c$ is a monoanionic bidentate ligand.

2. The metal complex of claim 1, wherein the metal M is selected from a group consisting of Cu, Ag, Au, Ru, Rh, Pd, Os, Ir and Pt; preferably, wherein the metal M is selected from Pt or Ir.

3. The metal complex of claim 1, wherein at least one of $X_1$ to $X_4$ is selected from $CR_1$; preferably, wherein $X_1$ to $X_4$ are each independently selected from $CR_1$.

4. The metal complex of claim 1, wherein $Y_1$ to $Y_5$ are each independently selected from $CR_2$, and $R_2$ is each independently selected from a group consisting of: hydrogen, halogen, substituted or unsubstituted alkyl group having 1 to 20 carbon atoms, substituted or unsubstituted cycloalkyl group having 3 to 20 ring carbon atoms, substituted or unsubstituted heteroalkyl group having 1 to 20 carbon atoms, substituted or unsubstituted aralkyl group having 7 to 30 carbon atoms, substituted or unsubstituted alkoxy group having 1 to 20 carbon atoms, substituted or unsubstituted aryloxy group having 6 to 30 carbon atoms, substituted or unsubstituted alkenyl group having 2 to 20 carbon atoms, substituted or unsubstituted aryl group having 6 to 30 carbon atoms, substituted or unsubstituted heteroaryl group having 3 to 30 carbon atoms, substituted or unsubstituted alkylsilyl group having 3 to 20 carbon atoms, substituted or unsubstituted arylsilyl group having 6 to 20 carbon atoms, substituted or unsubstituted amino group having 0 to 20 carbon atoms, an acyl group, a carbonyl group, a carboxylic acid group, an ester group, a cyano group, an isocyano group, a thio group, a sulfinyl group, a sulfonyl group, a phosphino group, and combinations thereof.

5. The metal complex claim 1, wherein $X_1$ is each independently $CR_1$ and/or $X_3$ is each independently $CR_1$, and $R_1$ is each independently selected from a group consisting of: deuterium, halogen, substituted or unsubstituted alkyl group having 1 to 20 carbon atoms, substituted or unsubstituted cycloalkyl group having 3 to 20 ring carbon atoms, substituted or unsubstituted heteroalkyl group having 1 to 20 carbon atoms, substituted or unsubstituted aralkyl group having 7 to 30 carbon atoms, substituted or unsubstituted alkoxy group having 1 to 20 carbon atoms, substituted or unsubstituted aryloxy group having 6 to 30 carbon atoms, substituted or unsubstituted alkenyl group having 2 to 20 carbon atoms, substituted or unsubstituted aryl group having 6 to 30 carbon atoms, substituted or unsubstituted heteroaryl group having 3 to 30 carbon atoms, substituted or unsubstituted alkylsilyl group having 3 to 20 carbon atoms, substituted or unsubstituted arylsilyl group having 6 to 20 carbon atoms, substituted or unsubstituted amino group having 0 to 20 carbon atoms, an acyl group, a carbonyl group, a carboxylic acid group, an ester group, a cyano group, an isocyano group, a thio group, a sulfinyl group, a sulfonyl group, a phosphino group, and combinations thereof;

preferably, wherein $X_1$ and $X_3$ are each independently selected from $CR_1$, and $R_1$ is each independently selected from a group consisting of: hydrogen, deuterium, halogen, substituted or unsubstituted alkyl group having 1 to 20 carbon atoms, substituted or unsubstituted cycloalkyl group having 3 to 20 ring carbon atoms, substituted or unsubstituted aryl group having 6 to 30 carbon atoms, substituted or unsubstituted heteroaryl group having 3 to 30 carbon atoms, and substituted or unsubstituted alkylsilyl group having 3 to 20 carbon atoms;

more preferably, wherein $X_1$ and $X_3$ are each independently selected from $CR_1$, and $R_1$ is each independently selected from substituted or unsubstituted alkyl group having 1 to 20 carbon atoms, and $X_2$ and $X_4$ are CH.

6. The metal complex of claim 1, wherein $X_1$ and $X_4$ each are CH, and $X_2$ and $X_3$ are each independently selected from $CR_1$.

7. The metal complex of claim 1, wherein $Y_3$ is $CR_2$, and $R_2$ is independently selected from a group consisting of: halogen, substituted or unsubstituted alkyl group having 1 to 20 carbon atoms, substituted or unsubstituted cycloalkyl group having 3 to 20 ring carbon atoms, substituted or unsubstituted heteroalkyl group having 1 to 20 carbon atoms, substituted or unsubstituted aralkyl group having 7 to 30 carbon atoms, substituted or unsubstituted alkoxy group having 1 to 20 carbon atoms, substituted or unsubstituted aryloxy group having 6 to 30 carbon atoms, substituted or unsubstituted alkenyl group having 2 to 20 carbon atoms, substituted or unsubstituted aryl group having 6 to 30 carbon atoms, substituted or unsubstituted heteroaryl group having 3 to 30 carbon atoms, substituted or unsubstituted alkylsilyl group having 3 to 20 carbon atoms, substituted or unsubstituted arylsilyl group having 6 to 20 carbon atoms, substituted or unsubstituted amino group having 0 to 20 carbon atoms, an acyl group, a carbonyl group, a carboxylic acid group, an ester group, a cyano group, an isocyano group, a thio group, a sulfinyl group, a sulfonyl group, a phosphino group, and combinations thereof;

preferably, $Y_3$ is $CR_2$, and $R_2$ is independently selected from a group consisting of: halogen, substituted or unsubstituted alkyl group having 1 to 20 carbon atoms, substituted or unsubstituted cycloalkyl group having 3 to 20 ring carbon atoms, substituted or unsubstituted aryl group having 6 to 30 carbon atoms, substituted or unsubstituted heteroaryl group having 3 to 30 carbon atoms, and substituted or unsubstituted alkylsilyl group having 3 to 20 carbon atoms; and preferably, $R_2$ is substituted or unsubstituted alkyl group having 1 to 20 carbon atoms;

more preferably, $Y_3$ is $CR_2$, $R_2$ is independently selected from substituted or unsubstituted alkyl group having 1 to 20 carbon atoms, or substituted or unsubstituted alkylsilyl group having 3 to 20 carbon atoms, and $Y_1$, $Y_2$, $Y_4$ and $Y_5$ are CH.

8. The metal complex of claim 1, wherein $R_2$ is independently selected from a group consisting of hydrogen, methyl group, isopropyl group, 2-butyl group, isobutyl group, t-butyl group, pentan-3-yl group, cyclopentyl group, cyclohexyl group, 4,4-dimethylcyclohexyl group, neopentyl group, 2,4-dimethylpent-3-yl group, 1,1-dimethylsilacyclohex-4-yl group, cyclopentylmethyl group, cyano group, trifluoromethyl group, fluorine, trimethylsilyl group, phenyldimethylsilyl group, bicyclo[2,2,1]pentyl group, adamantyl group, phenyl group, and 3-pyridyl group.

9. The metal complex of claim 1, wherein the first ligand $L_a$ is each independently selected from any one or two of a group consisting of $L_{a1}$ to $L_{a1036}$:

$L_{a1}$

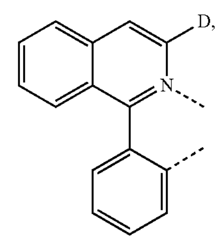

$L_{a2}$

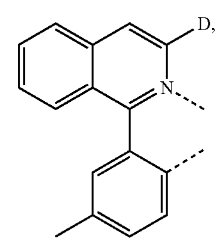

$L_{a3}$

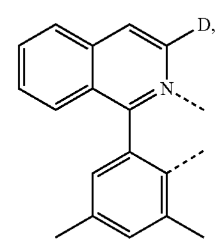

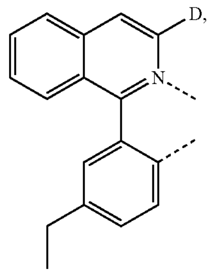
$L_{a4}$
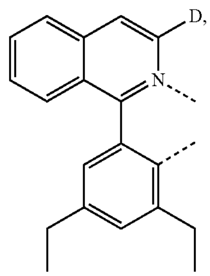
$L_{a5}$
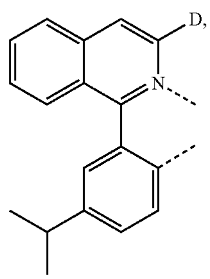
$L_{a6}$
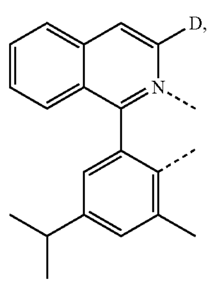
$L_{a7}$
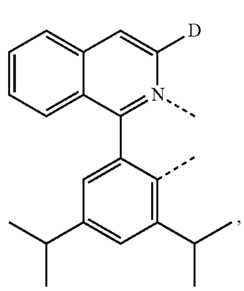
$L_{a8}$
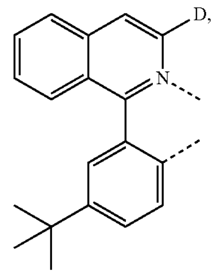
$L_{a9}$
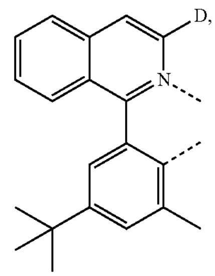
$L_{a10}$
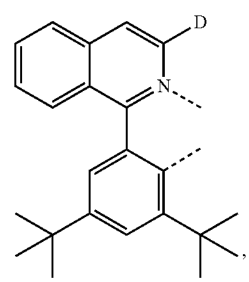
$L_{a11}$
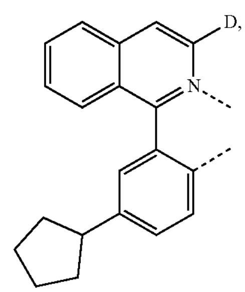
$L_{a12}$
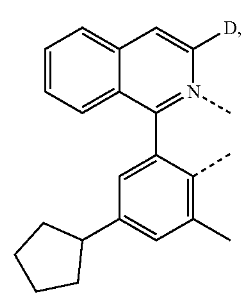
$L_{a13}$ -continued
$L_{a14}$
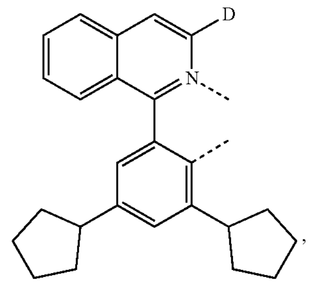
$L_{a15}$
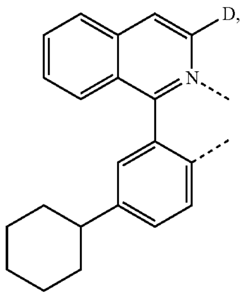
$L_{a16}$
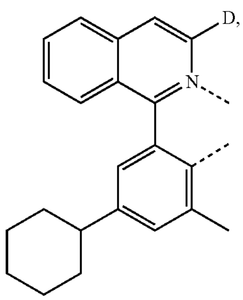
$L_{a17}$
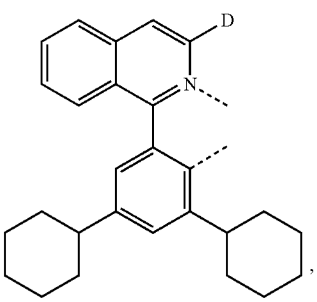
$L_{a18}$
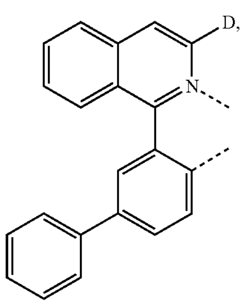
-continued
$L_{a19}$
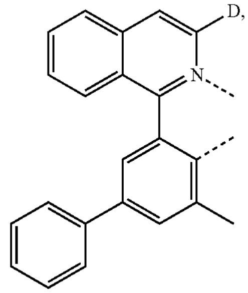
$L_{a20}$
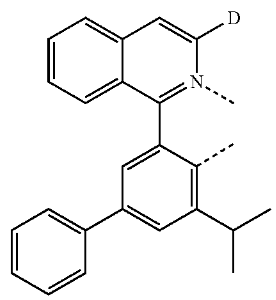
$L_{a21}$
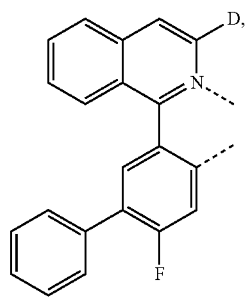
$L_{a22}$
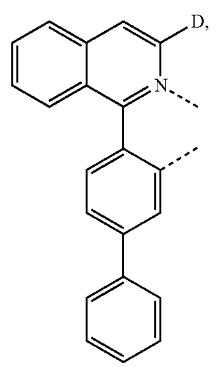
$L_{a23}$
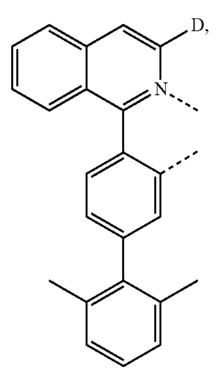

-continued
$L_{a24}$
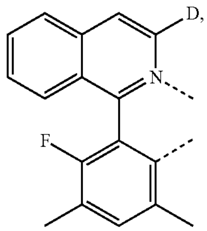
$L_{a25}$
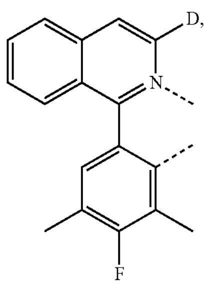
$L_{a26}$
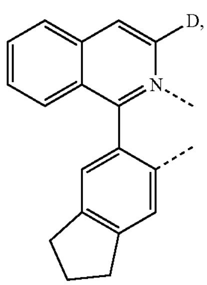
$L_{a27}$
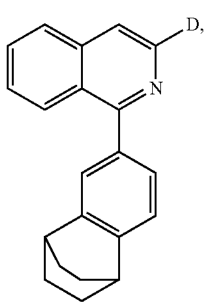
$L_{a28}$
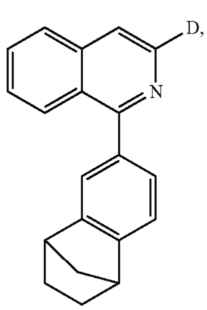
-continued
$L_{a29}$
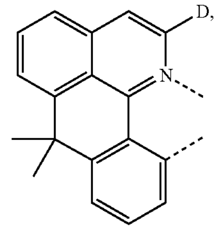
$L_{a30}$
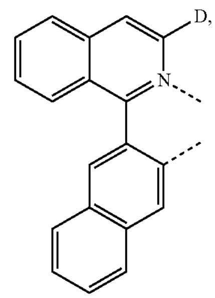
$L_{a31}$
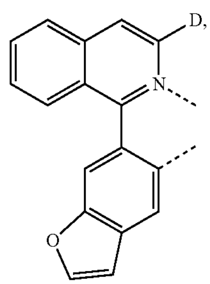
$L_{a32}$
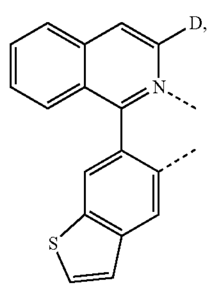
$L_{a33}$
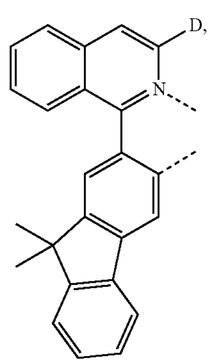

-continued
$L_{a34}$
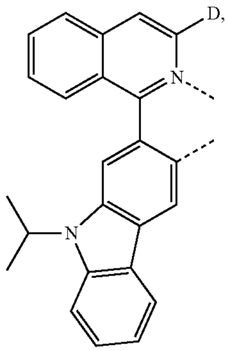
$L_{a35}$
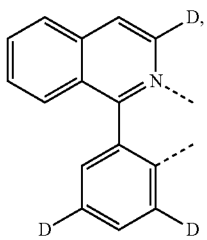
$L_{a36}$
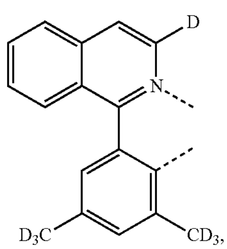
$L_{a37}$
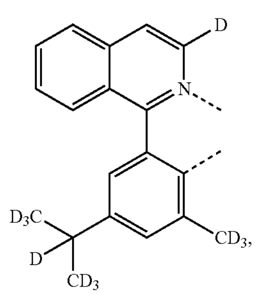
$L_{a38}$
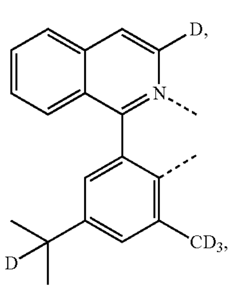
-continued
$L_{a39}$
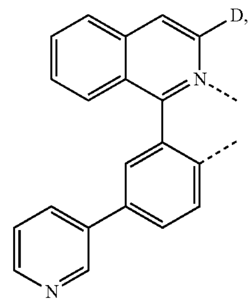
$L_{a40}$
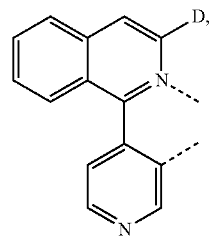
$L_{a41}$
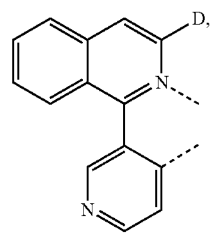
$L_{a42}$
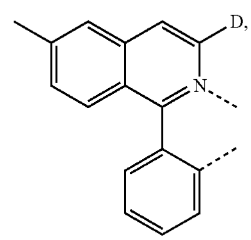
$L_{a43}$
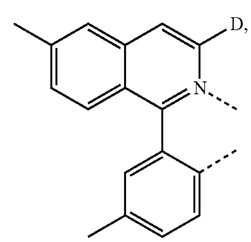
$L_{a44}$
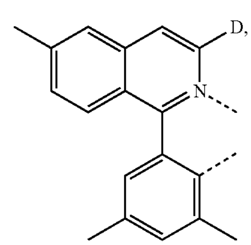

-continued
$L_{a45}$
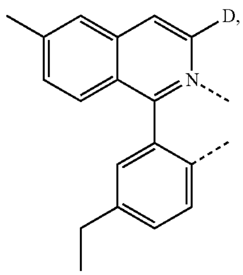
$L_{a46}$
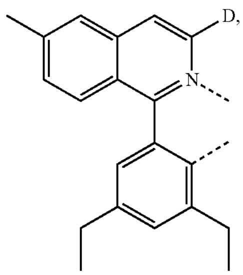
$L_{a47}$
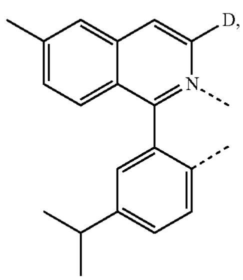
$L_{a48}$
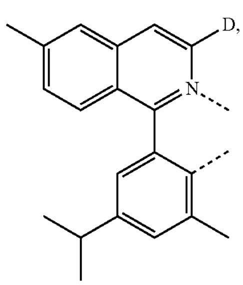
$L_{a49}$
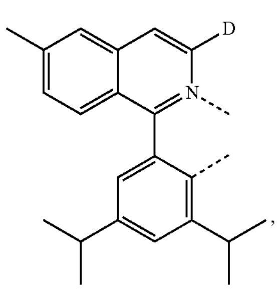
-continued
$L_{a50}$
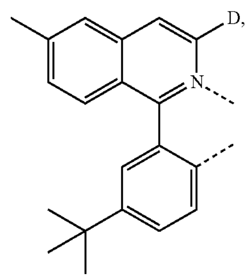
$L_{a51}$
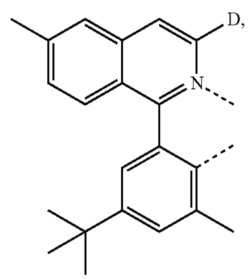
$L_{a52}$
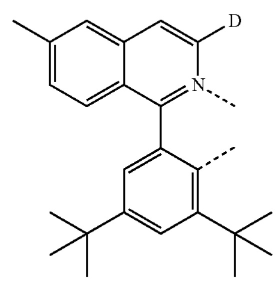
$L_{a53}$
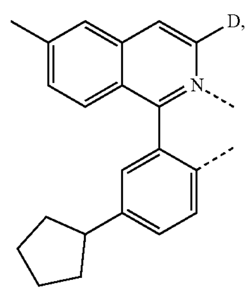
$L_{a54}$
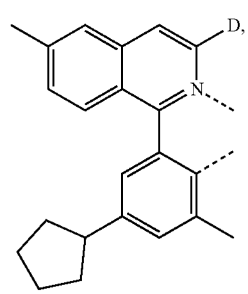

-continued
$L_{a55}$
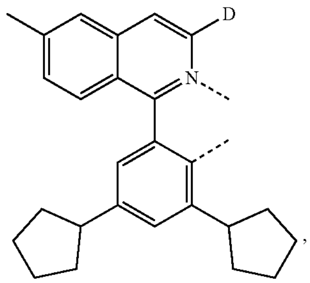
$L_{a56}$
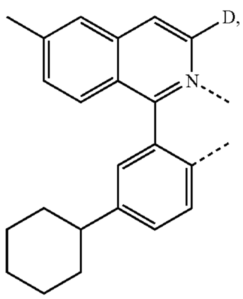
$L_{a57}$
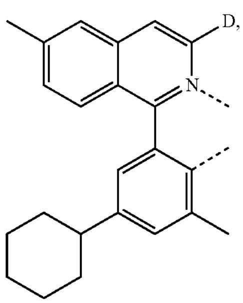
$L_{a58}$
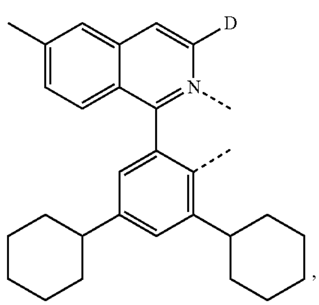
$L_{a59}$
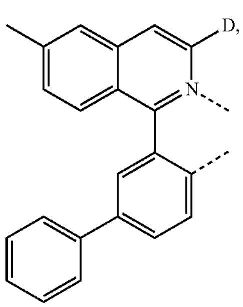
-continued
$L_{a60}$
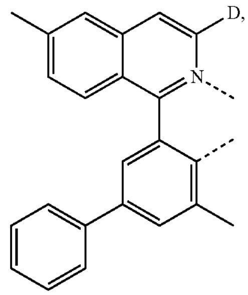
$L_{a61}$
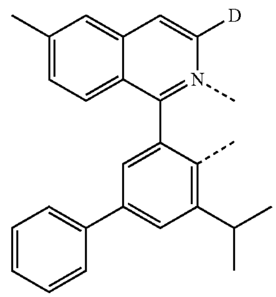
$L_{a62}$
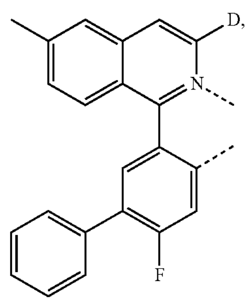
$L_{a63}$
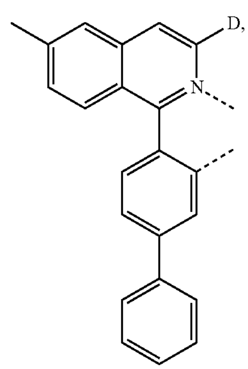
$L_{a64}$
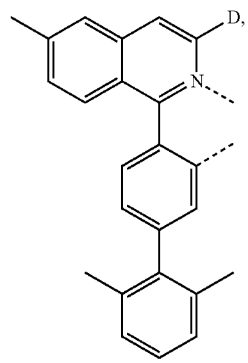

-continued
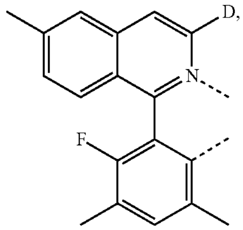
$L_{a65}$
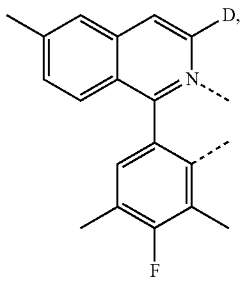
$L_{a66}$
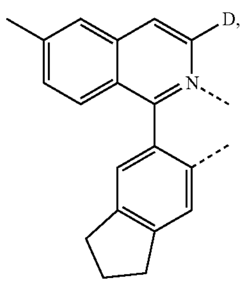
$L_{a67}$
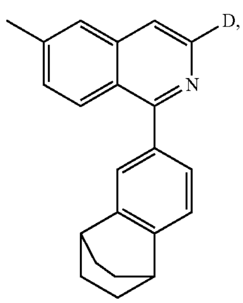
$L_{a68}$
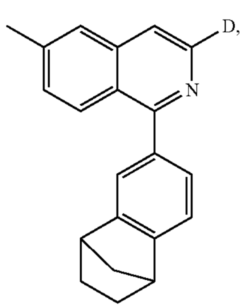
$L_{a69}$
-continued
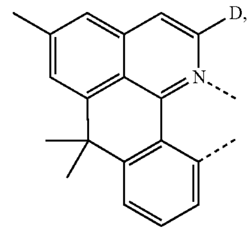
$L_{a70}$
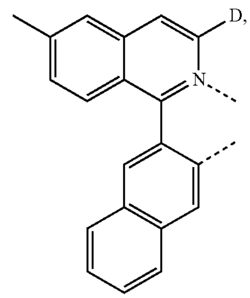
$L_{a71}$
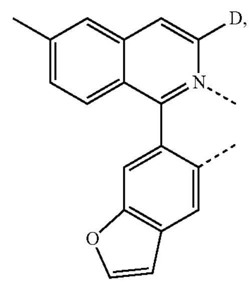
$L_{a72}$
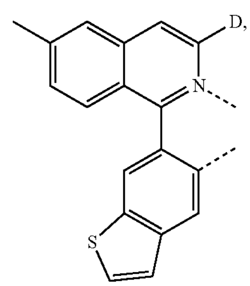
$L_{a73}$
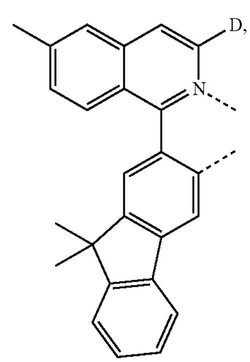
$L_{a74}$ -continued
$L_{a75}$
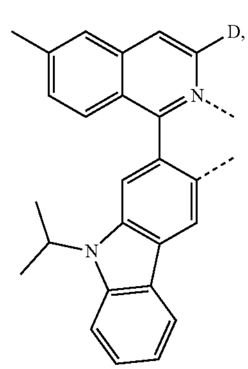
$L_{a76}$
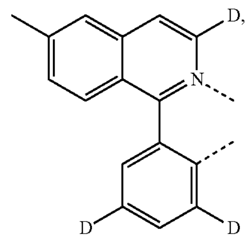
$L_{a77}$
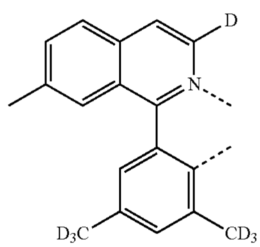
$L_{a78}$
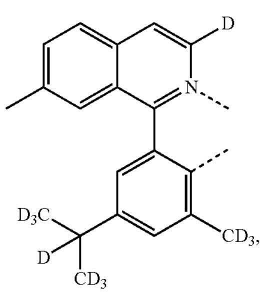
$L_{a79}$
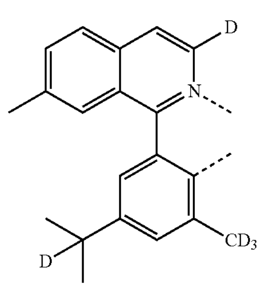
-continued
$L_{a80}$
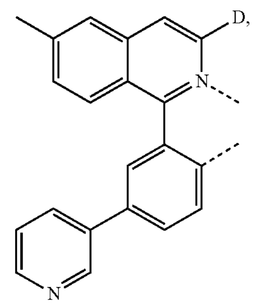
$L_{a81}$
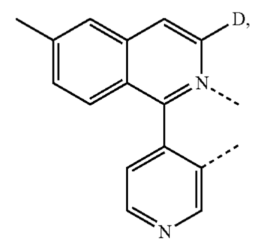
$L_{a82}$
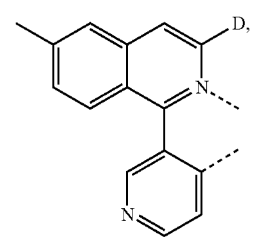
$L_{a83}$
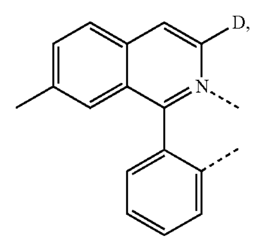
$L_{a84}$
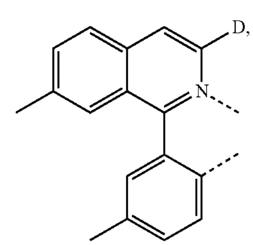
$L_{a85}$
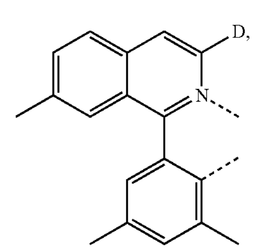

-continued
$L_{a86}$
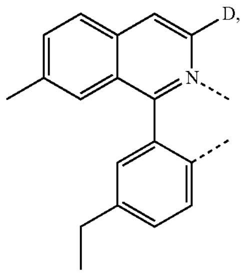
$L_{a87}$
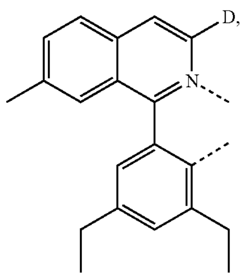
$L_{a88}$
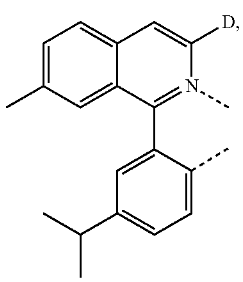
$L_{a89}$
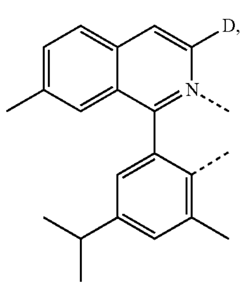
$L_{a90}$
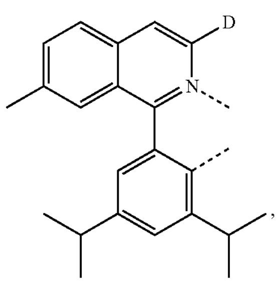
-continued
$L_{a91}$
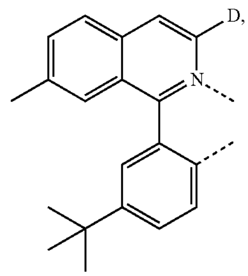
$L_{a92}$
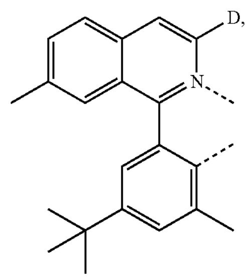
$L_{a93}$
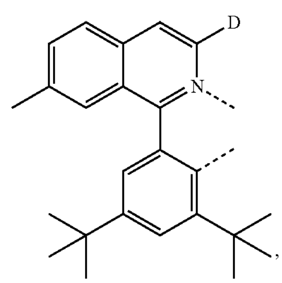
$L_{a94}$
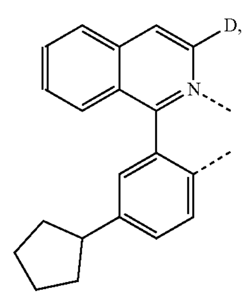
$L_{a95}$
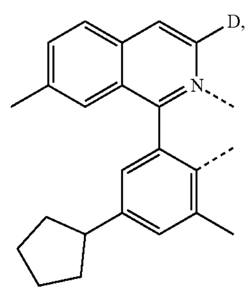

-continued
$L_{a96}$
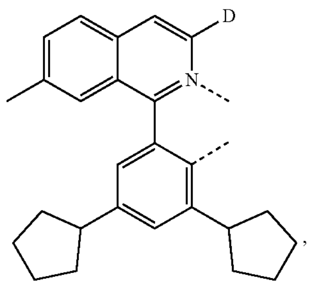
$L_{a97}$
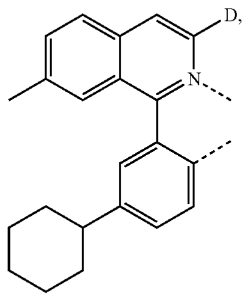
$L_{a98}$
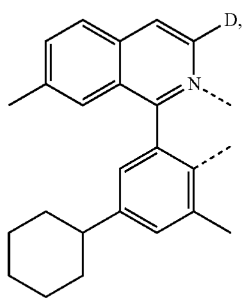
$L_{a99}$
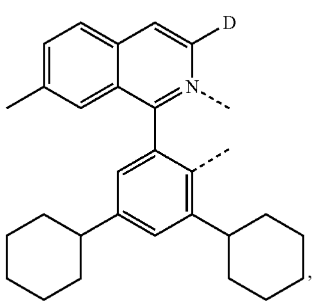
$L_{a100}$
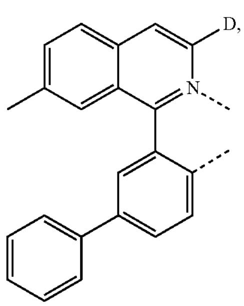
-continued
$L_{a101}$
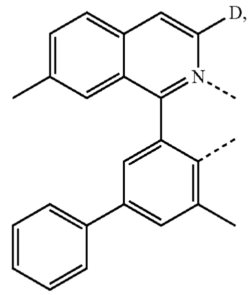
$L_{a102}$
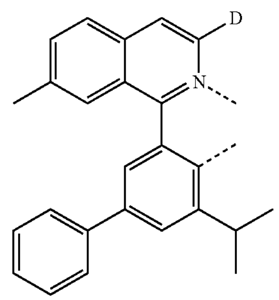
$L_{a103}$
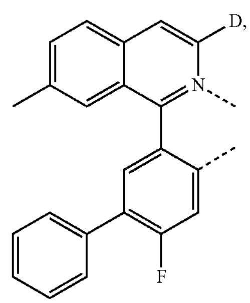
$L_{a104}$
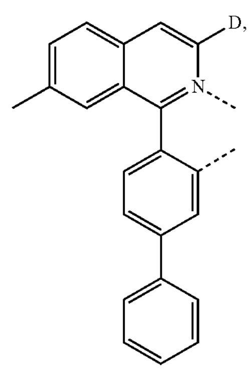
$L_{a105}$
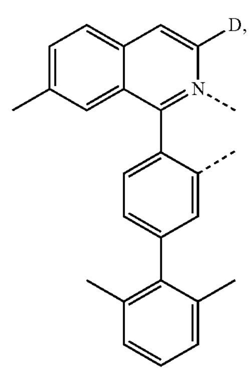

-continued
$L_{a106}$
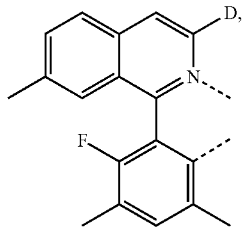
$L_{a107}$
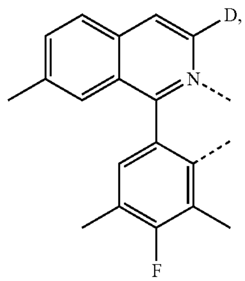
$L_{a108}$
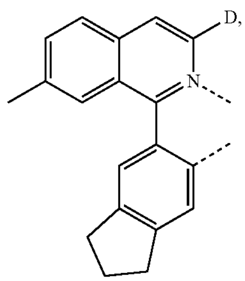
$L_{a109}$
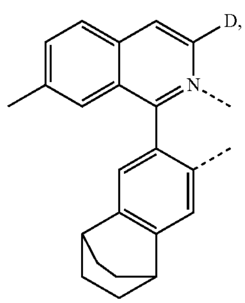
$L_{a110}$
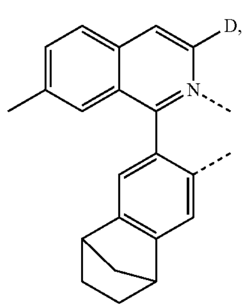
-continued
$L_{a111}$
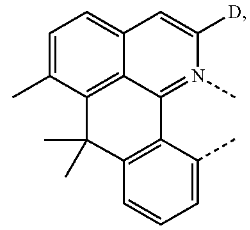
$L_{a112}$
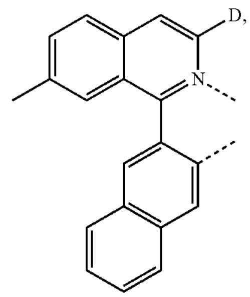
$L_{a113}$
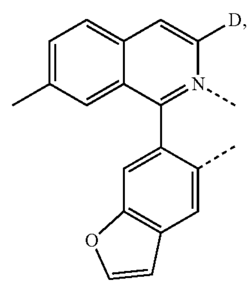
$L_{a114}$
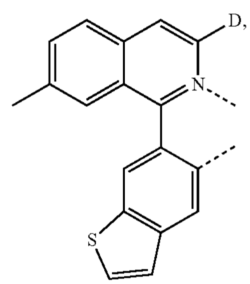
$L_{a115}$
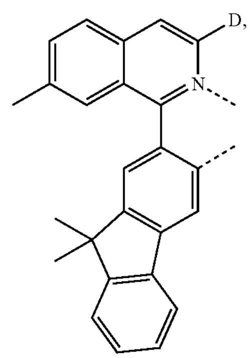

-continued
$L_{a116}$
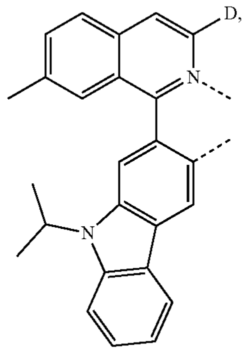
$L_{a117}$
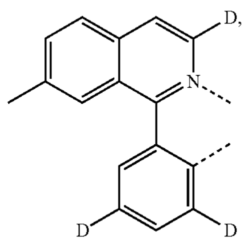
$L_{a118}$
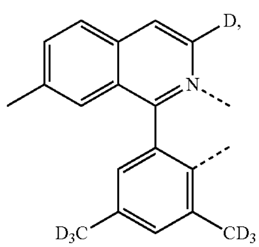
$L_{a119}$
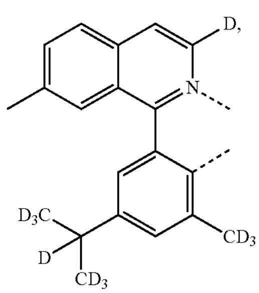
$L_{a120}$
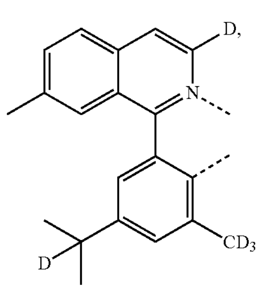
-continued
$L_{a121}$
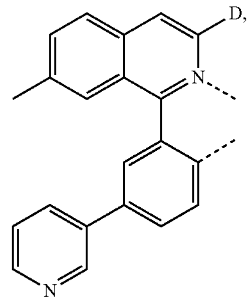
$L_{a122}$
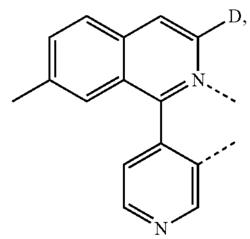
$L_{a123}$
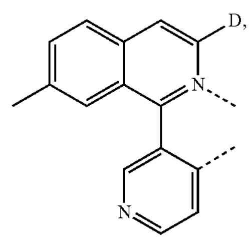
$L_{a124}$
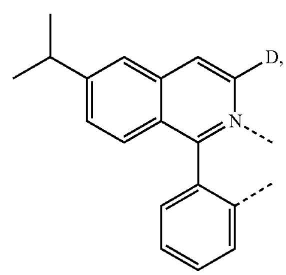
$L_{a125}$
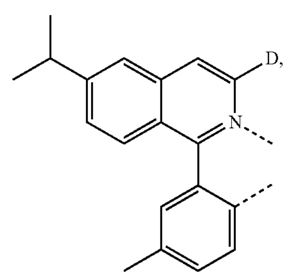
$L_{a126}$
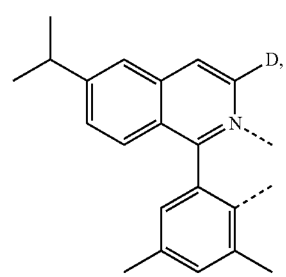

$L_{a127}$
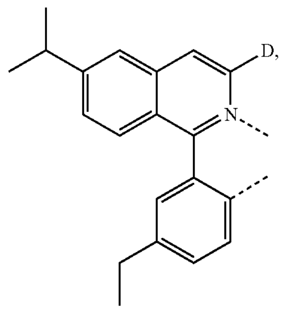
$L_{a128}$
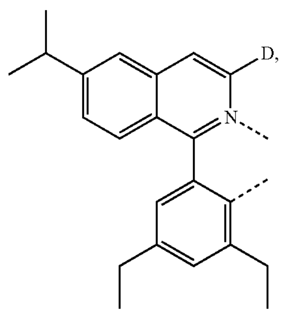
$L_{a129}$
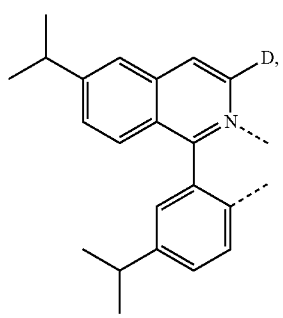
$L_{a130}$
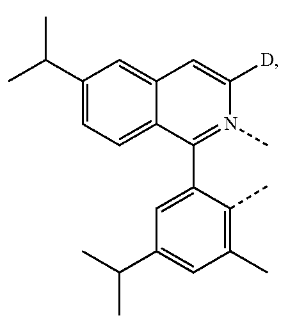
$L_{a131}$
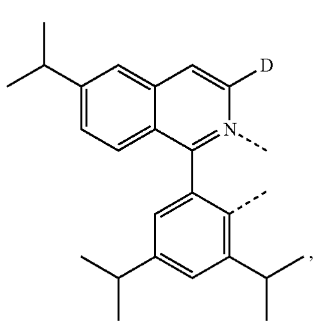
$L_{a132}$
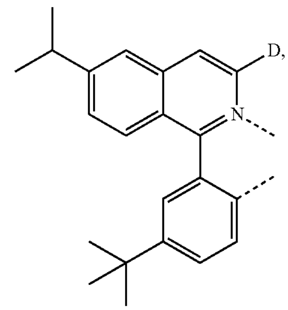
$L_{a133}$
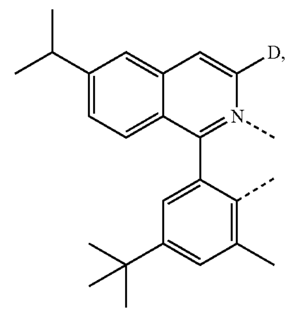
$L_{a134}$
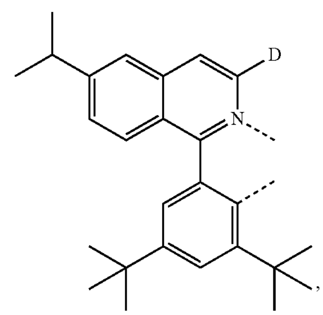
$L_{a135}$
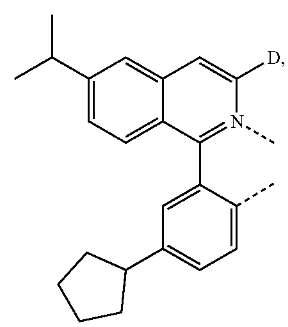
$L_{a136}$
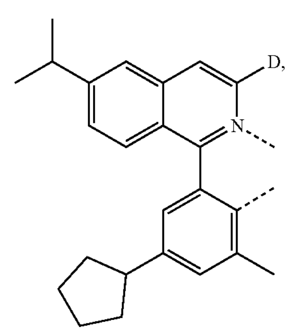

-continued
$L_{a137}$
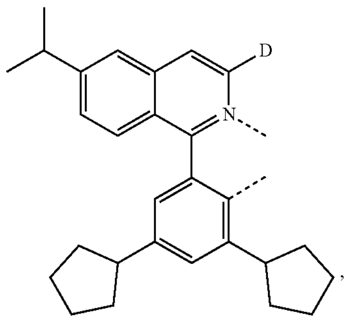
$L_{a138}$
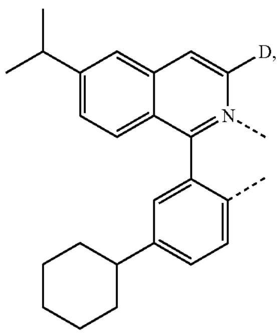
$L_{a139}$
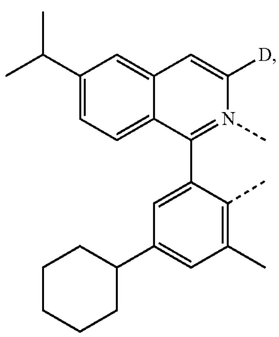
$L_{a140}$
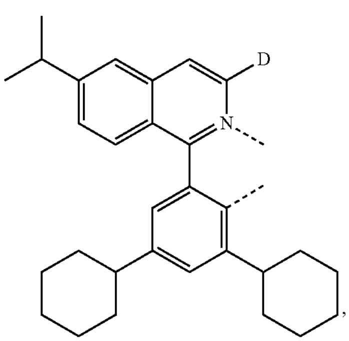
-continued
$L_{a141}$
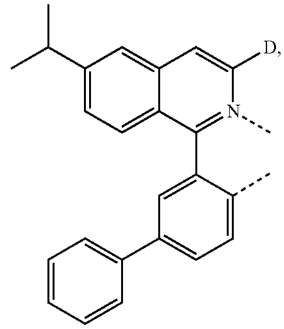
$L_{a142}$
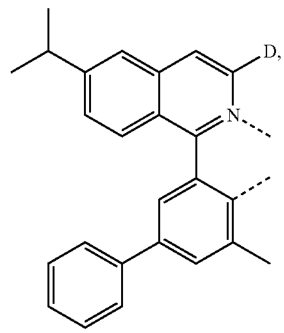
$L_{a143}$
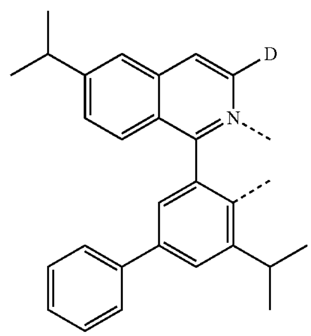
$L_{a144}$
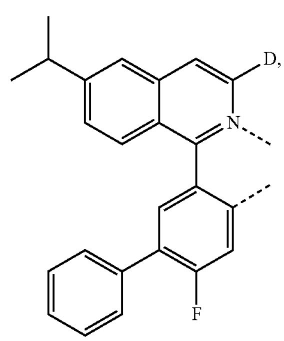

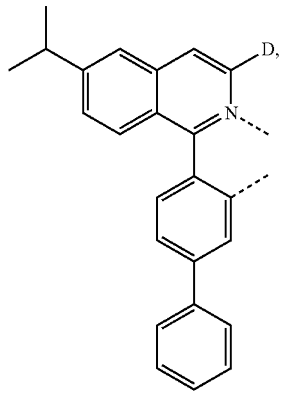
$L_{a145}$
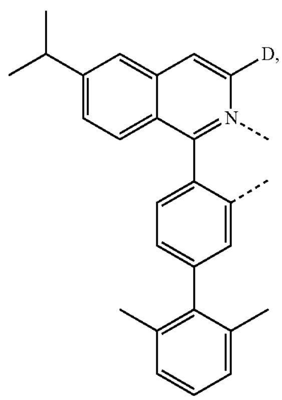
$L_{a146}$
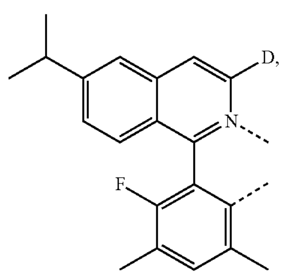
$L_{a147}$
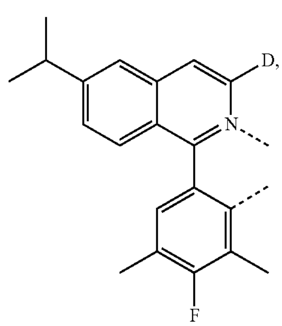
$L_{a148}$
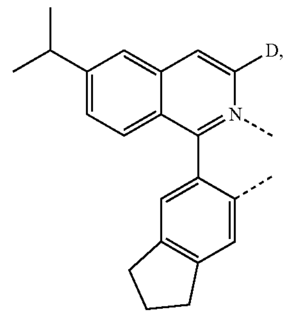
$L_{a149}$
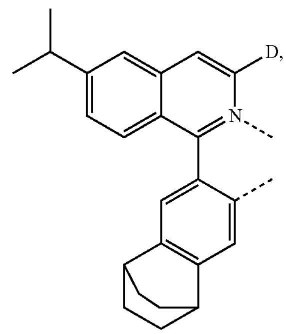
$L_{a150}$
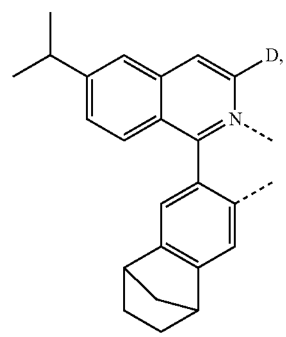
$L_{a151}$
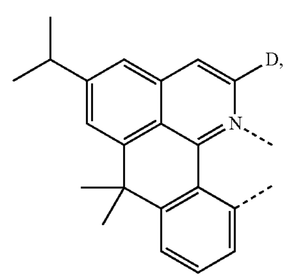
$L_{a152}$
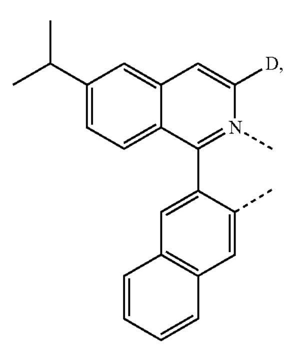
$L_{a153}$ -continued
$L_{a154}$
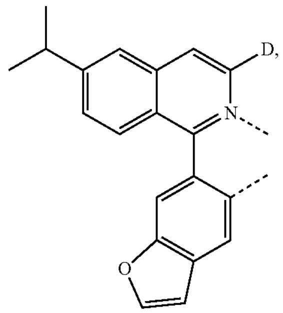
$L_{a155}$
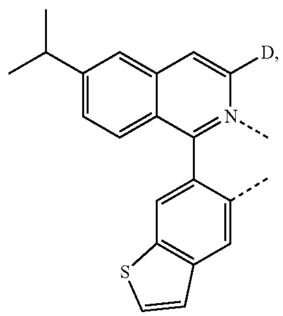
$L_{a156}$
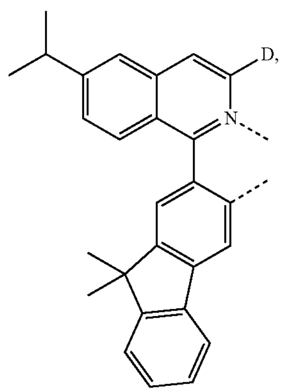
$L_{a157}$
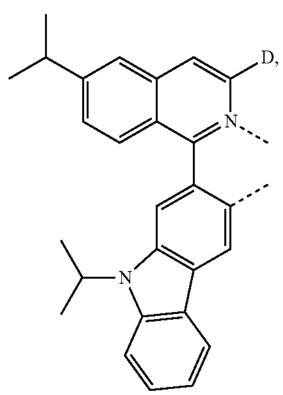
-continued
$L_{a158}$
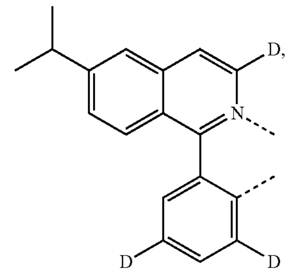
$L_{a159}$
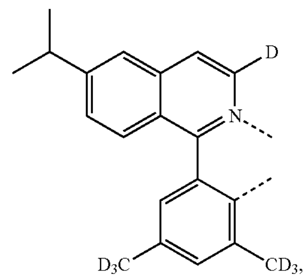
$L_{a160}$
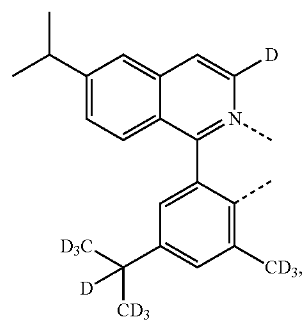
$L_{a161}$
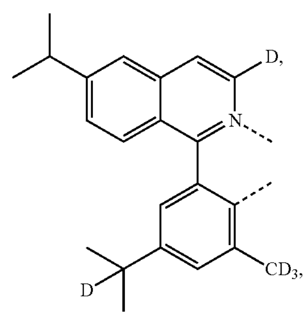
$L_{a162}$
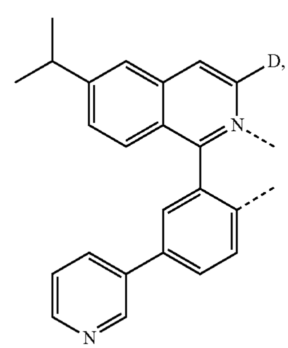

-continued
$L_{a163}$
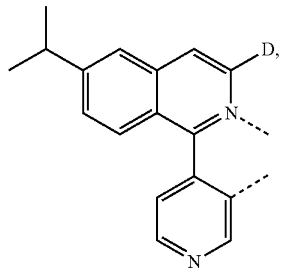
$L_{a164}$
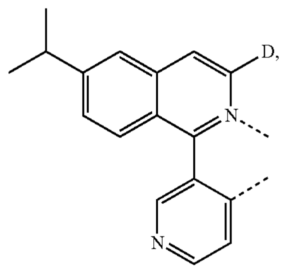
$L_{a165}$
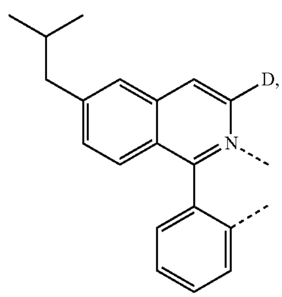
$L_{a166}$
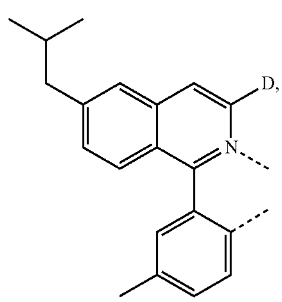
$L_{a167}$
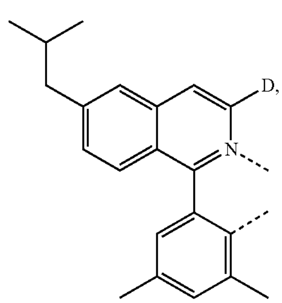
-continued
$L_{a168}$
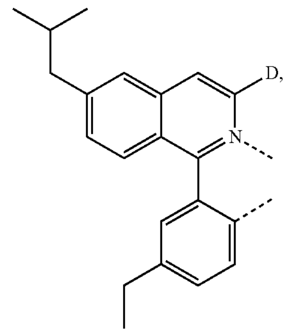
$L_{a169}$
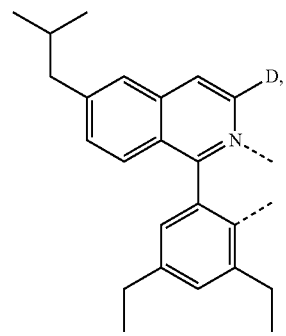
$L_{a170}$
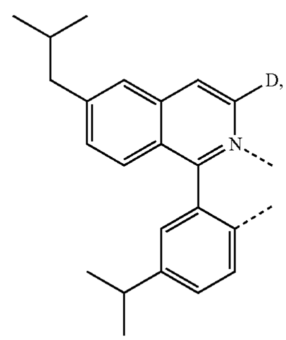
$L_{a171}$
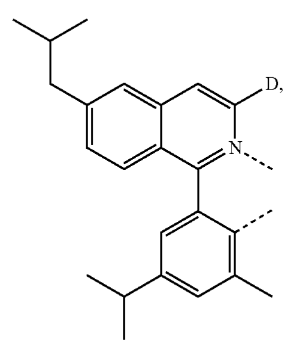

-continued
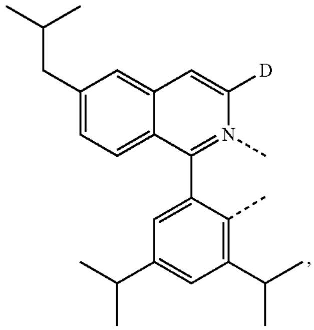
$L_{a172}$
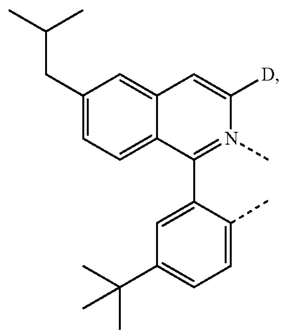
$L_{a173}$
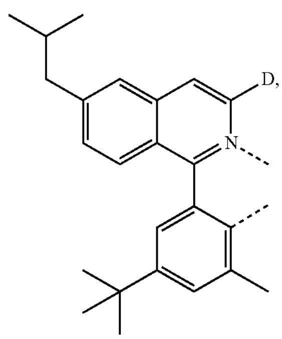
$L_{a174}$
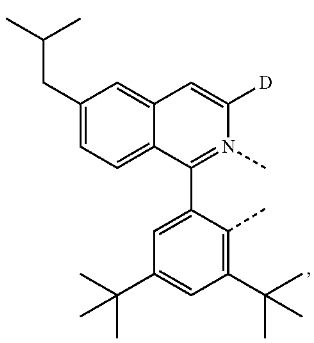
$L_{a175}$
-continued
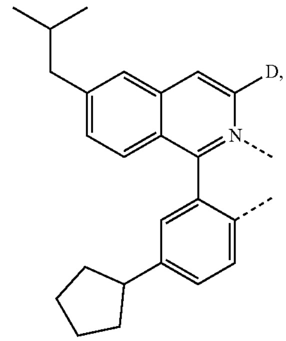
$L_{a176}$
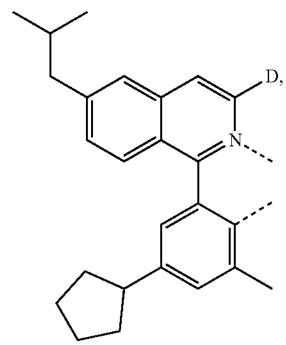
$L_{a177}$
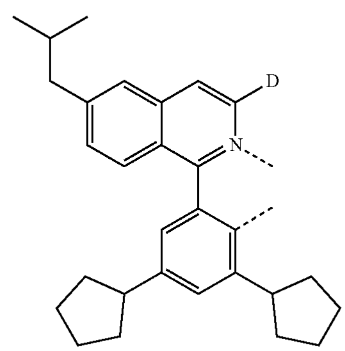
$L_{a178}$
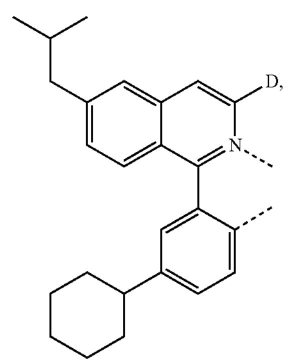
$L_{a179}$ -continued
$L_{a180}$
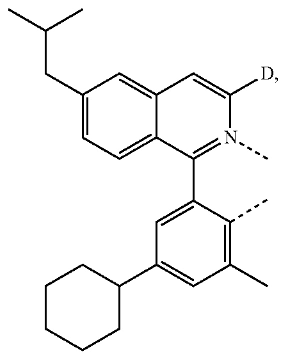
$L_{a181}$
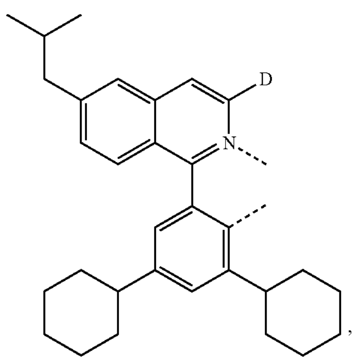
$L_{a182}$
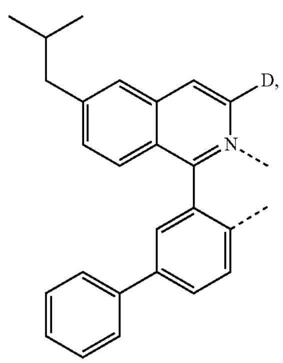
$L_{a183}$
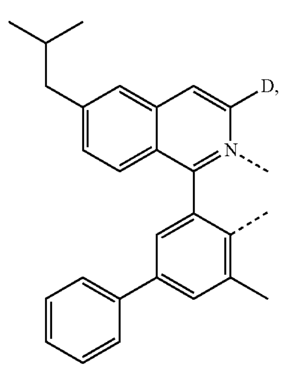
-continued
$L_{a184}$
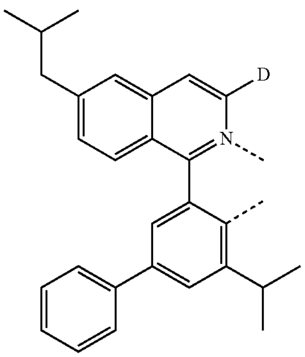
$L_{a185}$
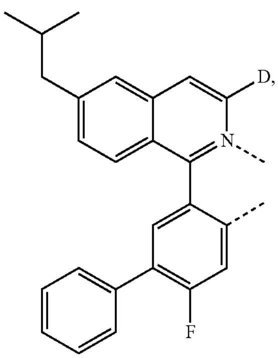
$L_{a186}$
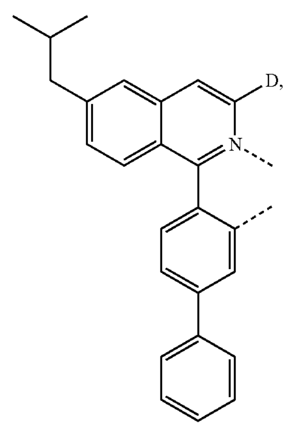
$L_{a187}$
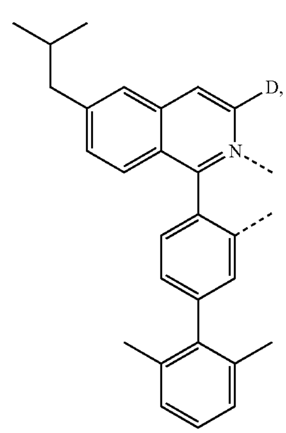

-continued
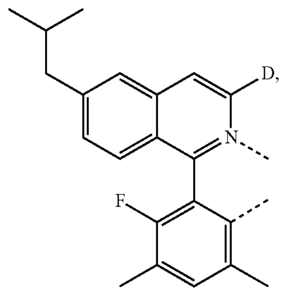
$L_{a188}$
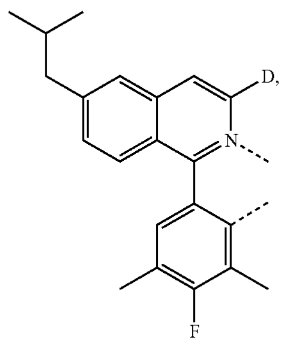
$L_{a189}$
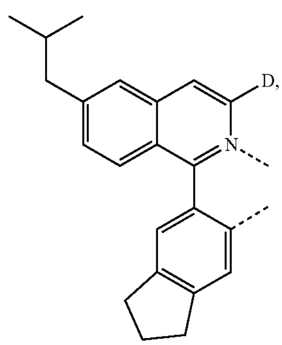
$L_{a190}$
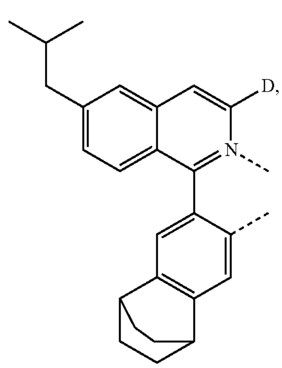
$L_{a191}$
-continued
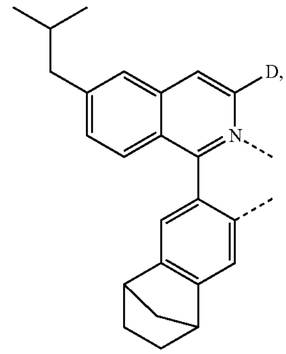
$L_{a192}$
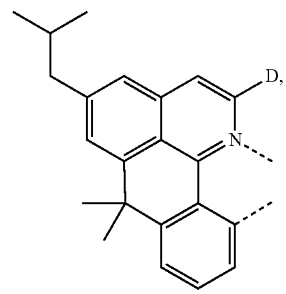
$L_{a193}$
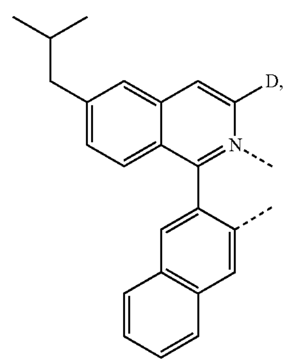
$L_{a194}$
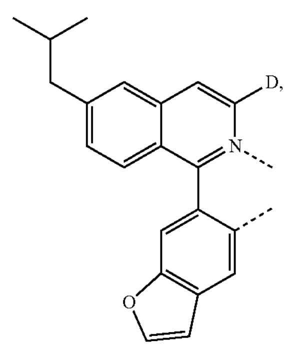
$L_{a195}$ -continued
$L_{a196}$
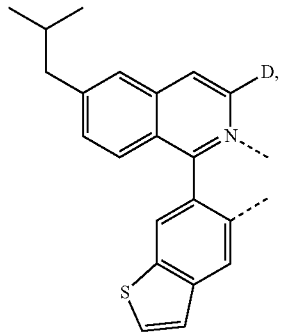
$L_{a197}$
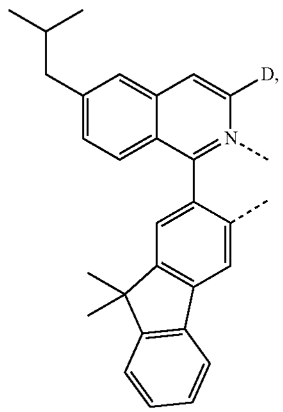
$L_{a198}$
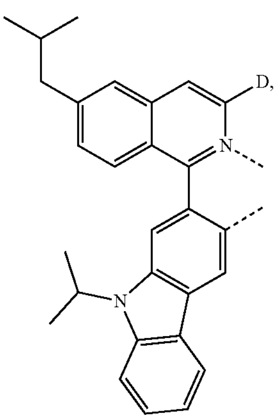
$L_{a199}$
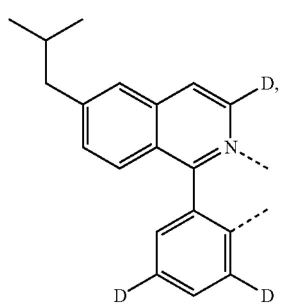
-continued
$L_{a200}$
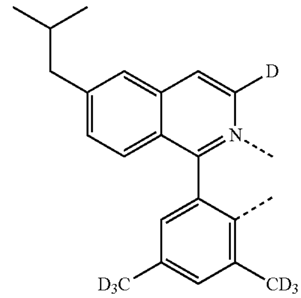
$L_{a201}$
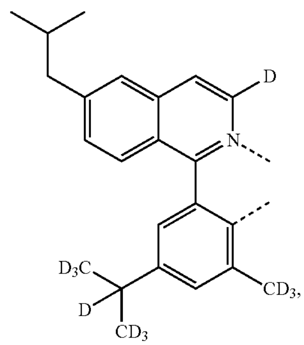
$L_{a202}$
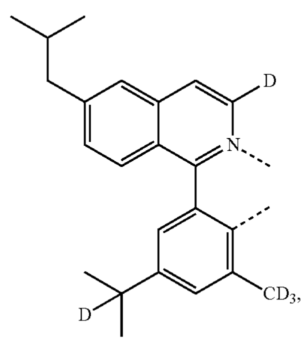
$L_{a203}$
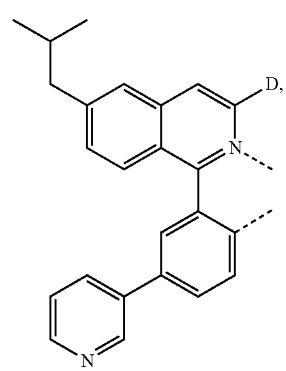

$L_{a204}$
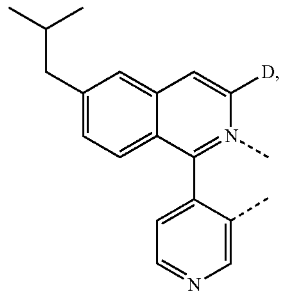
$L_{a205}$
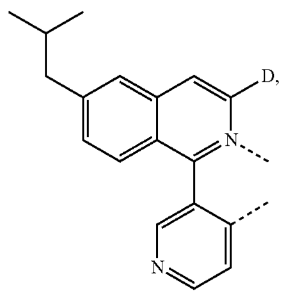
$L_{a206}$
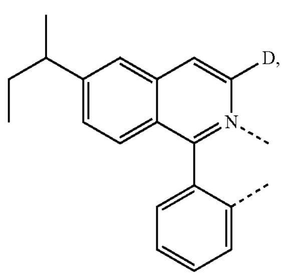
$L_{a207}$
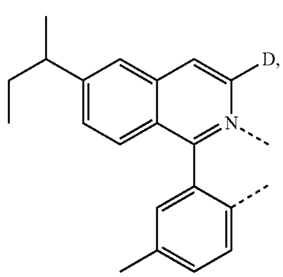
$L_{a208}$
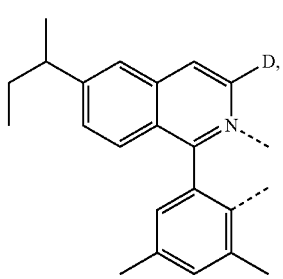
$L_{a209}$
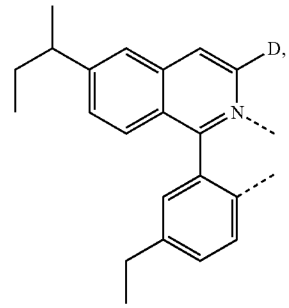
$L_{a210}$
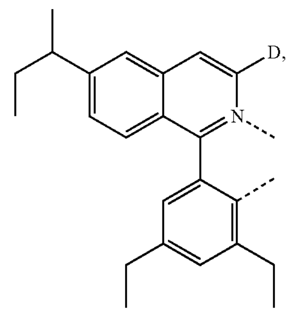
$L_{a211}$
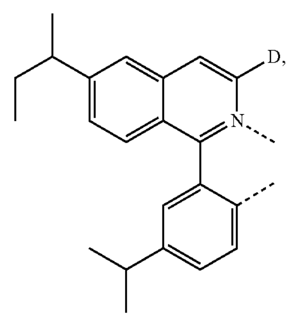
$L_{a212}$
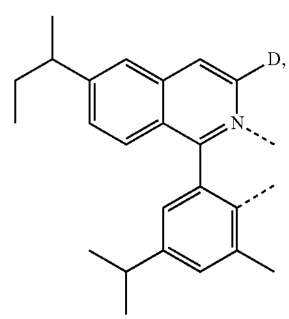
$L_{a213}$
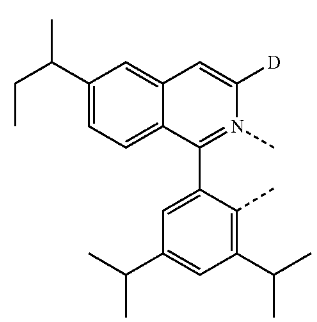

-continued
$L_{a214}$
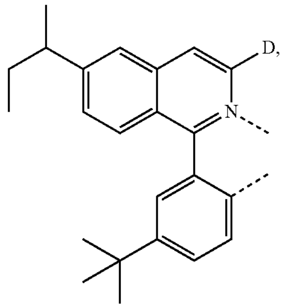
$L_{a215}$
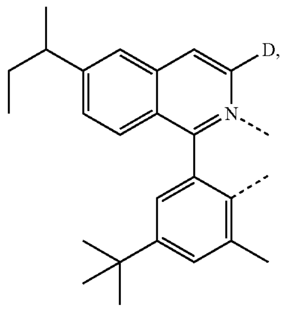
$L_{a216}$
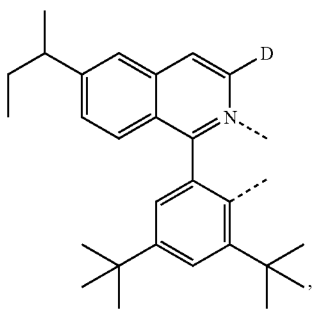
$L_{a217}$
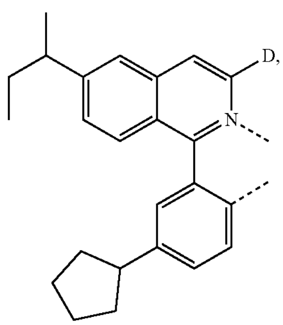
$L_{a218}$
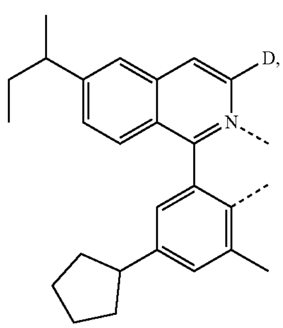
-continued
$L_{a219}$
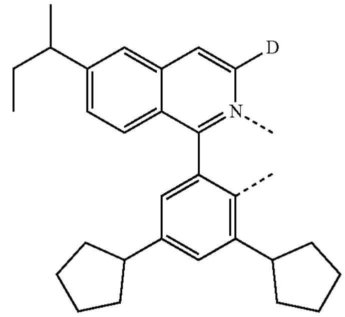
$L_{a220}$
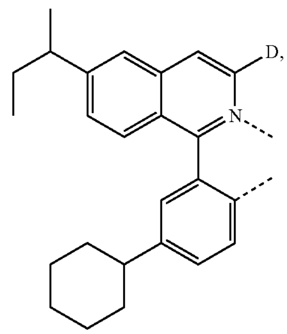
$L_{a221}$
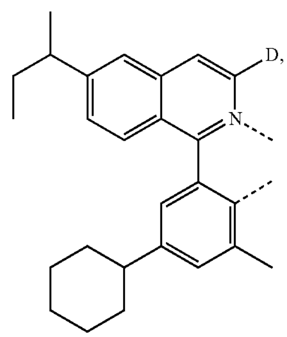
$L_{a222}$
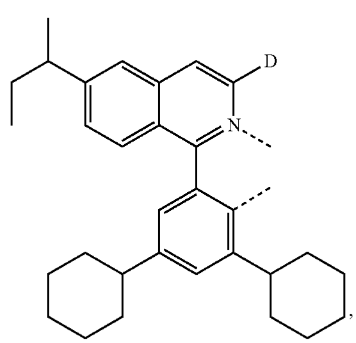

-continued
$L_{a223}$
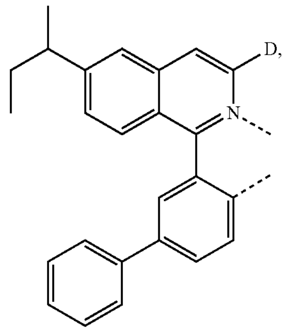
$L_{a224}$
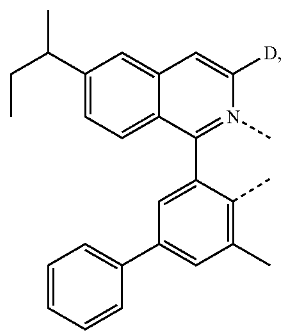
$L_{a225}$
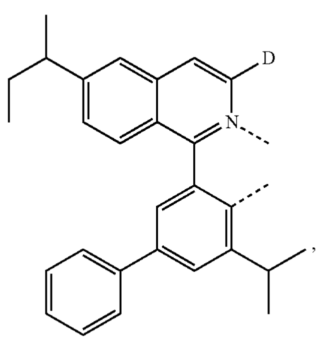
$L_{a226}$
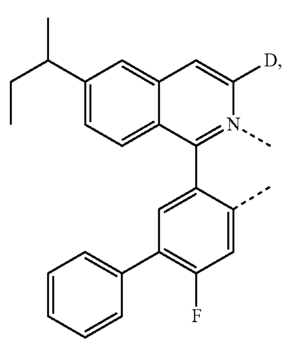
-continued
$L_{a227}$
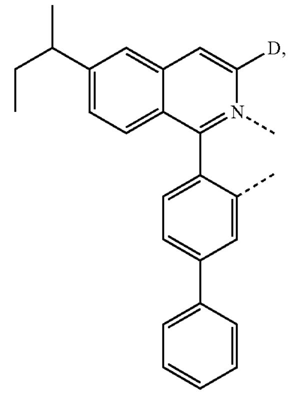
$L_{a228}$
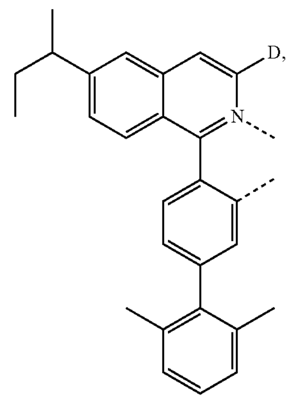
$L_{a229}$
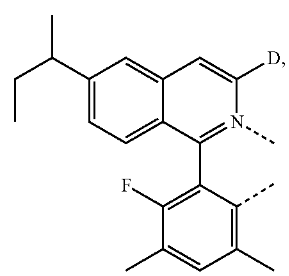
$L_{a230}$
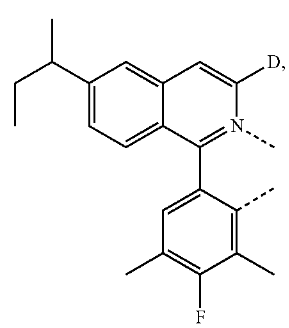

-continued
$L_{a231}$
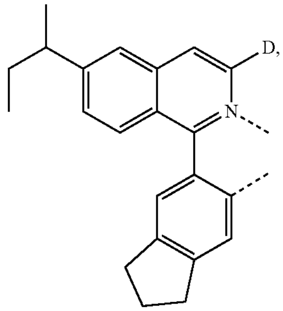
$L_{a232}$
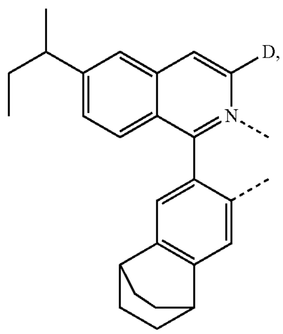
$L_{a233}$
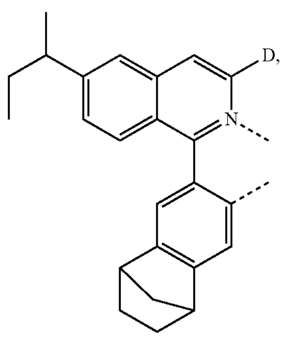
$L_{a234}$
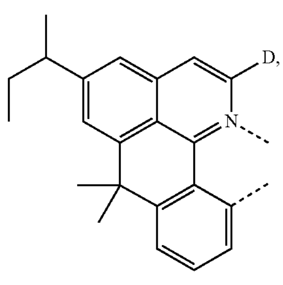
$L_{a235}$
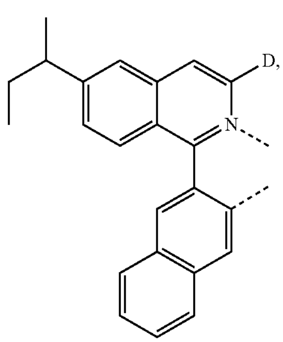
-continued
$L_{a236}$
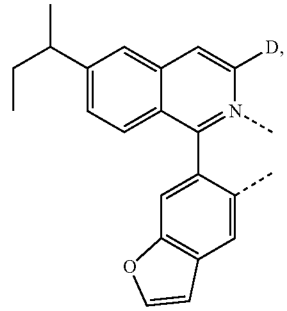
$L_{a237}$
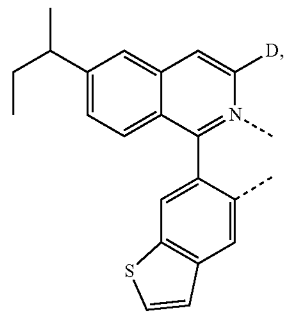
$L_{a238}$
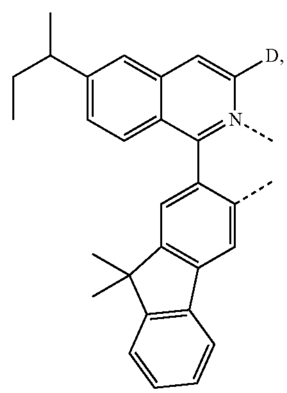
$L_{a239}$
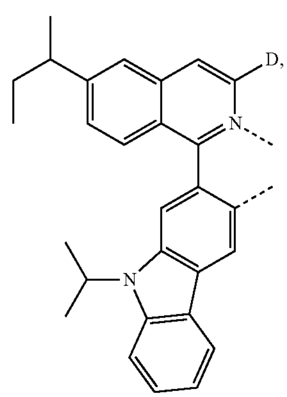

-continued
$L_{a240}$
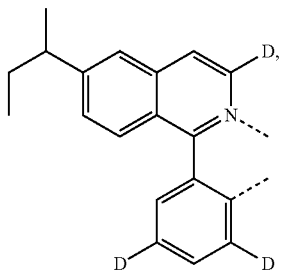
$L_{a241}$
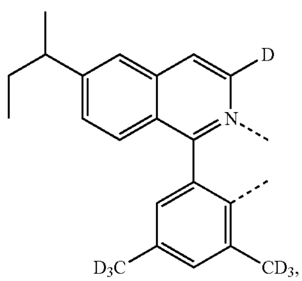
$L_{a242}$
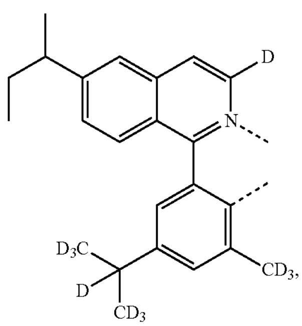
$L_{a243}$
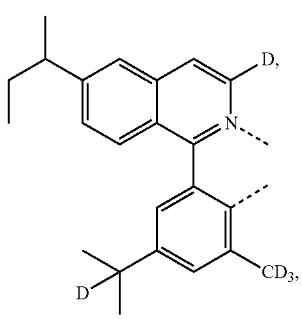
$L_{a244}$
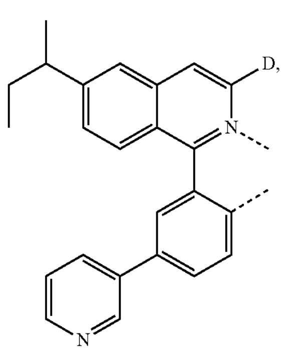
-continued
$L_{a245}$
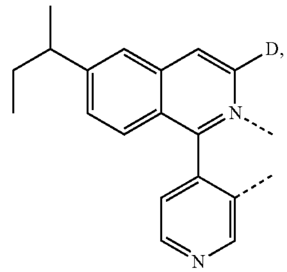
$L_{a246}$
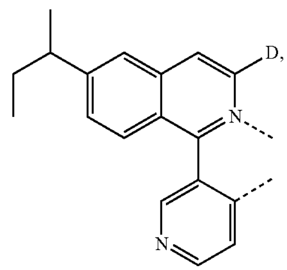
$L_{a247}$
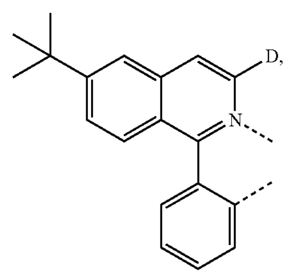
$L_{a248}$
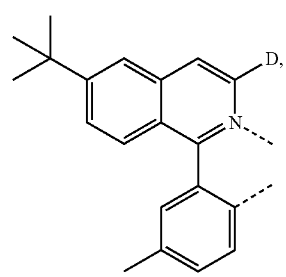
$L_{a249}$
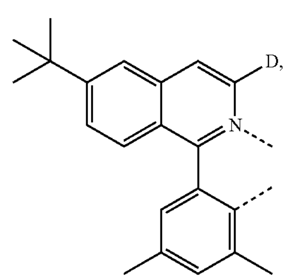

-continued
$L_{a250}$
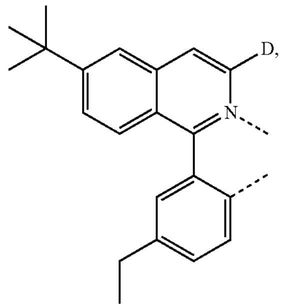
$L_{a251}$
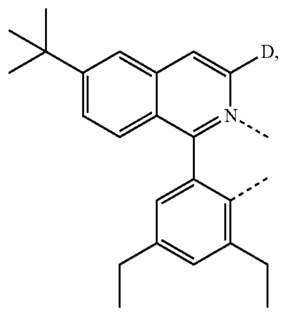
$L_{a252}$
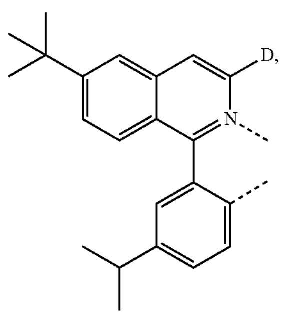
$L_{a253}$
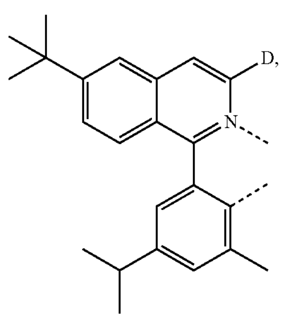
$L_{a254}$
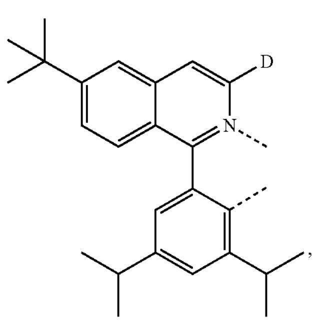
-continued
$L_{a255}$
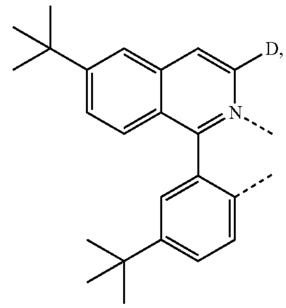
$L_{a256}$
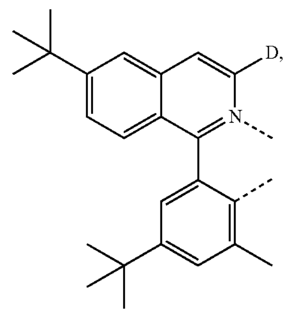
$L_{a257}$
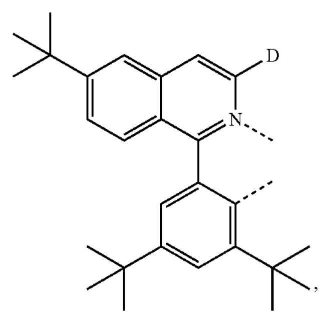
$L_{a258}$
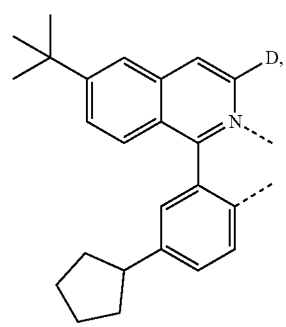
$L_{a259}$
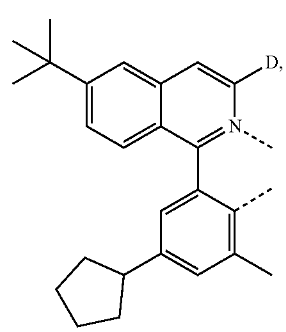

-continued
$L_{a260}$
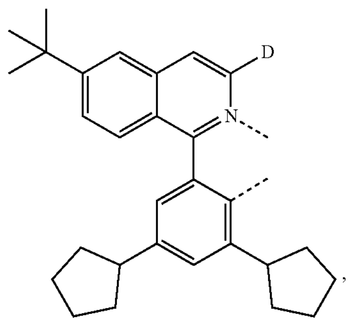
$L_{a261}$
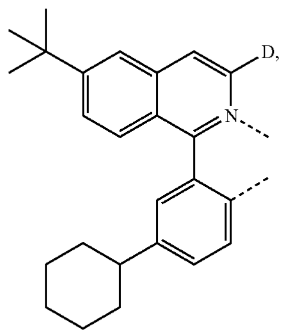
$L_{a262}$
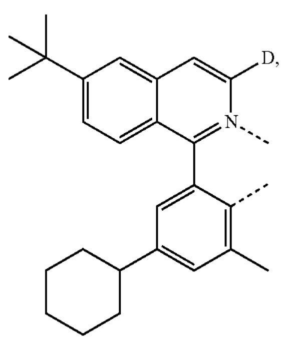
$L_{a263}$
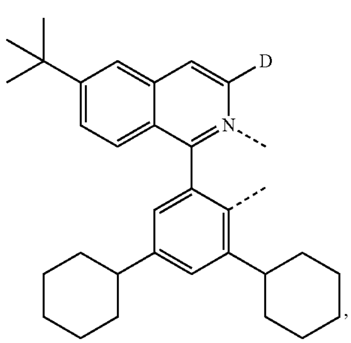
-continued
$L_{a264}$
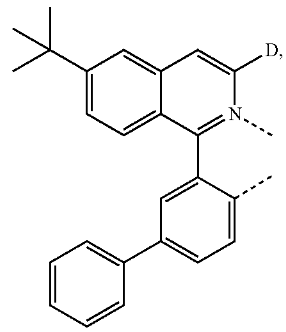
$L_{a265}$
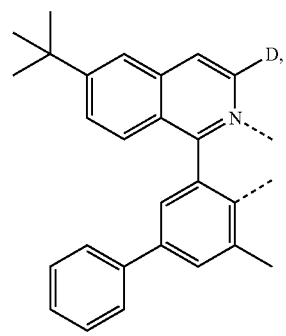
$L_{a266}$
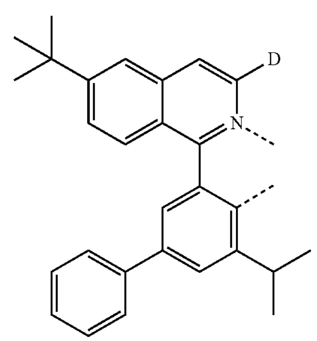
$L_{a267}$
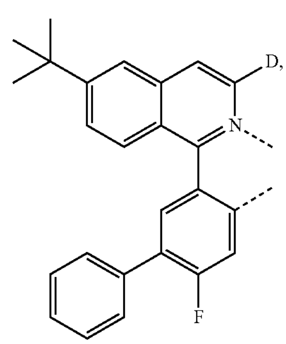

-continued
$L_{a268}$
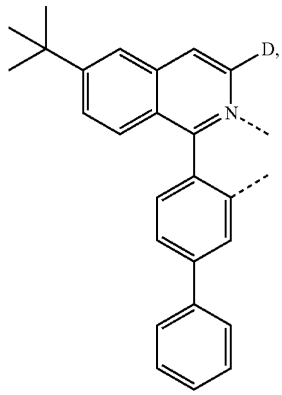
$L_{a269}$
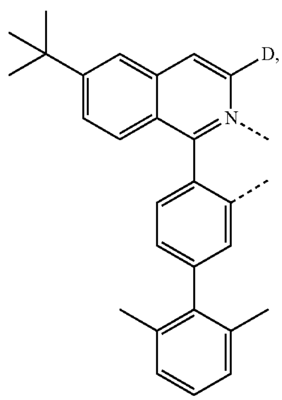
$L_{a270}$
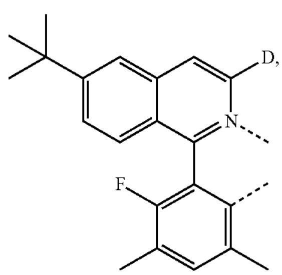
$L_{a271}$
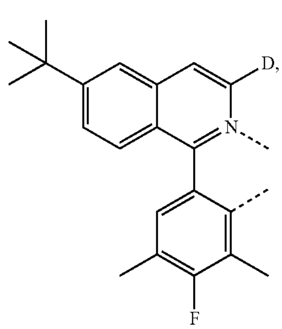
-continued
$L_{a272}$
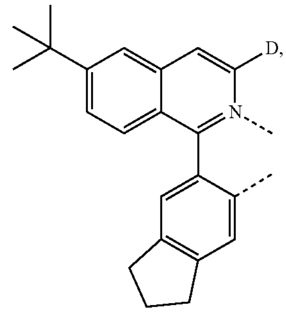
$L_{a273}$
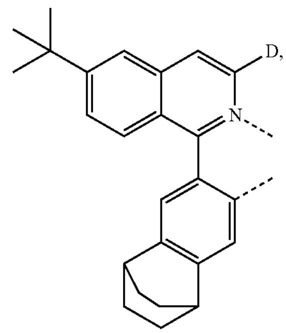
$L_{a274}$
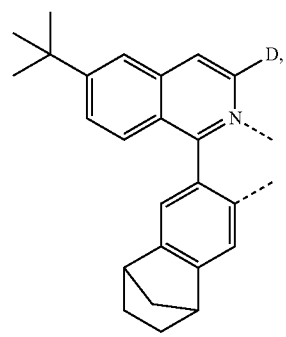
$L_{a275}$
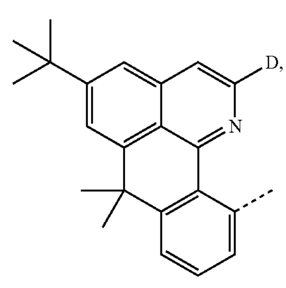

-continued
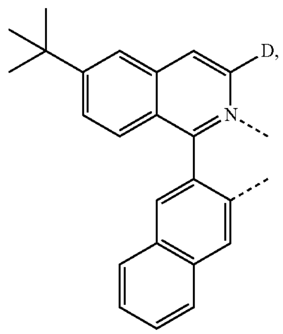
$L_{a276}$
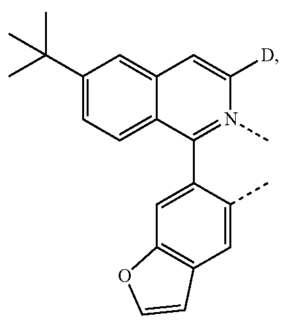
$L_{a277}$
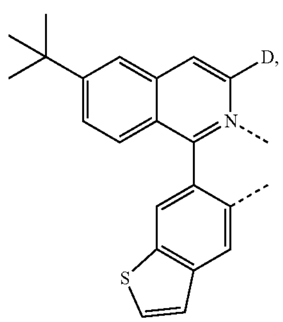
$L_{a278}$
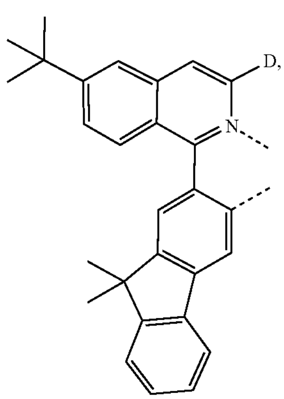
$L_{a279}$
-continued
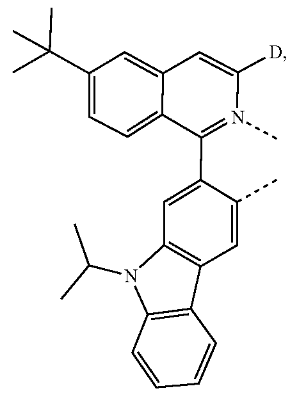
$L_{a280}$
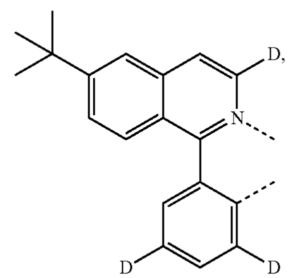
$L_{a281}$
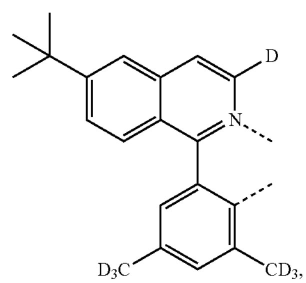
$L_{a282}$
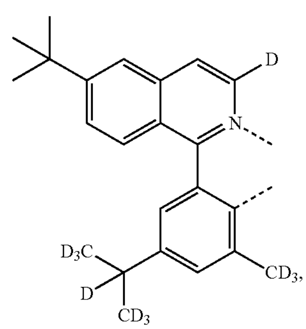
$L_{a283}$
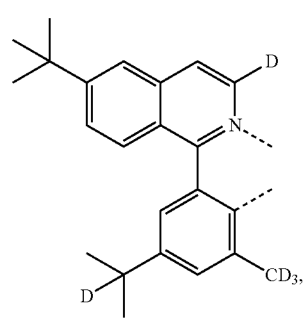
$L_{a284}$ $L_{a285}$
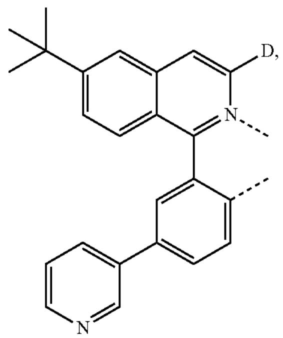
$L_{a286}$
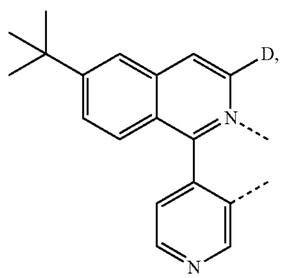
$L_{a287}$
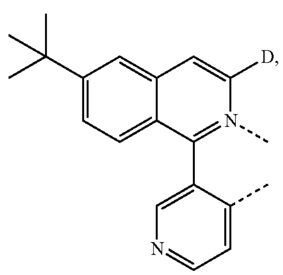
$L_{a288}$
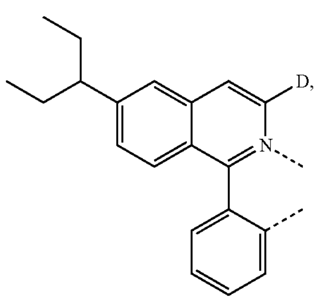
$L_{a289}$
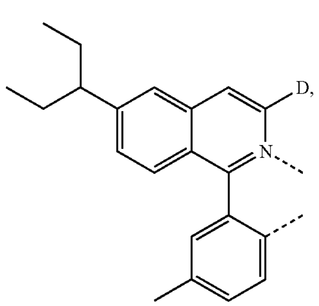
$L_{a290}$
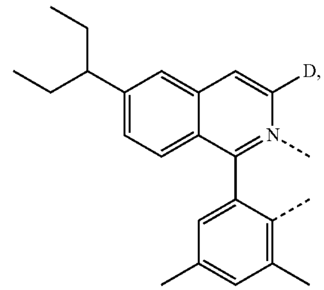
$L_{a291}$
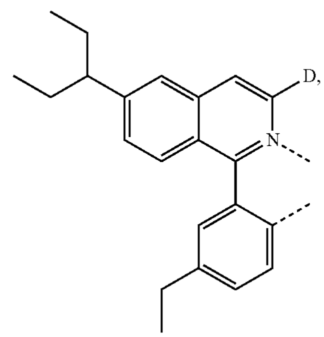
$L_{a292}$
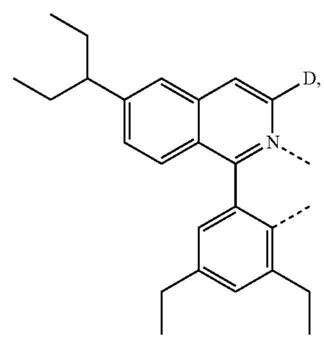
$L_{a293}$
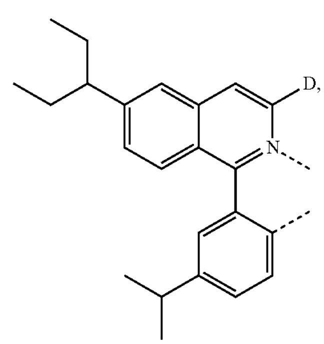
$L_{a294}$
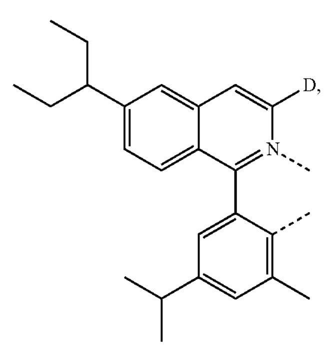

$L_{a295}$
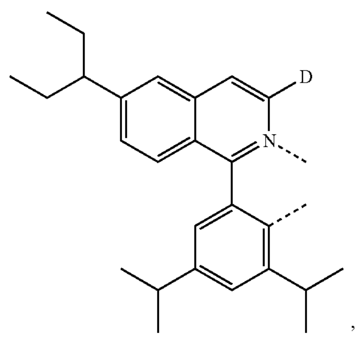
$L_{a296}$
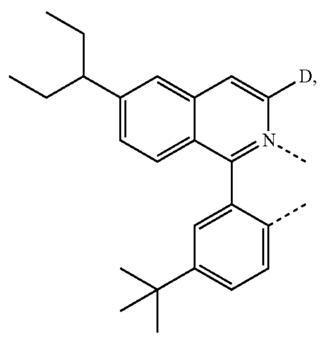
$L_{a297}$
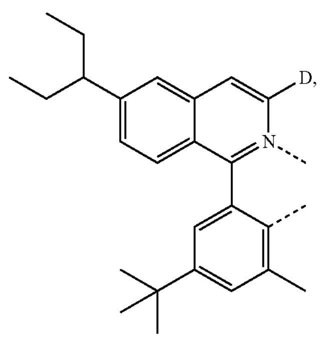
$L_{a298}$
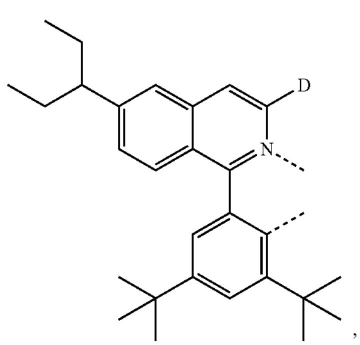
$L_{a299}$
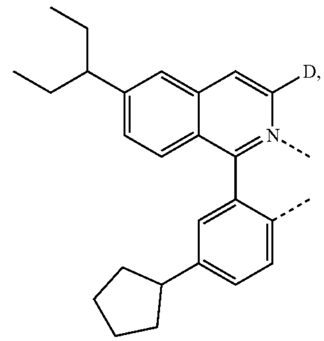
$L_{a300}$
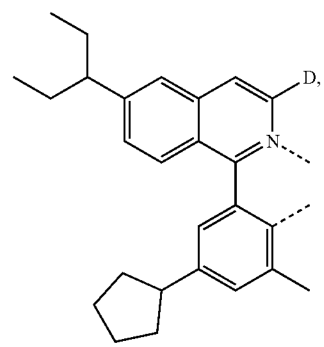
$L_{a301}$
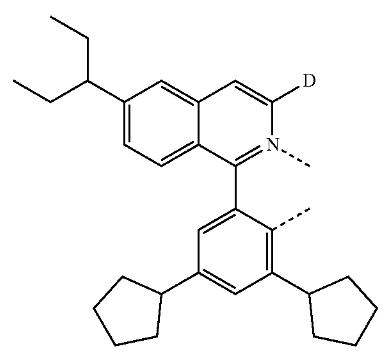
$L_{a302}$
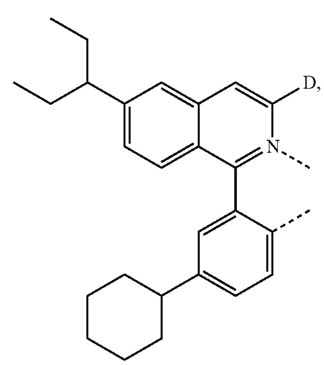

-continued
$L_{a303}$
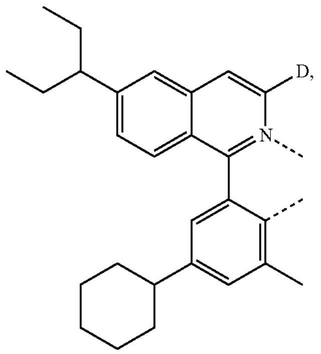
$L_{a304}$
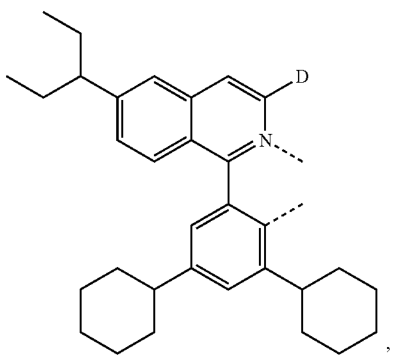
$L_{a305}$
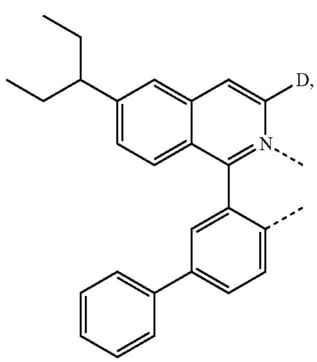
$L_{a306}$
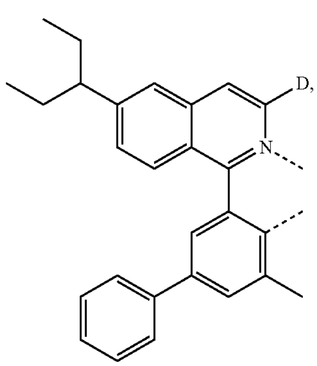
-continued
$L_{a307}$
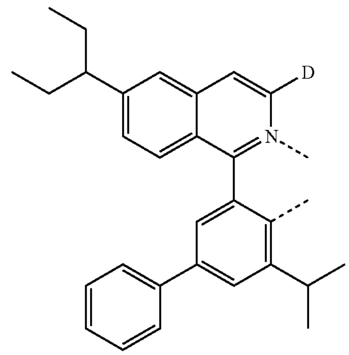
$L_{a308}$
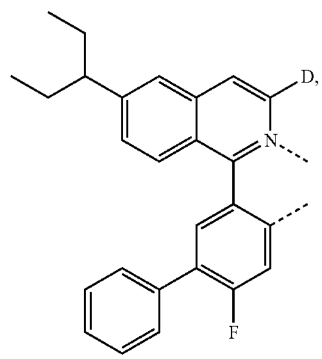
$L_{a309}$
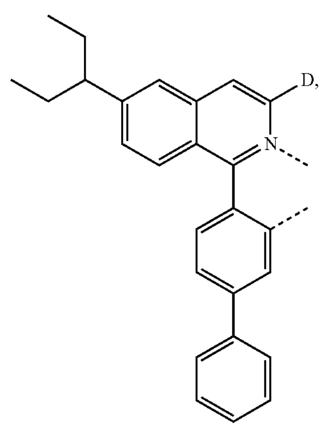
$L_{a310}$
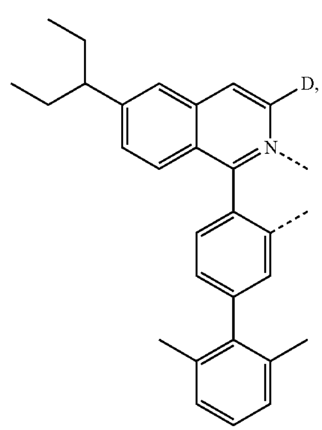

-continued
$L_{a311}$
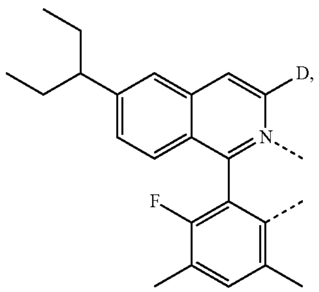
$L_{a312}$
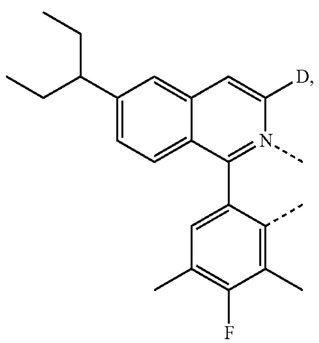
$L_{a313}$
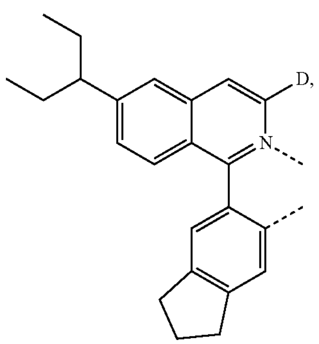
$L_{a314}$
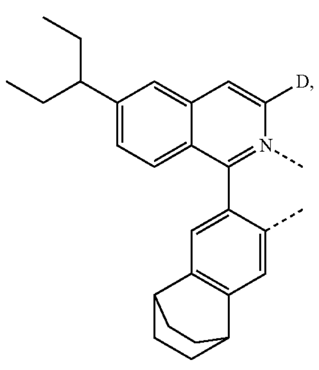
-continued
$L_{a315}$
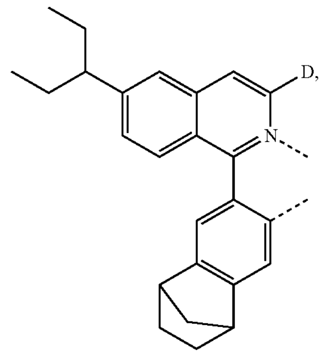
$L_{a316}$
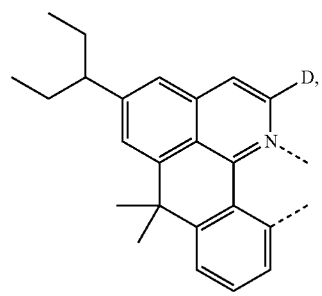
$L_{a317}$
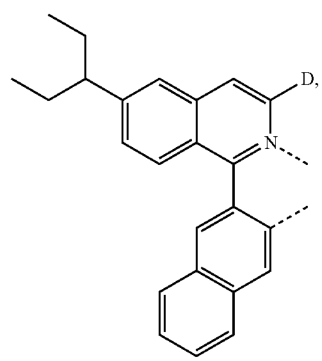
$L_{a318}$
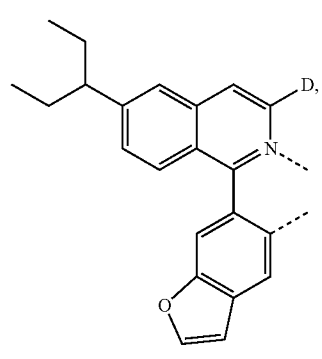

$L_{a319}$
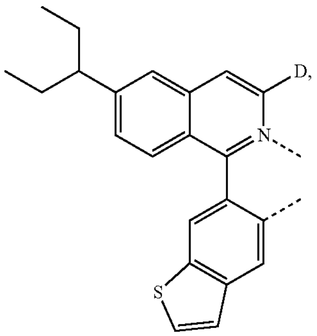
$L_{a320}$
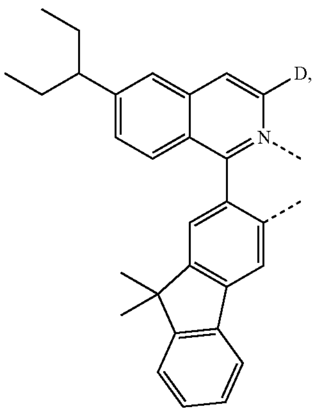
$L_{a321}$
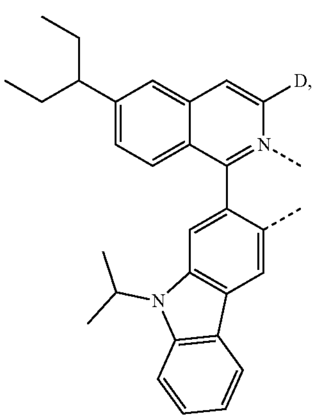
$L_{a322}$
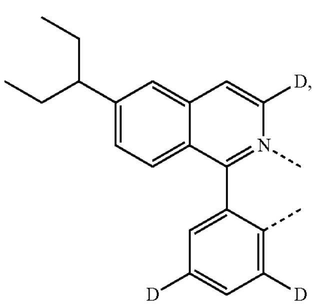
$L_{a323}$
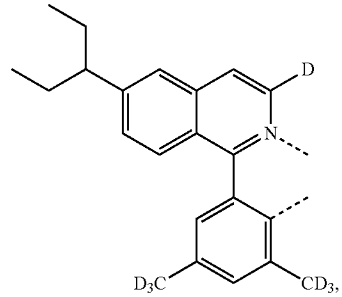
$L_{a324}$
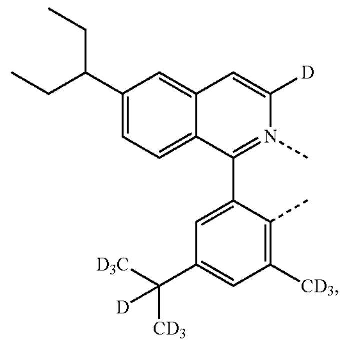
$L_{a325}$
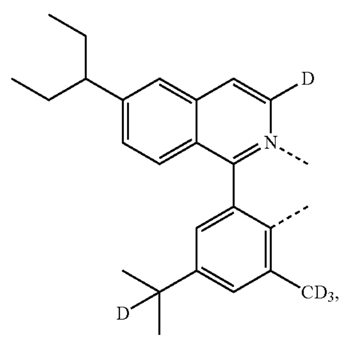
$L_{a326}$
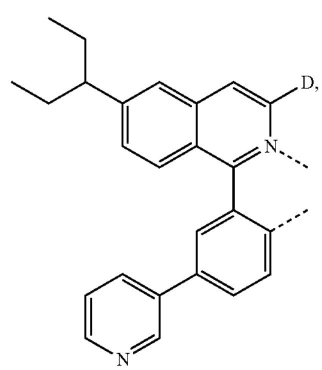

-continued
$L_{a327}$
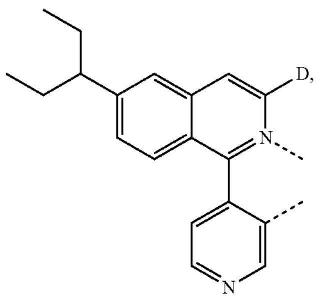
$L_{a328}$
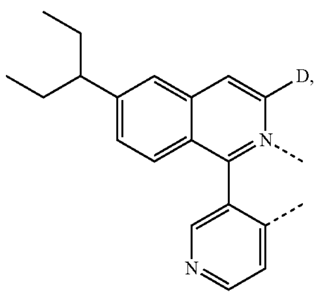
$L_{a329}$
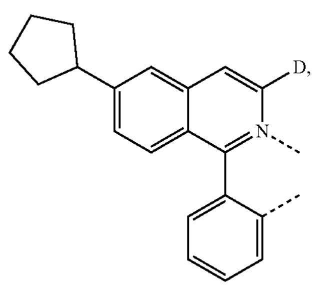
$L_{a330}$
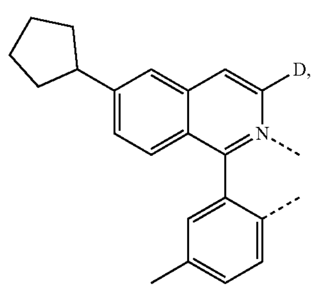
$L_{a331}$
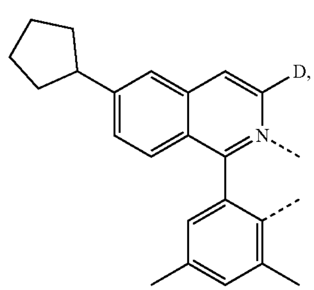
-continued
$L_{a332}$
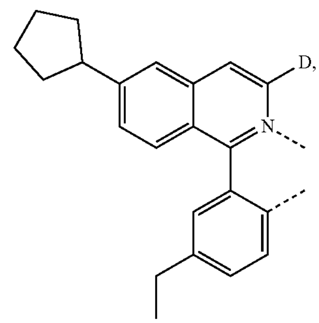
$L_{a333}$
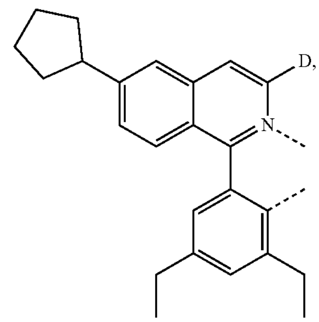
$L_{a334}$
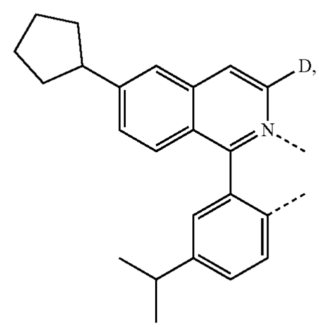
$L_{a335}$
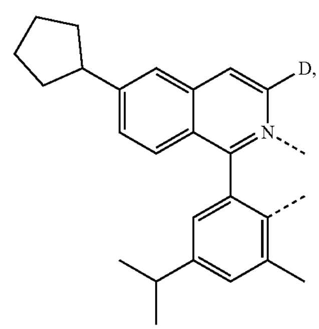
$L_{a336}$
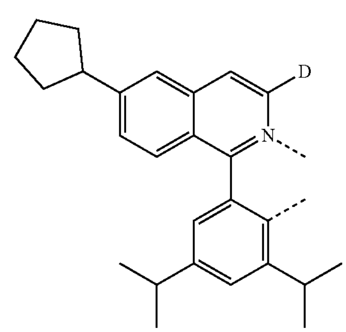
, -continued
$L_{a337}$
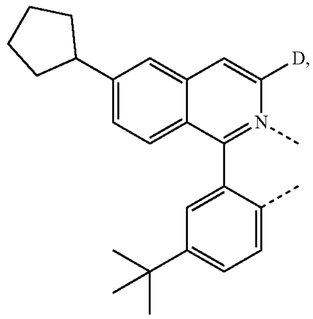
$L_{a338}$
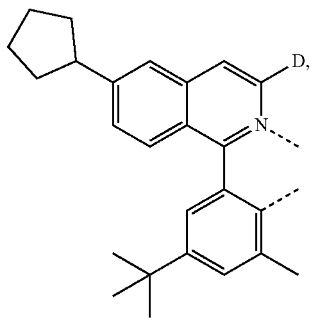
$L_{a339}$
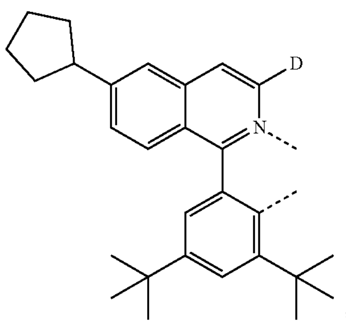
$L_{a340}$
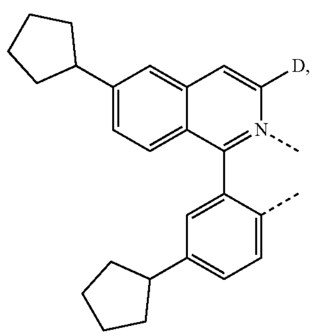
$L_{a341}$
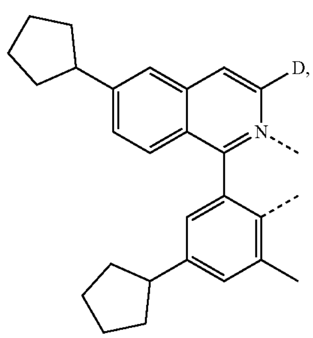
-continued
$L_{a342}$
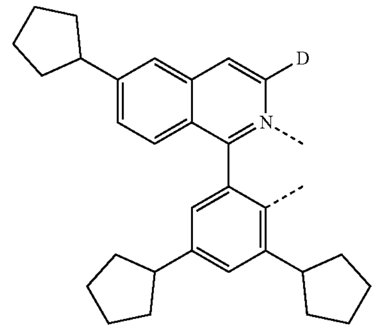
$L_{a343}$
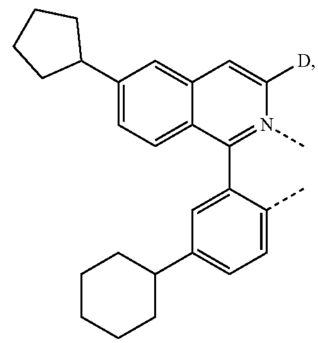
$L_{a344}$
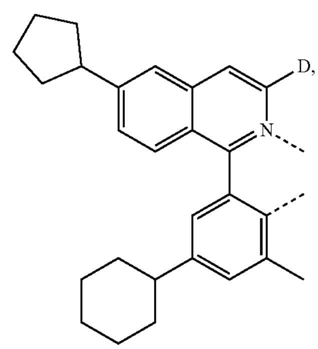
$L_{a345}$
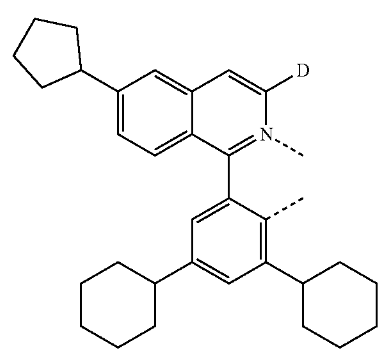

-continued
$L_{a346}$
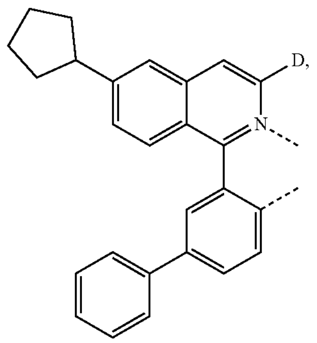
$L_{a347}$
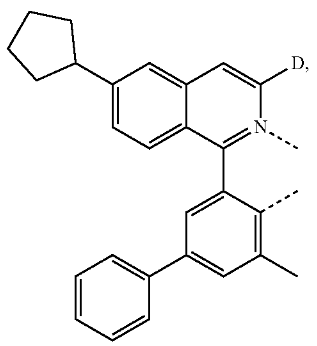
$L_{a348}$
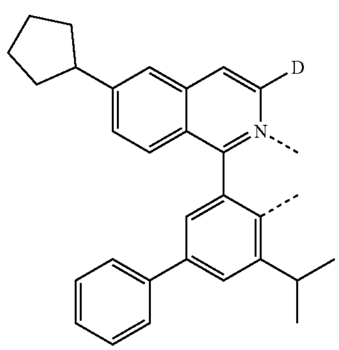
,
$L_{a349}$
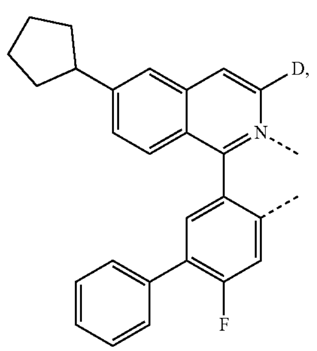
-continued
$L_{a350}$
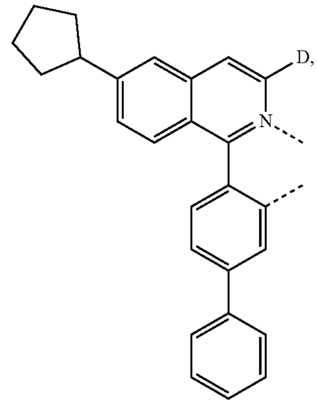
$L_{a351}$
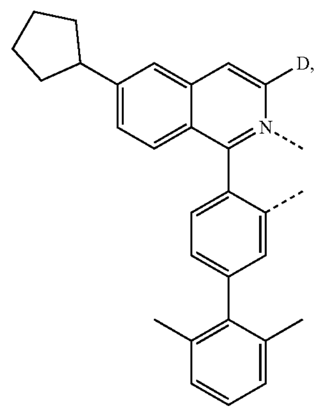
$L_{a352}$
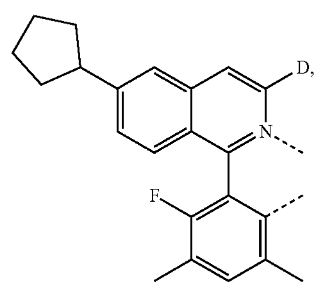
$L_{a353}$
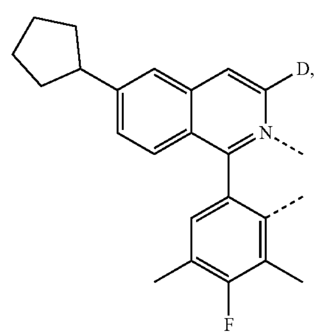

$L_{a354}$
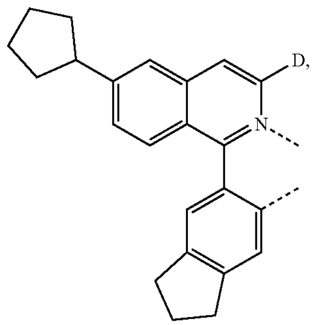
$L_{a355}$
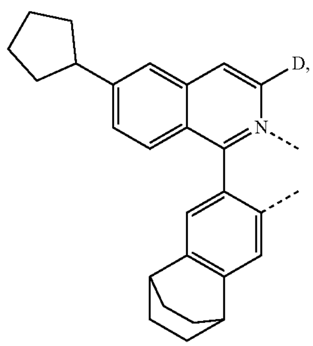
$L_{a356}$
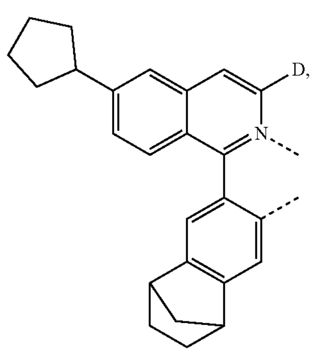
$L_{a357}$
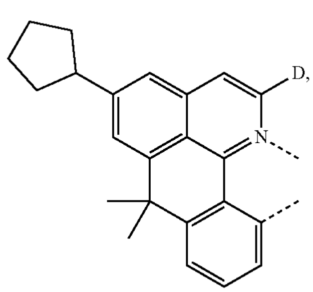
$L_{a358}$
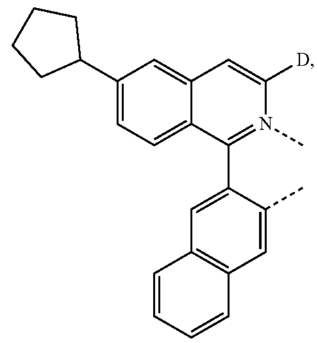
$L_{a359}$
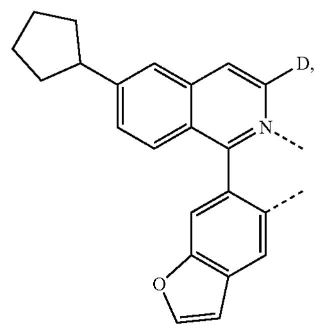
$L_{a360}$
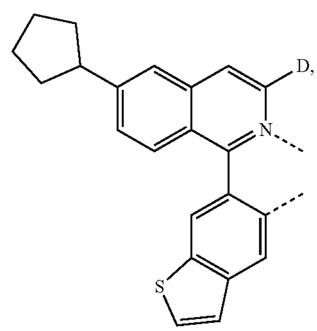
$L_{a361}$
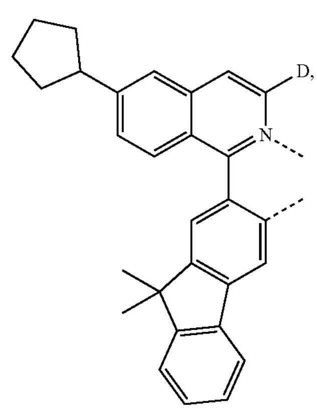

-continued
$L_{a362}$
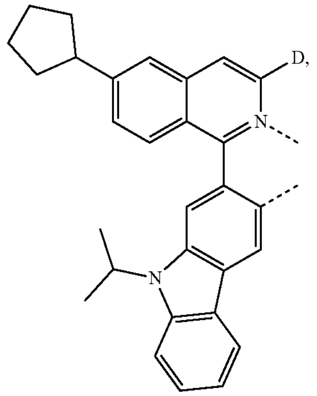
$L_{a363}$
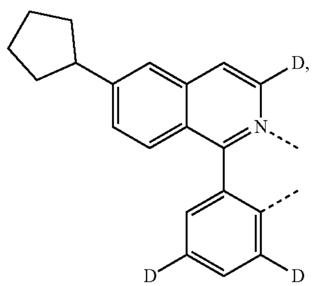
$L_{a364}$
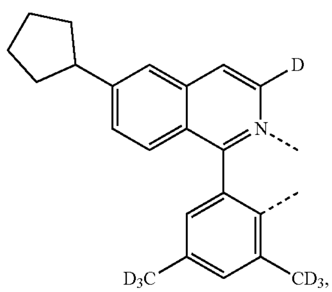
$L_{a365}$
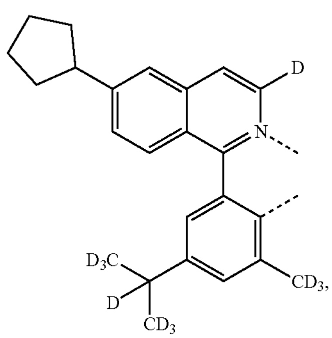
$L_{a366}$
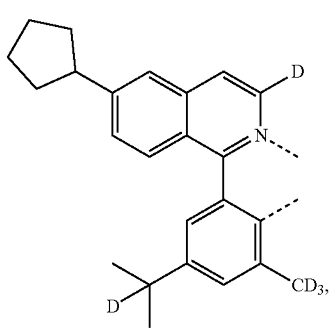
-continued
$L_{a367}$
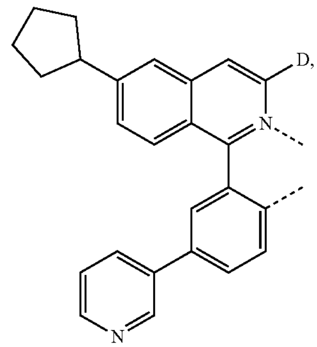
$L_{a368}$
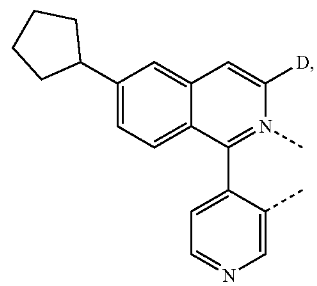
$L_{a369}$
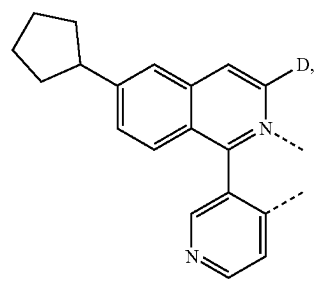
$L_{a370}$
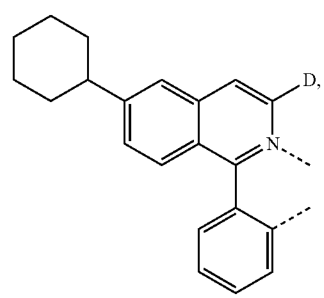
$L_{a371}$
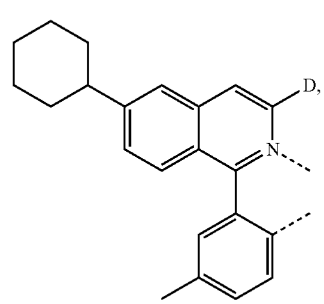

$L_{a372}$
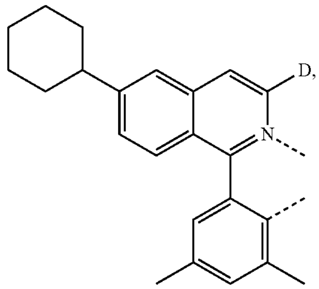
$L_{a373}$
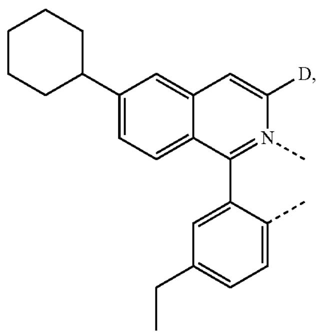
$L_{a374}$
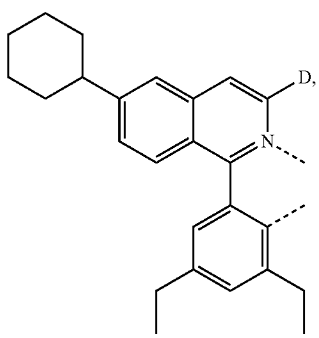
$L_{a375}$
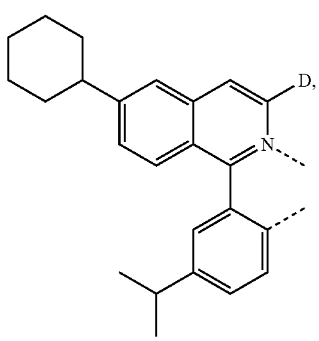
$L_{a376}$
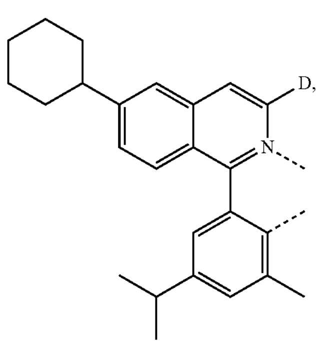
$L_{a377}$
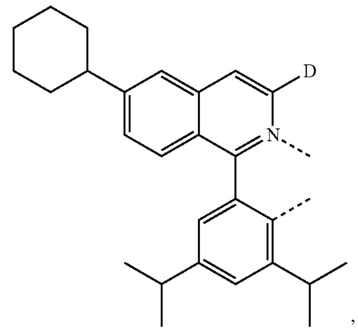
$L_{a378}$
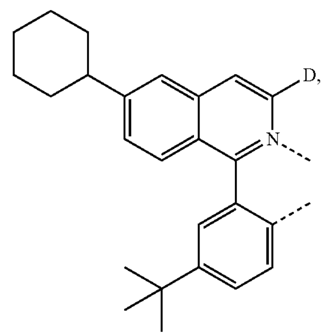
$L_{a379}$
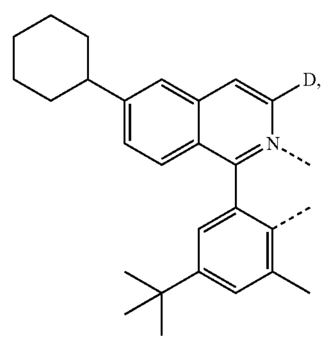
$L_{a380}$
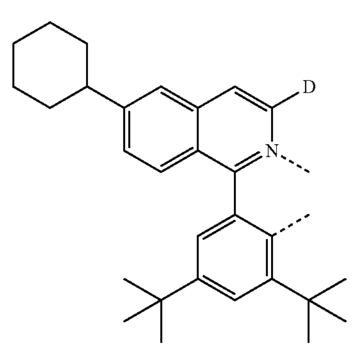

L$_{a381}$
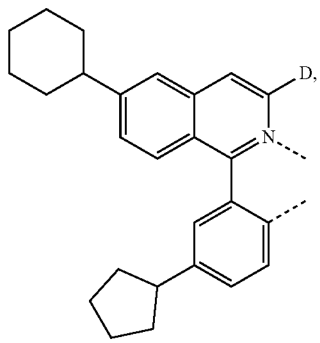
L$_{a382}$
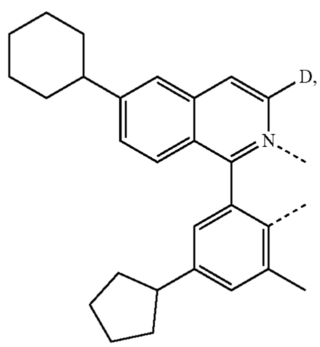
L$_{a383}$
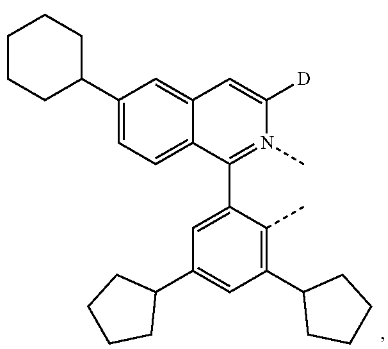
L$_{a384}$
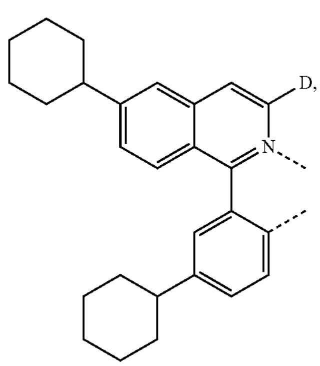
L$_{a385}$
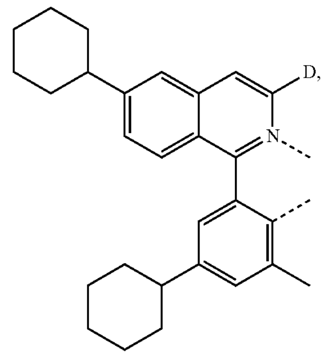
L$_{a386}$
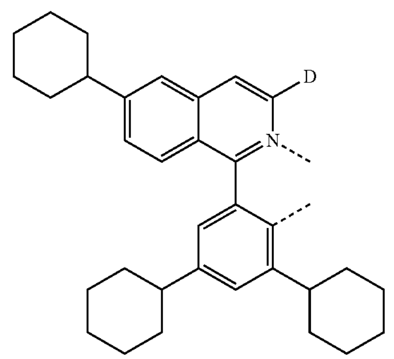
L$_{a387}$
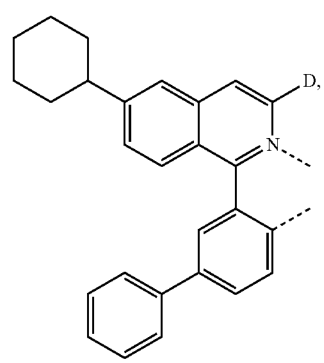
L$_{a388}$
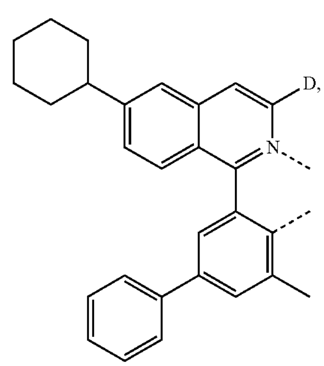

-continued
$L_{a389}$
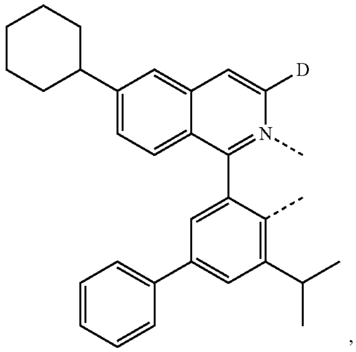
$L_{a390}$
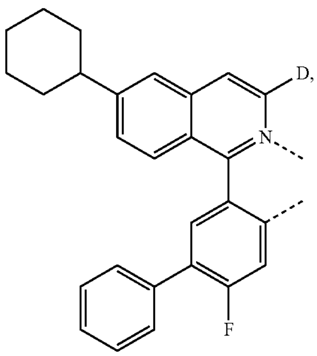
$L_{a391}$
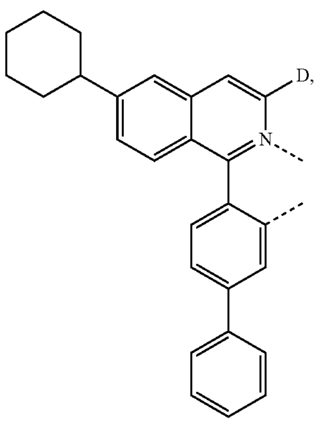
$L_{a392}$
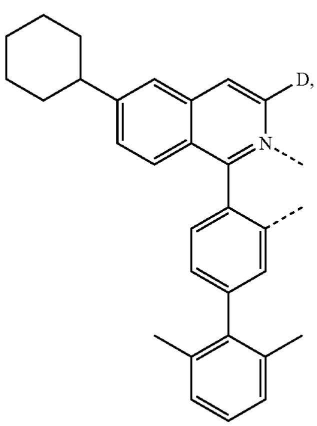
-continued
$L_{a393}$
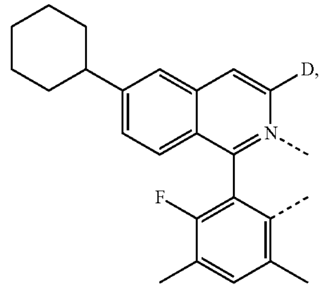
$L_{a394}$
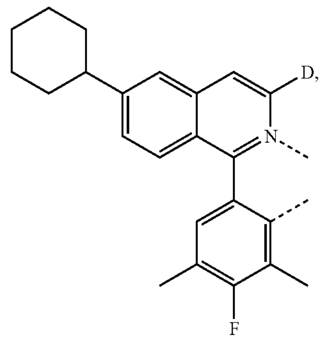
$L_{a395}$
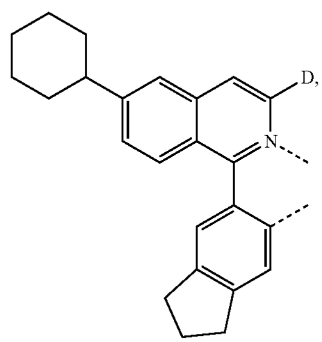
$L_{a396}$
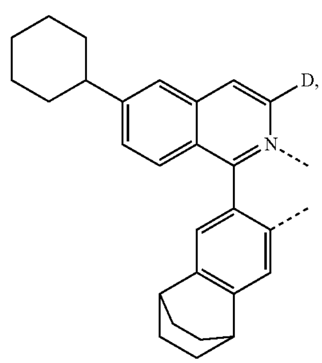

-continued
$L_{a397}$
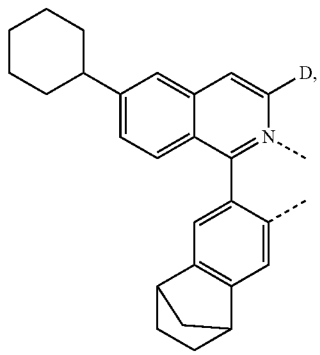
$L_{a398}$
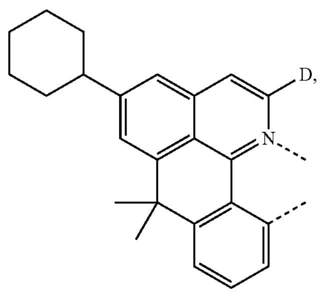
$L_{a399}$
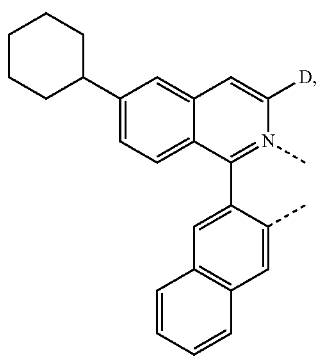
$L_{a400}$
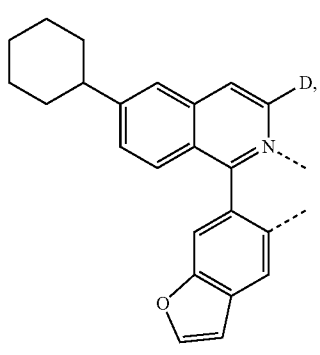
-continued
$L_{a401}$
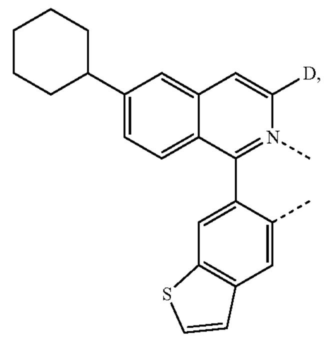
$L_{a402}$
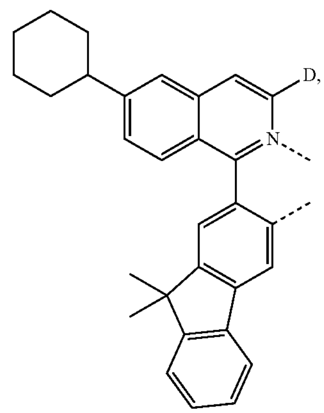
$L_{a403}$
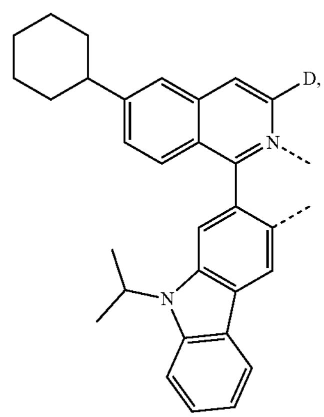
$L_{a404}$
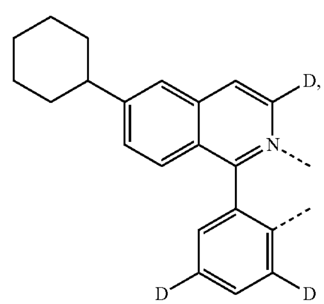

-continued
L$_{a405}$
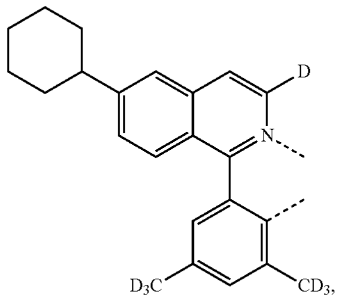
L$_{a406}$
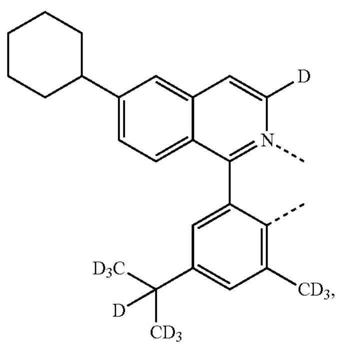
L$_{a407}$
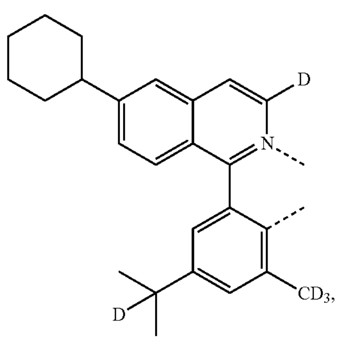
L$_{a408}$
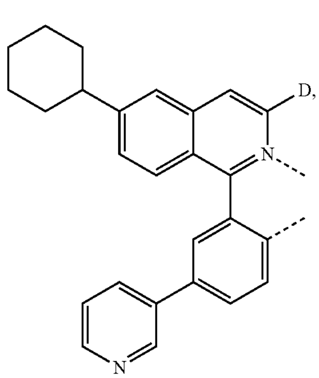
-continued
L$_{a409}$
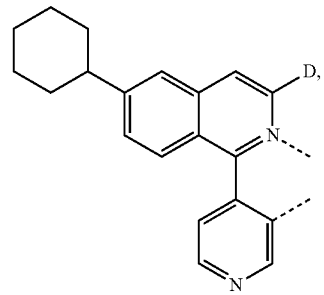
L$_{a410}$
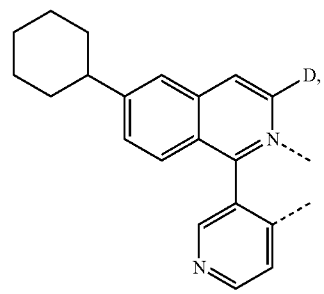
L$_{a411}$
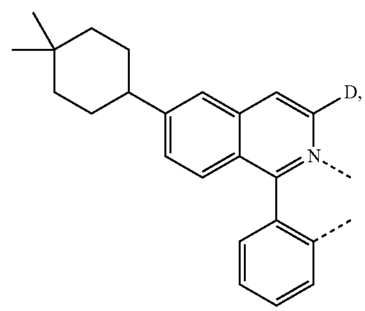
L$_{a412}$
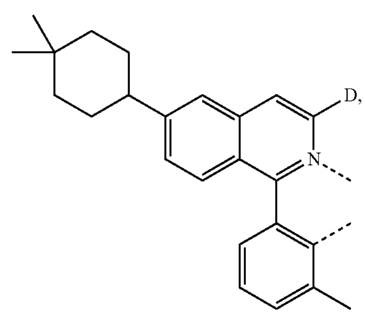
L$_{a413}$
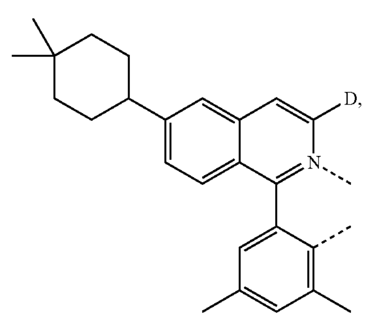

-continued
$L_{a414}$
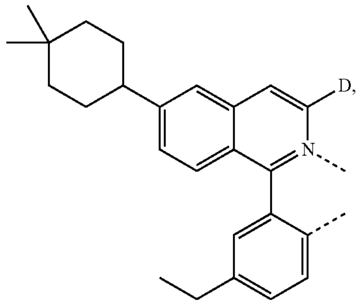
$L_{a415}$
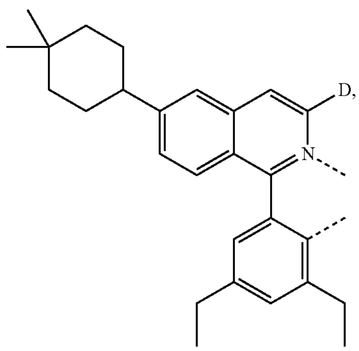
$L_{a416}$
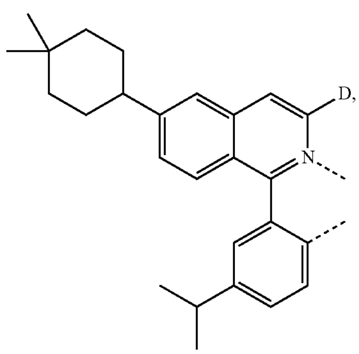
$L_{a417}$
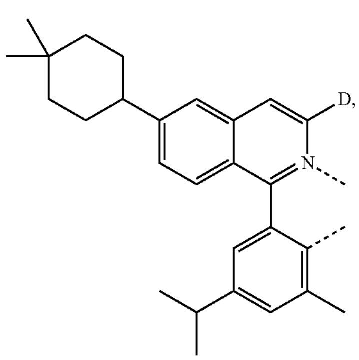
-continued
$L_{a418}$
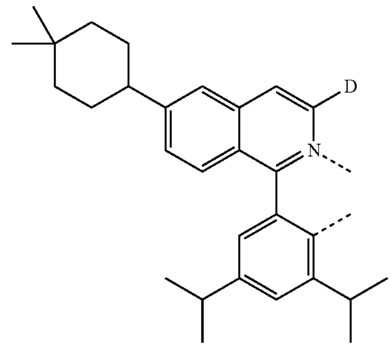
,
$L_{a419}$
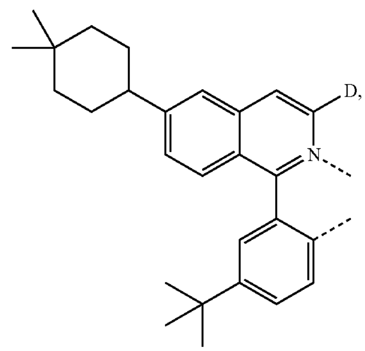
$L_{a420}$
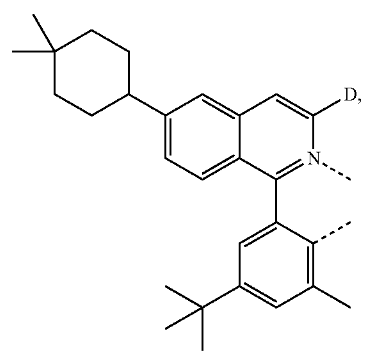
$L_{a421}$
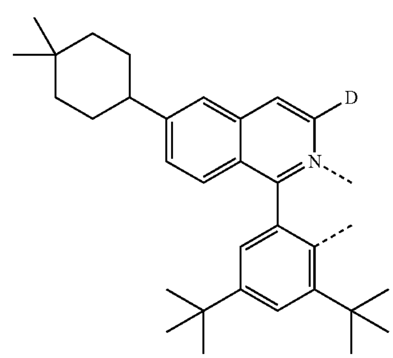
, -continued
$L_{a422}$
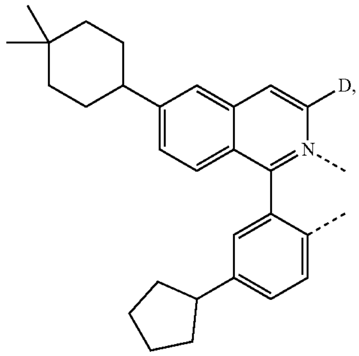
$L_{a423}$
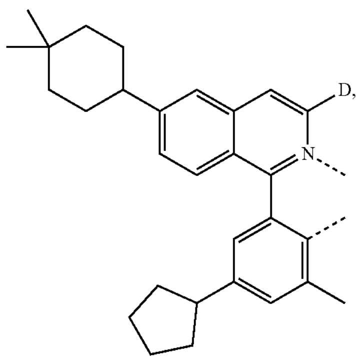
$L_{a424}$
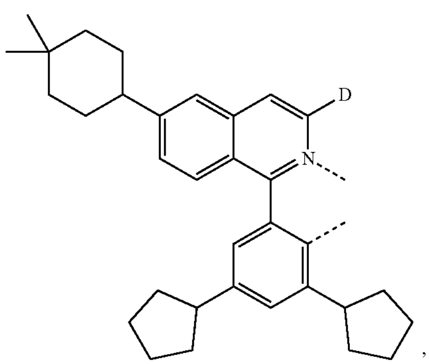
$L_{a425}$
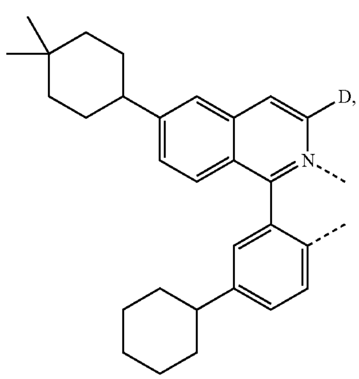
-continued
$L_{a426}$
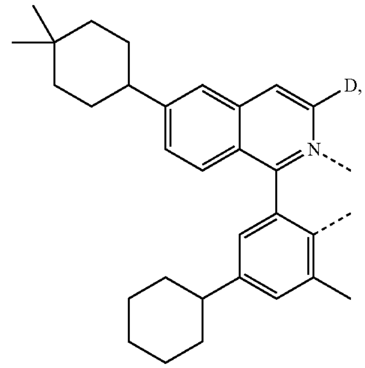
$L_{a427}$
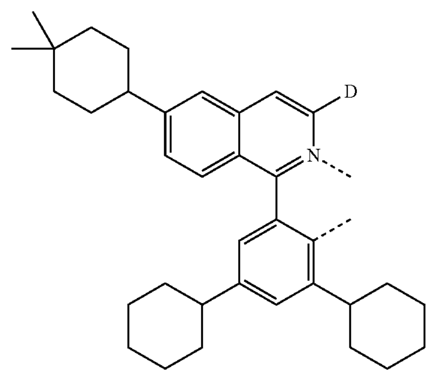
$L_{a428}$
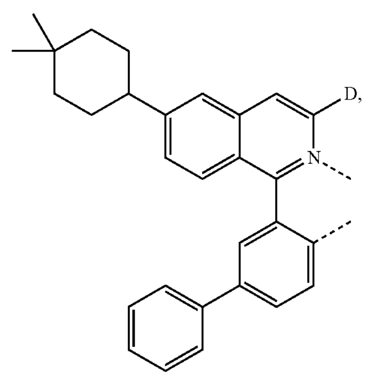
$L_{a429}$
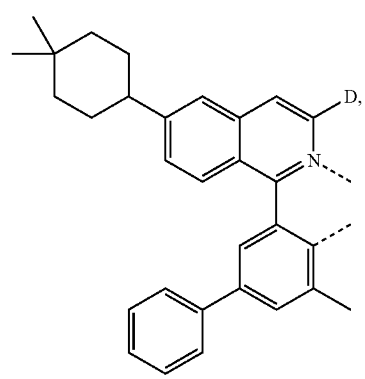

-continued
$L_{a430}$
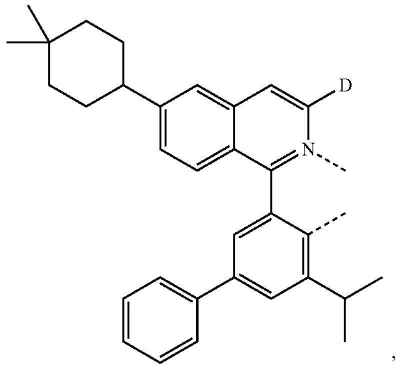
$L_{a431}$
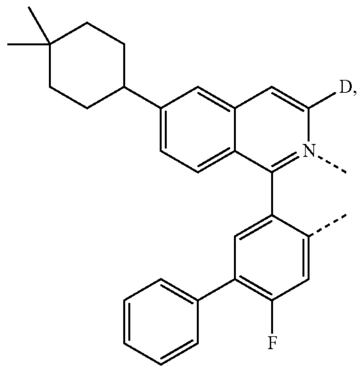
$L_{a432}$
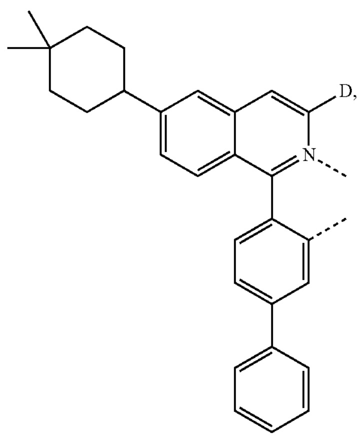
$L_{a433}$
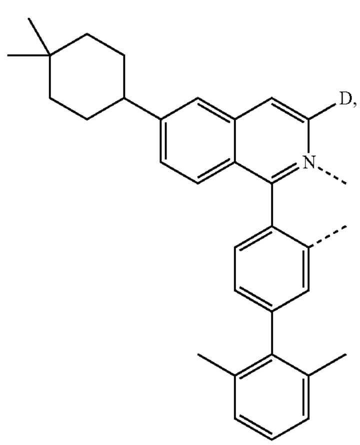
-continued
$L_{a434}$
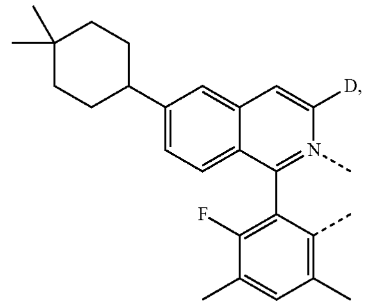
$L_{a435}$
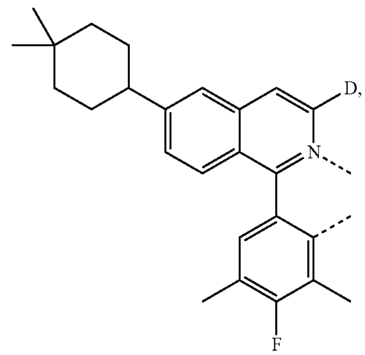
$L_{a436}$
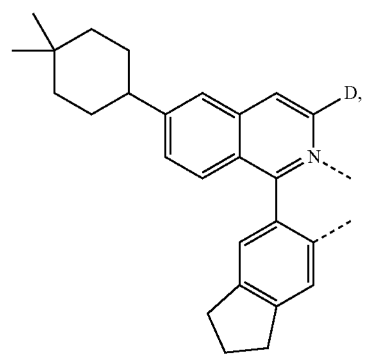
$L_{a437}$
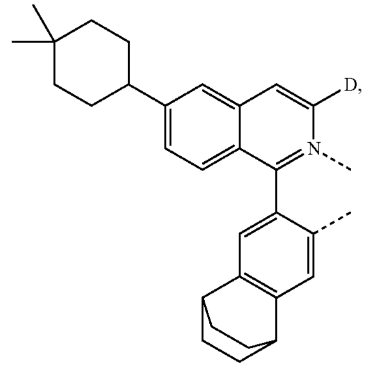

-continued
$L_{a438}$
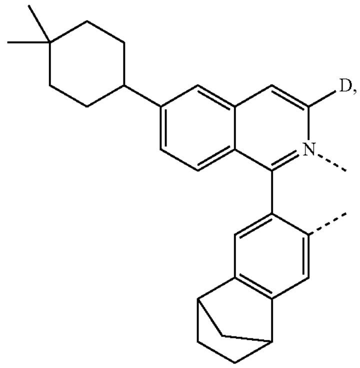
$L_{a439}$
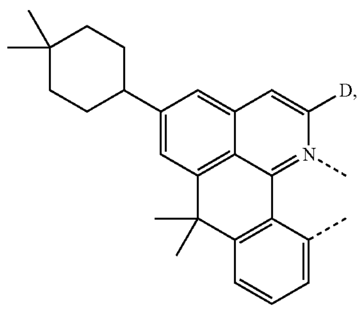
$L_{a440}$
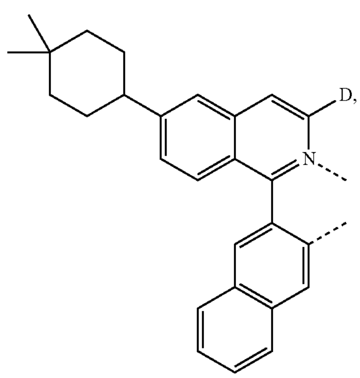
$L_{a441}$
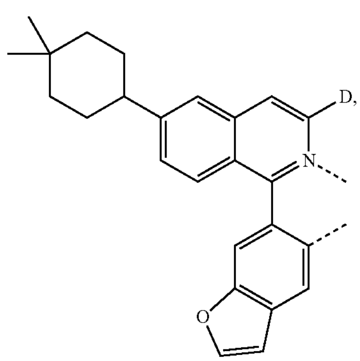
-continued
$L_{a442}$
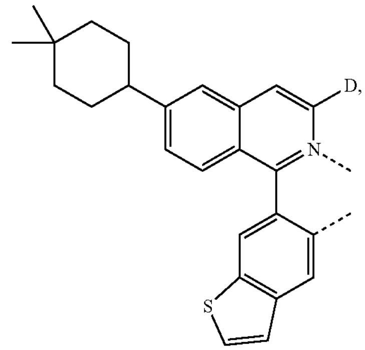
$L_{a443}$
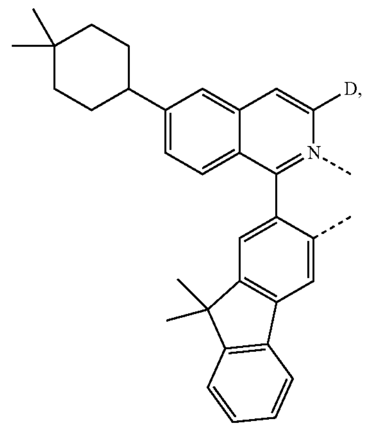
$L_{a444}$
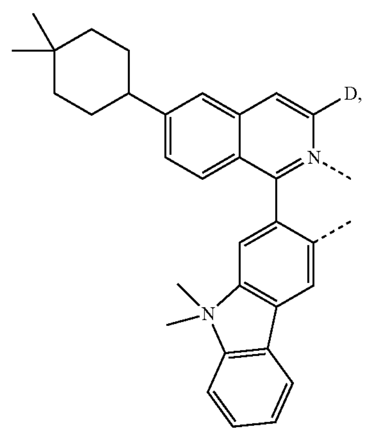
$L_{a445}$
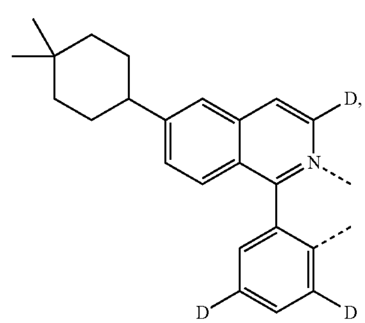

$L_{a446}$
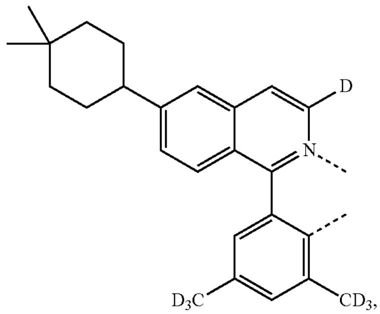
$L_{a447}$
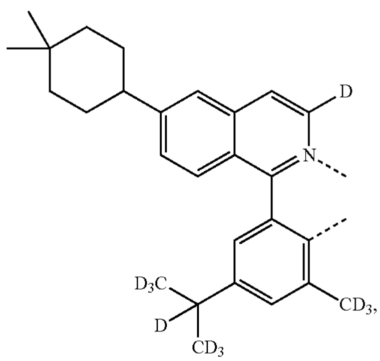
$L_{a448}$
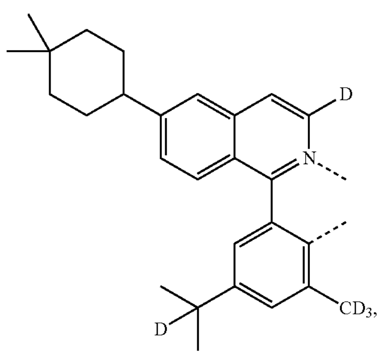
$L_{a449}$
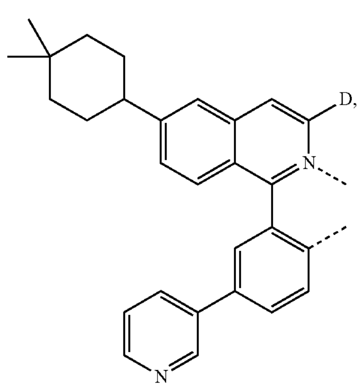
$L_{a450}$
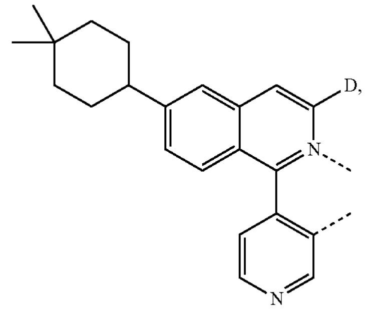
$L_{a451}$
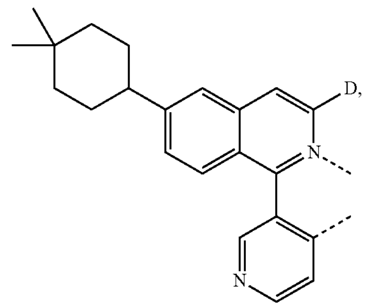
$L_{a452}$
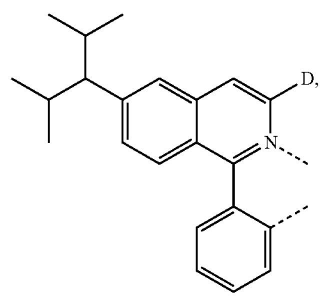
$L_{a453}$
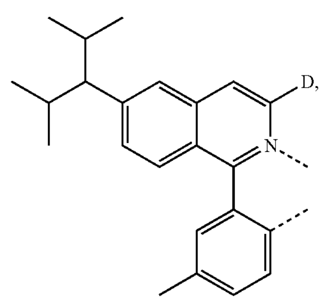
$L_{a454}$
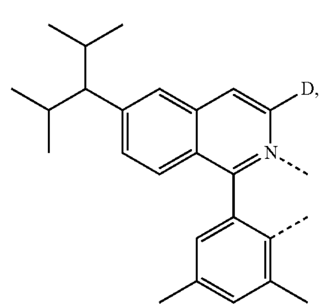

-continued
$L_{a455}$
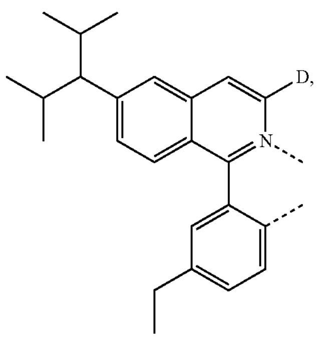
$L_{a456}$
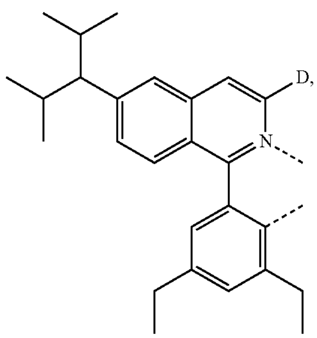
$L_{a457}$
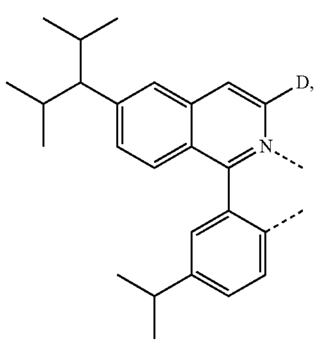
$L_{a458}$
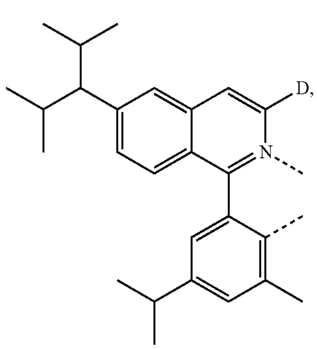
-continued
$L_{a459}$
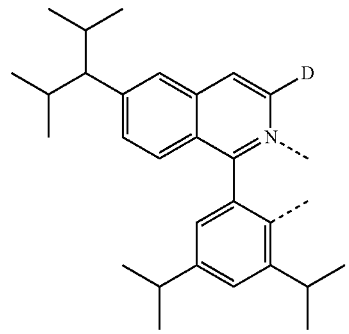
$L_{a460}$
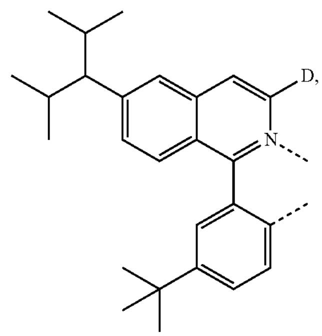
$L_{a461}$
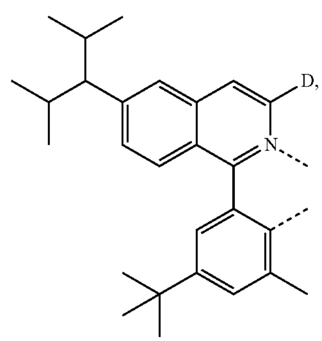
$L_{a462}$
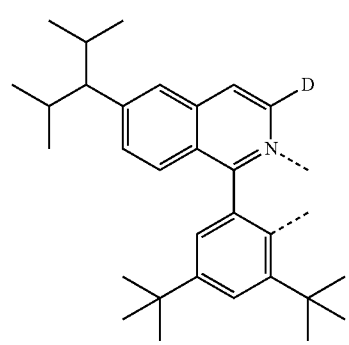

-continued
$L_{a463}$
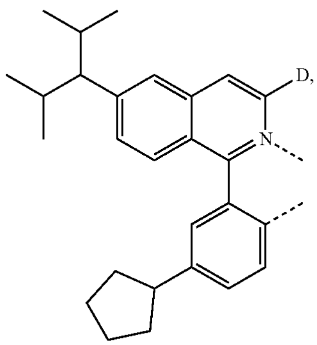
$L_{a464}$
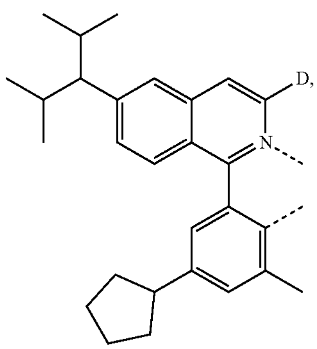
$L_{a465}$
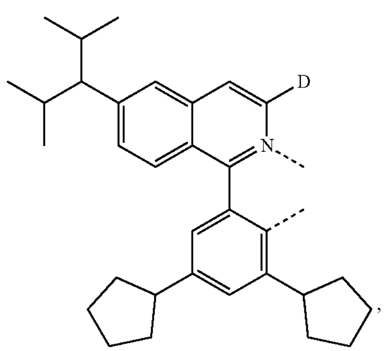
$L_{a466}$
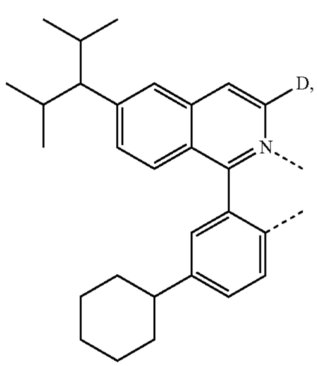
$L_{a467}$
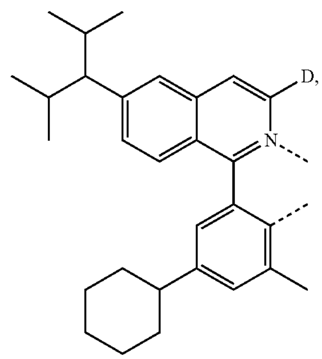
$L_{a468}$
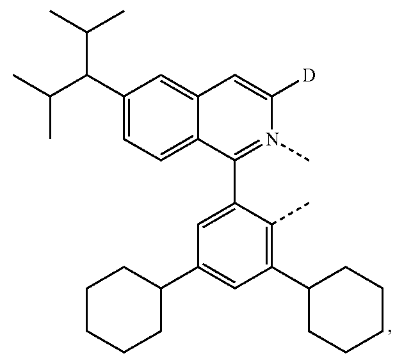
$L_{a469}$
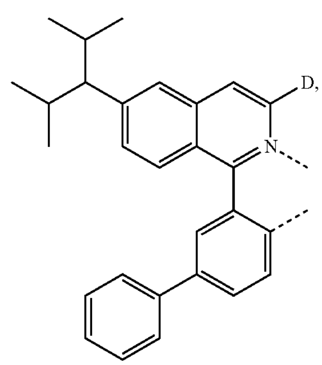
$L_{a470}$
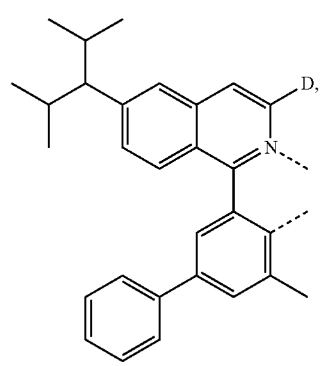

-continued
$L_{a471}$
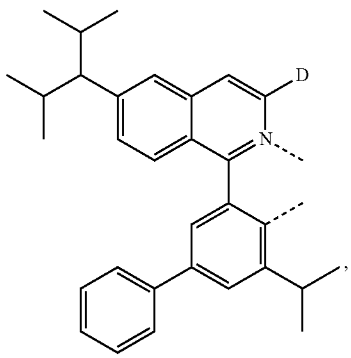
$L_{a472}$
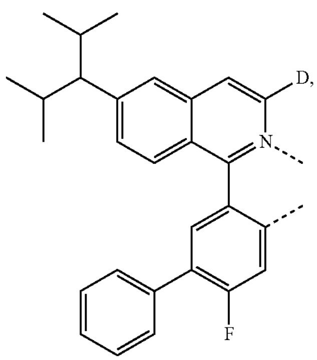
$L_{a473}$
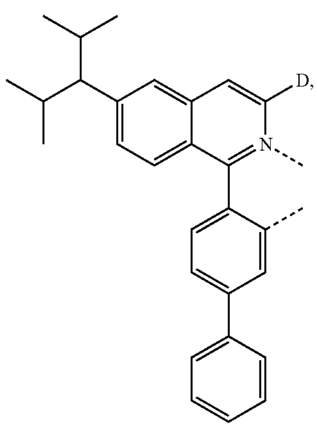
$L_{a474}$
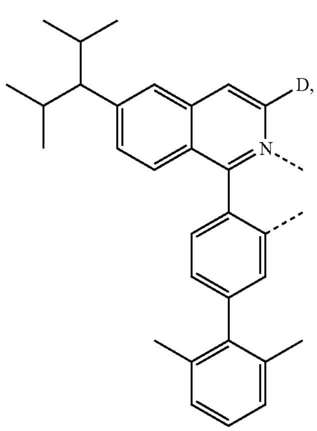
-continued
$L_{a475}$
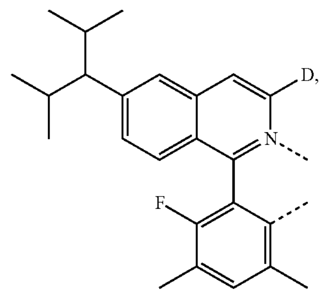
$L_{a476}$
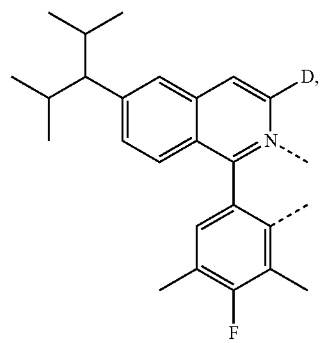
$L_{a477}$
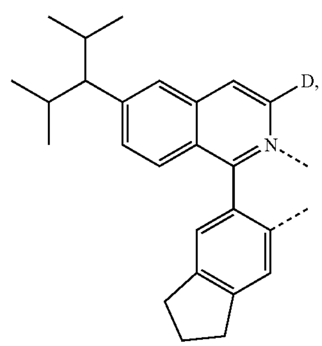
$L_{a478}$
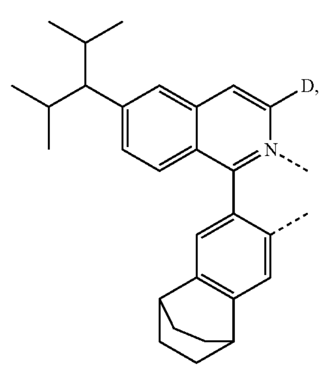

$L_{a479}$
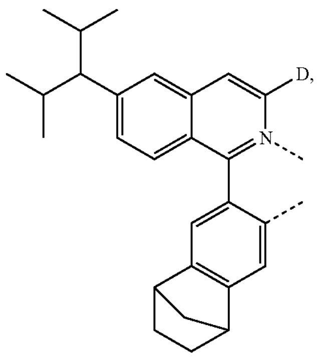
$L_{a480}$
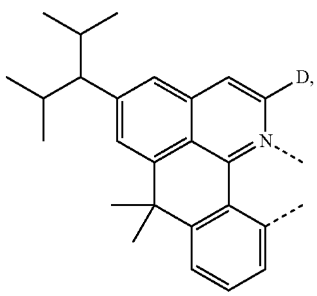
$L_{a481}$
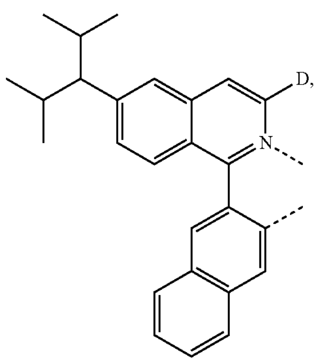
$L_{a482}$
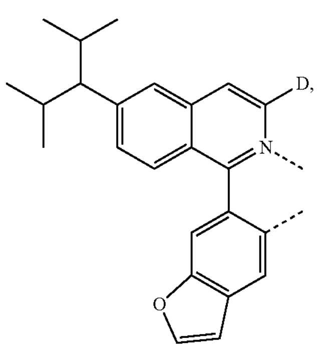
$L_{a483}$
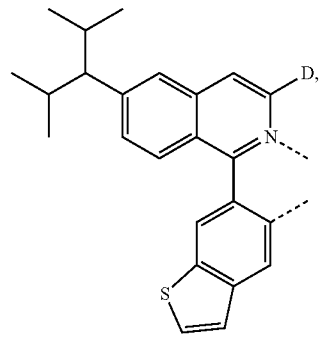
$L_{a484}$
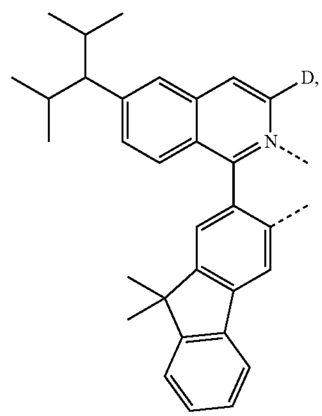
$L_{a485}$
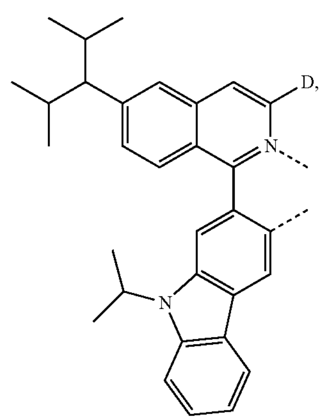
$L_{a486}$
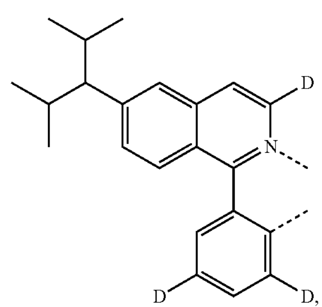

-continued
$L_{a487}$
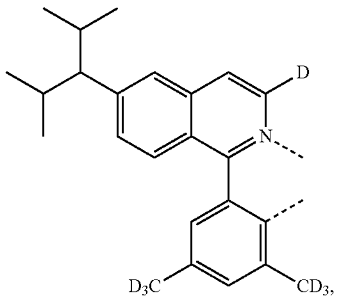
$L_{a488}$
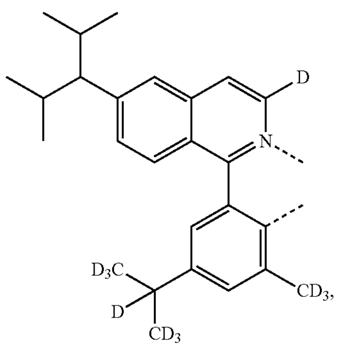
$L_{a489}$
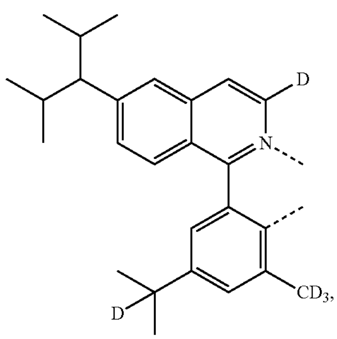
$L_{a490}$
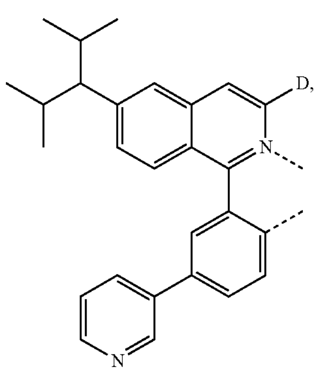
-continued
$L_{a491}$
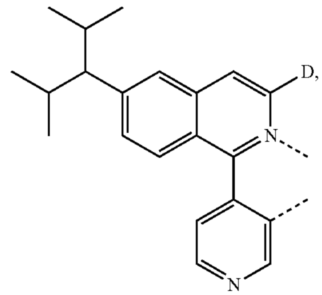
$L_{a492}$
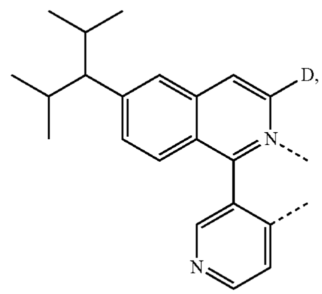
$L_{a493}$
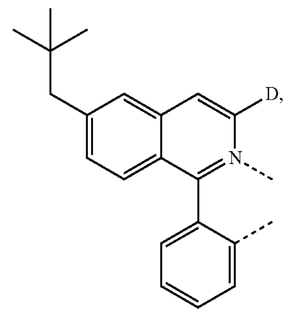
$L_{a494}$
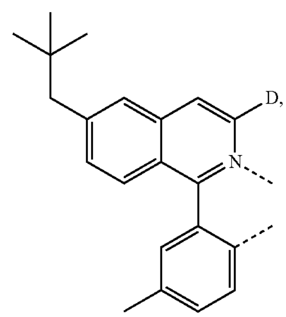
$L_{a495}$
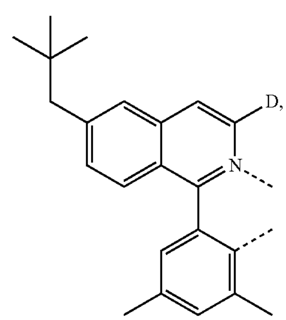

-continued
$L_{a496}$
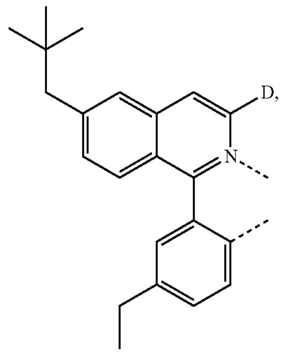
$L_{a497}$
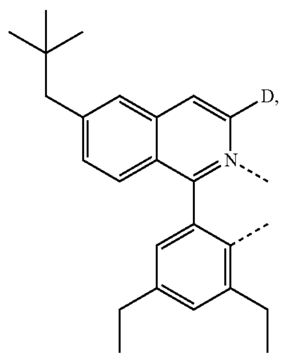
$L_{a498}$
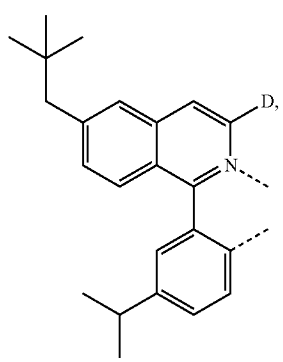
$L_{a499}$
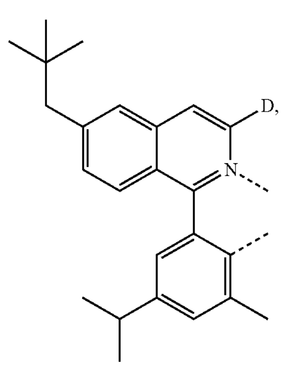
-continued
$L_{a500}$
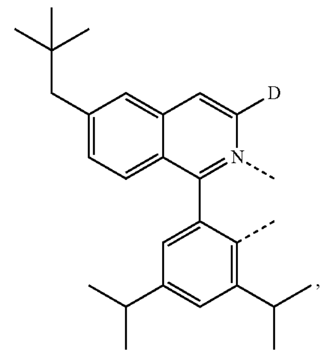
$L_{a501}$
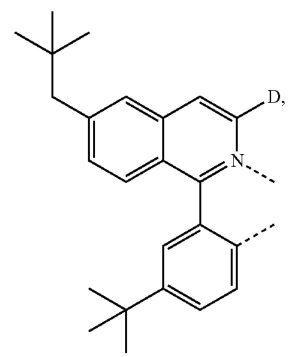
$L_{a502}$
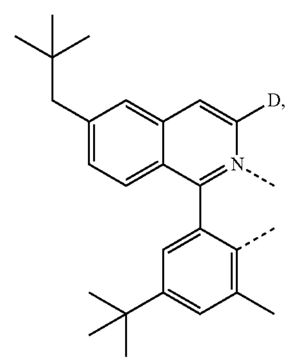
$L_{a503}$
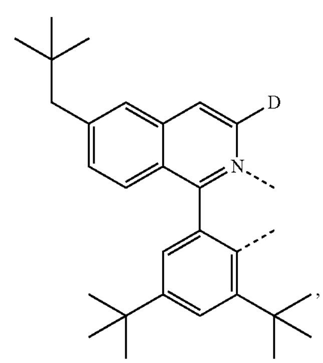

-continued
$L_{a504}$
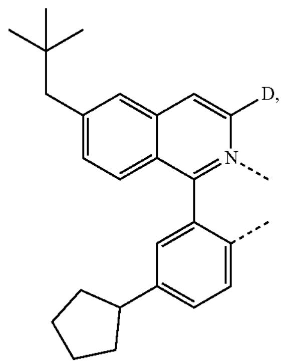
$L_{a505}$
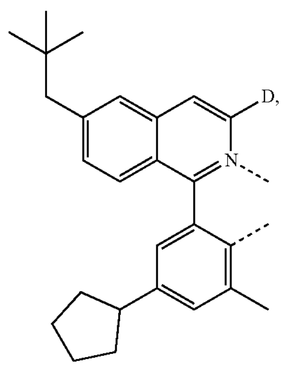
$L_{a506}$
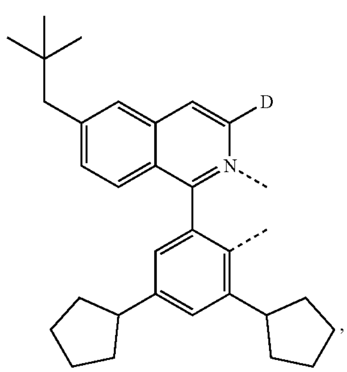
$L_{a507}$
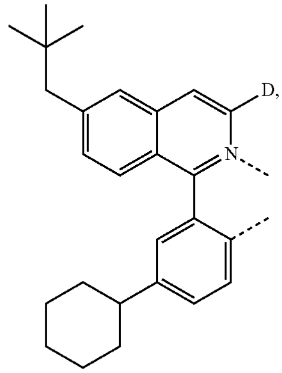
-continued
$L_{a508}$
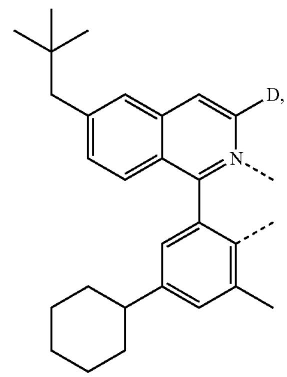
$L_{a509}$
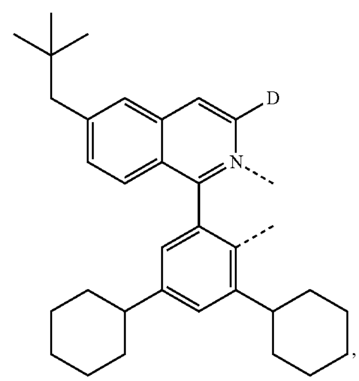
$L_{a510}$
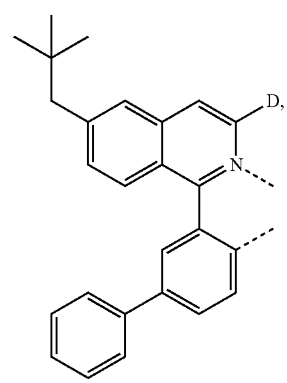
$L_{a511}$
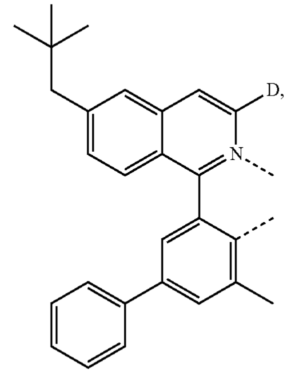

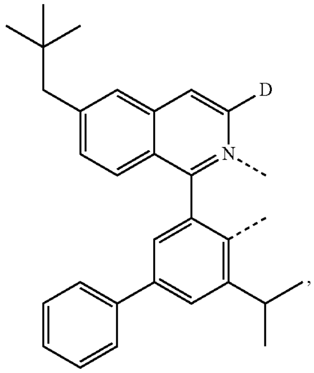
$L_{a512}$
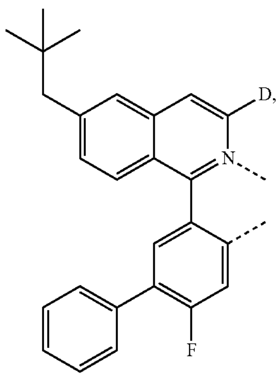
$L_{a513}$
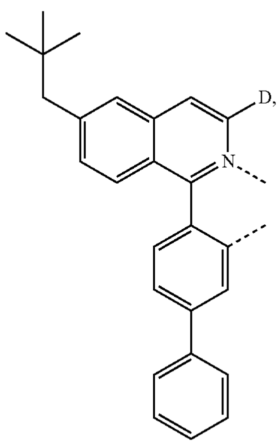
$L_{a514}$
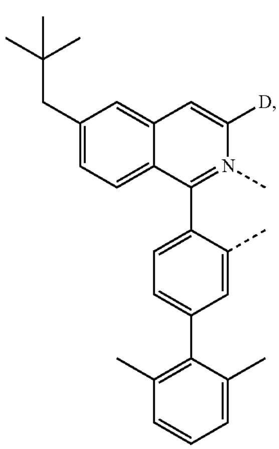
$L_{a515}$
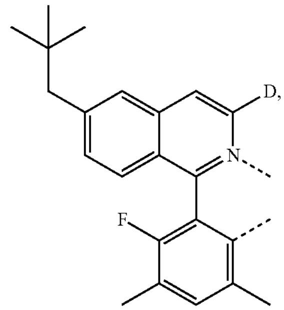
$L_{a516}$
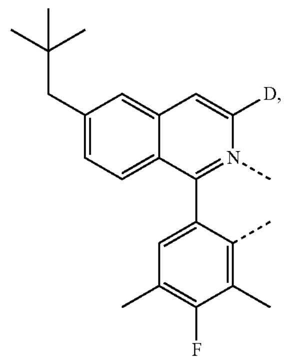
$L_{a517}$
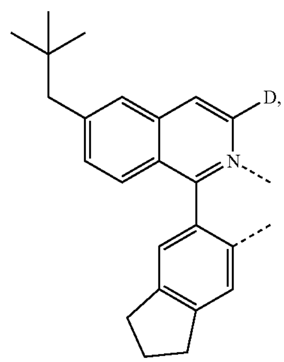
$L_{a518}$
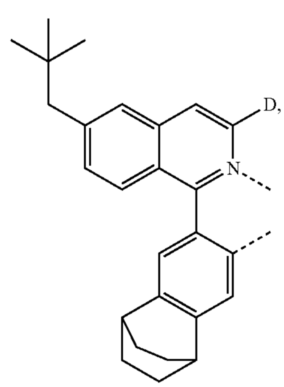
$L_{a519}$ -continued
$L_{a520}$
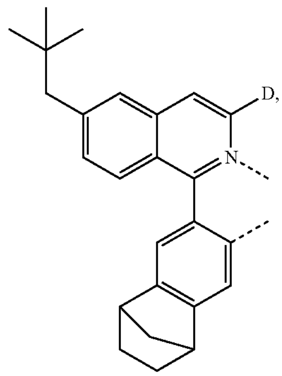
$L_{a521}$
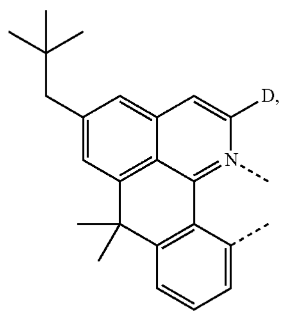
$L_{a522}$
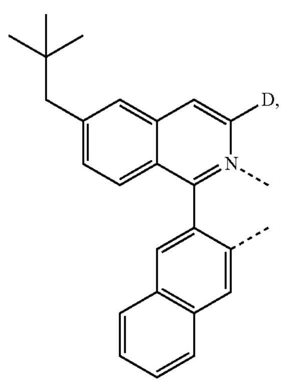
$L_{a523}$
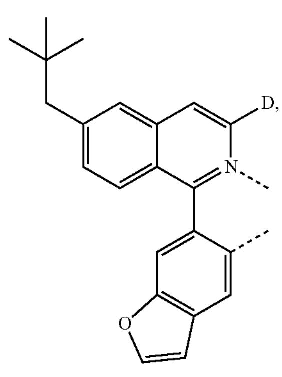
-continued
$L_{a524}$
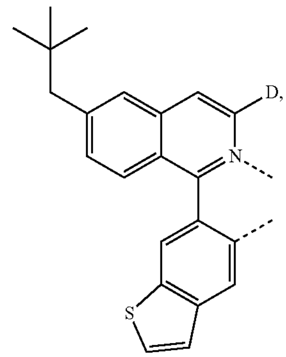
$L_{a525}$
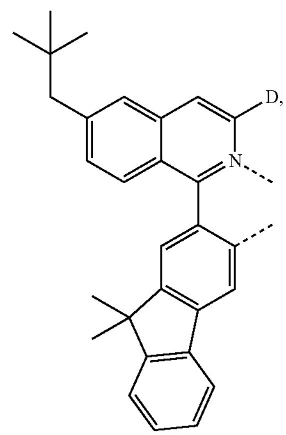
$L_{a526}$
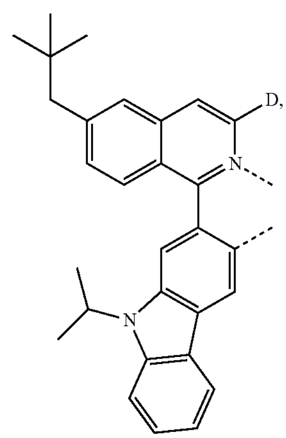
$L_{a527}$
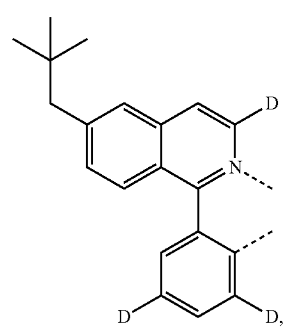

$L_{a528}$
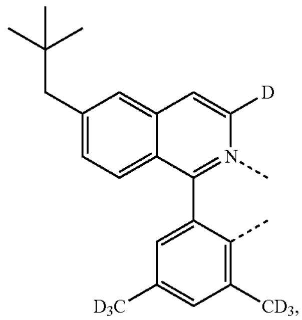
$L_{a529}$
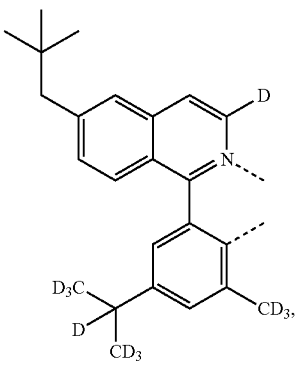
$L_{a530}$
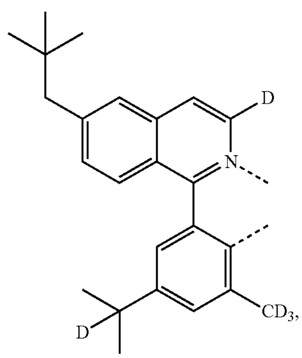
$L_{a531}$
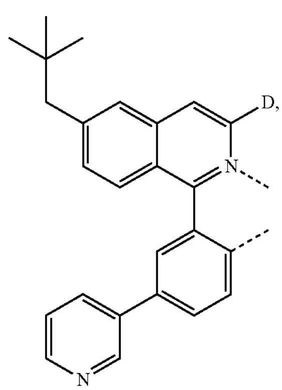
$L_{a532}$
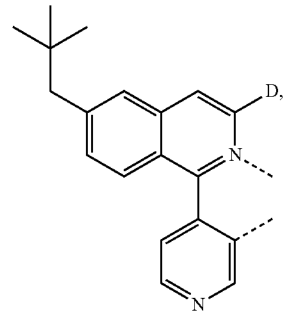
$L_{a533}$
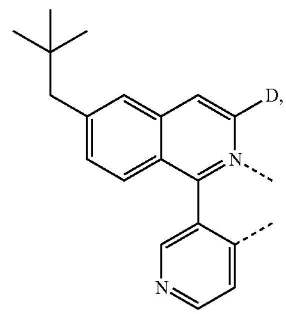
$L_{a534}$
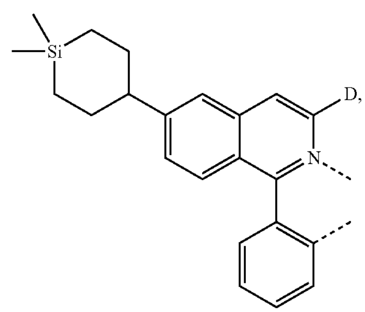
$L_{a535}$
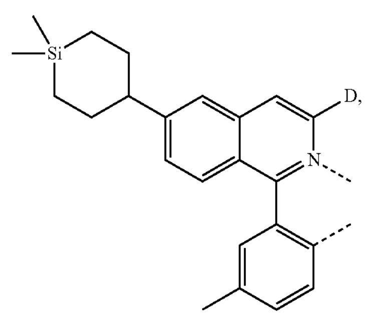
$L_{a536}$
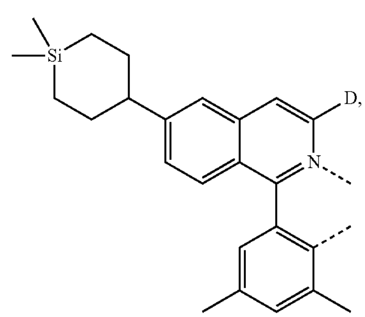

-continued
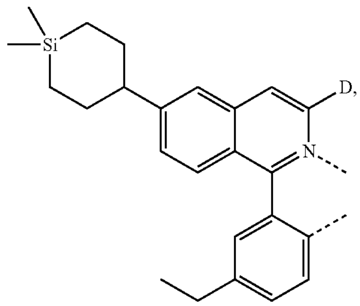
$L_{a537}$
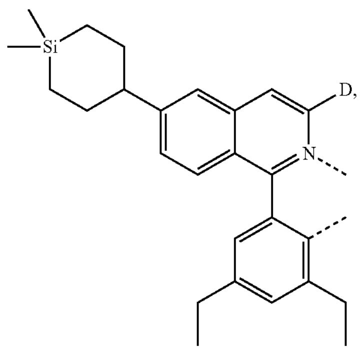
$L_{a538}$
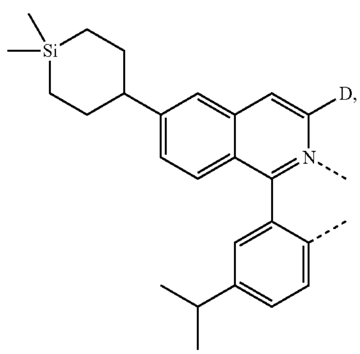
$L_{a539}$
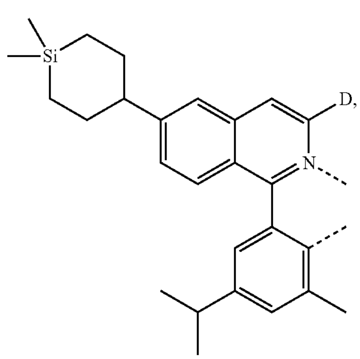
$L_{a540}$
-continued
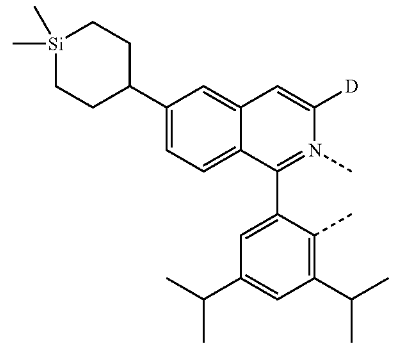
$L_{a541}$
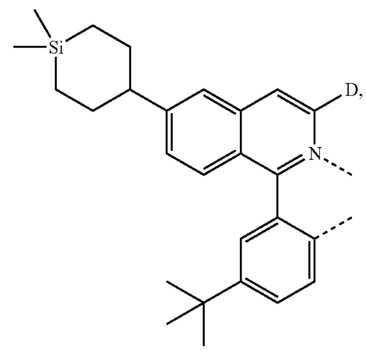
$L_{a542}$
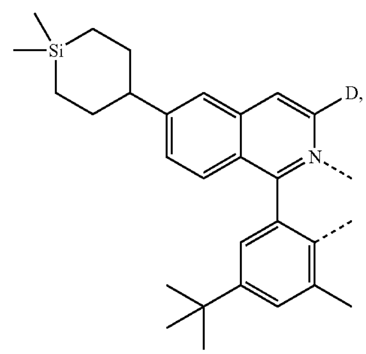
$L_{a543}$
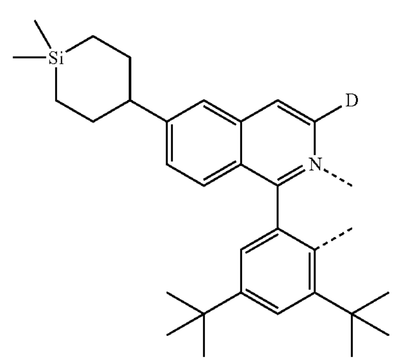
$L_{a544}$ $L_{a545}$
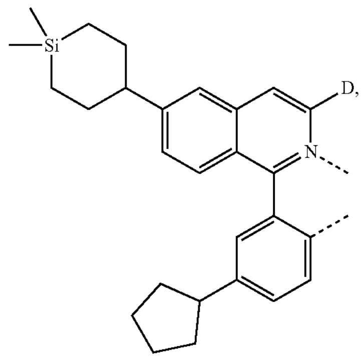
$L_{a546}$
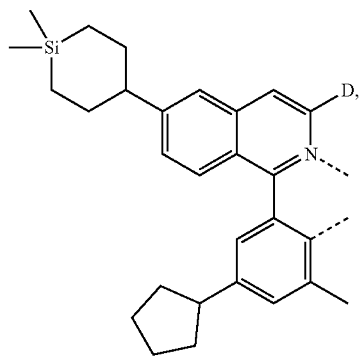
$L_{a547}$
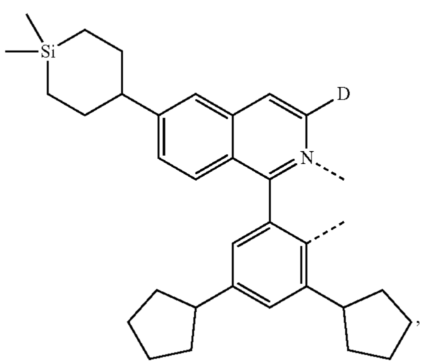
$L_{a548}$
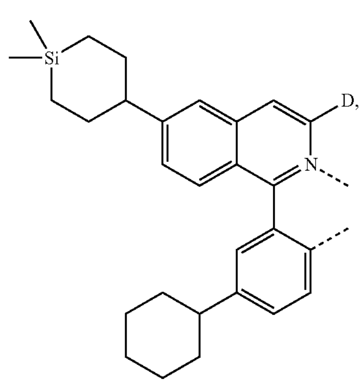
$L_{a549}$
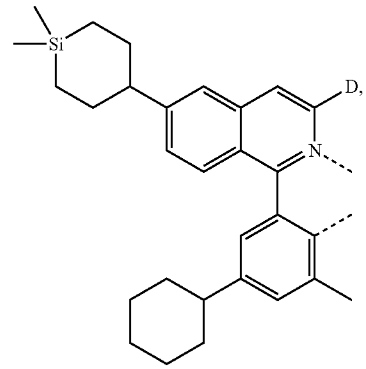
$L_{a550}$
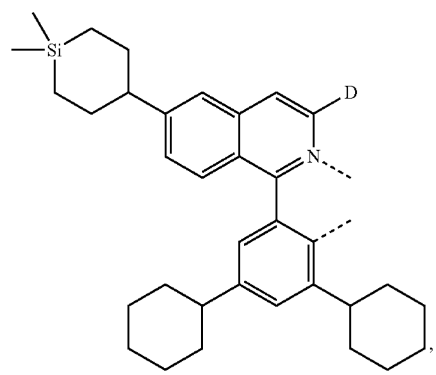
$L_{a551}$
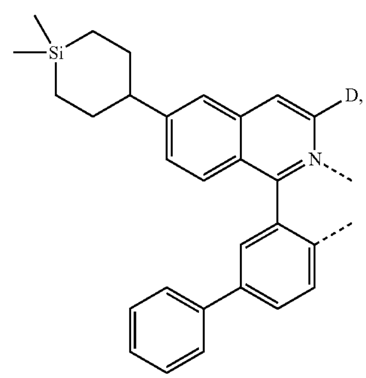
$L_{a552}$
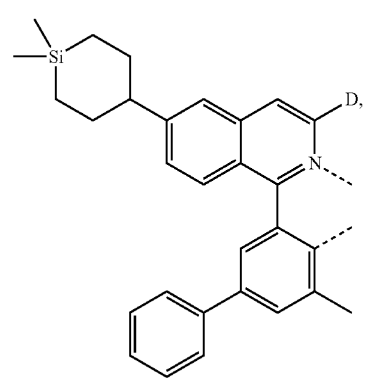

-continued
$L_{a553}$
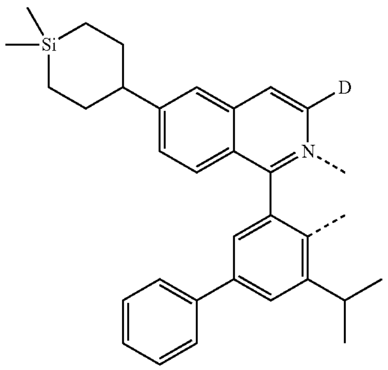
$L_{a554}$
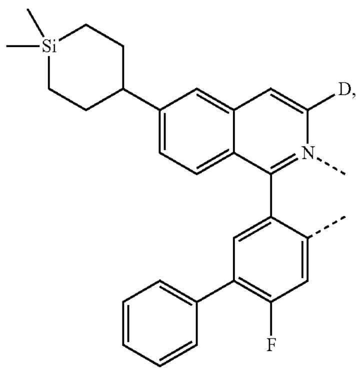
$L_{a555}$
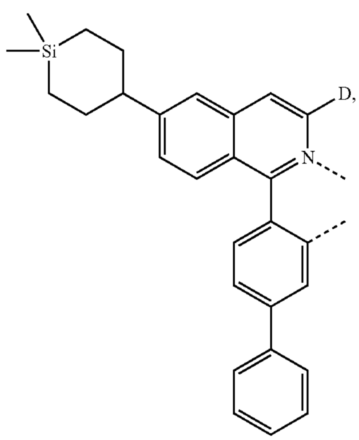
$L_{a556}$
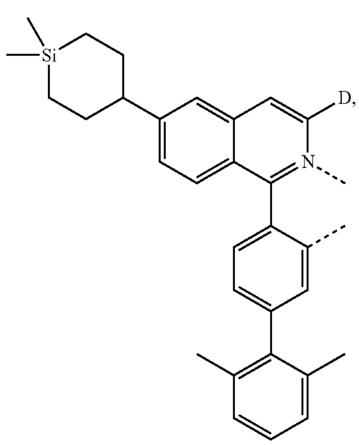
-continued
$L_{a557}$
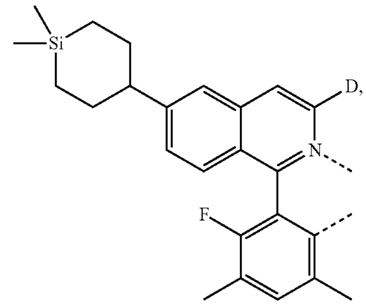
$L_{a558}$
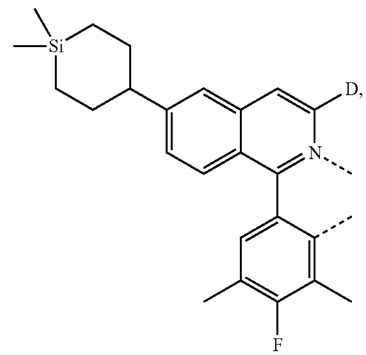
$L_{a559}$
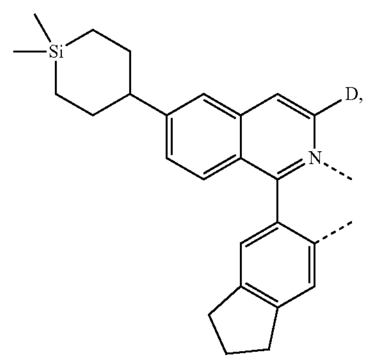
$L_{a560}$
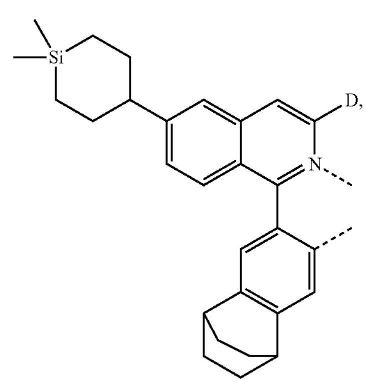

-continued
$L_{a561}$
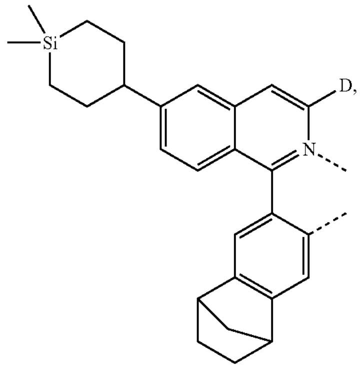
$L_{a562}$
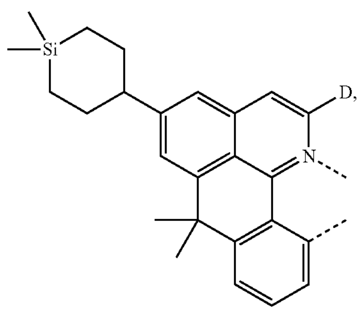
$L_{a563}$
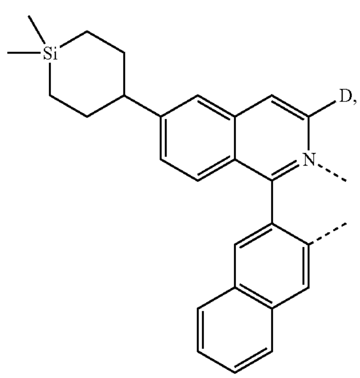
$L_{a564}$
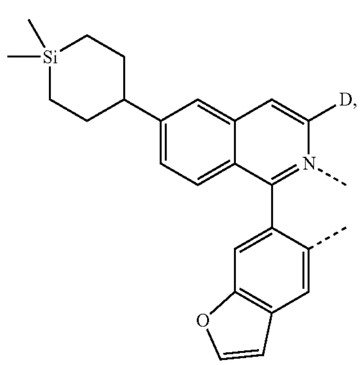
-continued
$L_{a565}$
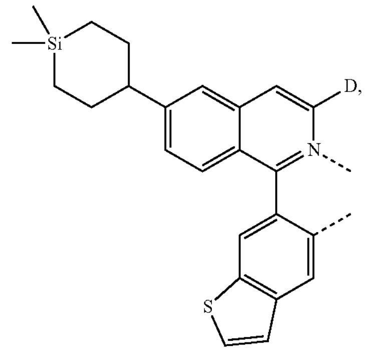
$L_{a566}$
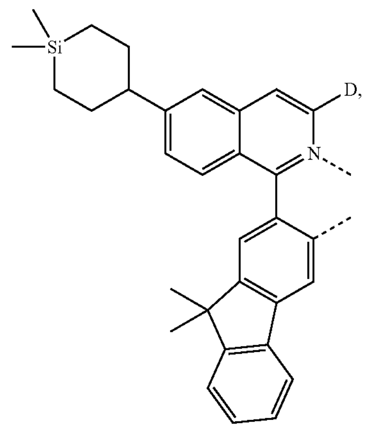
$L_{a567}$
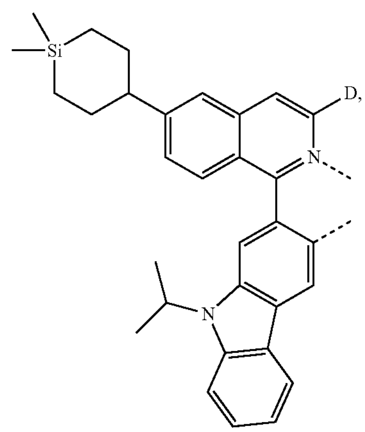
$L_{a568}$
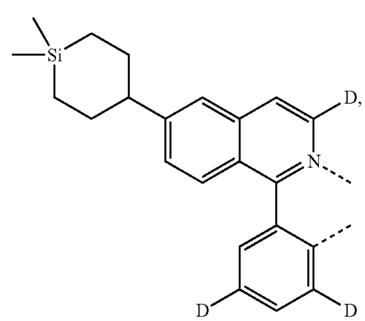

-continued
$L_{a569}$
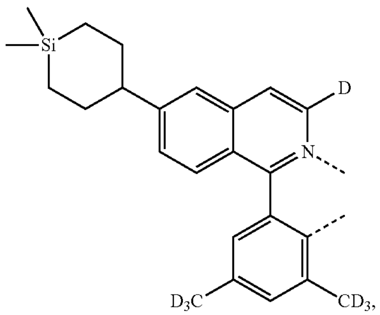
$L_{a570}$
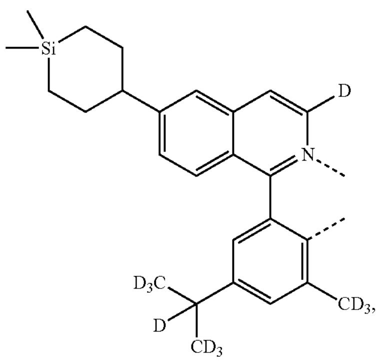
$L_{a571}$
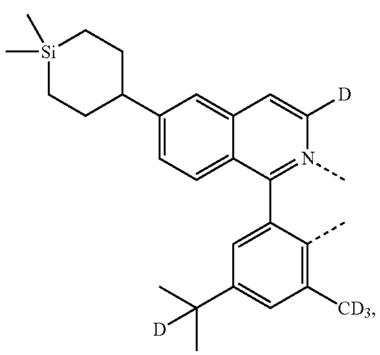
$L_{a572}$
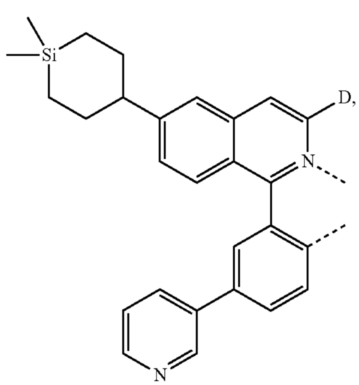
-continued
$L_{a573}$
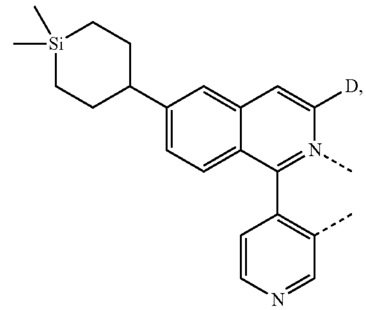
$L_{a574}$
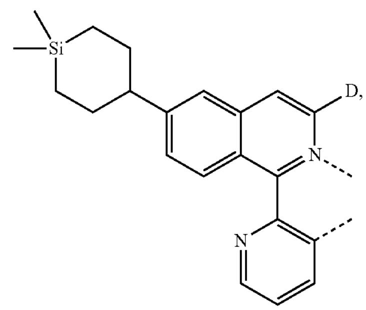
$L_{a575}$
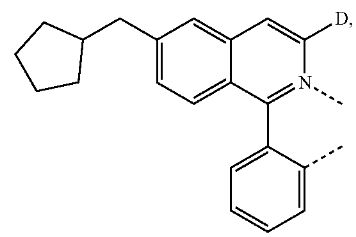
$L_{a576}$
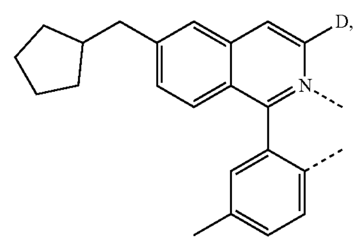
$L_{a577}$
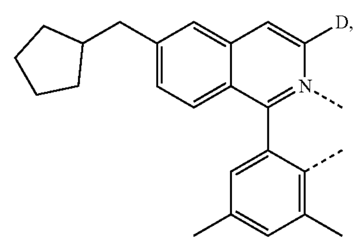
$L_{a578}$
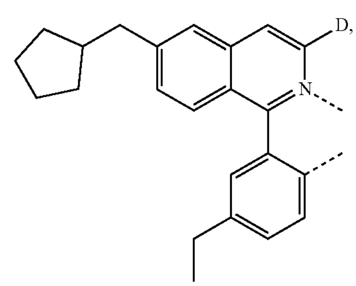

-continued
$L_{a579}$
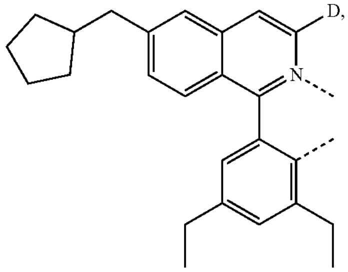
$L_{a580}$
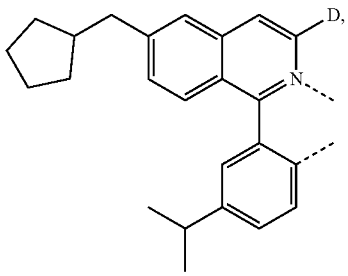
$L_{a581}$
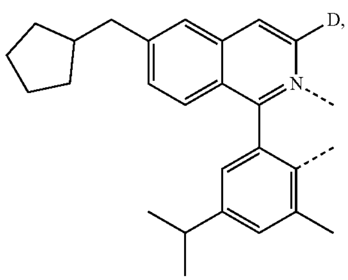
$L_{a582}$
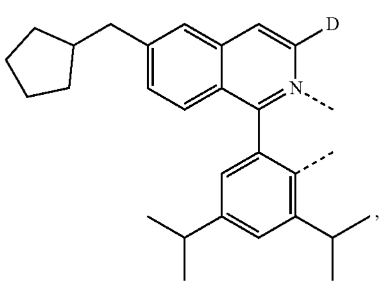
$L_{a583}$
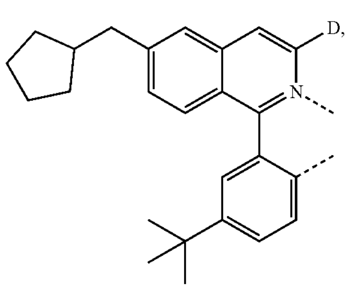
-continued
$L_{a584}$
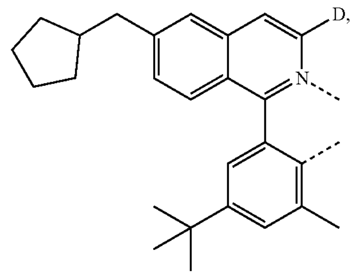
$L_{a585}$
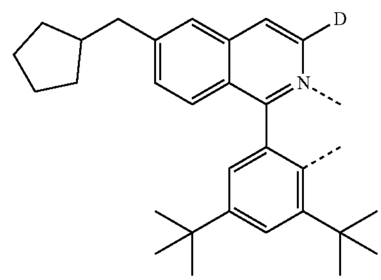
$L_{a586}$
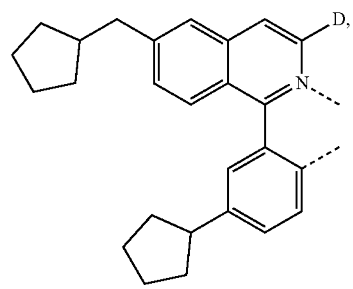
$L_{a587}$
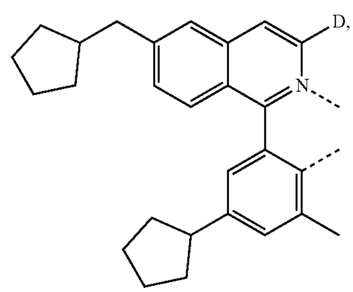
$L_{a588}$
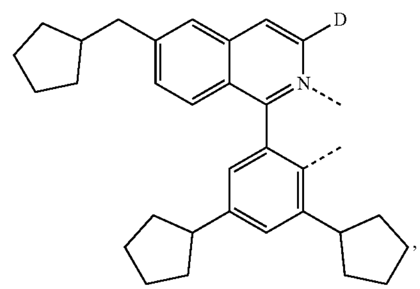

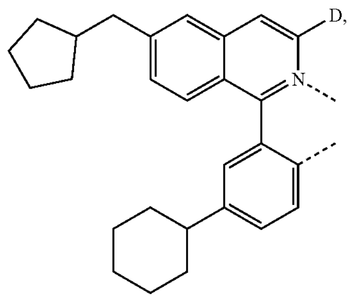
$L_{a589}$
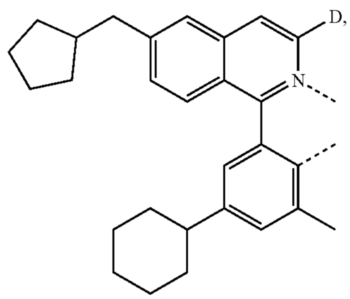
$L_{a590}$
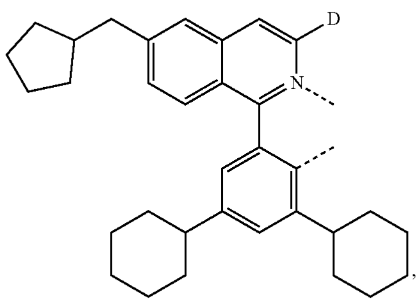
$L_{a591}$
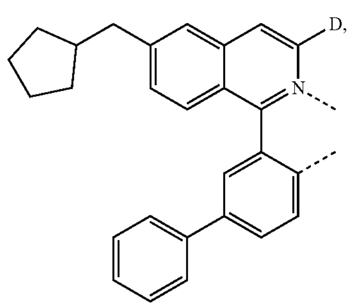
$L_{a592}$
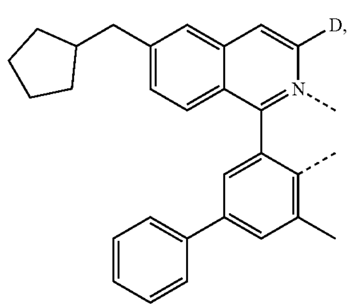
$L_{a593}$
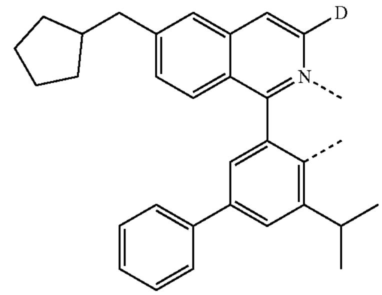
$L_{a594}$
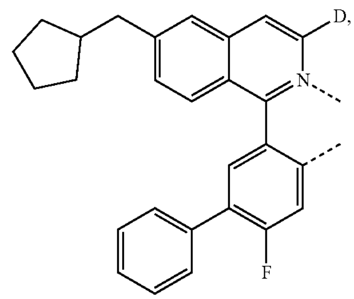
$L_{a595}$
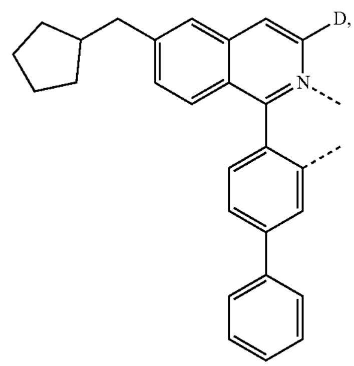
$L_{a596}$
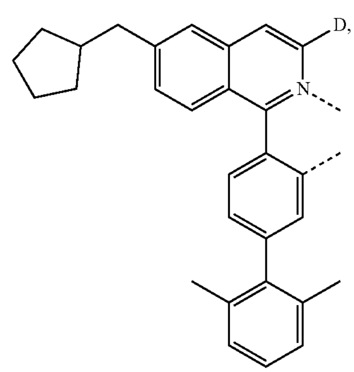
$L_{a597}$
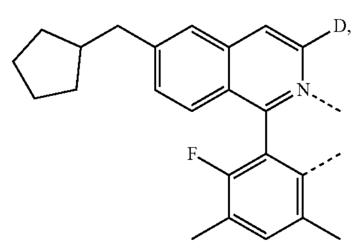
$L_{a598}$

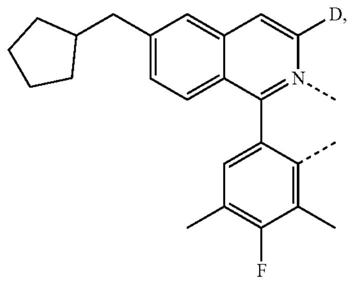
$L_{a599}$
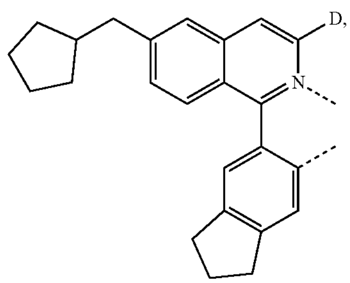
$L_{a600}$
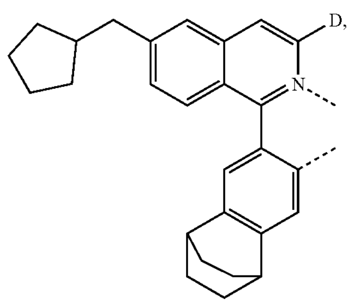
$L_{a601}$
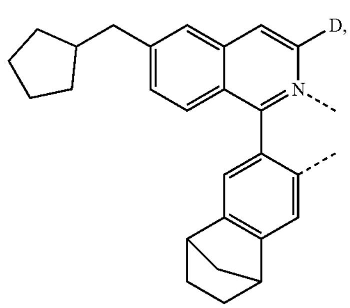
$L_{a602}$
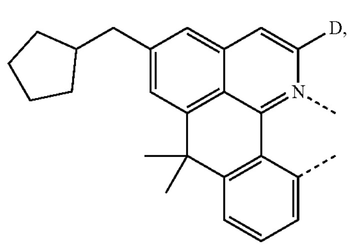
$L_{a603}$
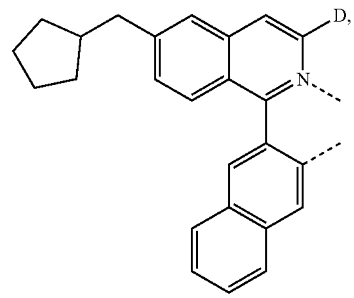
$L_{a604}$
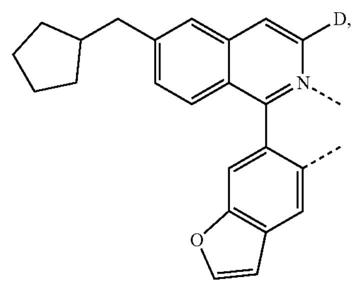
$L_{a605}$
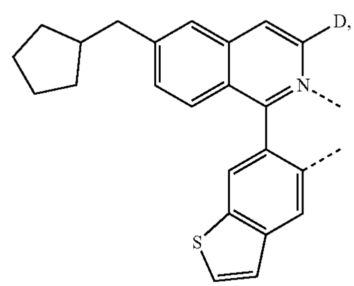
$L_{a606}$
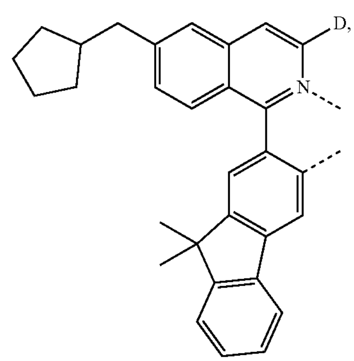
$L_{a607}$
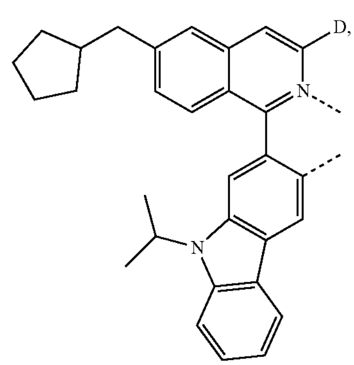
$L_{a608}$ -continued
$L_{a609}$
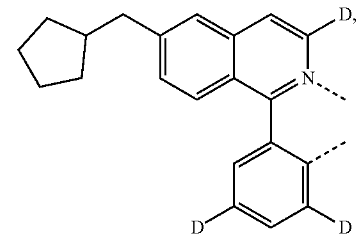
$L_{a610}$
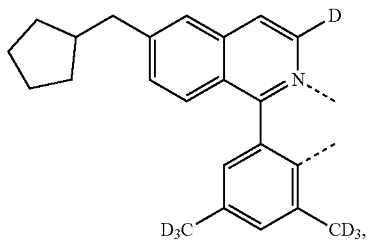
$L_{a611}$
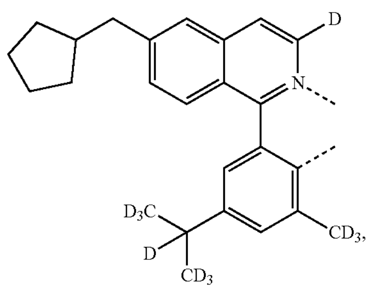
$L_{a612}$
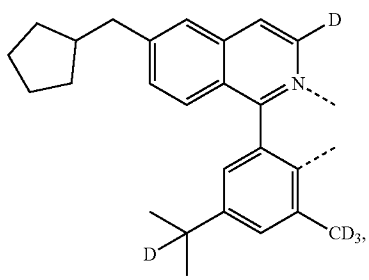
$L_{a613}$
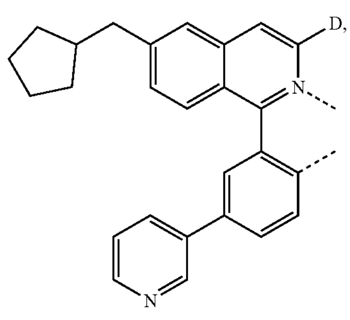
$L_{a614}$
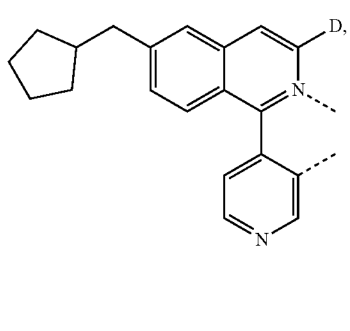
-continued
$L_{a615}$
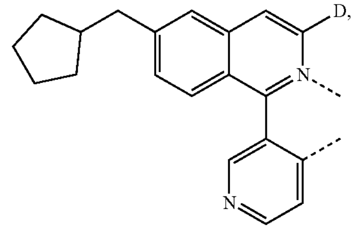
$L_{a616}$
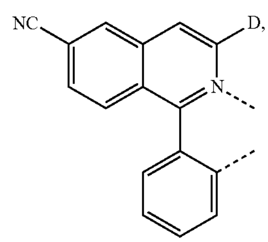
$L_{a617}$
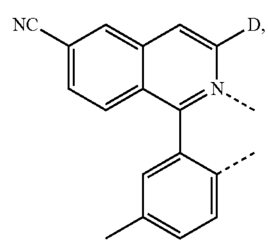
$L_{a618}$
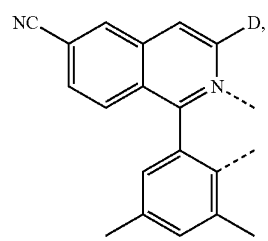
$L_{a619}$
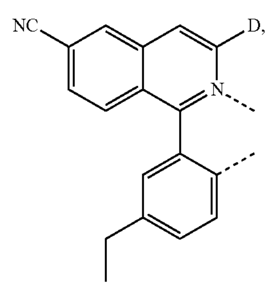
$L_{a620}$
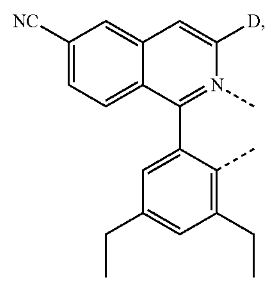

-continued
$L_{a621}$
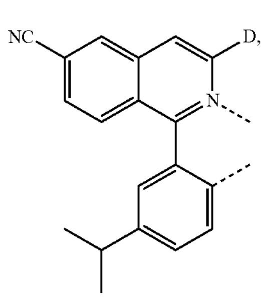
$L_{a622}$
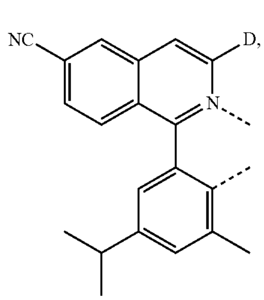
$L_{a623}$
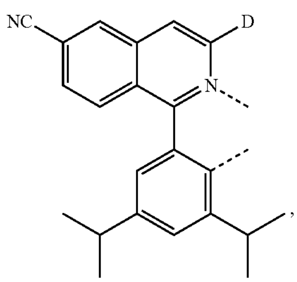
$L_{a624}$
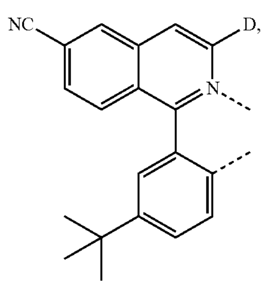
$L_{a625}$
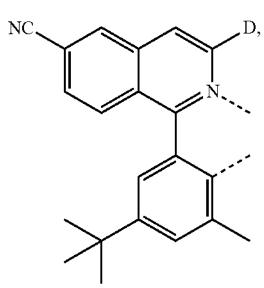
-continued
$L_{a626}$
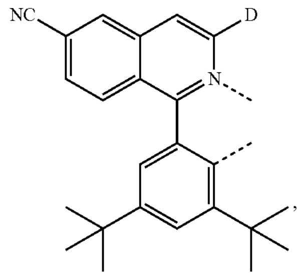
$L_{a627}$
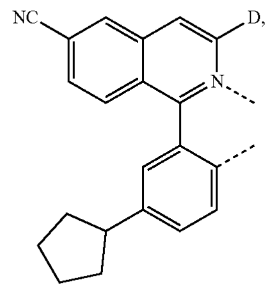
$L_{a628}$
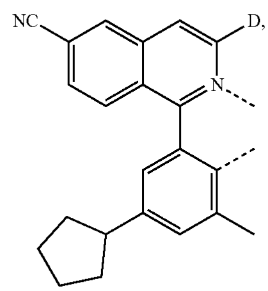
$L_{a629}$
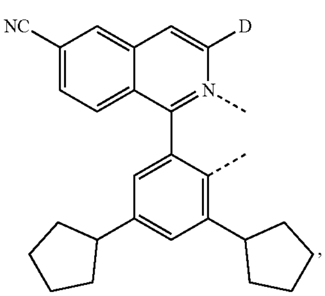
$L_{a630}$
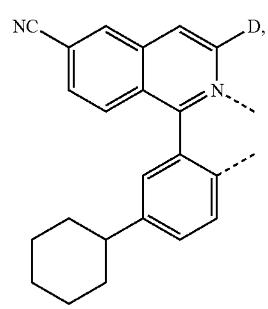

-continued
$L_{a631}$
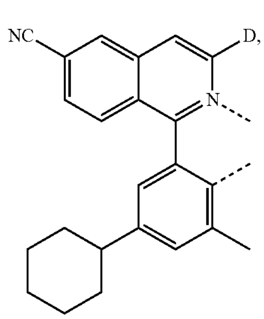
$L_{a632}$
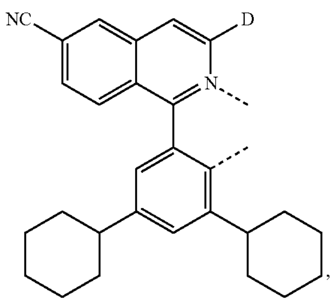
$L_{a633}$
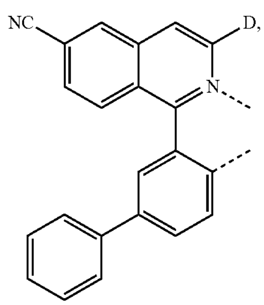
$L_{a634}$
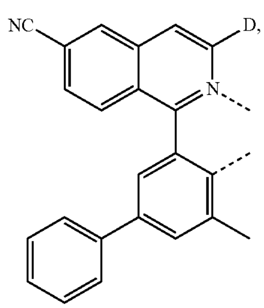
$L_{a635}$
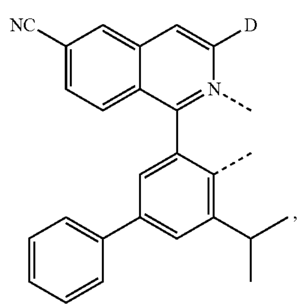
-continued
$L_{a636}$
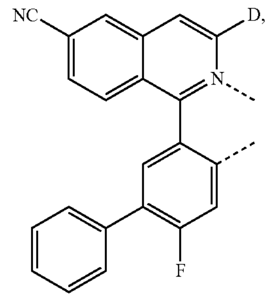
$L_{a637}$
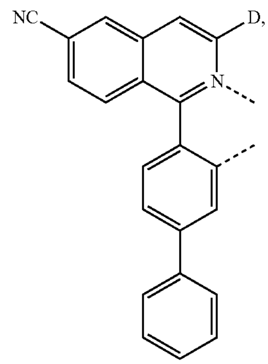
$L_{a638}$
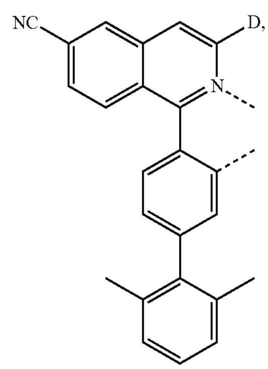
$L_{a639}$
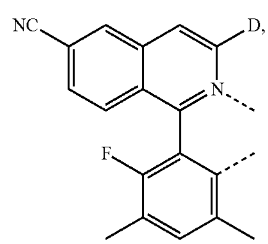
$L_{a640}$
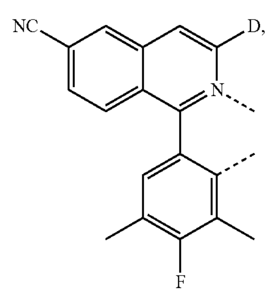

-continued
$L_{a641}$
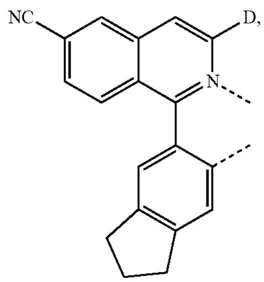
$L_{a642}$
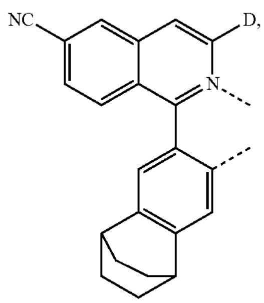
$L_{a643}$
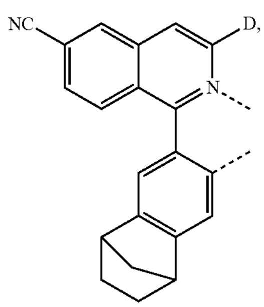
$L_{a644}$
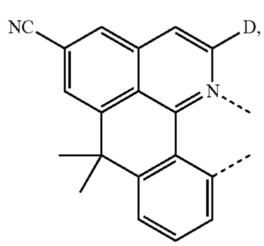
$L_{a645}$
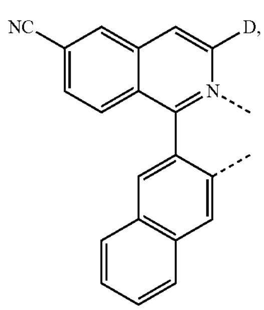
-continued
$L_{a646}$
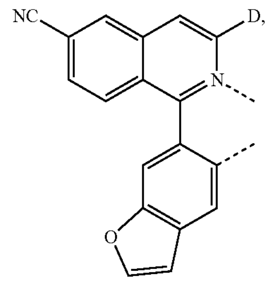
$L_{a647}$
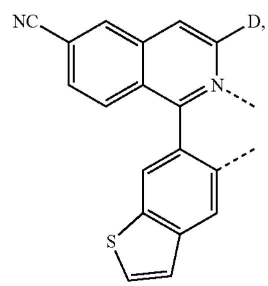
$L_{a648}$
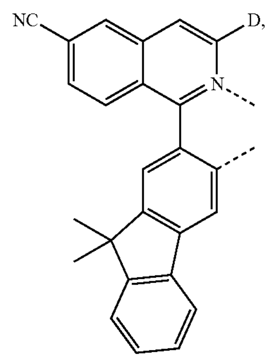
$L_{a649}$
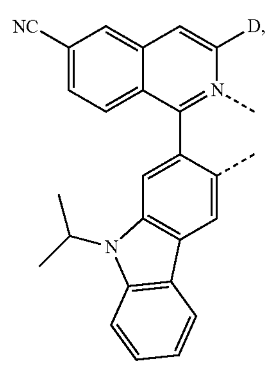
$L_{a650}$
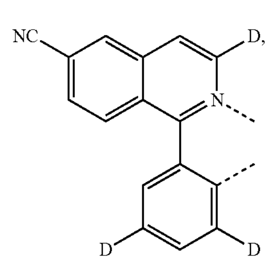

-continued
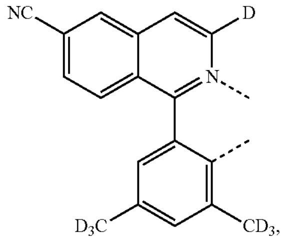
$L_{a651}$
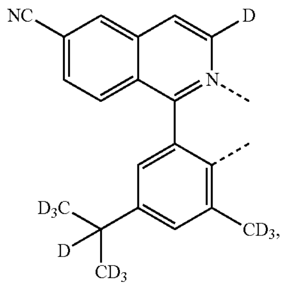
$L_{a652}$
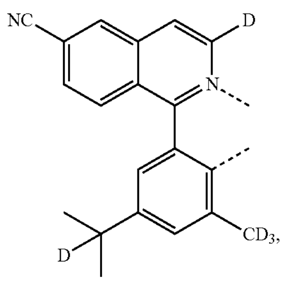
$L_{a653}$
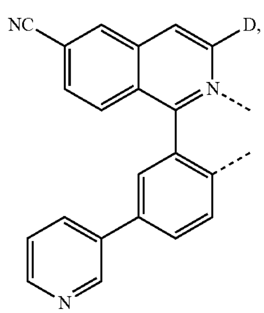
$L_{a654}$
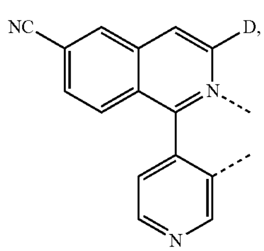
$L_{a655}$
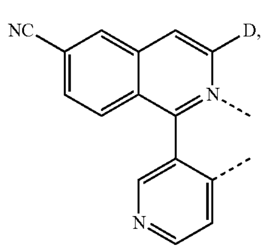
$L_{a656}$
-continued
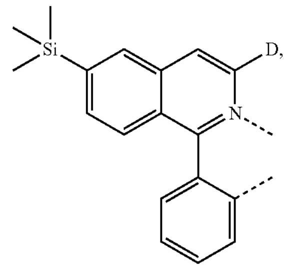
$L_{a657}$
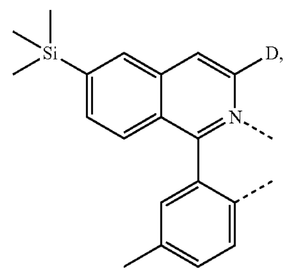
$L_{a658}$
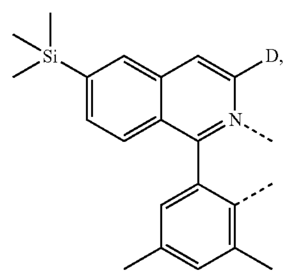
$L_{a659}$
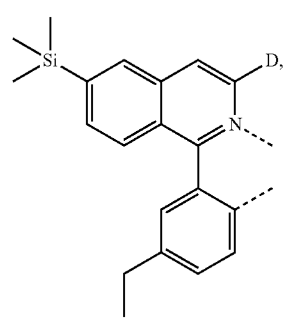
$L_{a660}$
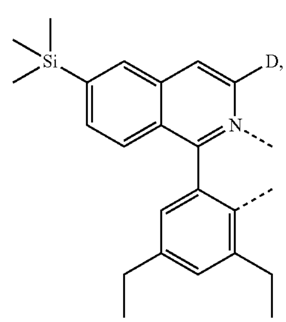
$L_{a661}$ La662
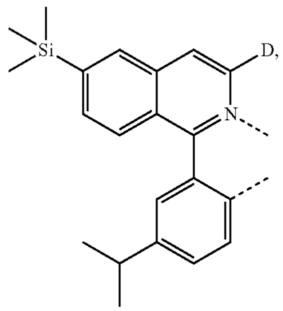
La663
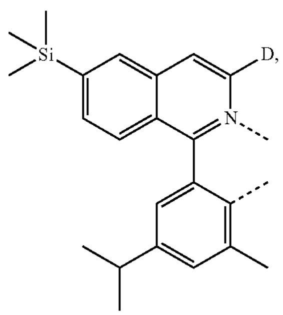
La664
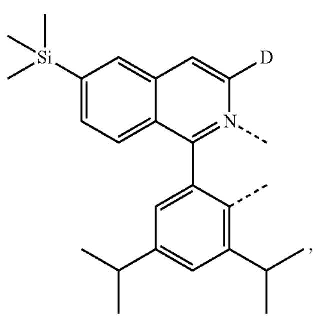
La665
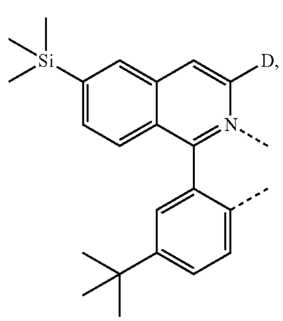
La666
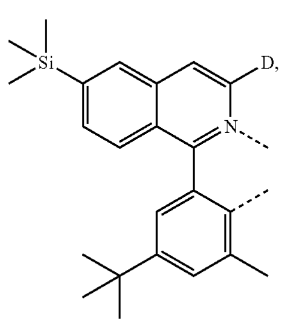
La667
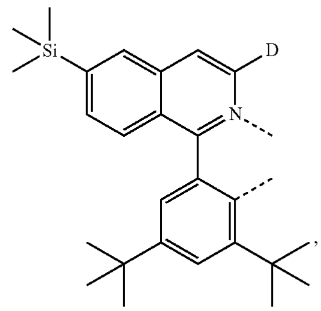
La668
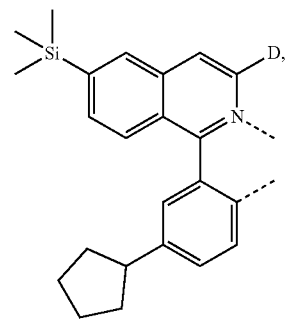
La669
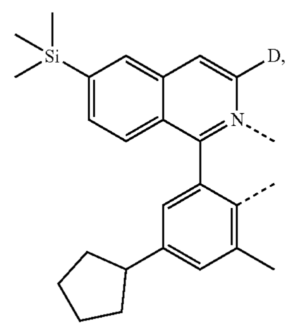
La670
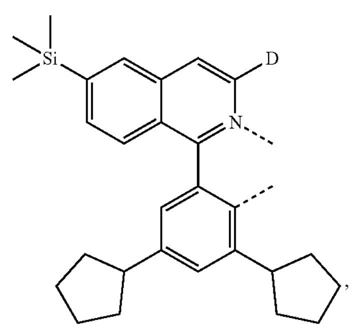
La671
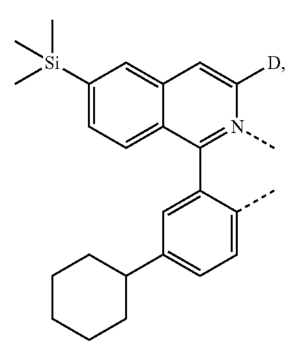

$L_{a672}$
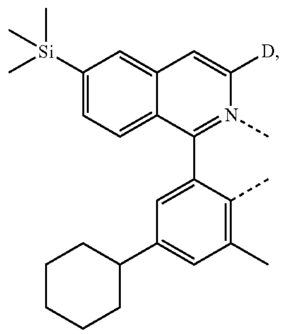
$L_{a673}$
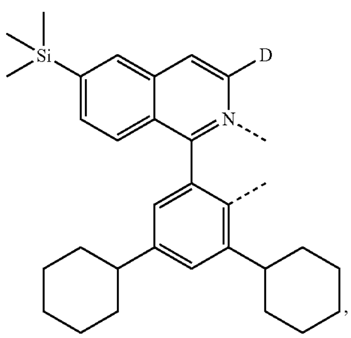
$L_{a674}$
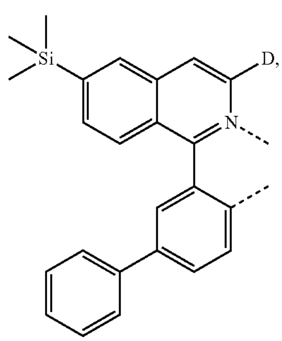
$L_{a675}$
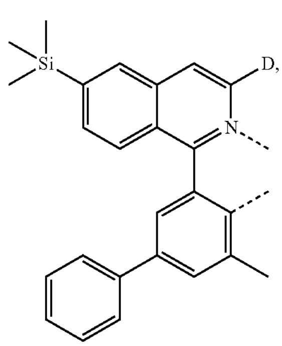
$L_{a676}$
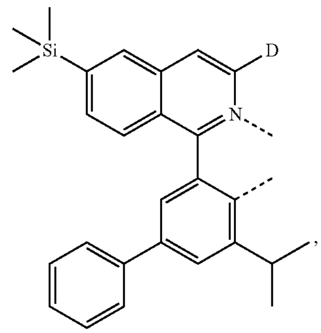
$L_{a677}$
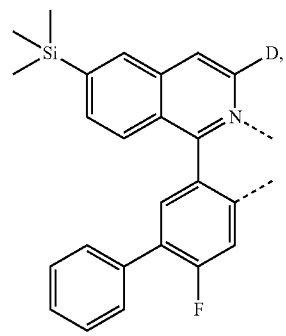
$L_{a678}$
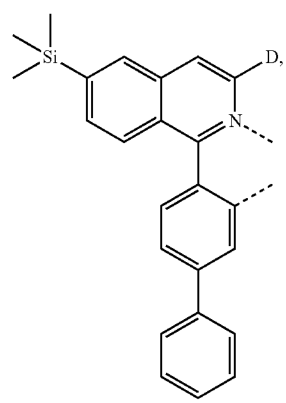
$L_{a679}$
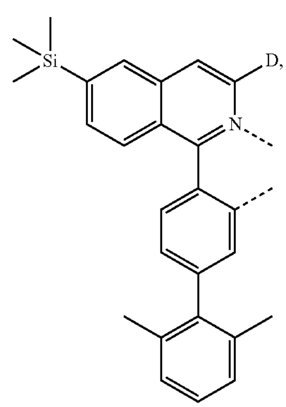

-continued
$L_{a680}$
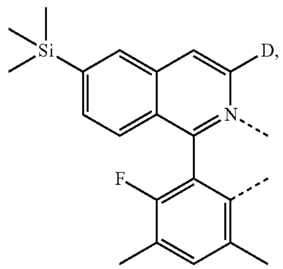
$L_{a681}$
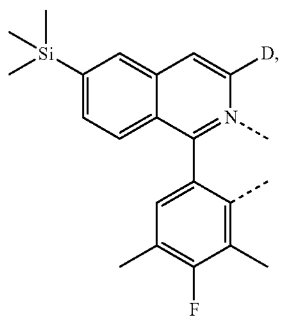
$L_{a682}$
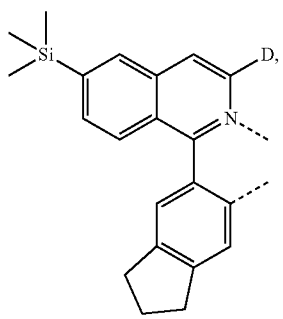
$L_{a683}$
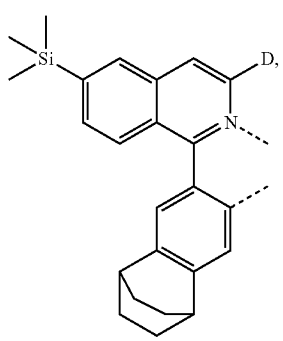
$L_{a684}$
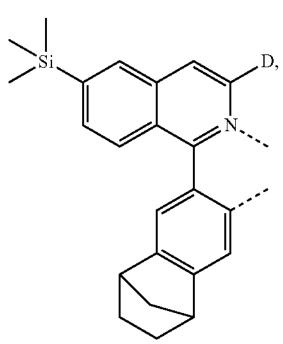
-continued
$L_{a685}$
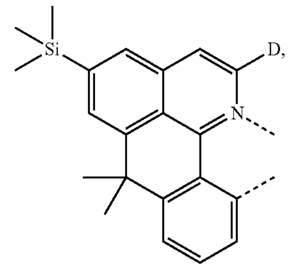
$L_{a686}$
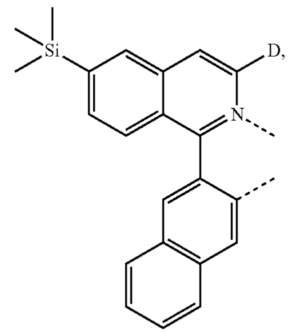
$L_{a687}$
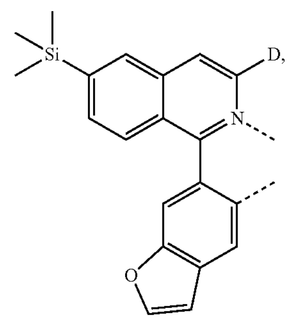
$L_{a688}$
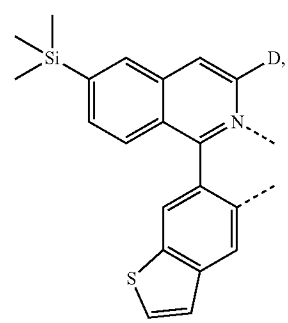
$L_{a689}$
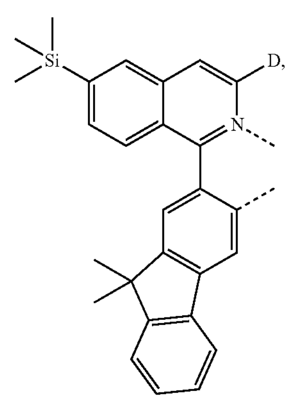

-continued
$L_{a690}$
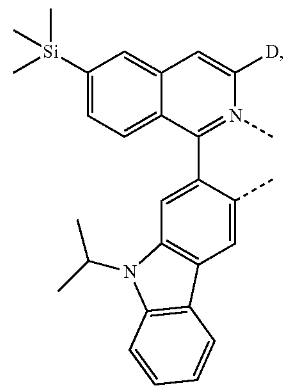
$L_{a691}$
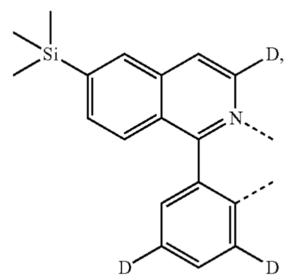
$L_{a692}$
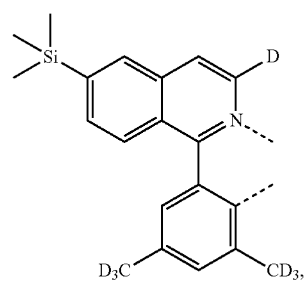
$L_{a693}$
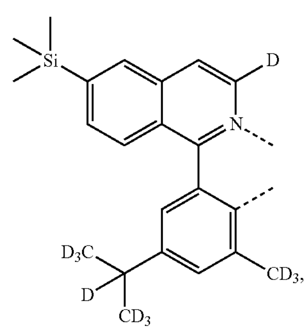
$L_{a694}$
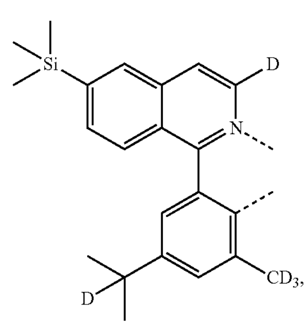
-continued
$L_{a695}$
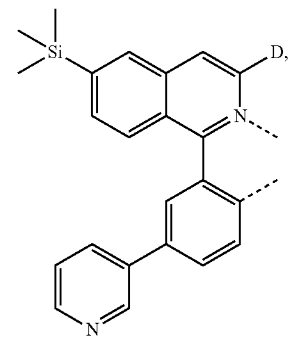
$L_{a696}$
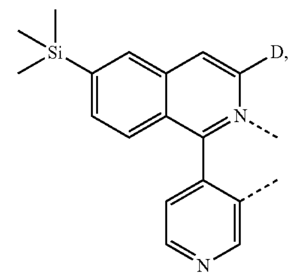
$L_{a697}$
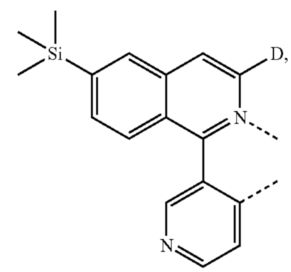
$L_{a698}$
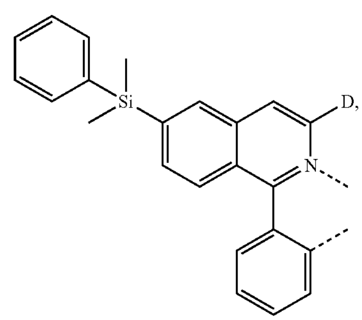
$L_{a699}$
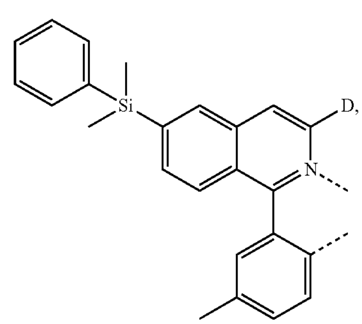

-continued
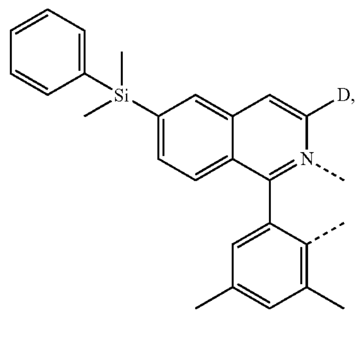
$L_{a700}$
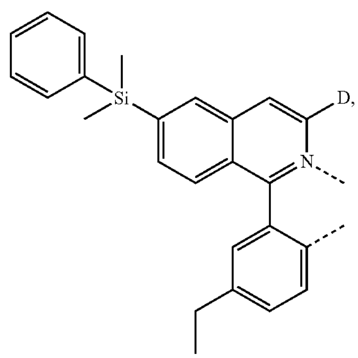
$L_{a701}$
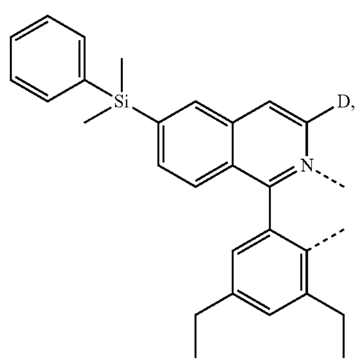
$L_{a702}$
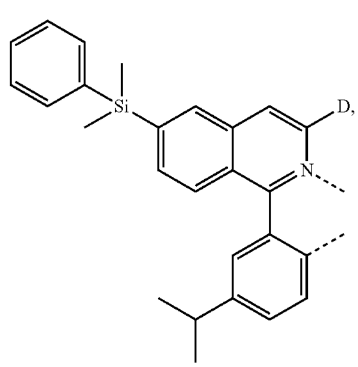
$L_{a703}$
-continued
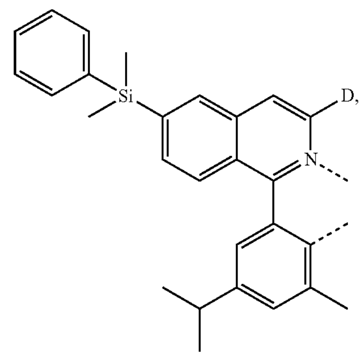
$L_{a704}$
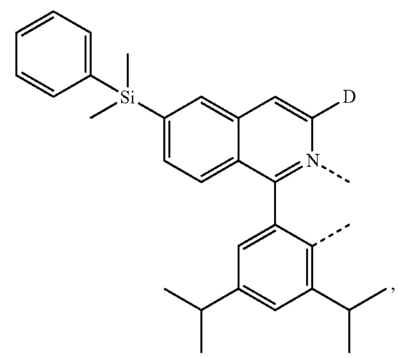
$L_{a705}$
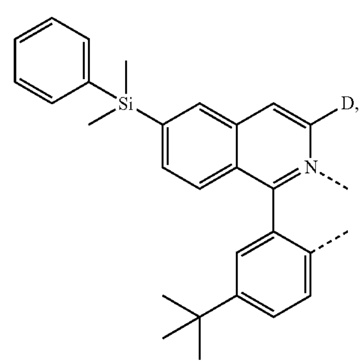
$L_{a706}$
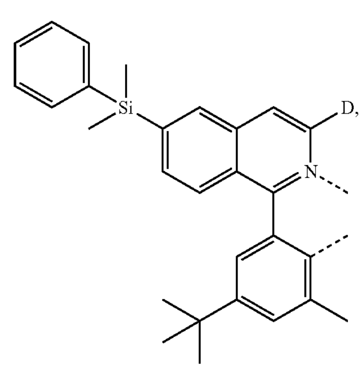
$L_{a707}$ -continued
$L_{a708}$
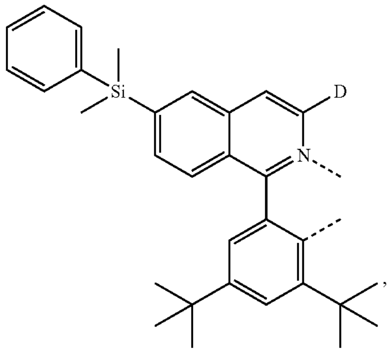
$L_{a709}$
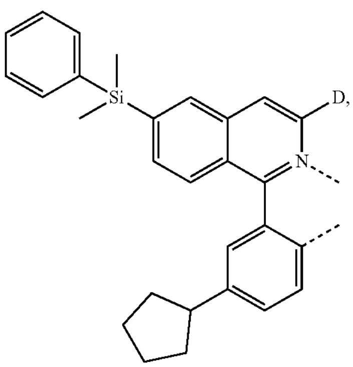
$L_{a710}$
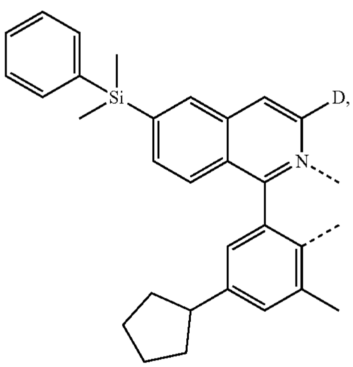
$L_{a711}$
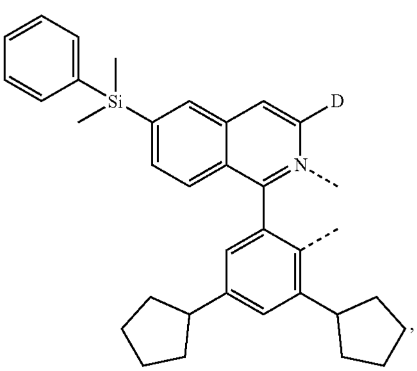
-continued
$L_{a712}$
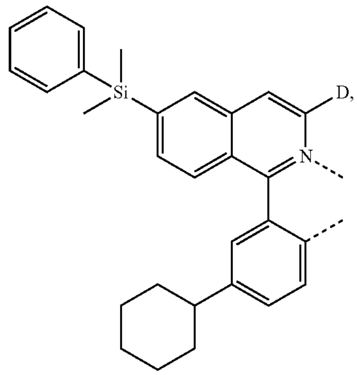
$L_{a713}$
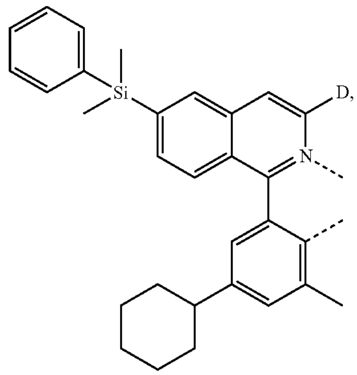
$L_{a714}$
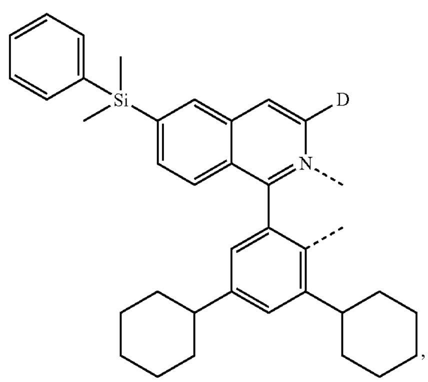
$L_{a715}$
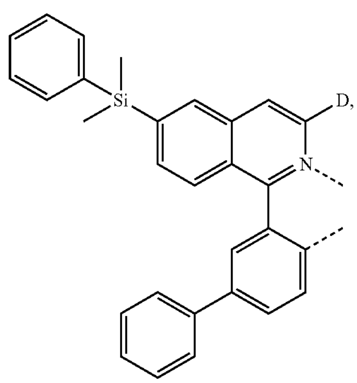

$L_{a716}$
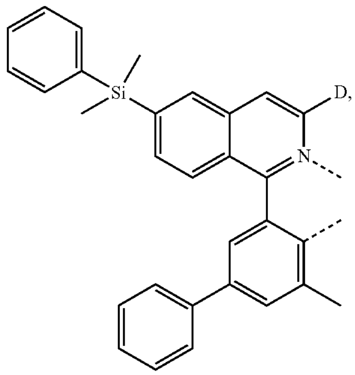
$L_{a717}$
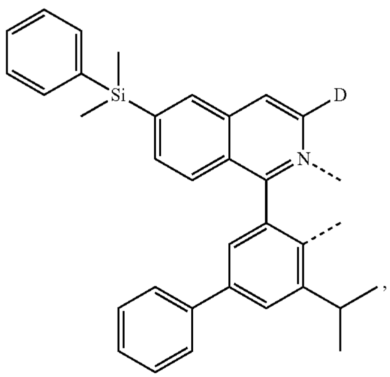
$L_{a718}$
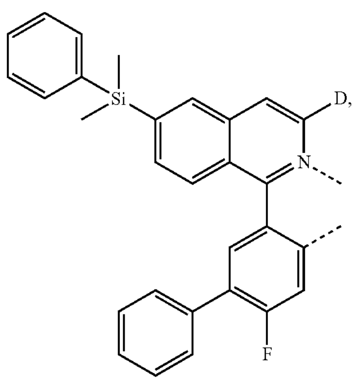
$L_{a719}$
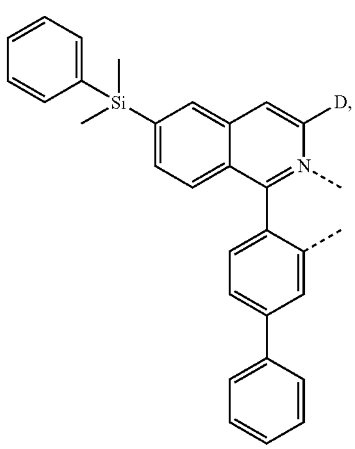
$L_{a720}$
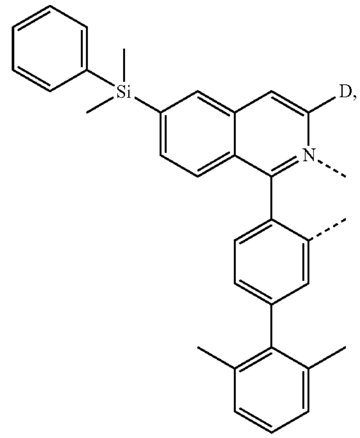
$L_{a721}$
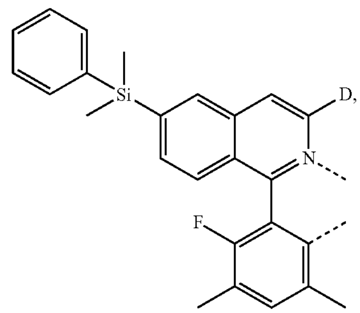
$L_{a722}$
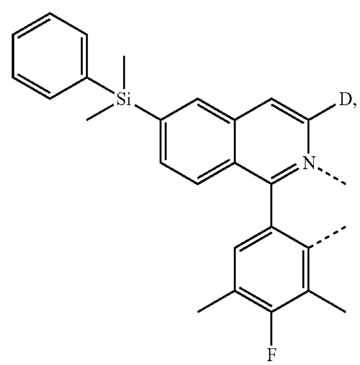
$L_{a723}$
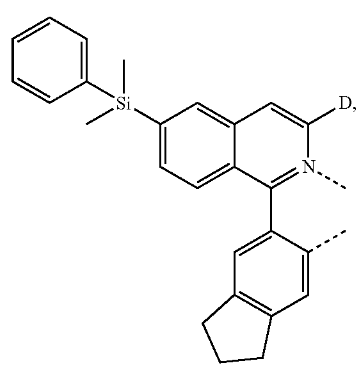

-continued
$L_{a724}$
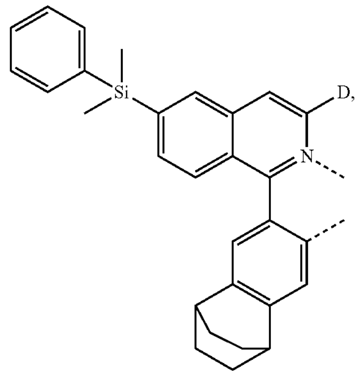
$L_{a725}$
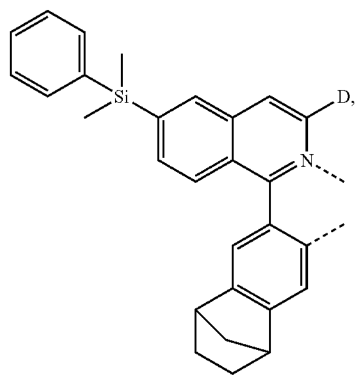
$L_{a726}$
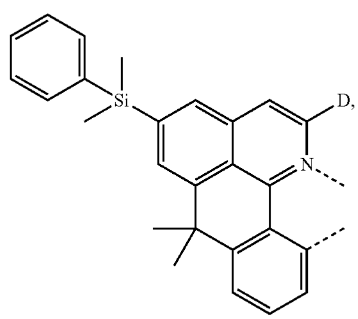
$L_{a727}$
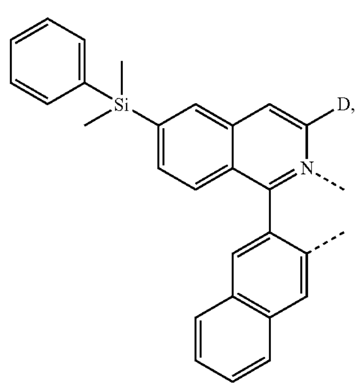
-continued
$L_{a728}$
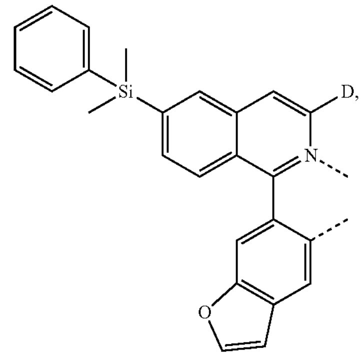
$L_{a729}$
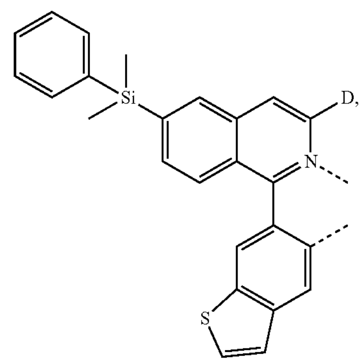
$L_{a730}$
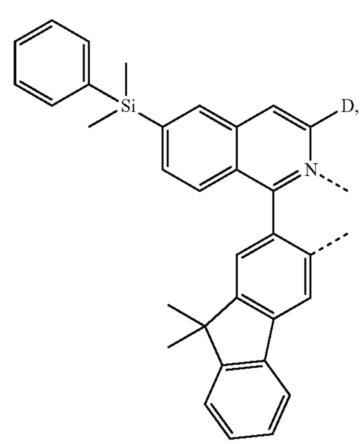

$L_{a731}$
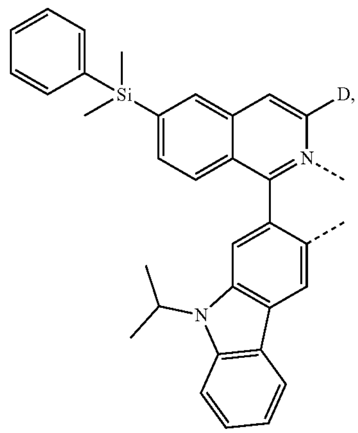
$L_{a732}$
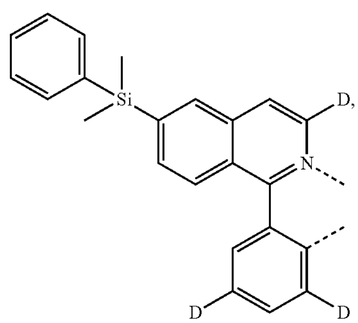
$L_{a733}$
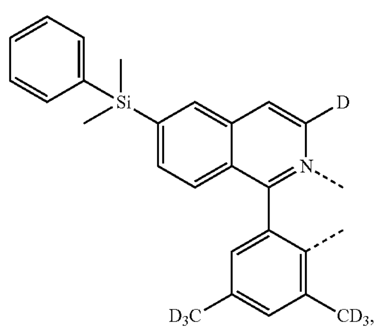
$L_{a734}$
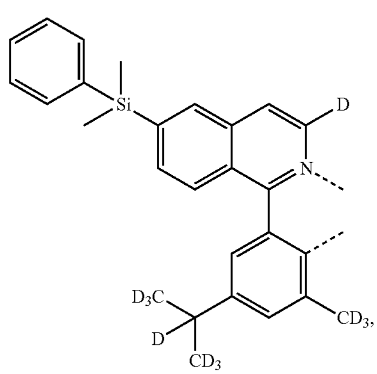
$L_{a735}$
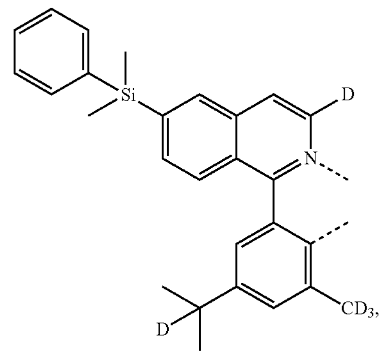
$L_{a736}$
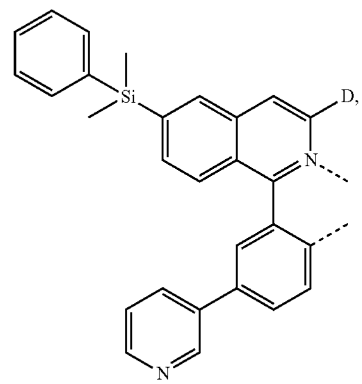
$L_{a737}$
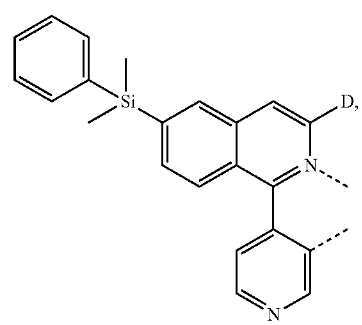
$L_{a738}$
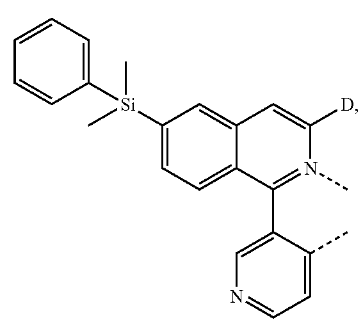

-continued
$L_{a739}$
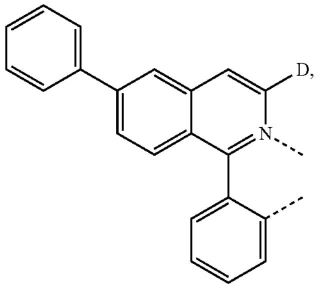
$L_{a740}$
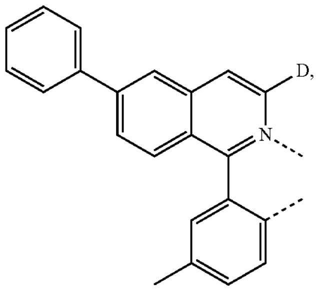
$L_{a741}$
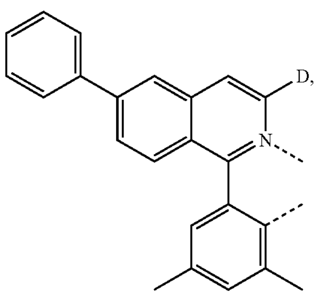
$L_{a742}$
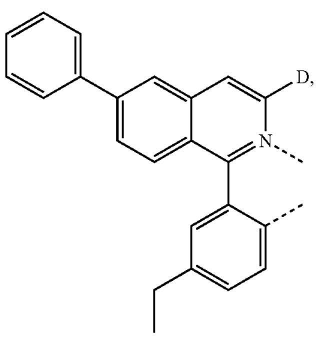
$L_{a743}$
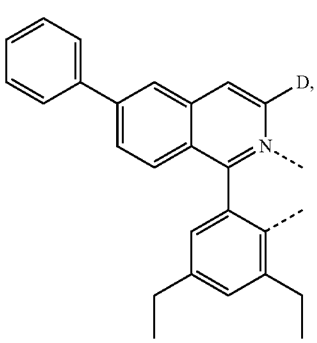
-continued
$L_{a744}$
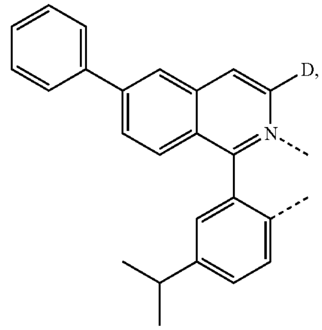
$L_{a745}$
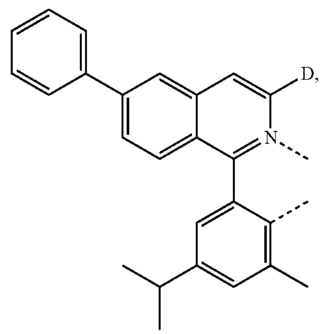
$L_{a746}$
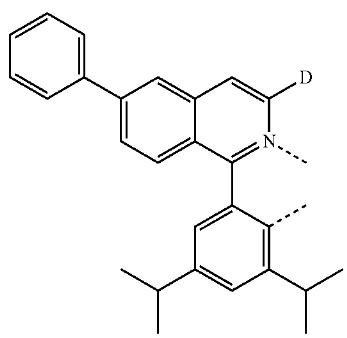
$L_{a747}$
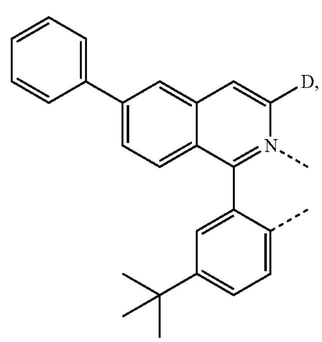

-continued
$L_{a748}$
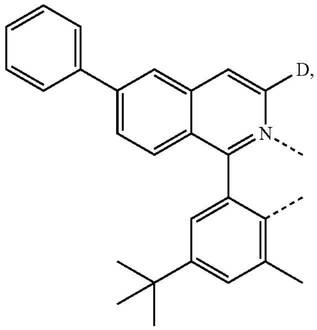
$L_{a749}$
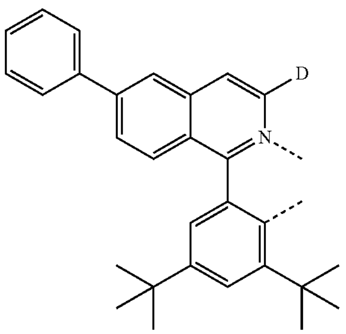
$L_{a750}$
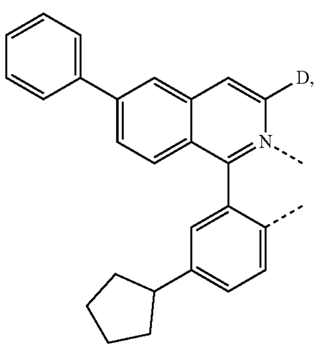
$L_{a751}$
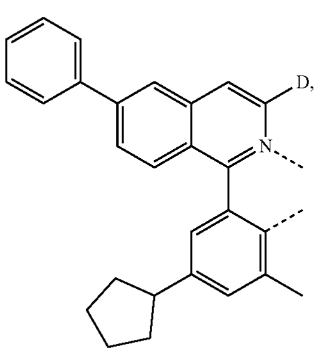
-continued
$L_{a752}$
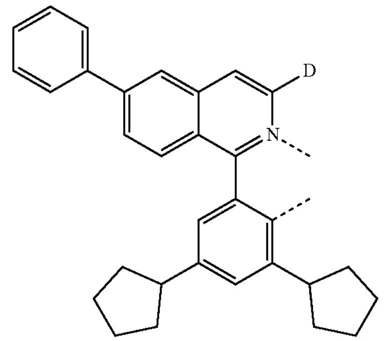
$L_{a753}$
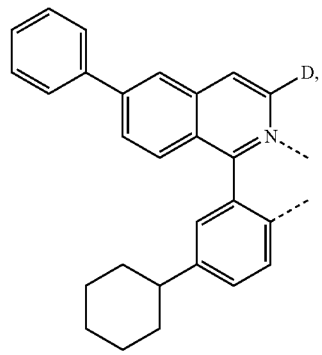
$L_{a754}$
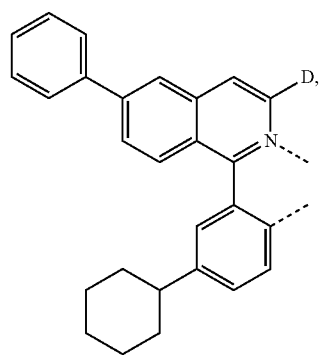
$L_{a755}$
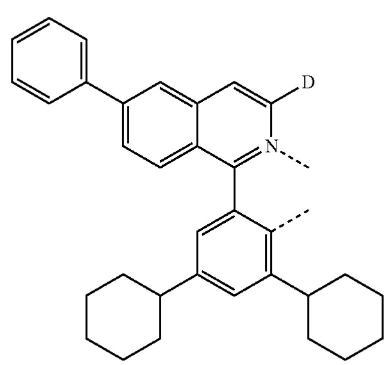

-continued
$L_{a756}$
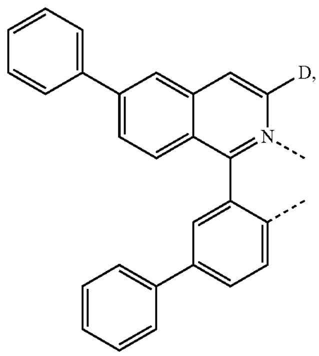
$L_{a757}$
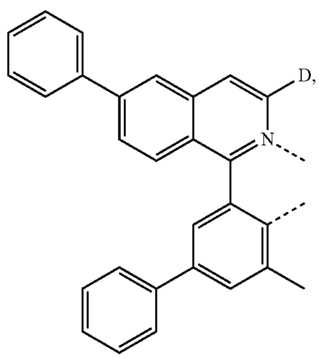
$L_{a758}$
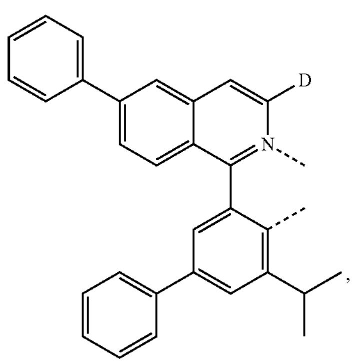
$L_{a759}$
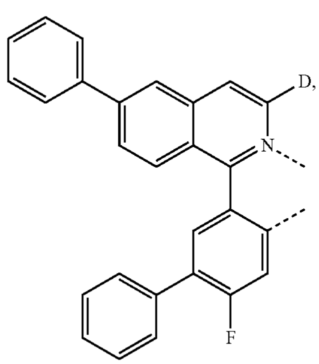
-continued
$L_{a760}$
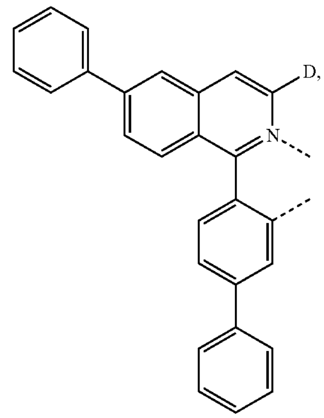
$L_{a761}$
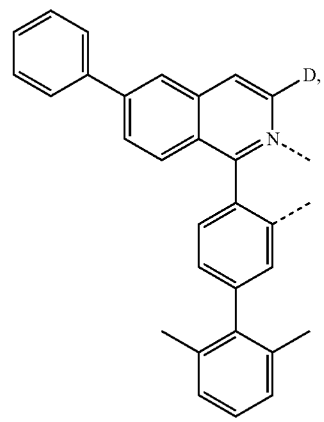
$L_{a762}$
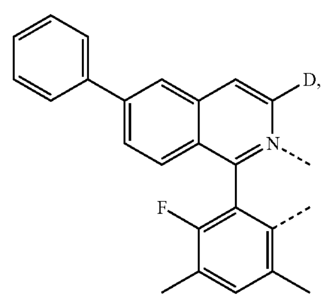
$L_{a763}$
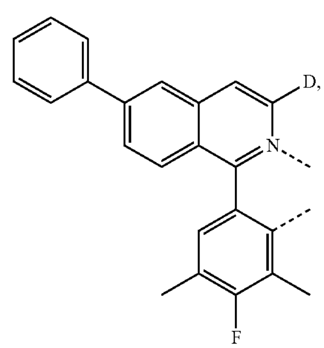

-continued
$L_{a764}$
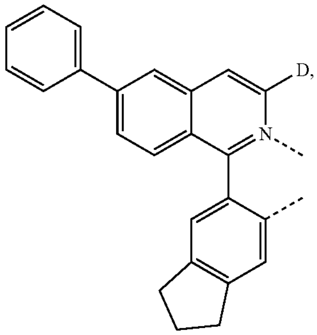
$L_{a765}$
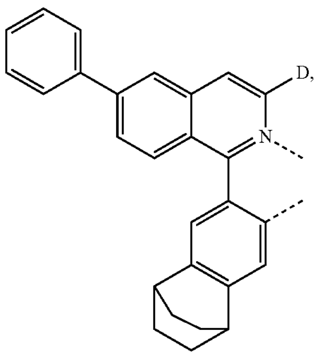
$L_{a766}$
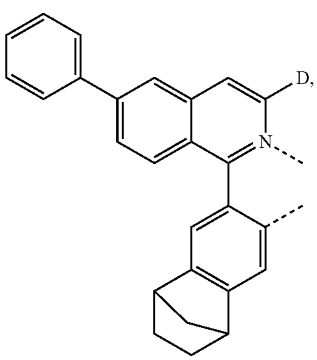
$L_{a767}$
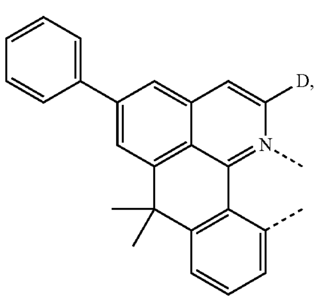
-continued
$L_{a768}$
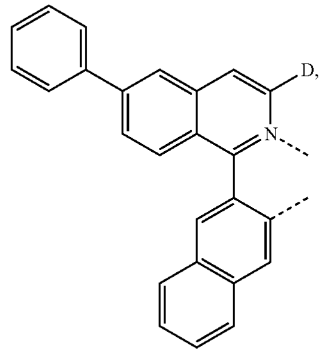
$L_{a769}$
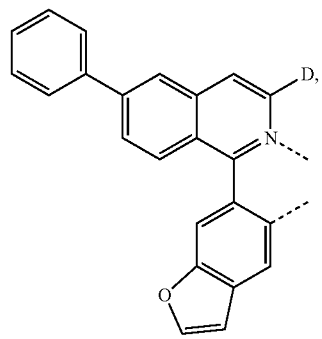
$L_{a770}$
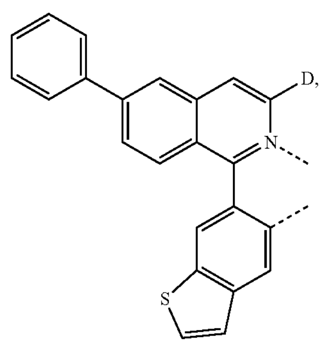
$L_{a771}$
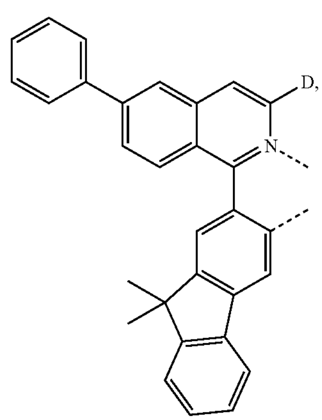

$L_{a772}$
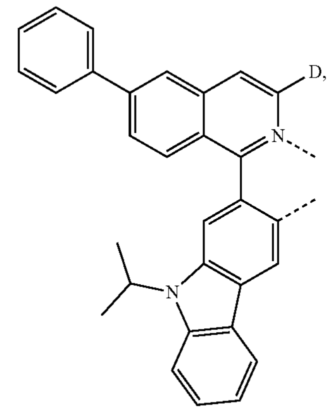
$L_{a773}$
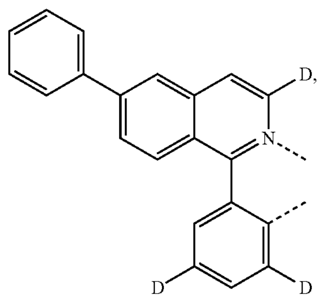
$L_{a774}$
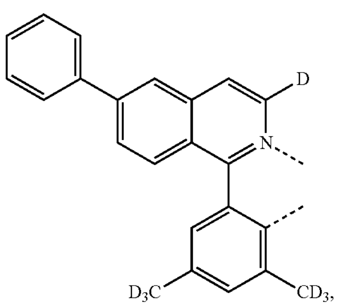
$L_{a775}$
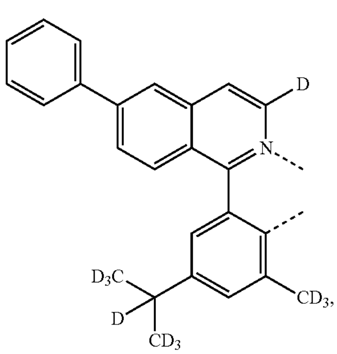
$L_{a776}$
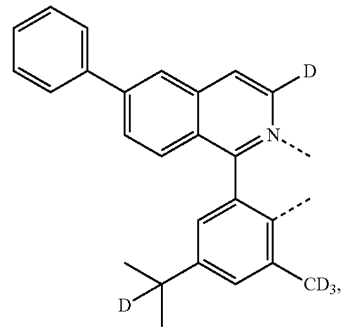
$L_{a777}$
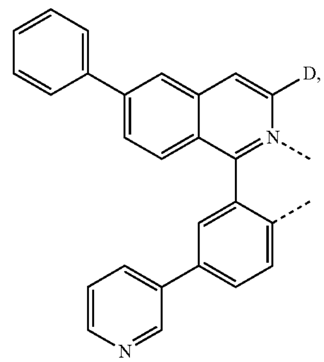
$L_{a778}$
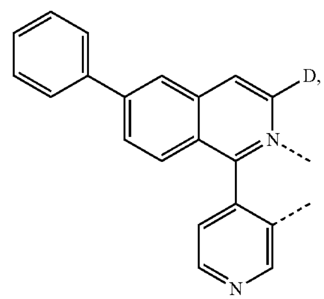
$L_{a779}$
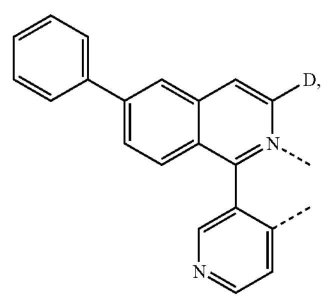
$L_{a780}$
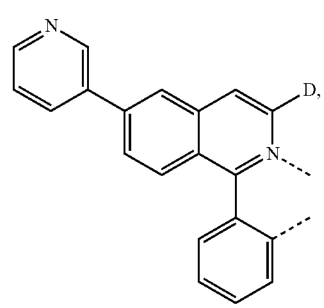

-continued
$L_{a781}$
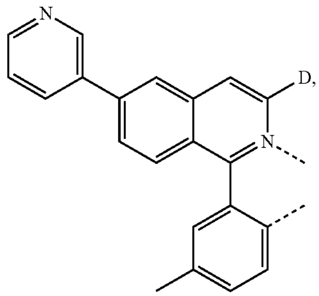
$L_{a782}$
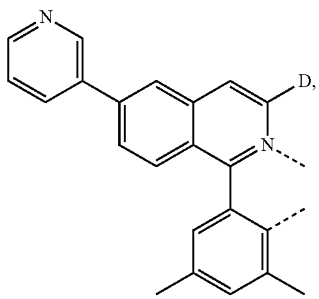
$L_{a783}$
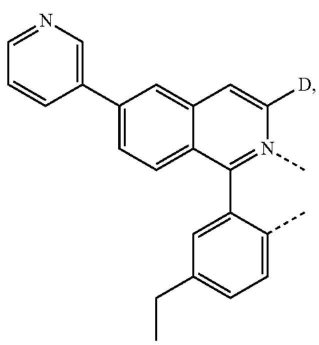
$L_{a784}$
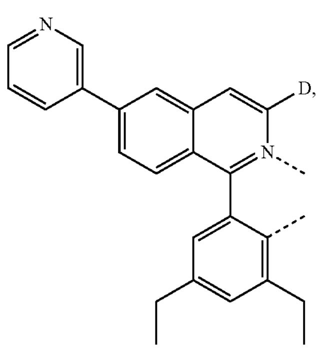
$L_{a785}$
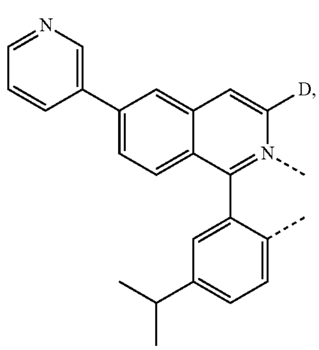
-continued
$L_{a786}$
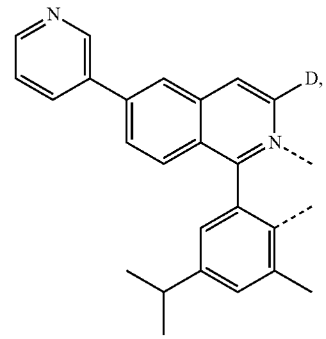
$L_{a787}$
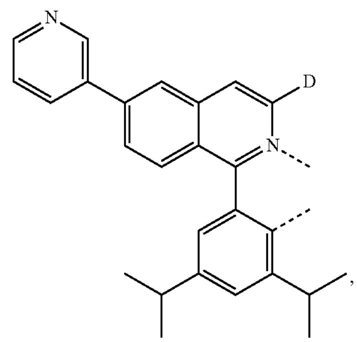
$L_{a788}$
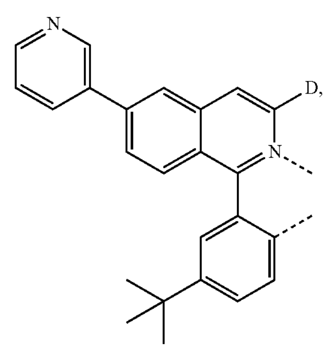
$L_{a789}$
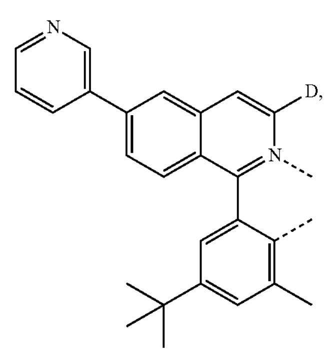

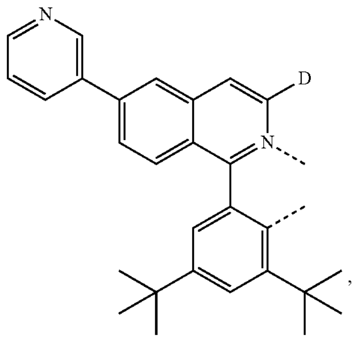
$L_{a790}$
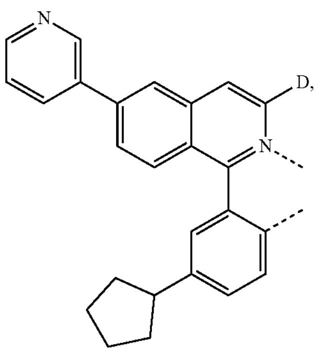
$L_{a791}$
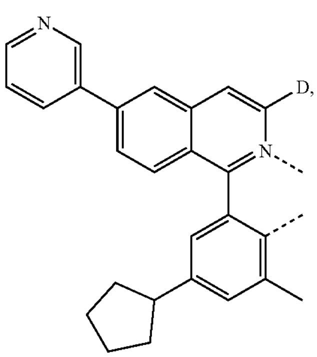
$L_{a792}$
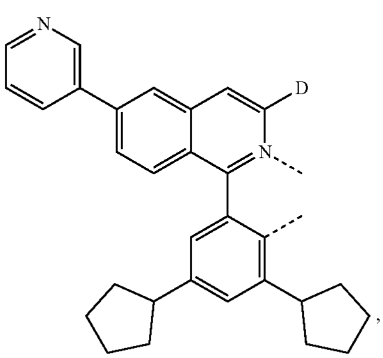
$L_{a793}$
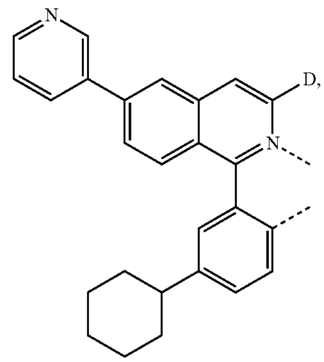
$L_{a794}$
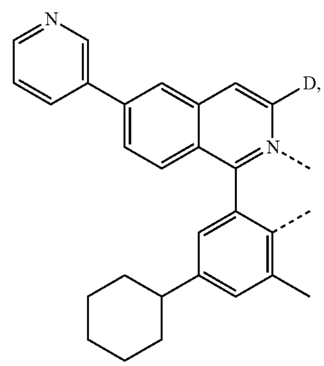
$L_{a795}$
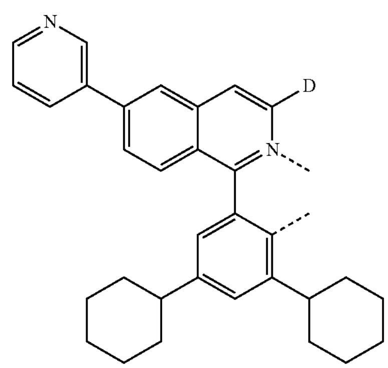
$L_{a796}$
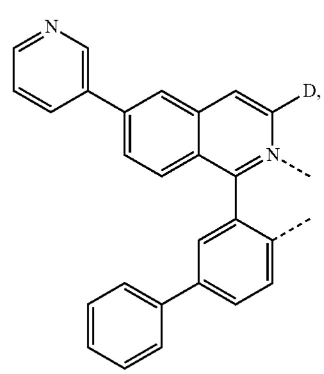
$L_{a797}$

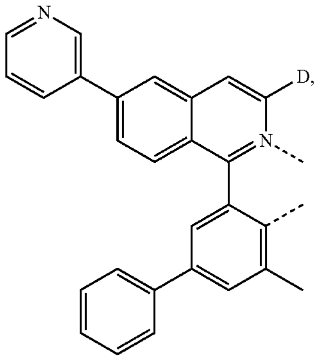
$L_{a798}$
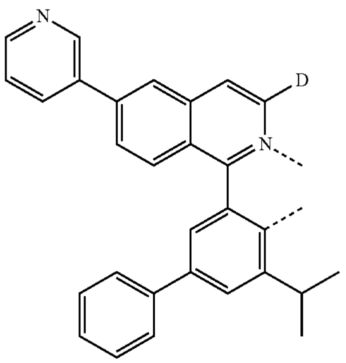
$L_{a799}$
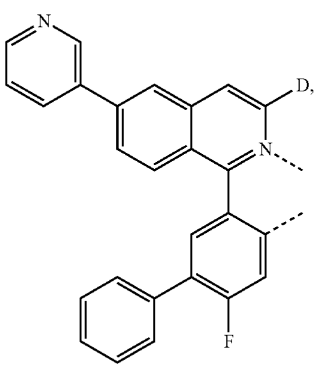
$L_{a800}$
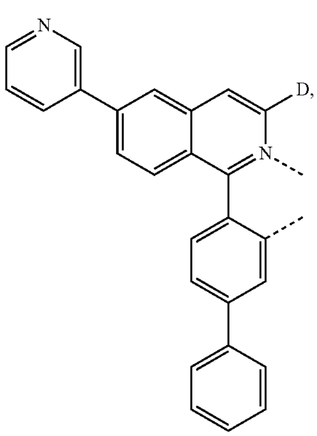
$L_{a801}$
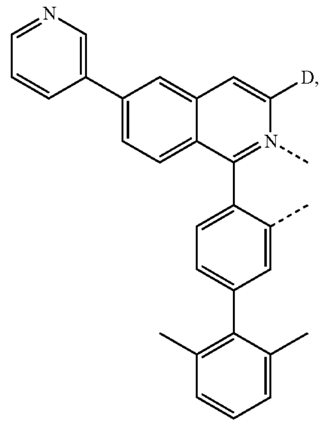
$L_{a802}$
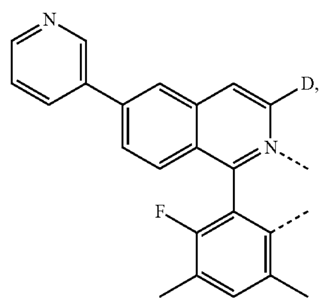
$L_{a803}$
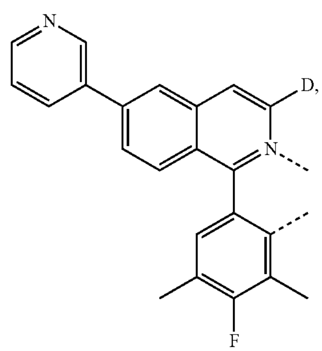
$L_{a804}$
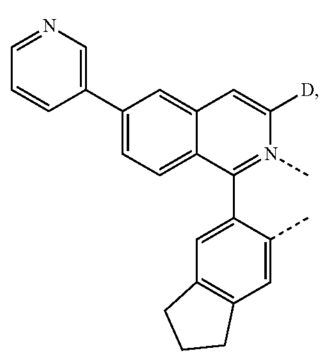
$L_{a805}$ -continued
$L_{a806}$
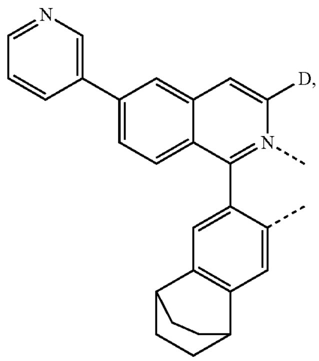
$L_{a807}$
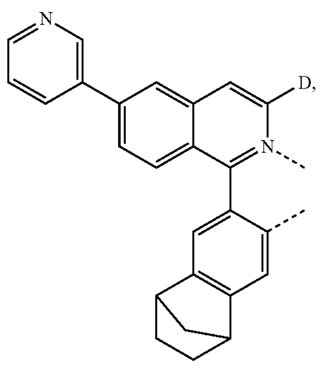
$L_{a808}$
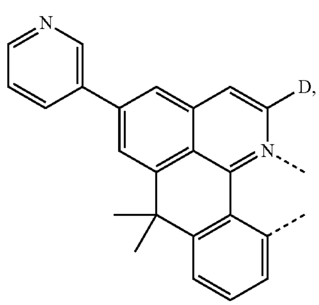
$L_{a809}$
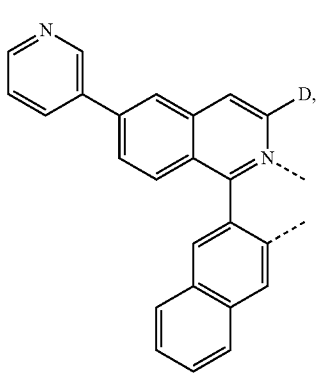
-continued
$L_{a810}$
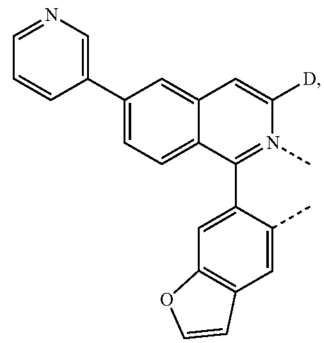
$L_{a811}$
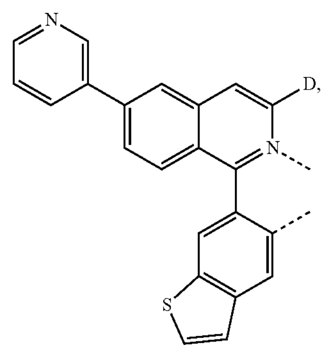
$L_{a812}$
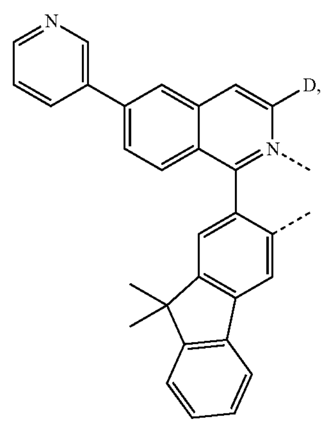
$L_{a813}$
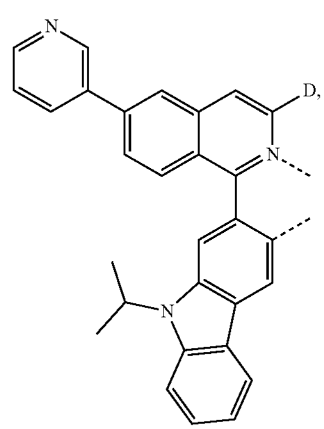

-continued
La814
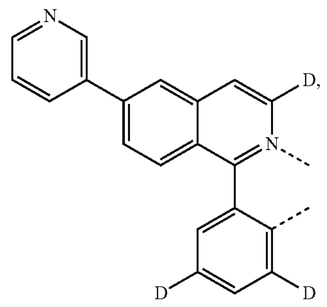
La815
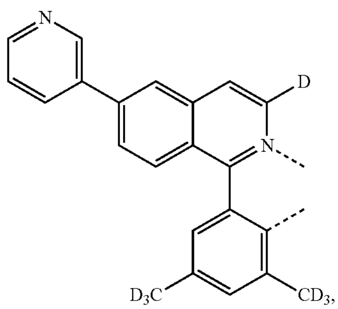
La816
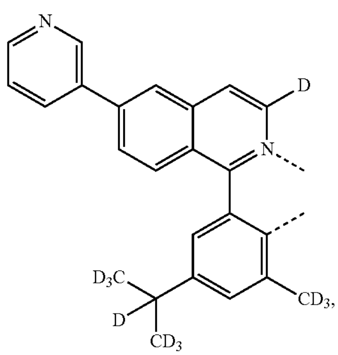
La817
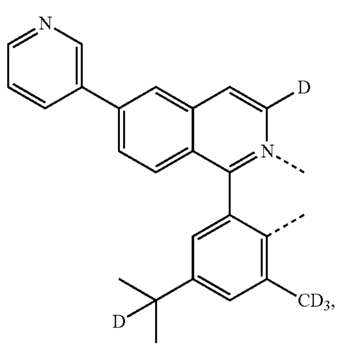
-continued
La818
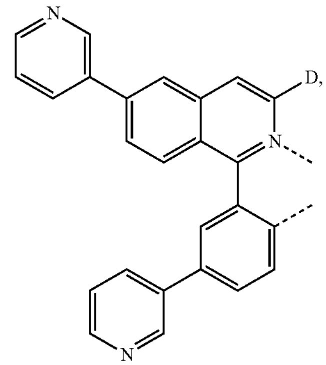
La819
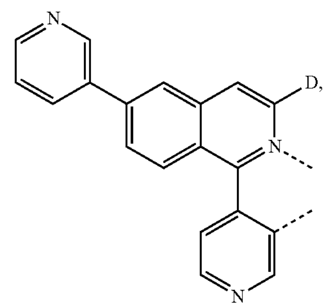
La820
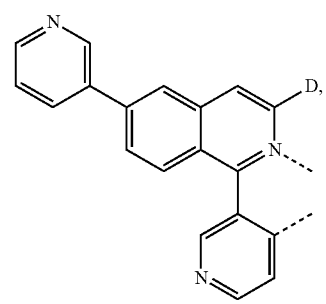
La821
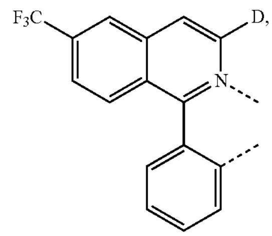
La822
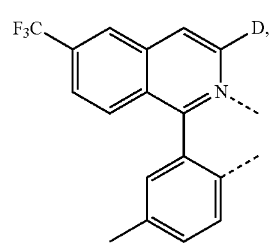

-continued
$L_{a823}$
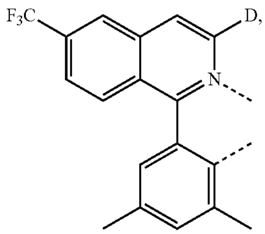
$L_{a824}$
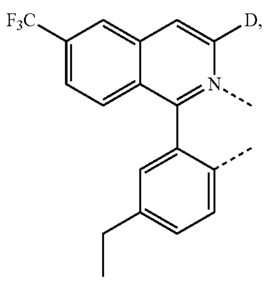
$L_{a825}$
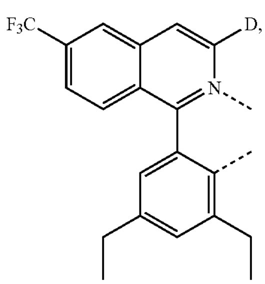
$L_{a826}$
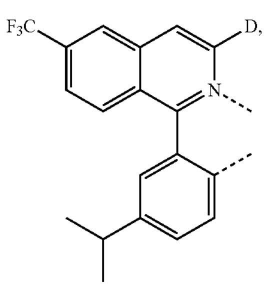
$L_{a827}$
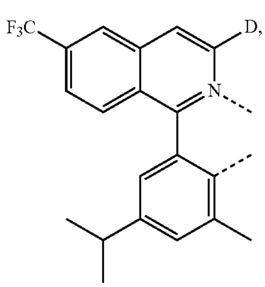
-continued
$L_{a828}$
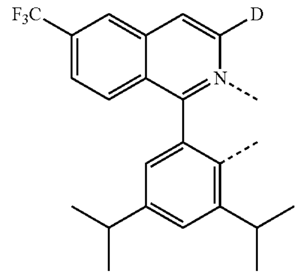
$L_{a829}$
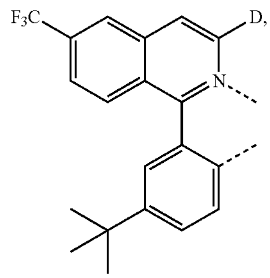
$L_{a830}$
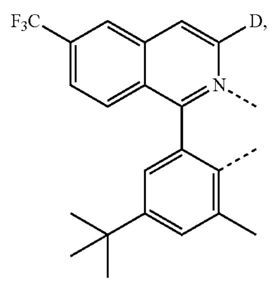
$L_{a831}$
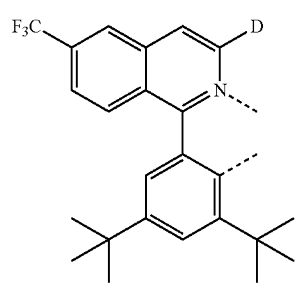
$L_{a832}$
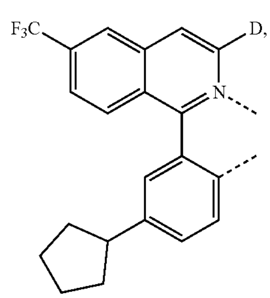

-continued
L$_{a833}$
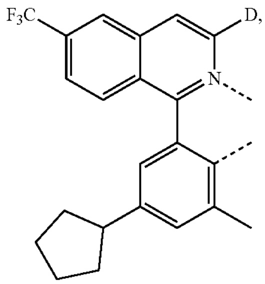
L$_{a834}$
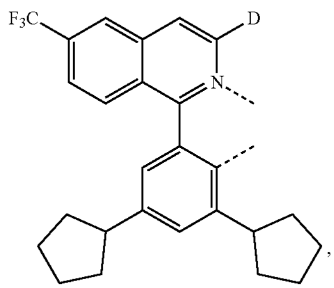
L$_{a835}$
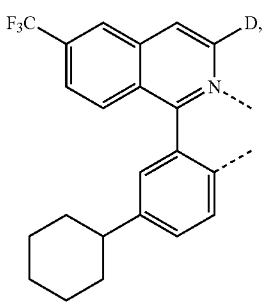
L$_{a836}$
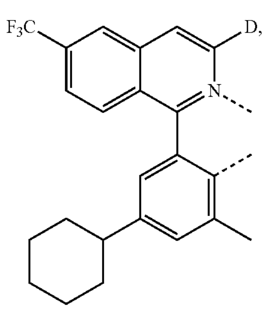
L$_{a837}$
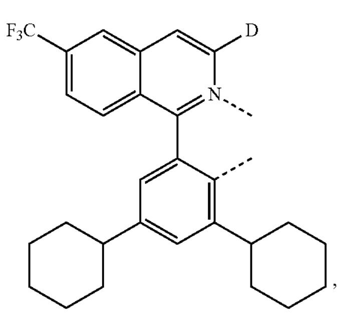
-continued
L$_{a838}$
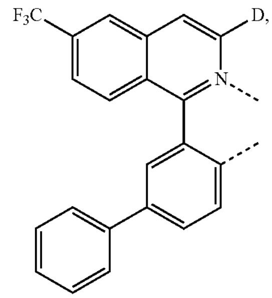
L$_{a839}$
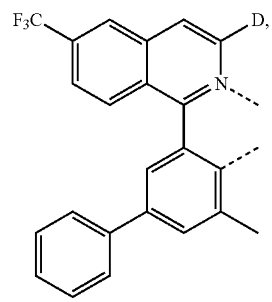
L$_{a840}$
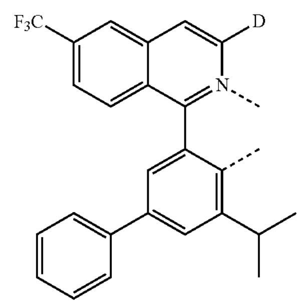
L$_{a841}$
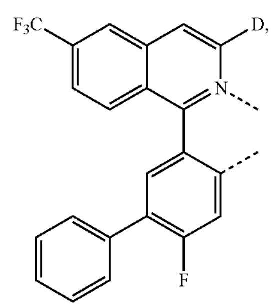
L$_{a842}$
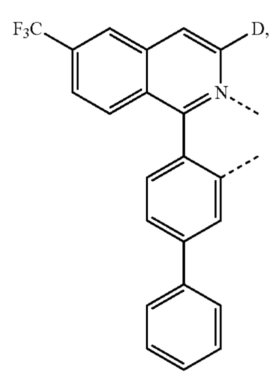

$L_{a843}$
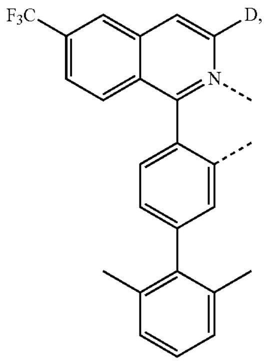
$L_{a844}$
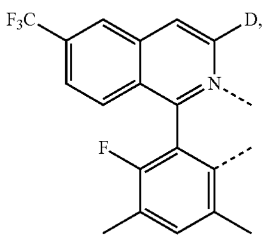
$L_{a845}$
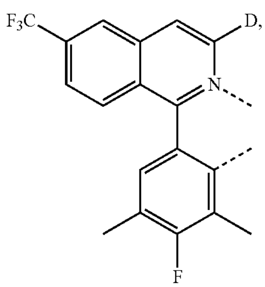
$L_{a846}$
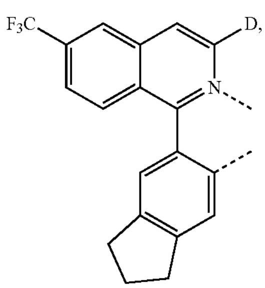
$L_{a847}$
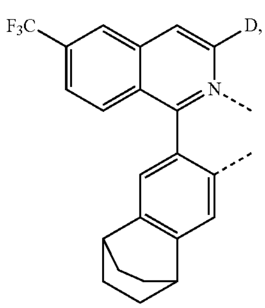
$L_{a848}$
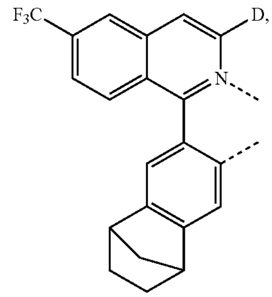
$L_{a849}$
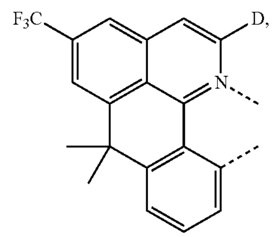
$L_{a850}$
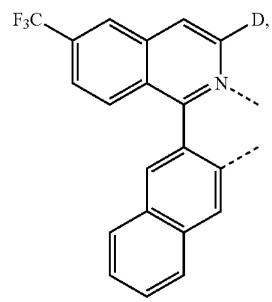
$L_{a851}$
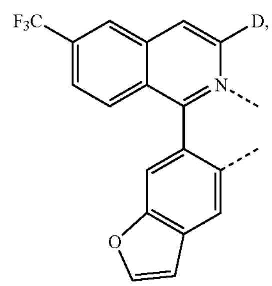
$L_{a852}$
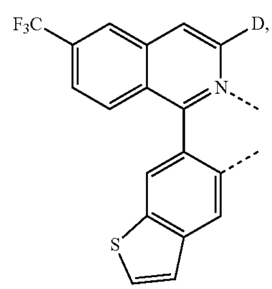

-continued
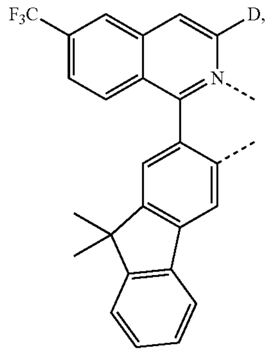
$L_{a853}$
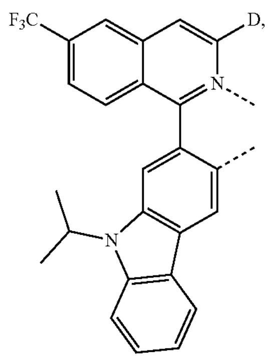
$L_{a854}$
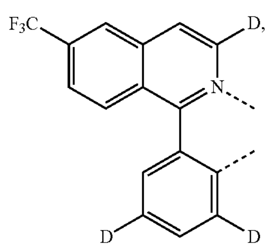
$L_{a855}$
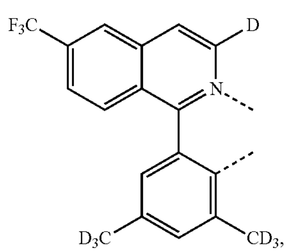
$L_{a856}$
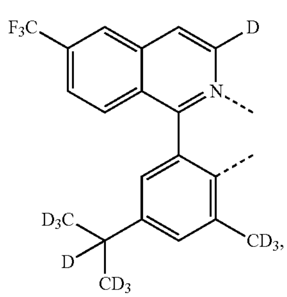
$L_{a857}$
-continued
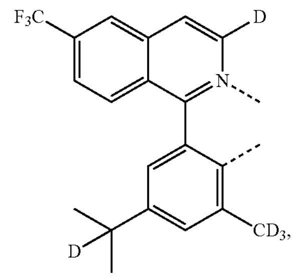
$L_{a858}$
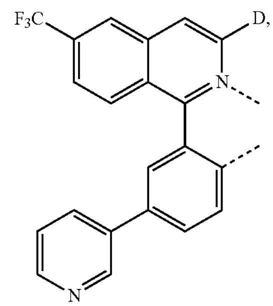
$L_{a859}$
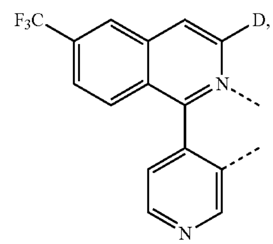
$L_{a860}$
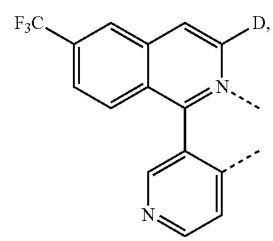
$L_{a861}$
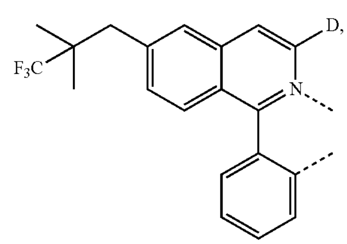
$L_{a862}$
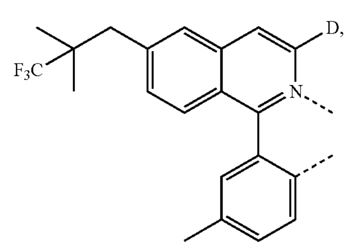
$L_{a863}$ -continued
$L_{a864}$
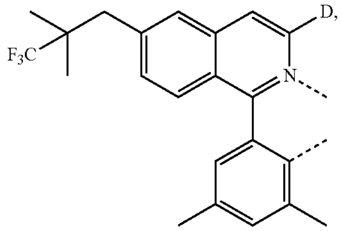
$L_{a865}$
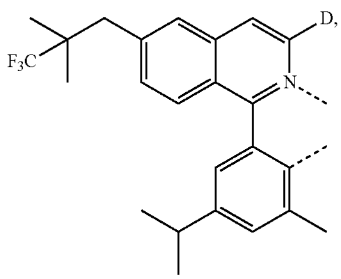
$L_{a866}$
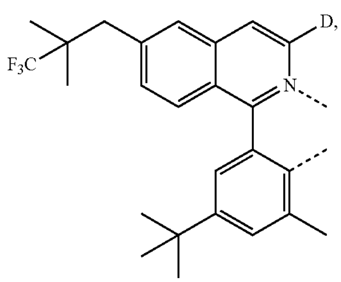
$L_{a867}$
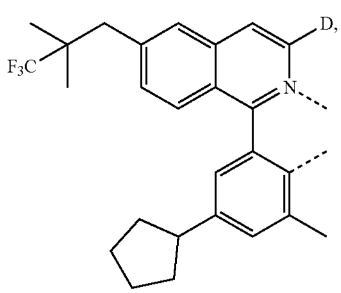
$L_{a868}$
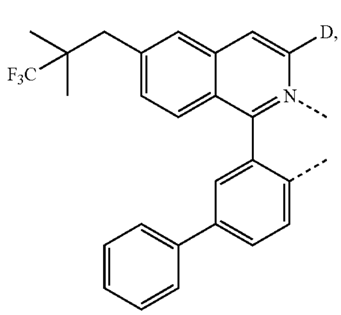
-continued
$L_{a869}$
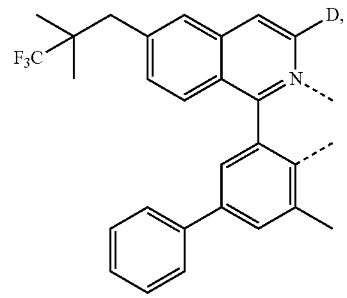
$L_{a870}$
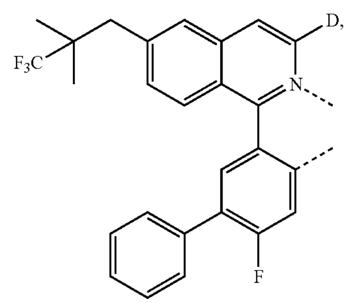
$L_{a871}$
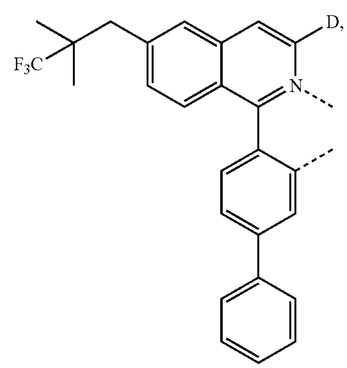
$L_{a872}$
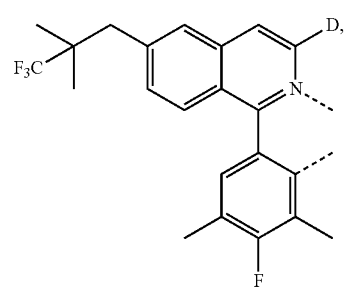
$L_{a873}$
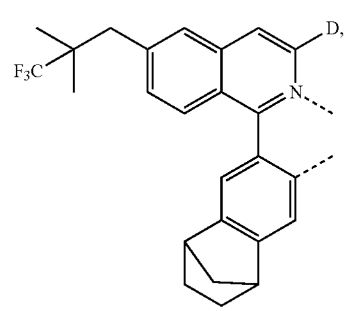

-continued
$L_{a874}$
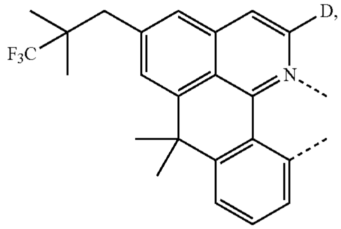
$L_{a875}$
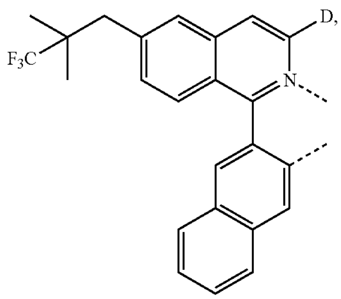
$L_{a876}$
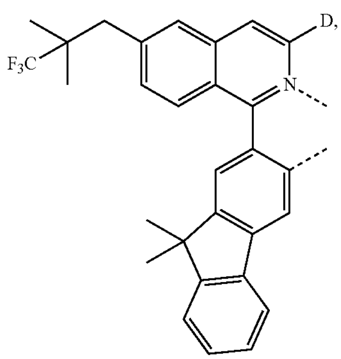
$L_{a877}$
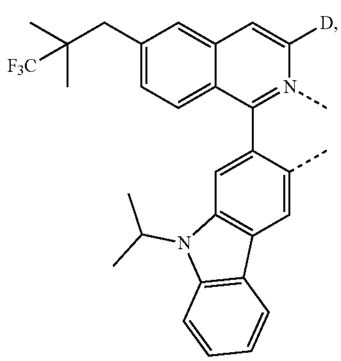
$L_{a878}$
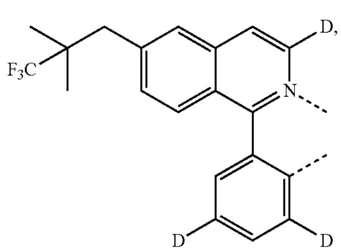
-continued
$L_{a879}$
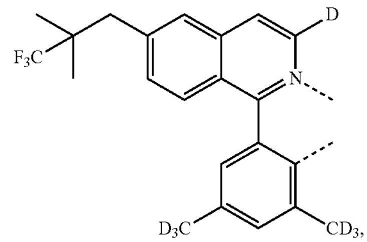
$L_{a880}$
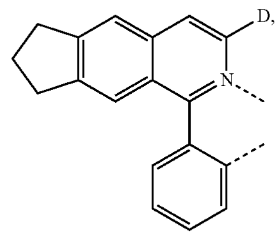
$L_{a881}$
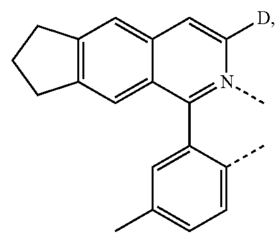
$L_{a882}$
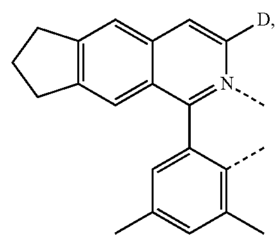
$L_{a883}$
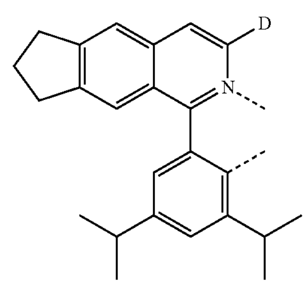
$L_{a884}$
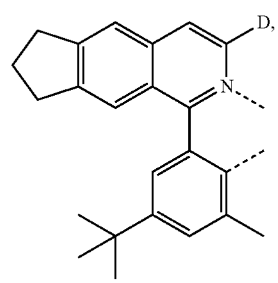

-continued
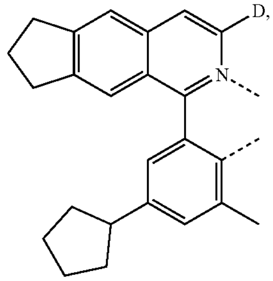
$L_{a885}$
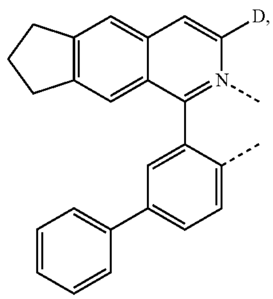
$L_{a886}$
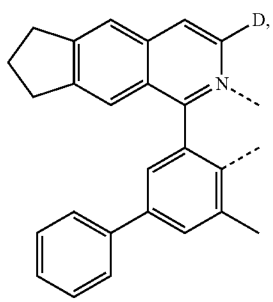
$L_{a887}$
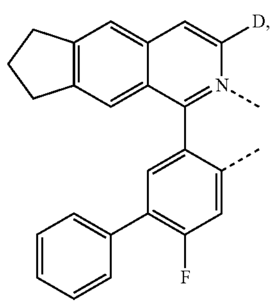
$L_{a888}$
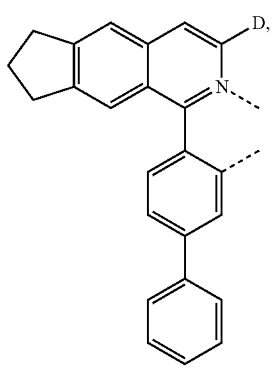
$L_{a889}$
-continued
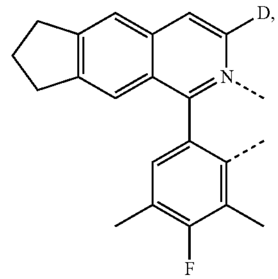
$L_{a890}$
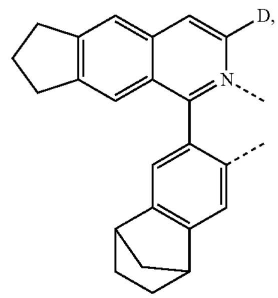
$L_{a891}$
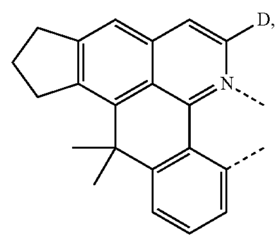
$L_{a892}$
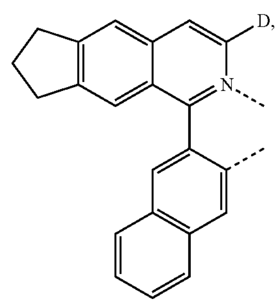
$L_{a893}$
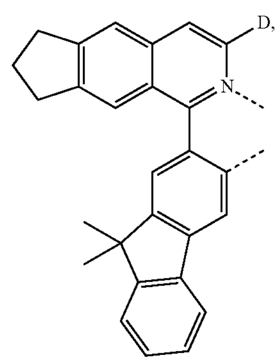
$L_{a894}$ -continued
$L_{a895}$
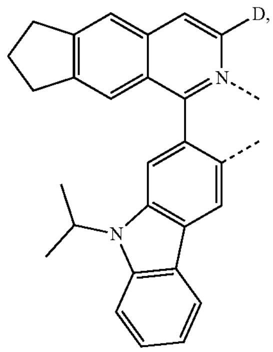
$L_{a896}$
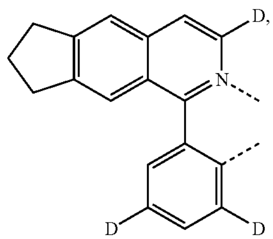
$L_{a897}$
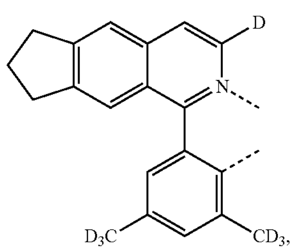
$L_{a898}$
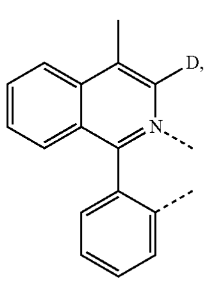
$L_{a899}$
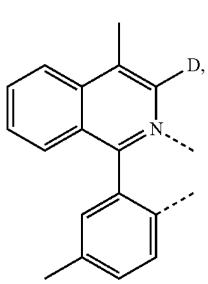
-continued
$L_{a900}$
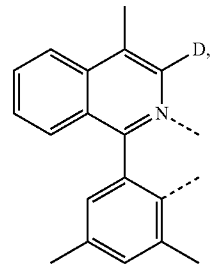
$L_{a901}$
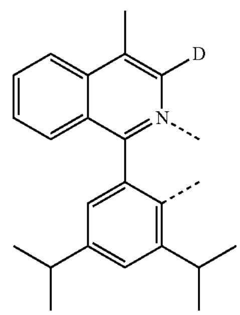
$L_{a902}$
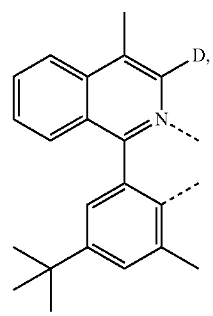
$L_{a903}$
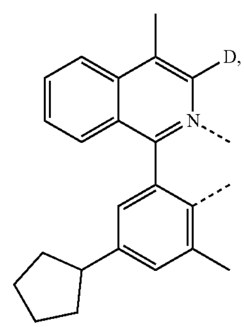
$L_{a904}$
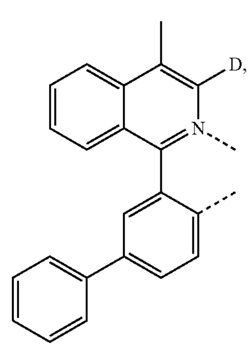

-continued
$L_{a905}$
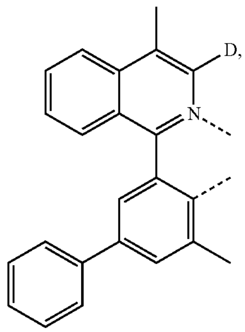
$L_{a906}$
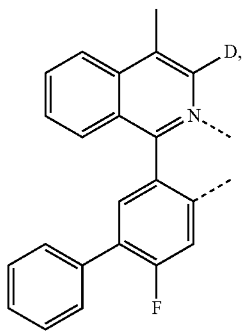
$L_{a907}$
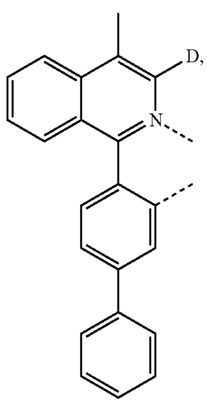
$L_{a908}$
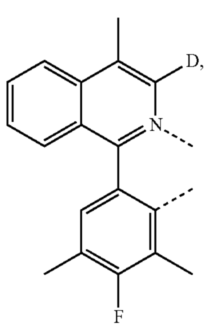
-continued
$L_{a909}$
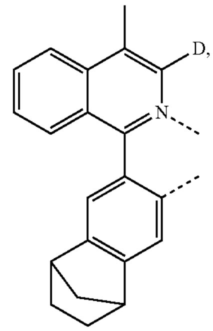
$L_{a910}$
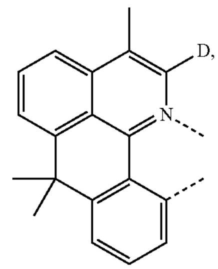
$L_{a911}$
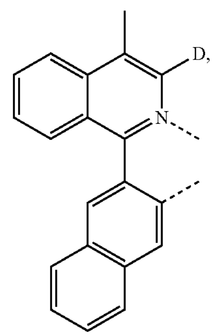
$L_{a912}$
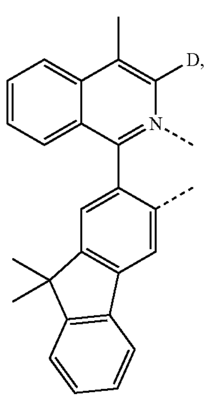

-continued
$L_{a913}$
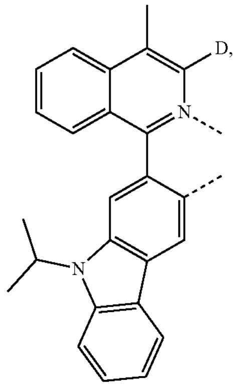
$L_{a914}$
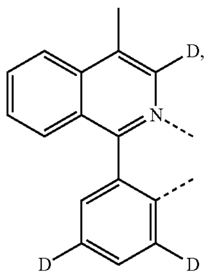
$L_{a915}$
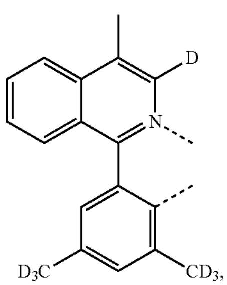
$L_{a916}$
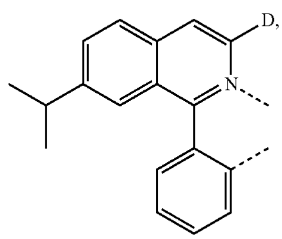
$L_{a917}$
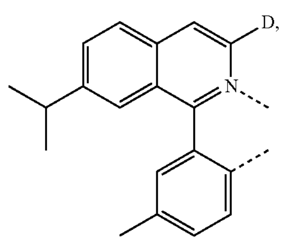
-continued
$L_{a918}$
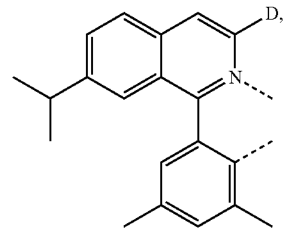
$L_{a919}$
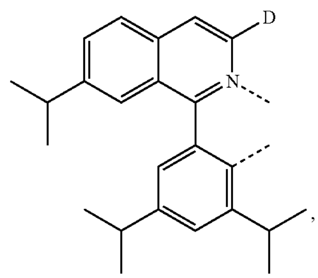
$L_{a920}$
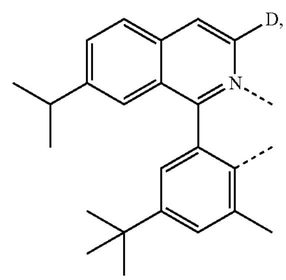
$L_{a921}$
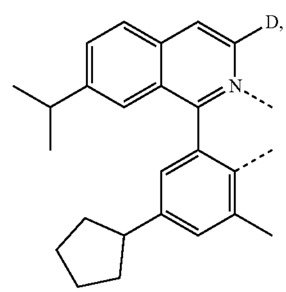
$L_{a922}$
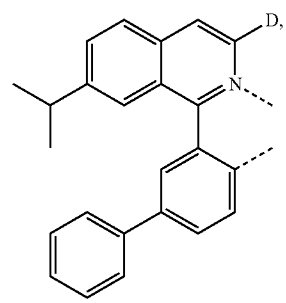

-continued
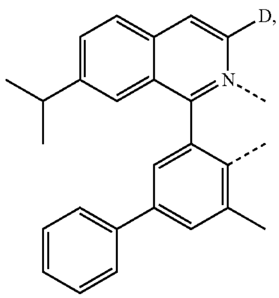
$L_{a923}$
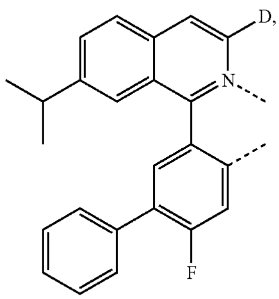
$L_{a924}$
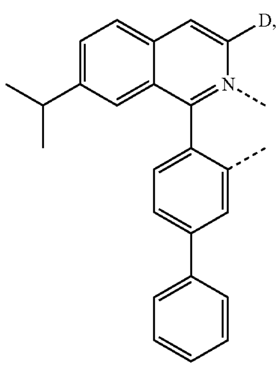
$L_{a925}$
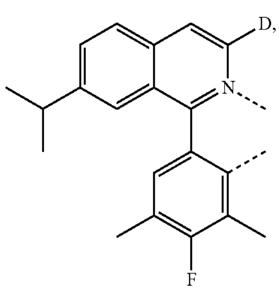
$L_{a926}$
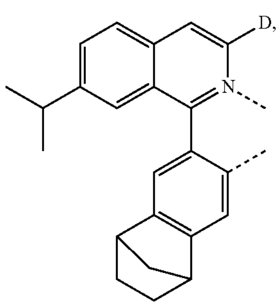
$L_{a927}$
-continued
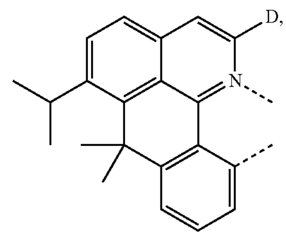
$L_{a928}$
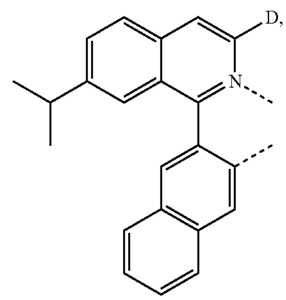
$L_{a929}$
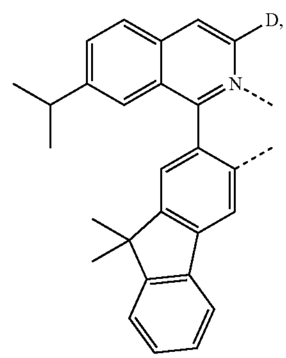
$L_{a930}$
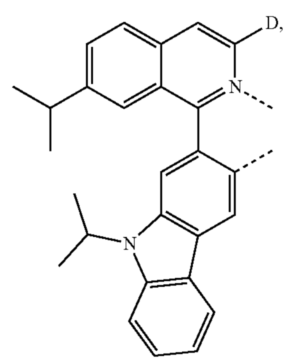
$L_{a931}$
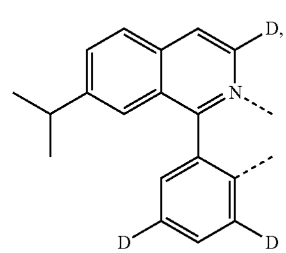
$L_{a932}$ -continued
$L_{a933}$
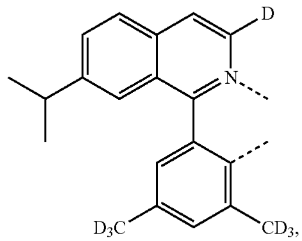
$L_{a934}$
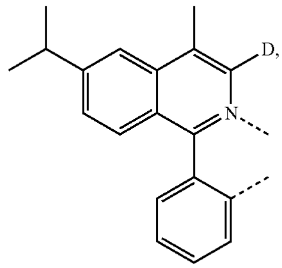
$L_{a935}$
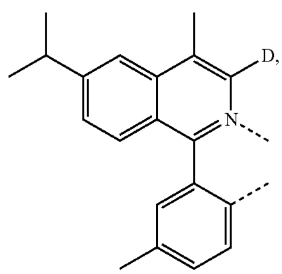
$L_{a936}$
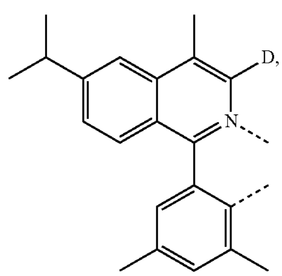
$L_{a937}$
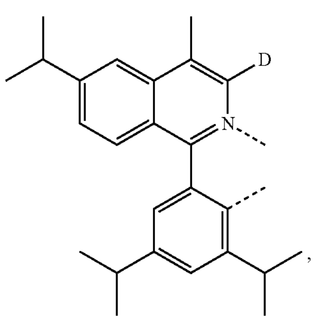
-continued
$L_{a938}$
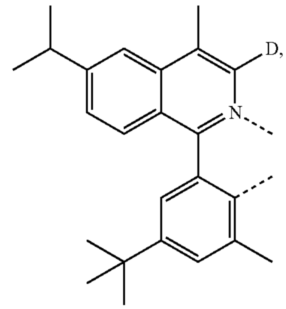
$L_{a939}$
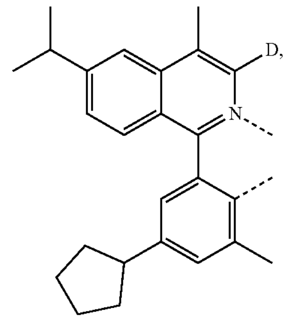
$L_{a940}$
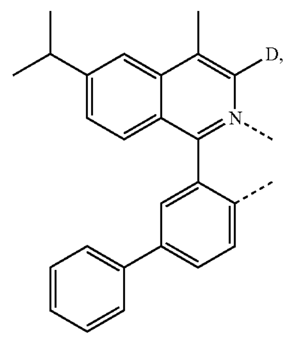
$L_{a941}$
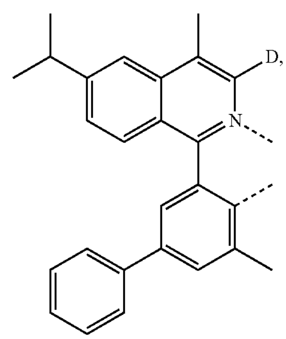

-continued
$L_{a942}$
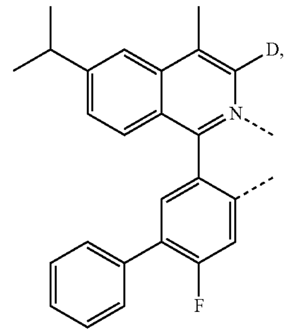
$L_{a943}$
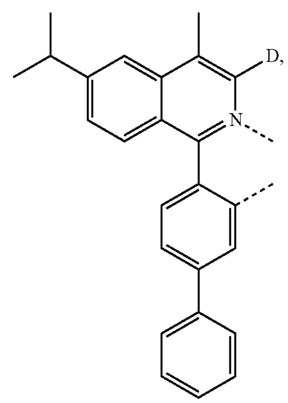
$L_{a944}$
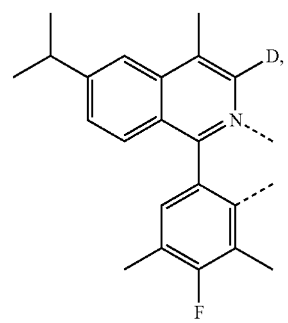
$L_{a945}$
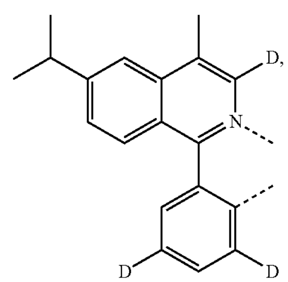
$L_{a946}$
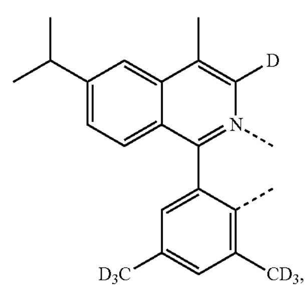
-continued
$L_{a947}$
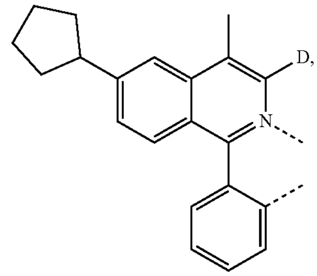
$L_{a948}$
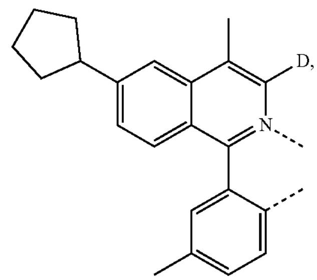
$L_{a949}$
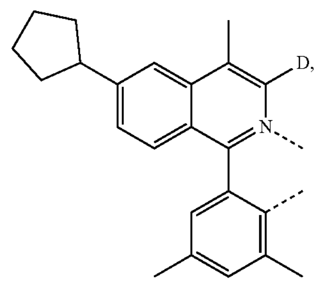
$L_{a950}$
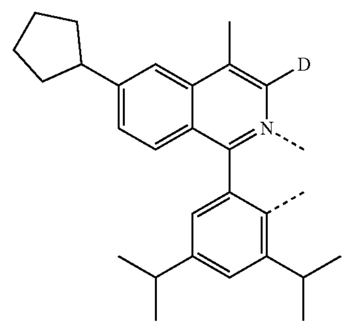
$L_{a951}$
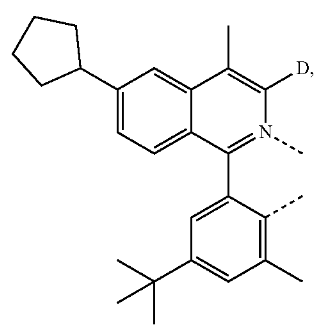

-continued
$L_{a952}$
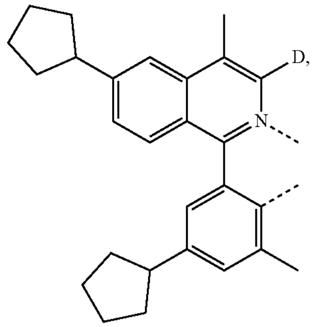
$L_{a953}$
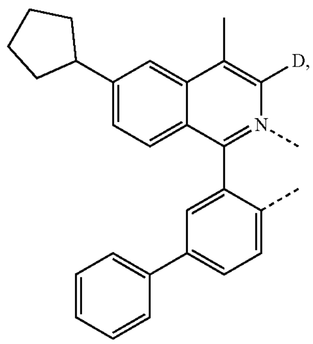
$L_{a954}$
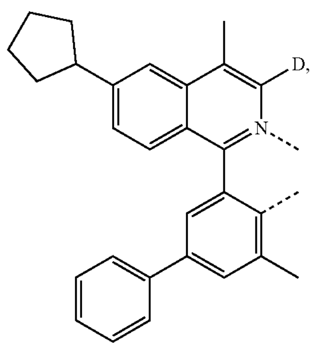
$L_{a955}$
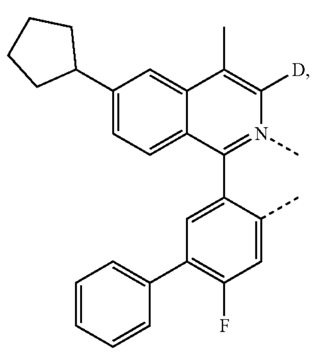
-continued
$L_{a956}$
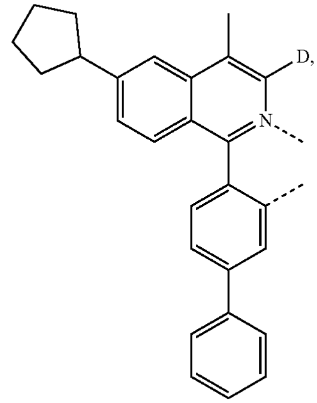
$L_{a957}$
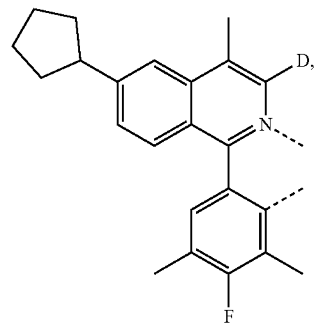
$L_{a958}$
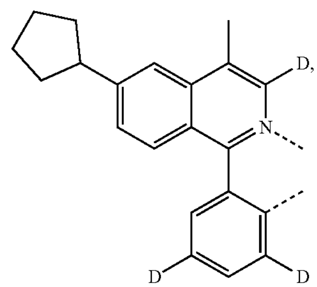
$L_{a959}$
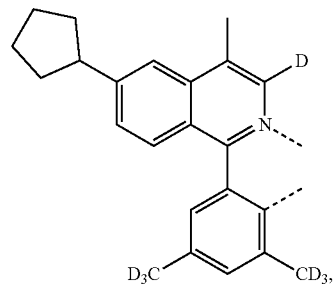
$L_{a960}$
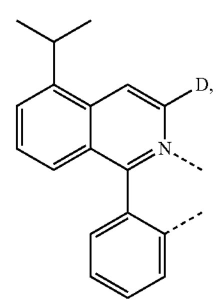

-continued
$L_{a961}$
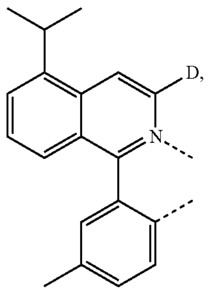
$L_{a962}$
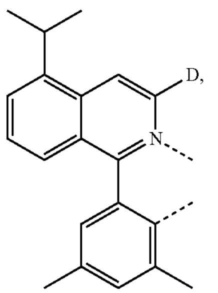
$L_{a963}$
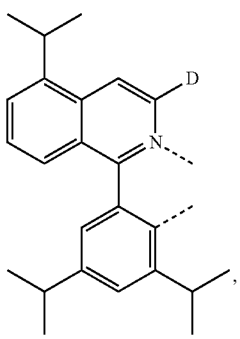
$L_{a964}$
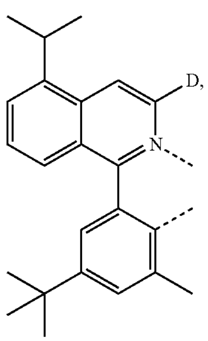
$L_{a965}$
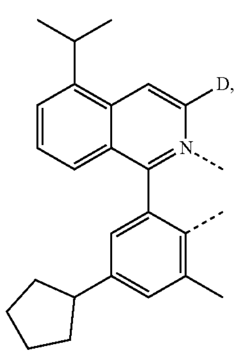
-continued
$L_{a966}$
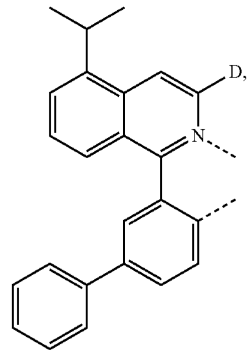
$L_{a967}$
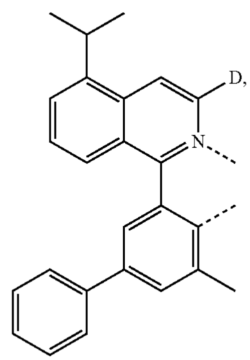
$L_{a968}$
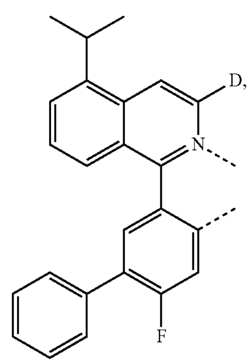
$L_{a969}$
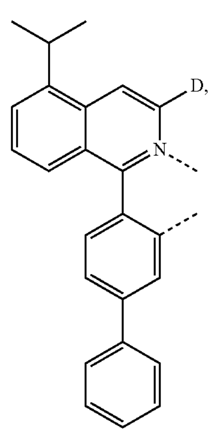

-continued
$L_{a970}$
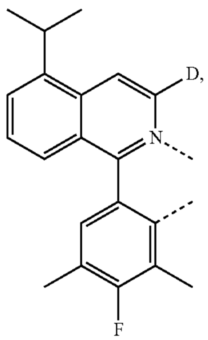
$L_{a971}$
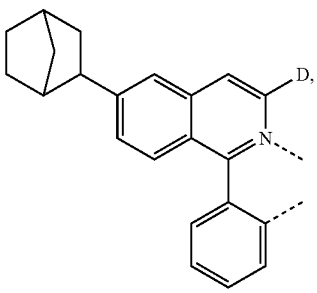
$L_{a972}$
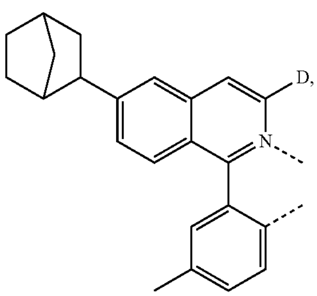
$L_{a973}$
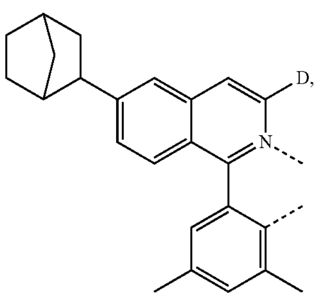
$L_{a974}$
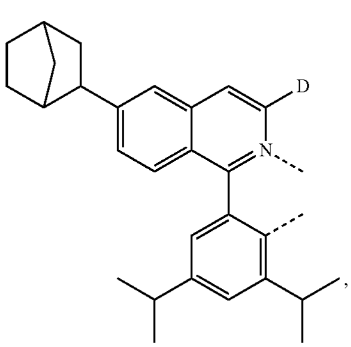
-continued
$L_{a975}$
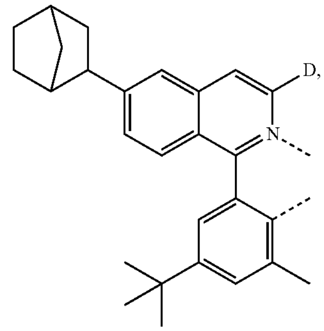
$L_{a976}$
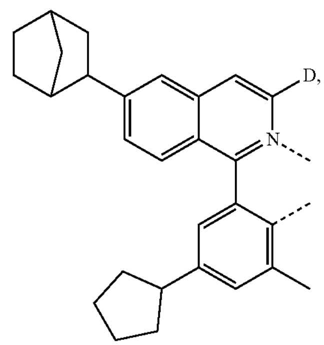
$L_{a977}$
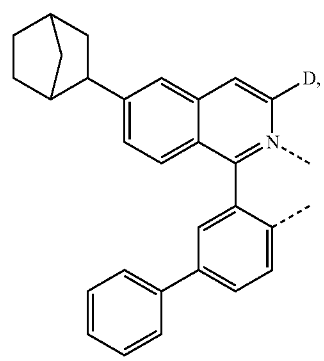
$L_{a978}$
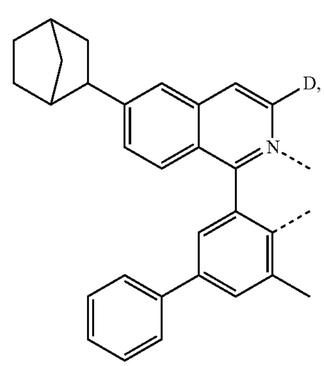

-continued
$L_{a979}$
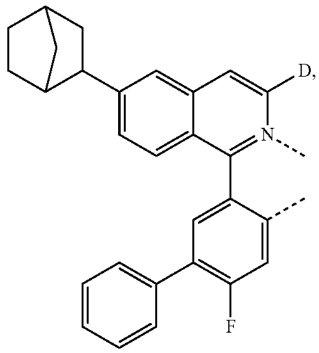
$L_{a980}$
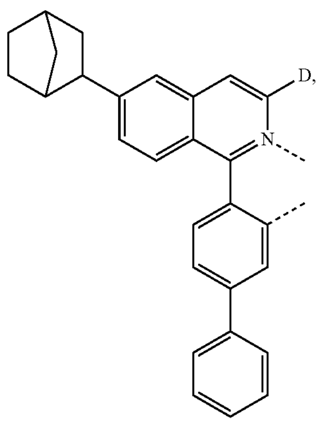
$L_{a981}$
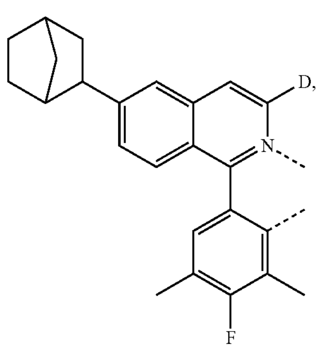
$L_{a982}$
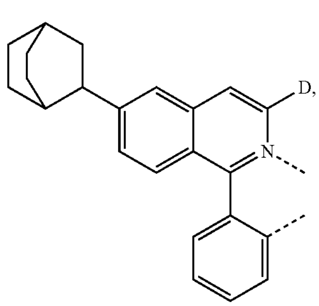
-continued
$L_{a983}$
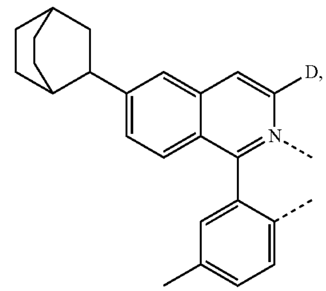
$L_{a984}$
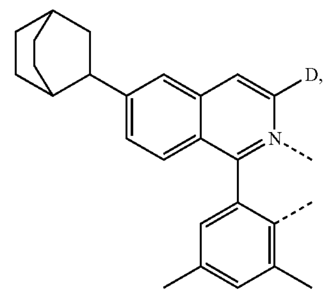
$L_{a985}$
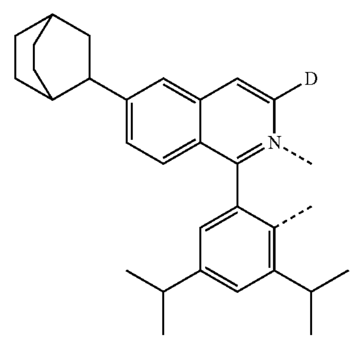
$L_{a986}$
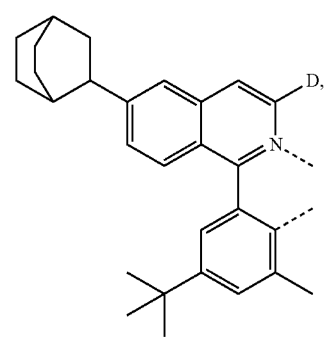
$L_{a987}$
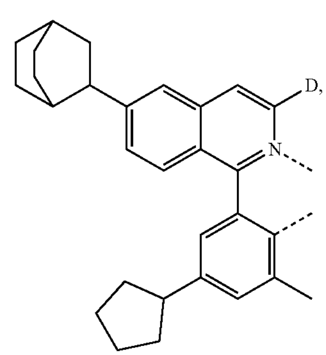

-continued
$L_{a988}$
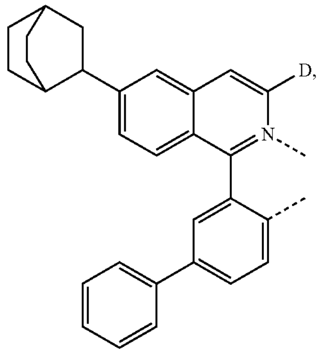
$L_{a989}$
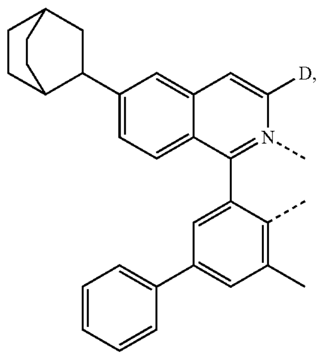
$L_{a990}$
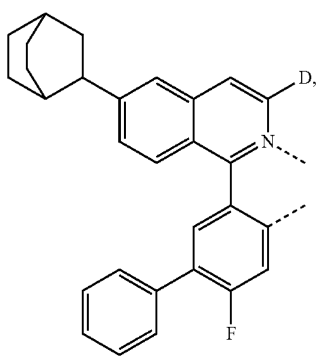
$L_{a991}$
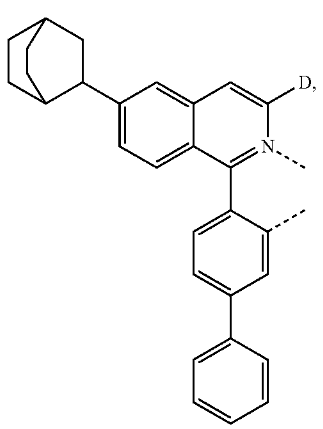
-continued
$L_{a992}$
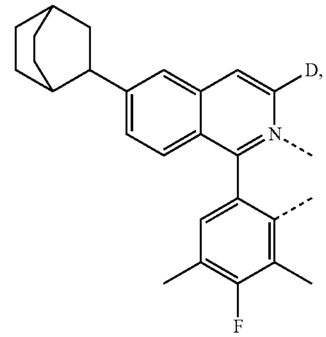
$L_{a993}$
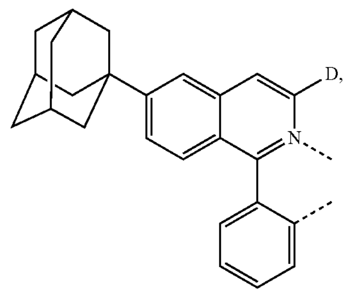
$L_{a994}$
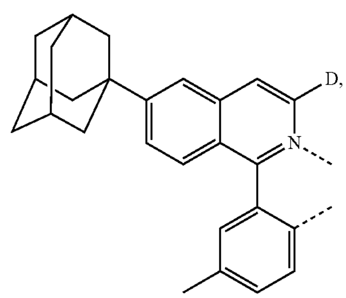
$L_{a995}$
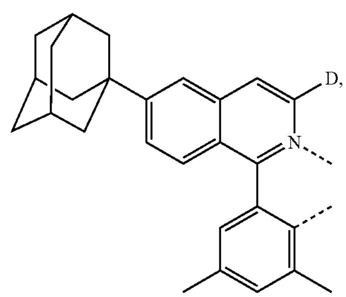
$L_{a996}$
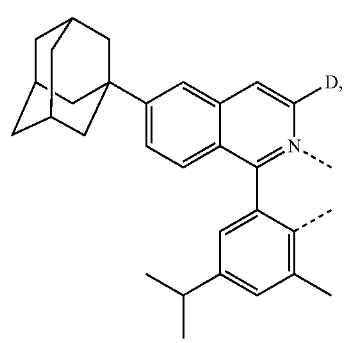

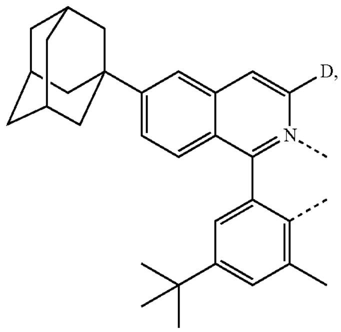
$L_{a997}$
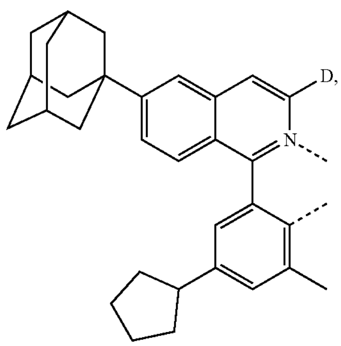
$L_{a998}$
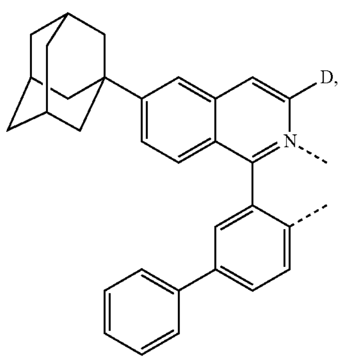
$L_{a999}$
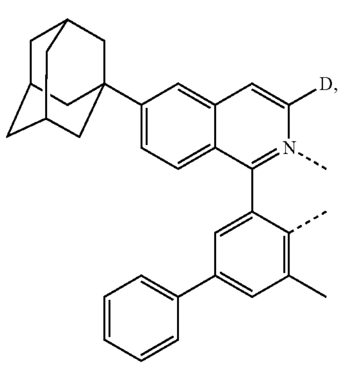
$L_{a1000}$
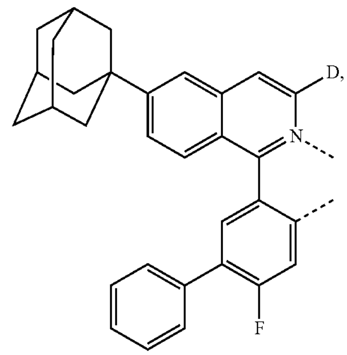
$L_{a1001}$
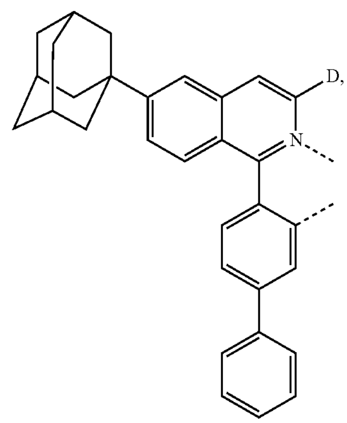
$L_{a1002}$
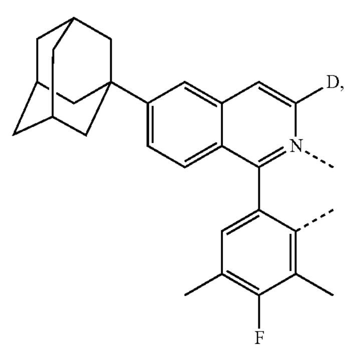
$L_{a1003}$
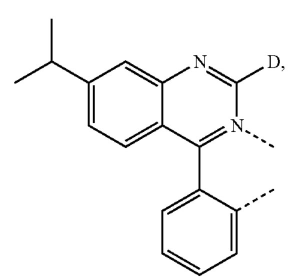
$L_{a1004}$ -continued
$L_{a1005}$
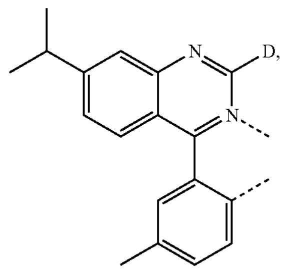
$L_{a1006}$
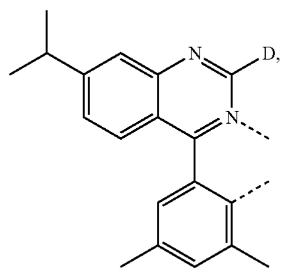
$L_{a1007}$
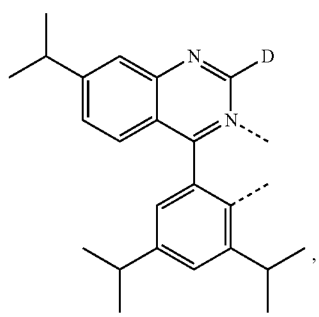
$L_{a1008}$
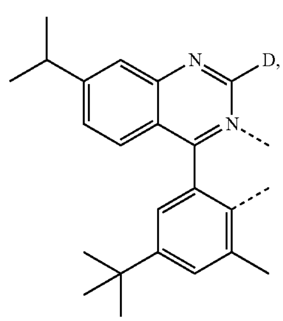
$L_{a1009}$
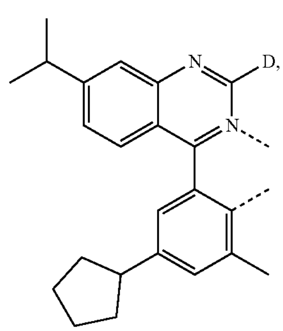
-continued
$L_{a1010}$
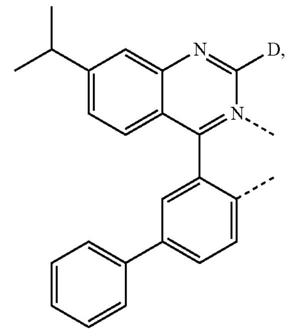
$L_{a1011}$
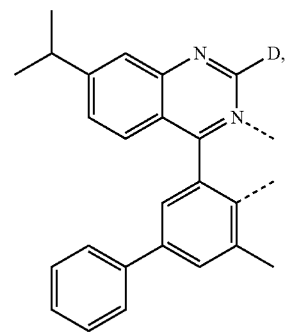
$L_{a1012}$
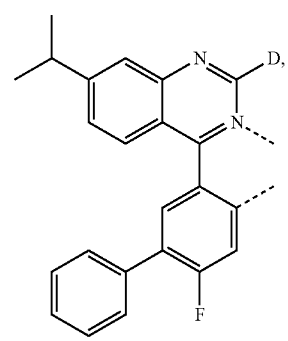
$L_{a1013}$
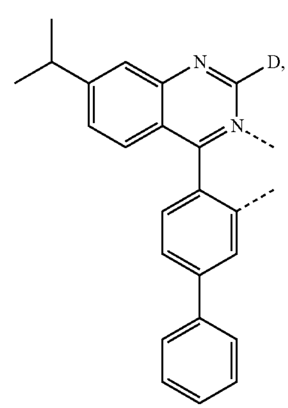

-continued
$L_{a1014}$
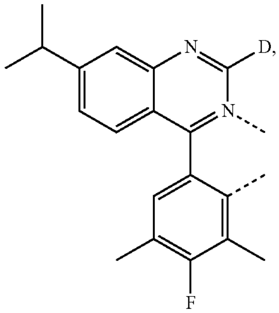
$L_{a1015}$
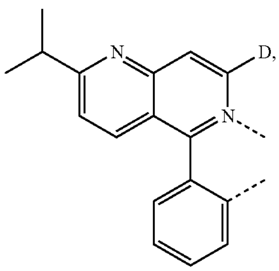
$L_{a1016}$
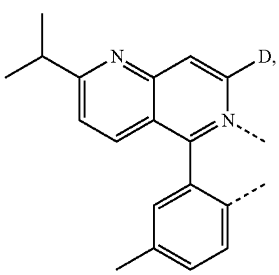
$L_{a1017}$
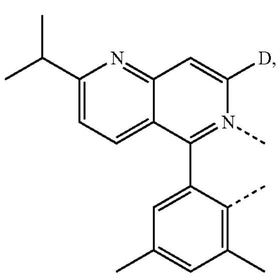
$L_{a1018}$
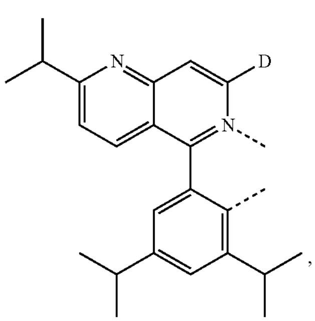
-continued
$L_{a1019}$
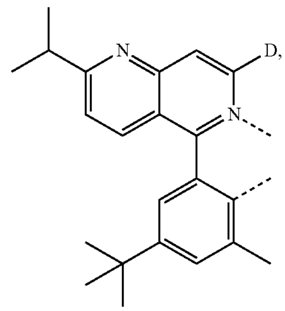
$L_{a1020}$
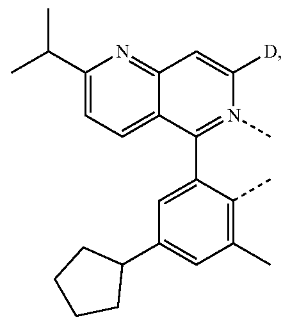
$L_{a1021}$
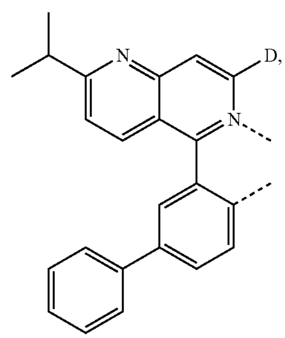
$L_{a1022}$
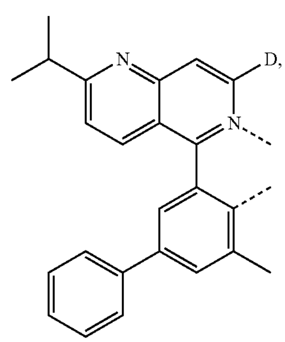
$L_{a1023}$
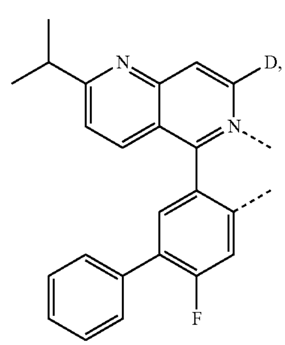

-continued
$L_{a1024}$
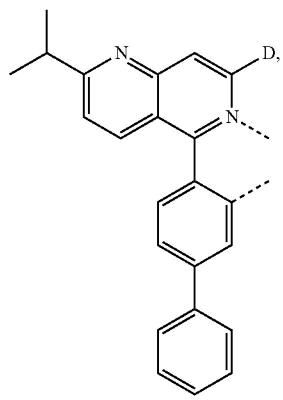
$L_{a1025}$
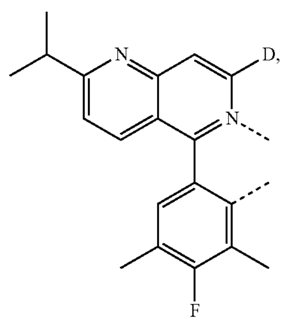
$L_{a1026}$
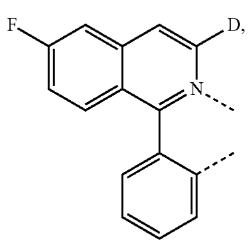
$L_{a1027}$
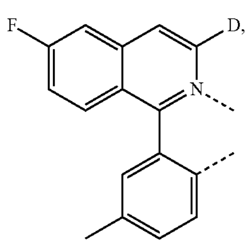
$L_{a1028}$
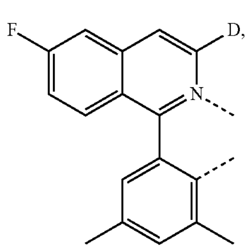
-continued
$L_{a1029}$
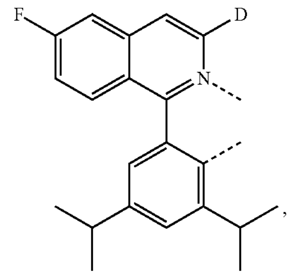
$L_{a1030}$
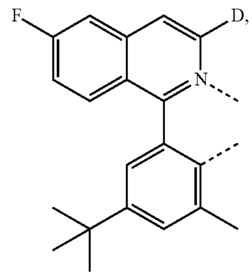
$L_{a1031}$
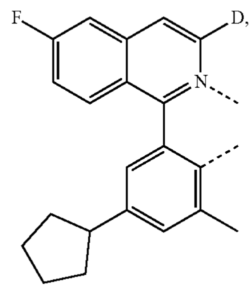
$L_{a1032}$
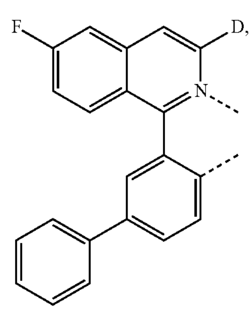
$L_{a1033}$
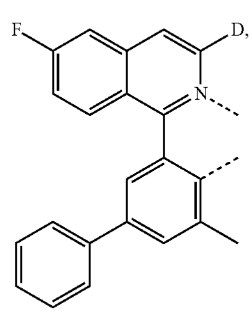

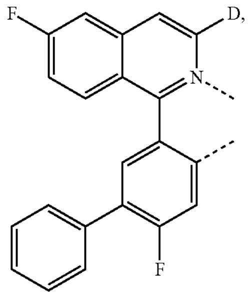
$L_{a1034}$
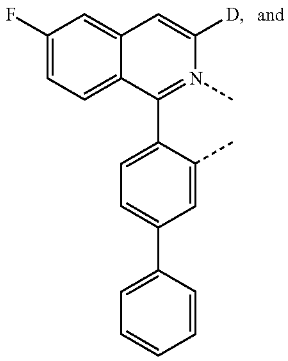
$L_{a1035}$
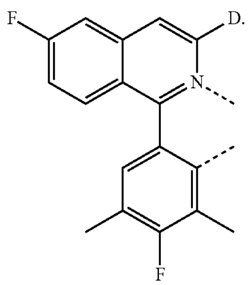
$L_{a1036}$
10. The metal complex of claim 9, wherein the second ligand $L_b$ is each independently selected from any one or two in a group consisting of $L_{b1}$ to $L_{b365}$:
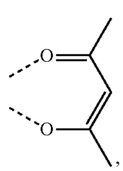
$L_{b1}$
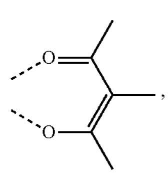
$L_{b2}$
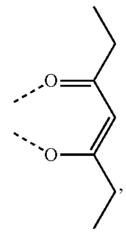
$L_{b3}$
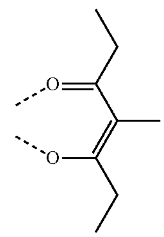
$L_{b4}$
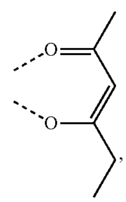
$L_{b5}$
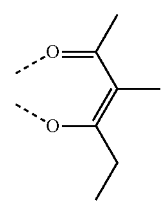
$L_{b6}$
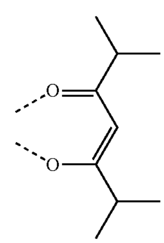
$L_{b7}$
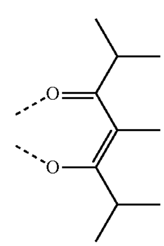
$L_{b8}$
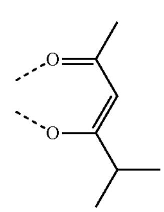
$L_{b9}$ -continued
$L_{b10}$
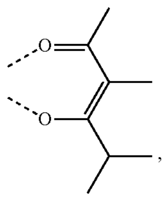
$L_{b11}$
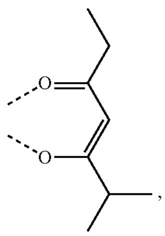
$L_{b12}$
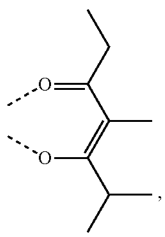
$L_{b13}$
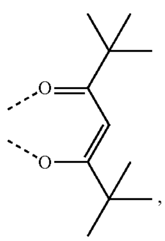
$L_{b14}$
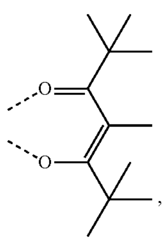
$L_{b15}$
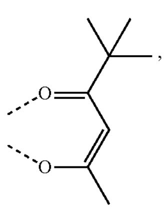
$L_{b16}$
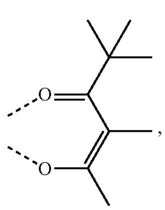
-continued
$L_{b17}$
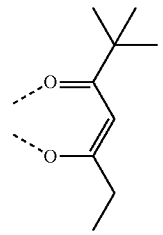
$L_{b18}$
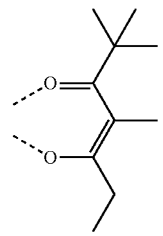
$L_{b19}$
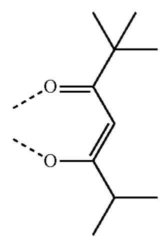
$L_{b20}$
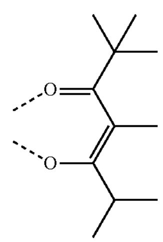
$L_{b21}$
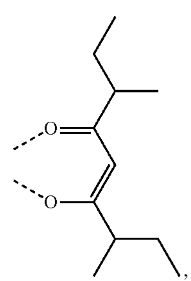
$L_{b22}$
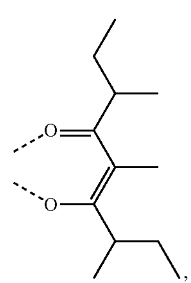

-continued
$L_{b23}$
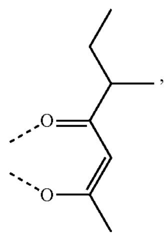
$L_{b24}$
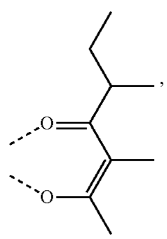
$L_{b25}$
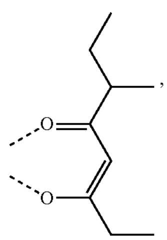
$L_{b26}$
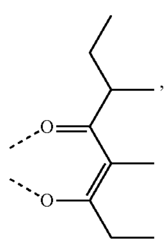
$L_{b27}$
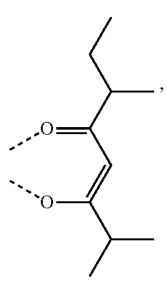
$L_{b28}$
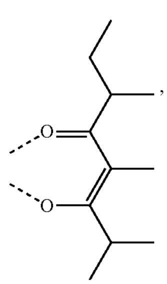
-continued
$L_{b29}$
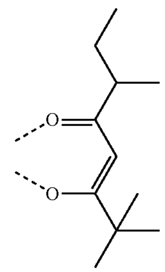
$L_{b30}$
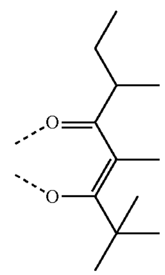
$L_{b31}$
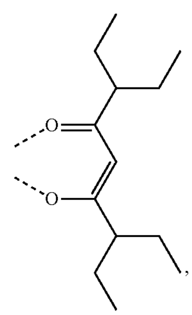
$L_{b32}$
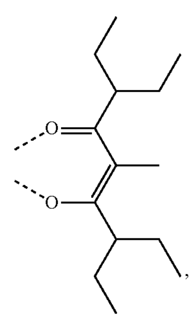
$L_{b33}$
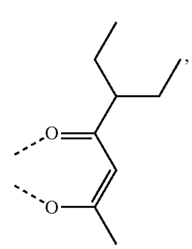

-continued
$L_{b34}$
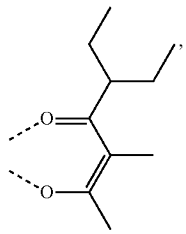
$L_{b35}$
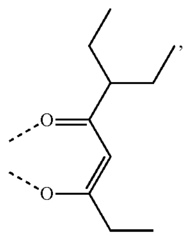
$L_{b36}$
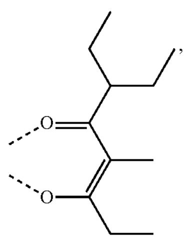
$L_{b37}$
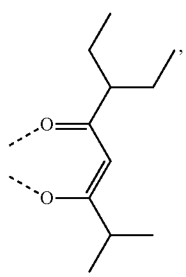
$L_{b38}$
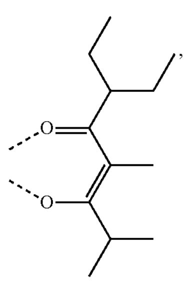
$L_{b39}$
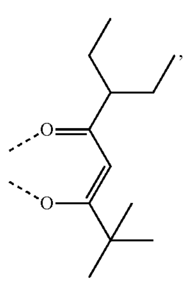
-continued
$L_{b40}$
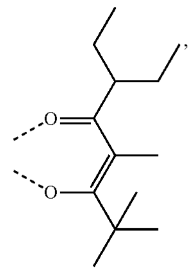
$L_{b41}$
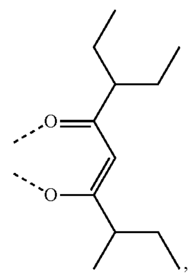
$L_{b42}$
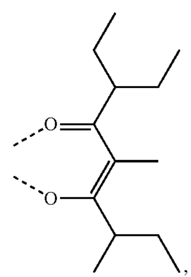
$L_{b43}$
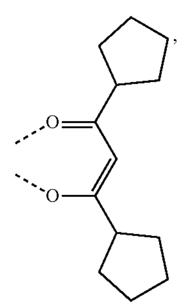
$L_{b44}$
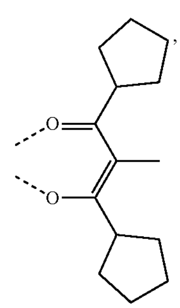

$L_{b45}$
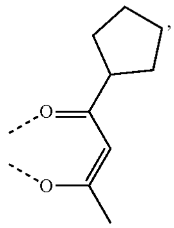
$L_{b46}$
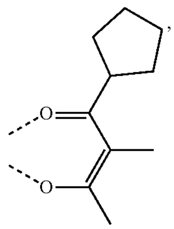
$L_{b47}$
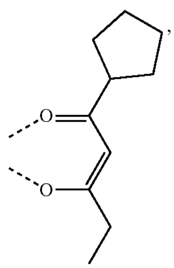
$L_{b48}$
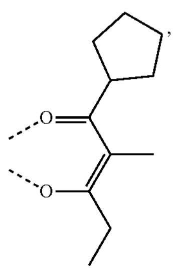
$L_{b49}$
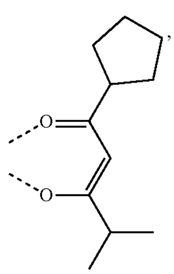
$L_{b50}$
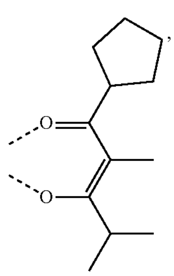
$L_{b51}$
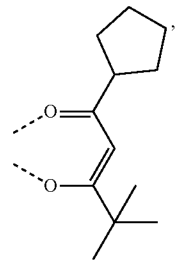
$L_{b52}$
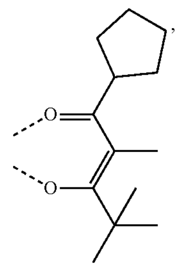
$L_{b53}$
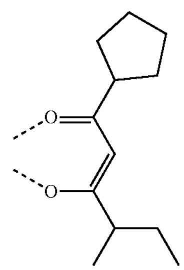
$L_{b54}$
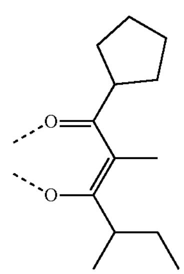
$L_{b55}$
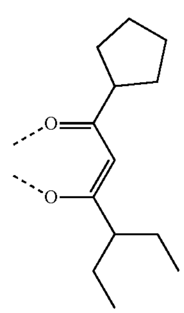

-continued
$L_{b56}$
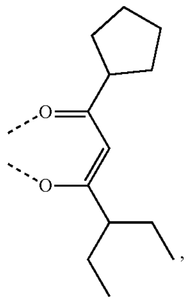
$L_{b57}$
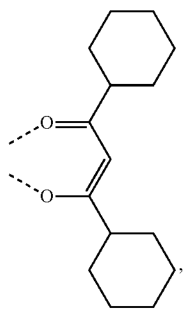
$L_{b58}$
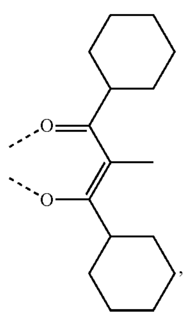
$L_{b59}$
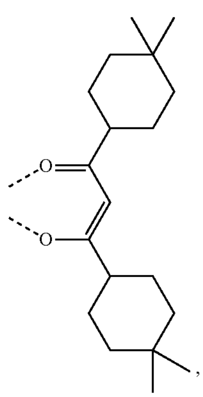
-continued
$L_{b60}$
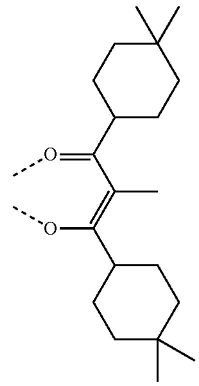
$L_{b61}$
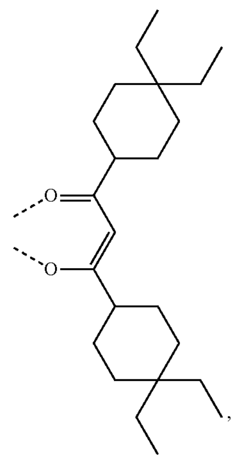
$L_{b62}$
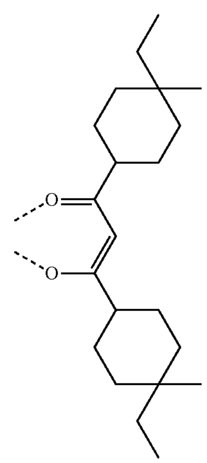

$L_{b63}$
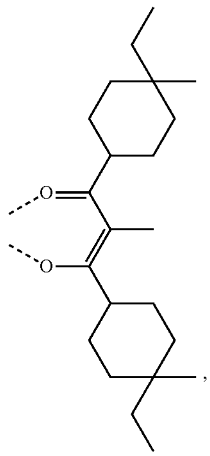
$L_{b64}$
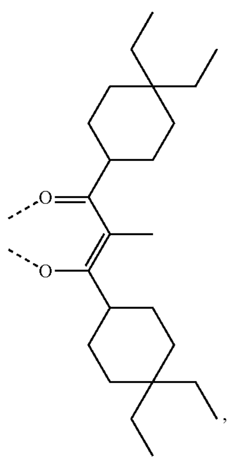
$L_{b65}$
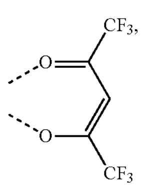
$L_{b66}$
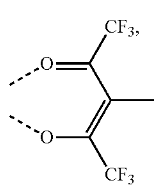
$L_{b67}$
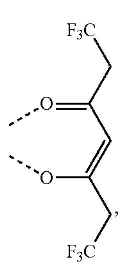
$L_{b68}$
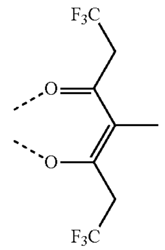
$L_{b69}$
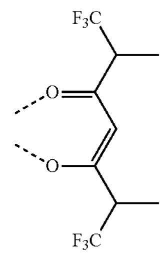
$L_{b70}$
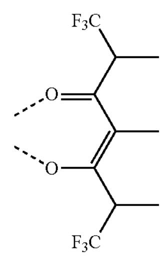
$L_{b71}$
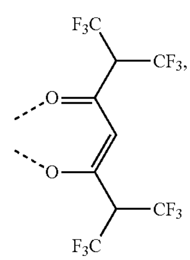
$L_{b72}$
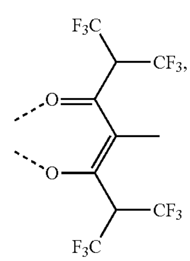
$L_{b73}$
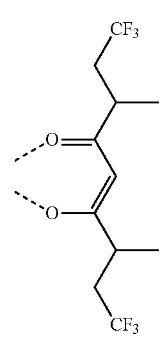

-continued
$L_{b74}$
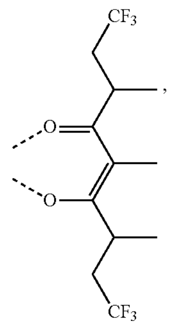
$L_{b75}$
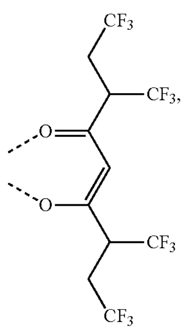
$L_{b76}$
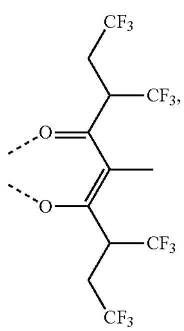
$L_{b77}$
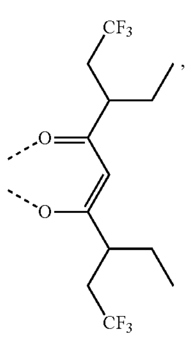
-continued
$L_{b78}$
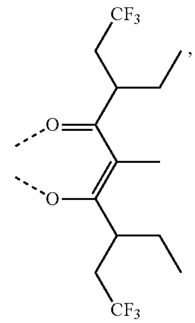
$L_{b79}$
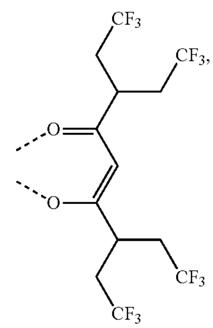
$L_{b80}$
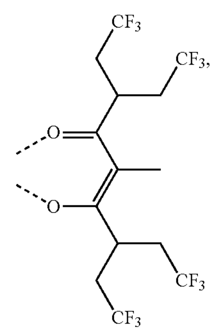
$L_{b81}$
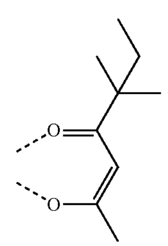
$L_{b82}$
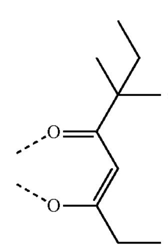

-continued
$L_{b83}$
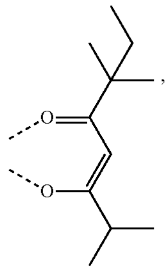
$L_{b84}$
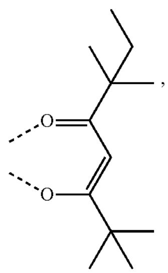
$L_{b85}$
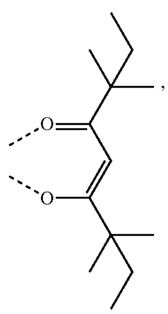
$L_{b86}$
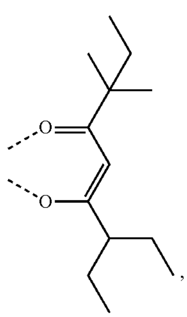
$L_{b87}$
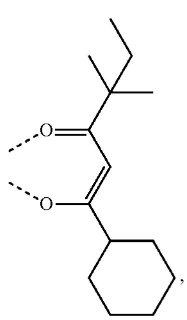
-continued
$L_{b88}$
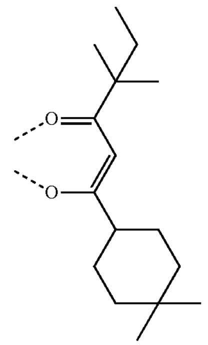
$L_{b89}$
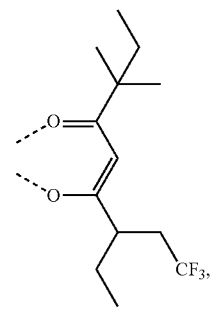
$L_{b90}$
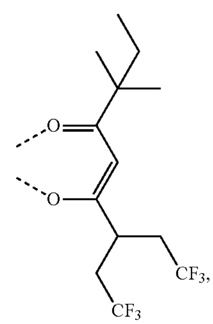
$L_{b91}$
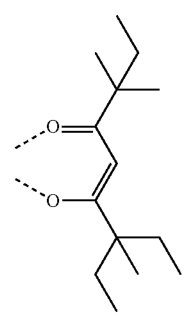
$L_{b92}$
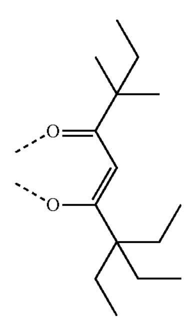

-continued
$L_{b93}$
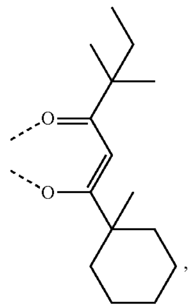
$L_{b94}$
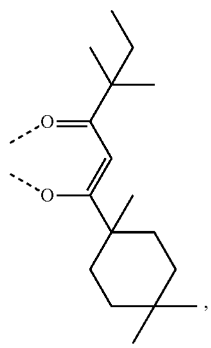
$L_{b95}$
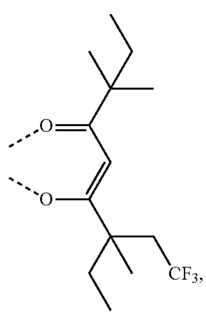
$L_{b96}$
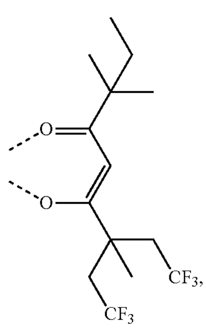
$L_{b97}$
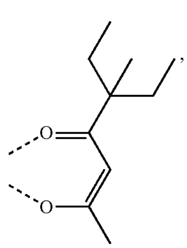
-continued
$L_{b98}$
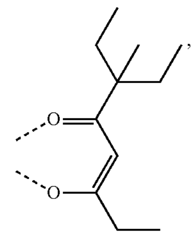
$L_{b99}$
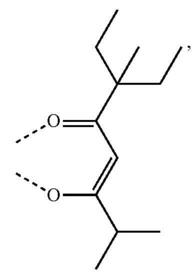
$L_{b100}$
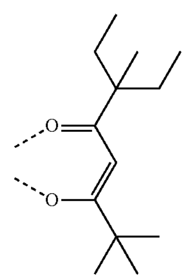
$L_{b101}$
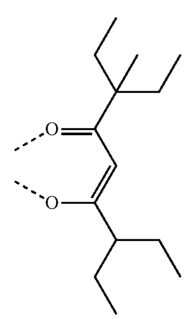
$L_{b102}$
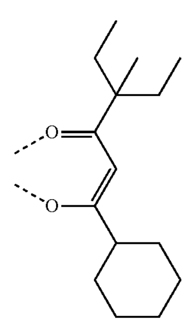

-continued
$L_{b103}$
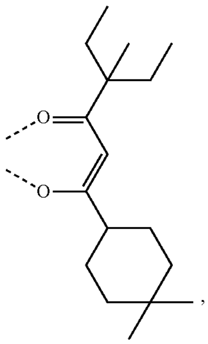
$L_{b104}$
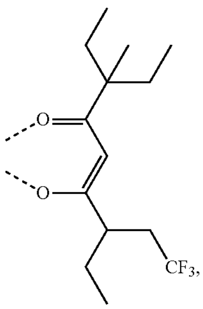
$L_{b105}$
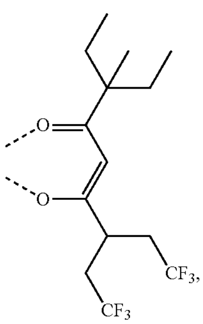
$L_{b106}$
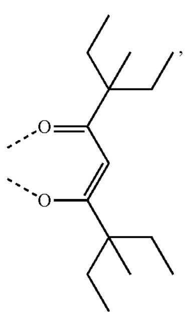
$L_{b107}$
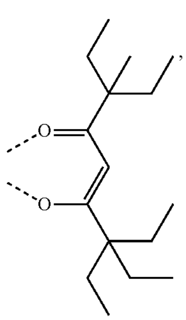
-continued
$L_{b108}$
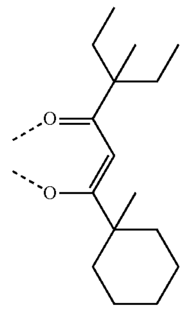
$L_{b109}$
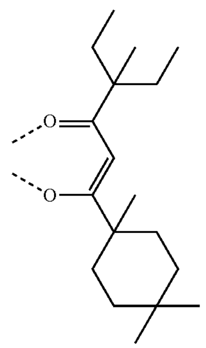
$L_{b110}$
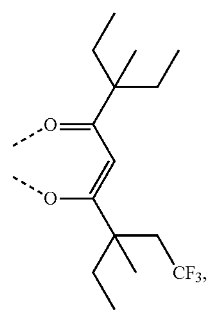
$L_{b111}$
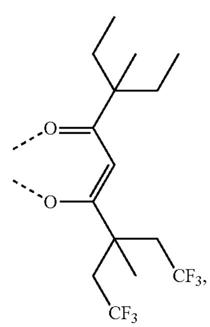
$L_{b112}$
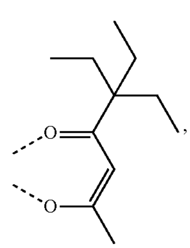

-continued
$L_{b113}$
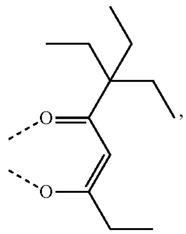
$L_{b114}$
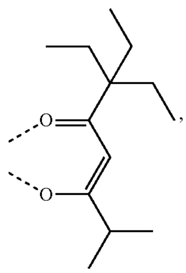
$L_{b115}$
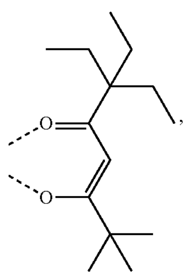
$L_{b116}$
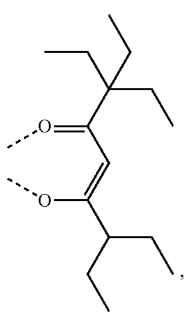
$L_{b117}$
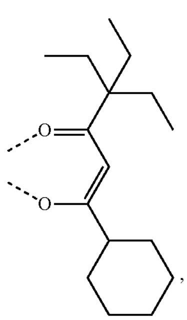
-continued
$L_{b118}$
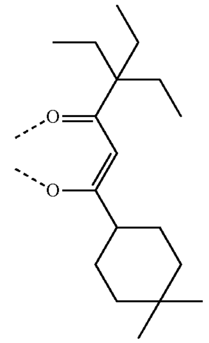
$L_{b119}$
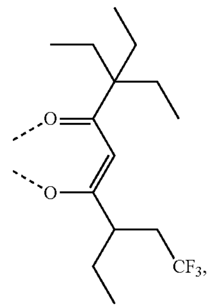
$L_{b120}$
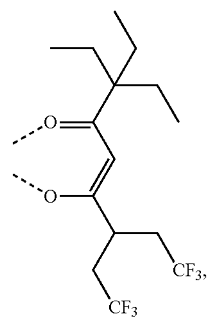
$L_{b121}$
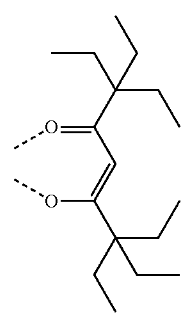
$L_{b122}$
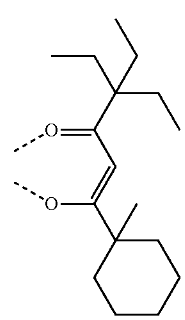

-continued
$L_{b123}$
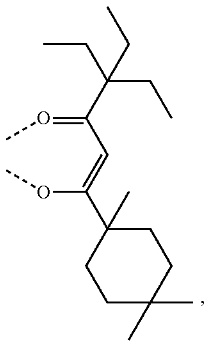
$L_{b124}$
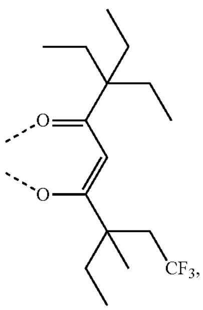
$L_{b125}$
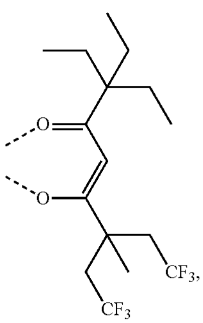
$L_{b126}$
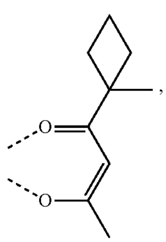
$L_{b127}$
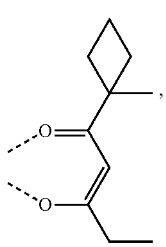
-continued
$L_{b128}$
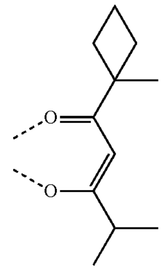
$L_{b129}$
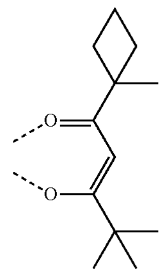
$L_{b130}$
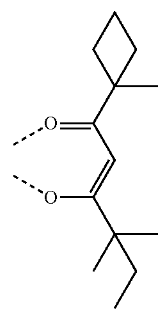
$L_{b131}$
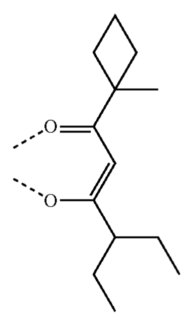
$L_{b132}$
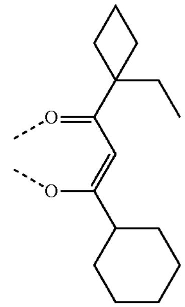

-continued
$L_{b133}$
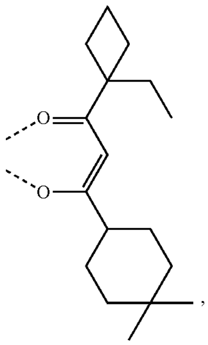
$L_{b134}$
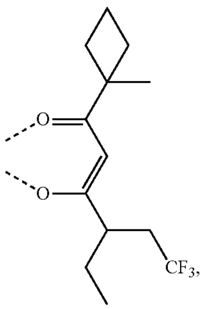
$L_{b135}$
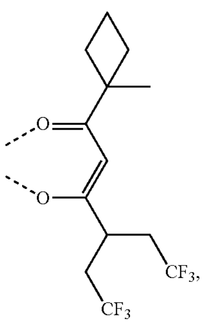
$L_{b136}$
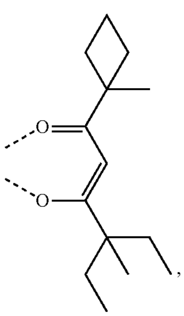
$L_{b137}$
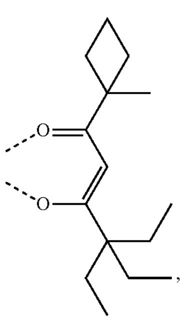
-continued
$L_{b138}$
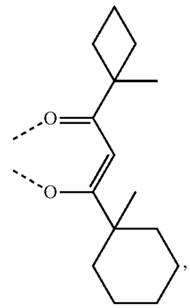
$L_{b139}$
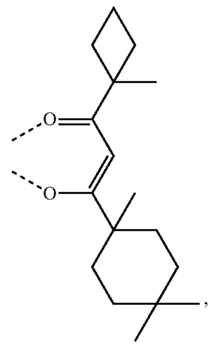
$L_{b140}$
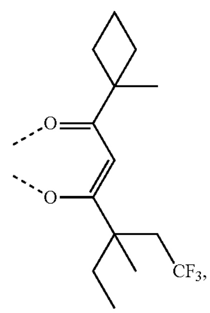
$L_{b141}$
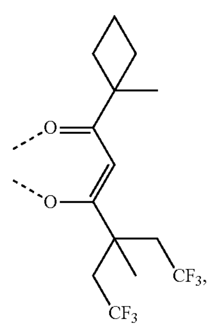
$L_{b142}$
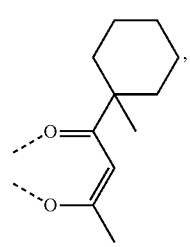

-continued
$L_{b143}$
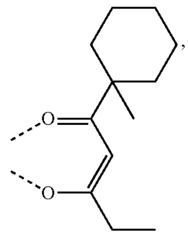
$L_{b144}$
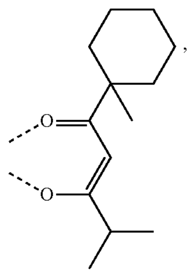
$L_{b145}$
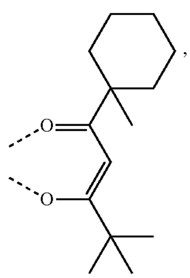
$L_{b146}$
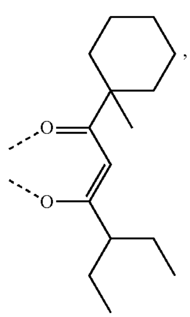
$L_{b147}$
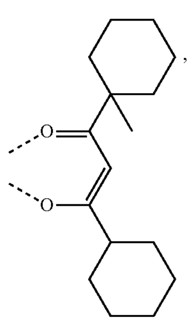
-continued
$L_{b148}$
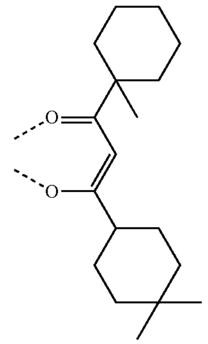
$L_{b149}$
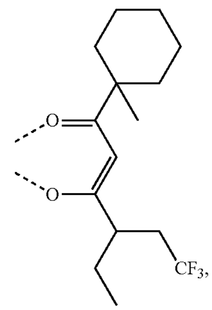
$L_{b150}$
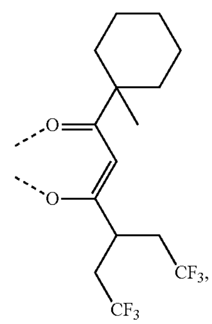
$L_{b151}$
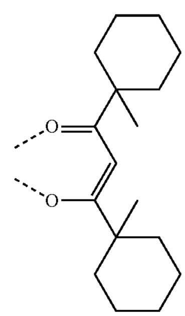
$L_{b152}$
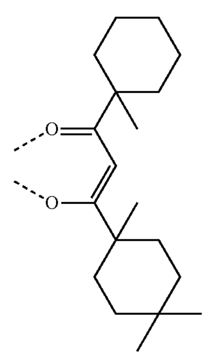

-continued
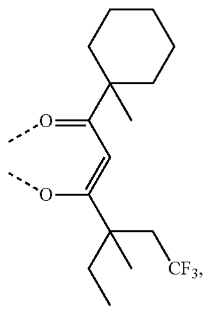
$L_{b153}$
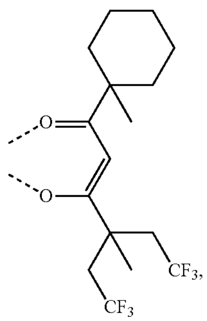
$L_{b154}$
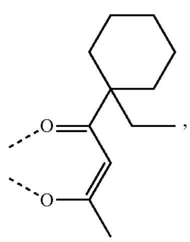
$L_{b155}$
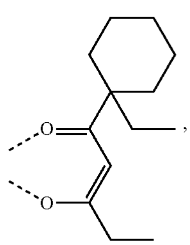
$L_{b156}$
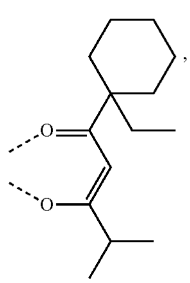
$L_{b157}$
-continued
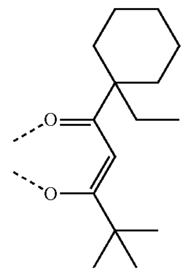
$L_{b158}$
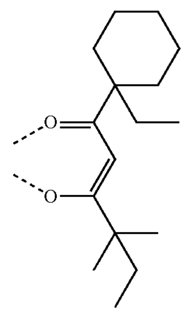
$L_{b159}$
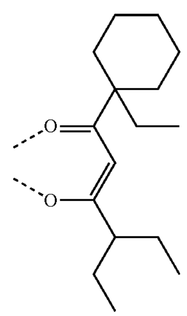
$L_{b160}$
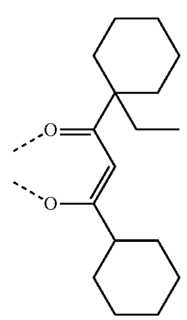
$L_{b161}$
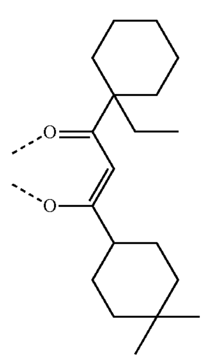
$L_{b162}$ $L_{b163}$
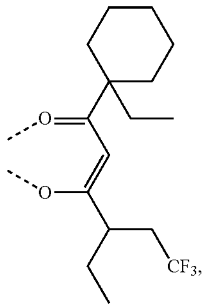
$L_{b164}$
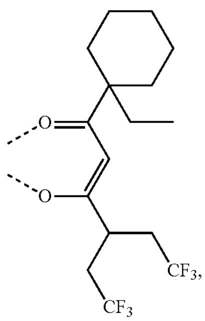
$L_{b165}$
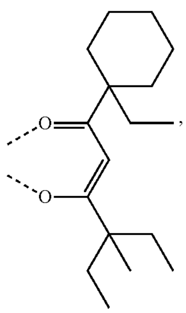
$L_{b166}$
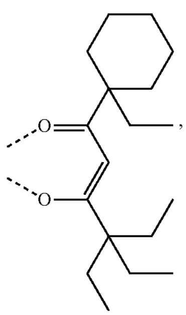
$L_{b167}$
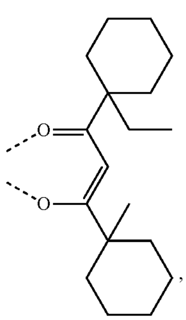
$L_{b168}$
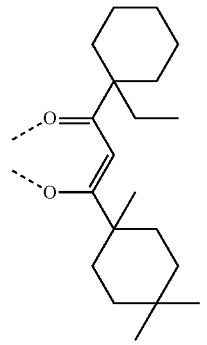
$L_{b169}$
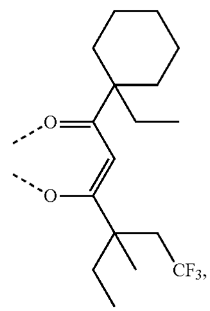
$L_{b170}$
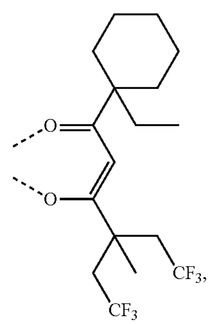
$L_{b171}$
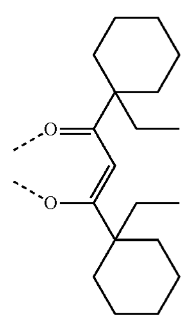
$L_{b172}$
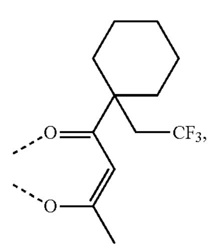

-continued
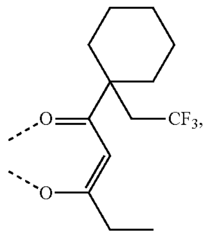
$L_{b173}$
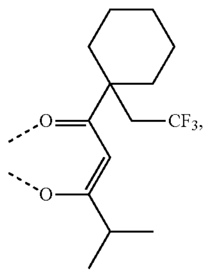
$L_{b174}$
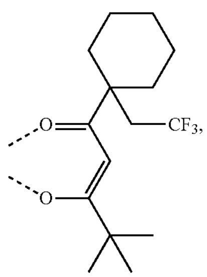
$L_{b175}$
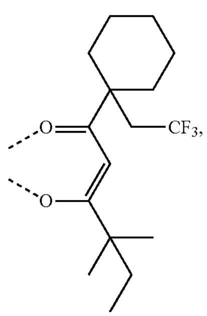
$L_{b176}$
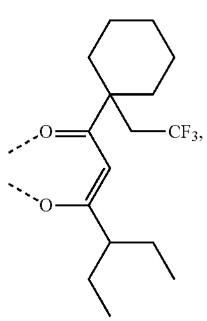
$L_{b177}$
-continued
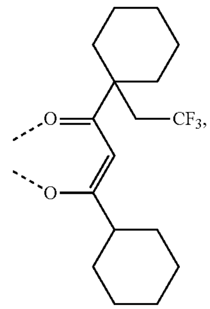
$L_{b178}$
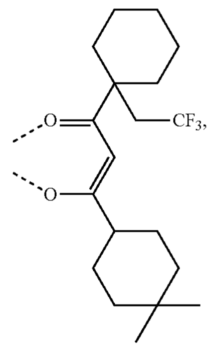
$L_{b179}$
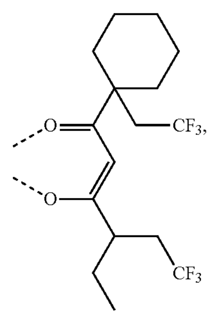
$L_{b180}$
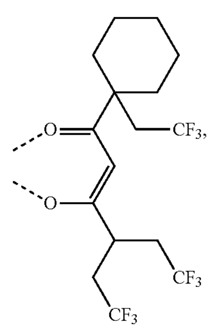
$L_{b181}$
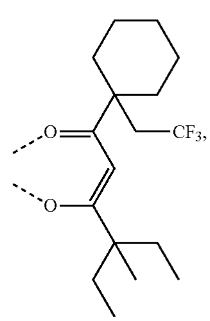
$L_{b182}$ -continued
$L_{b183}$
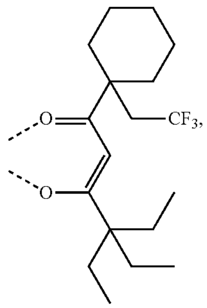
$L_{b184}$
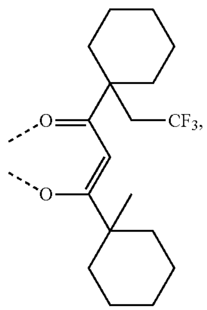
$L_{b185}$
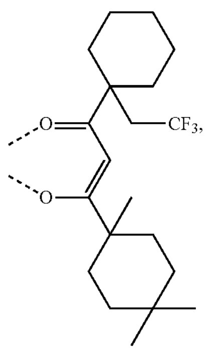
$L_{b186}$
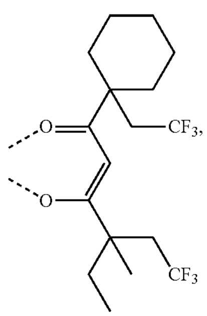
$L_{b187}$
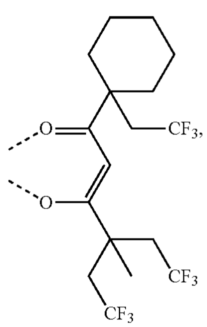
-continued
$L_{b188}$
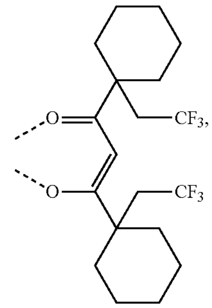
$L_{b189}$
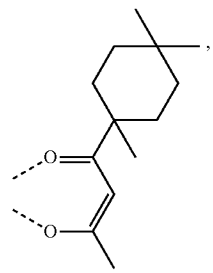
$L_{b190}$
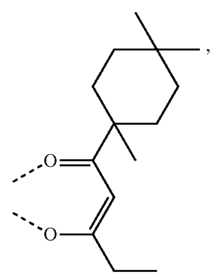
$L_{b191}$
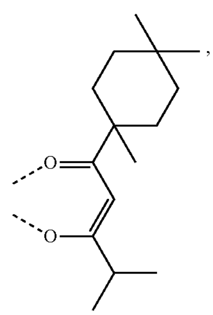
$L_{b192}$
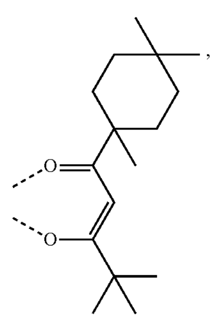

-continued
$L_{b193}$
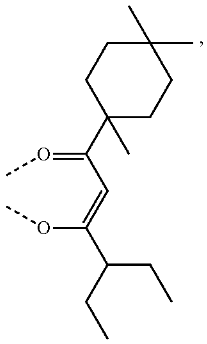
$L_{b194}$
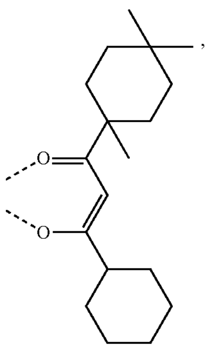
$L_{b195}$
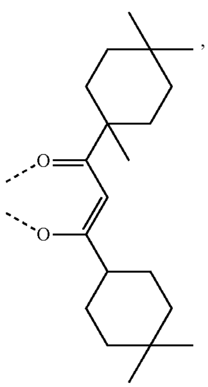
$L_{b196}$
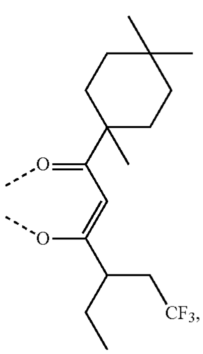
-continued
$L_{b197}$
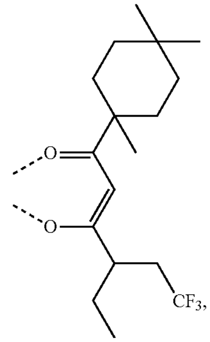
$L_{b198}$
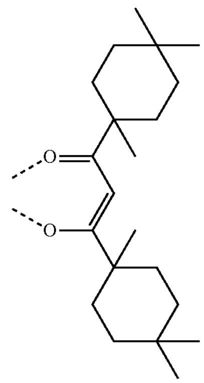
$L_{b199}$
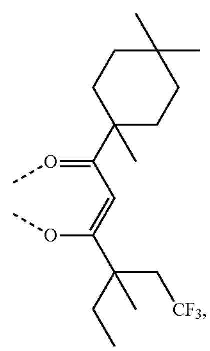
$L_{b200}$
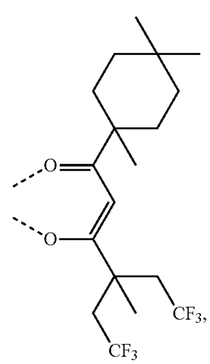

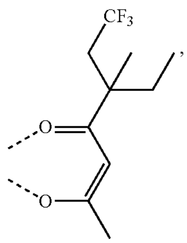
$L_{b201}$
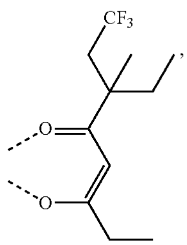
$L_{b202}$
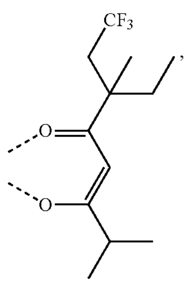
$L_{b203}$
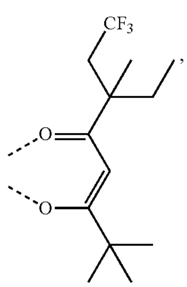
$L_{b204}$
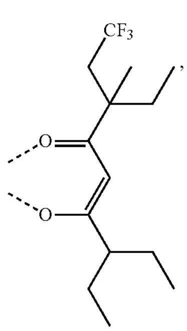
$L_{b205}$
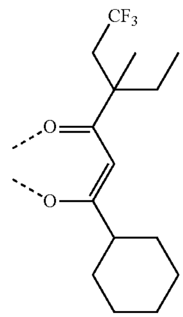
$L_{b206}$
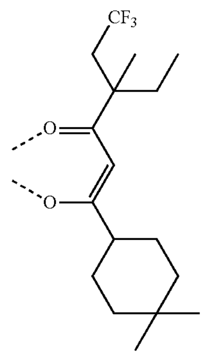
$L_{b207}$
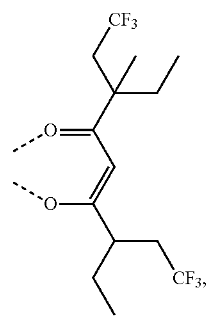
$L_{b208}$
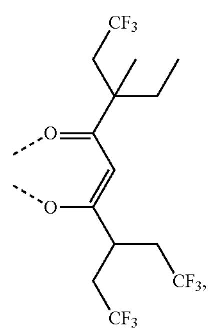
$L_{b209}$
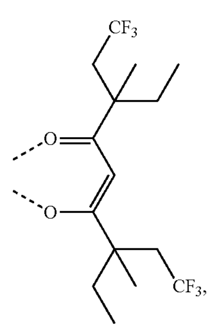
$L_{b210}$ -continued
L$_{b211}$
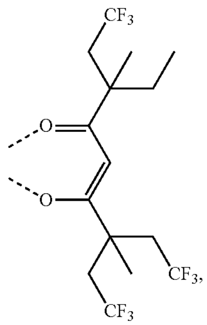
L$_{b212}$
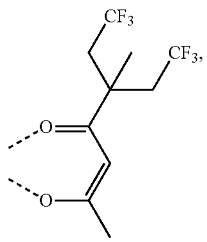
L$_{b213}$
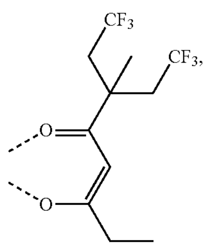
L$_{b214}$
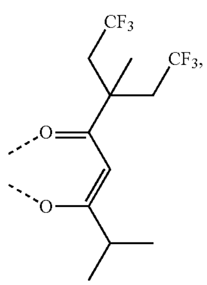
L$_{b215}$
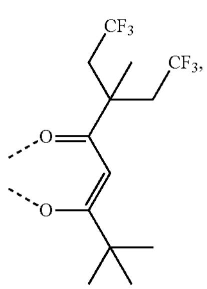
-continued
L$_{b216}$
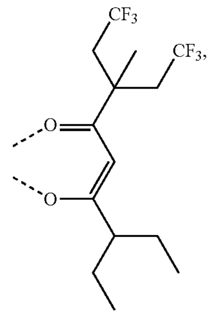
L$_{b217}$
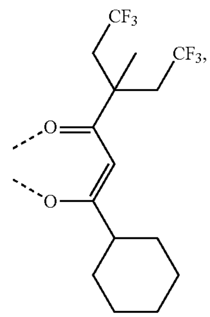
L$_{b218}$
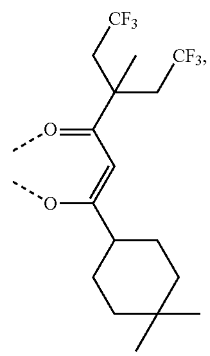
L$_{b219}$
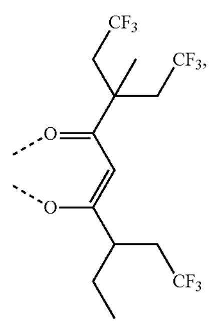
L$_{b220}$
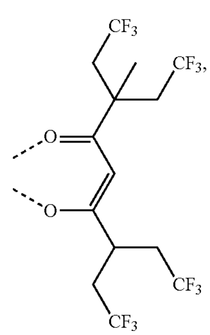

-continued
$L_{b221}$
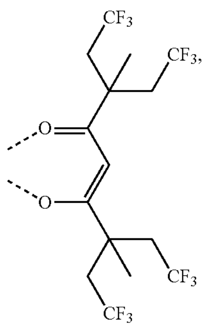
$L_{b222}$
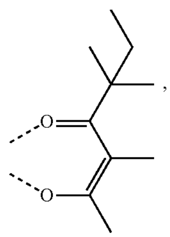
$L_{b223}$
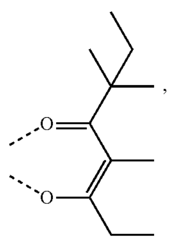
$L_{b224}$
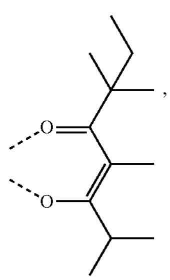
$L_{b225}$
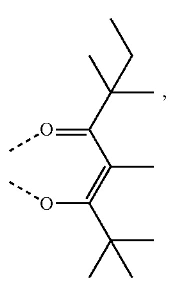
-continued
$L_{b226}$
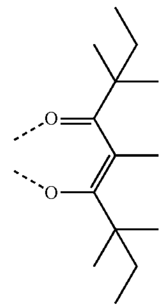
$L_{b227}$
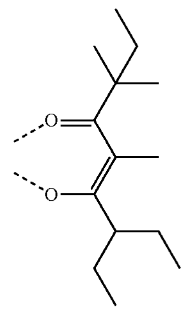
$L_{b228}$
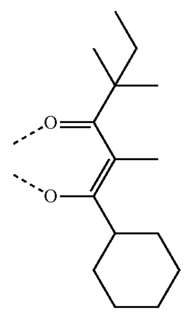
$L_{b229}$
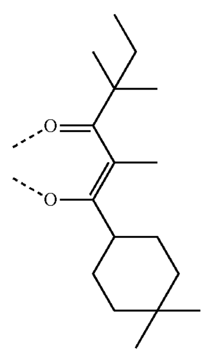
$L_{b230}$
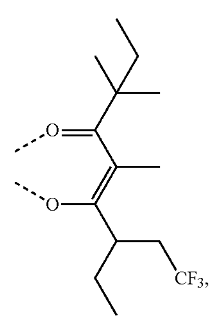

-continued
$L_{b231}$
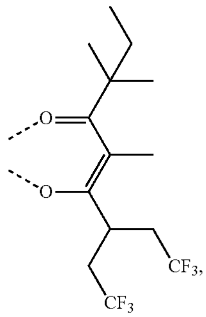
$L_{b232}$
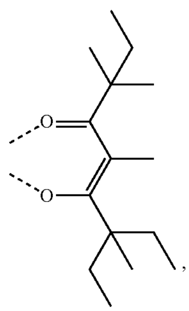
$L_{b233}$
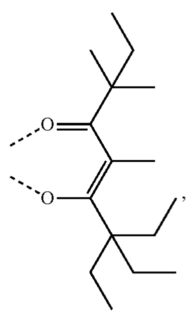
$L_{b234}$
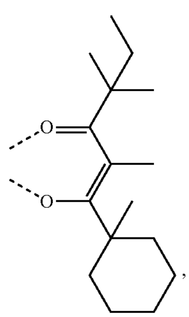
$L_{b235}$
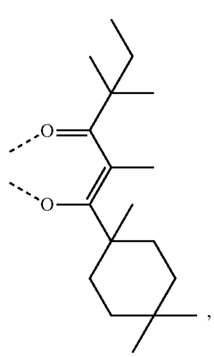
-continued
$L_{b236}$
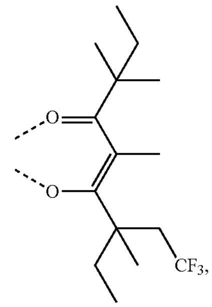
$L_{b237}$
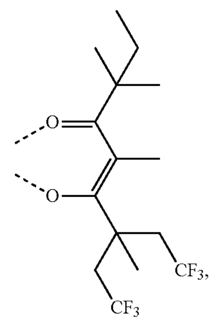
$L_{b238}$
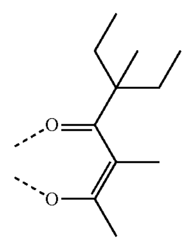
$L_{b239}$
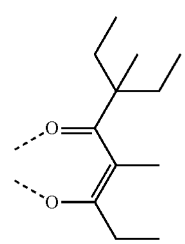
$L_{b240}$
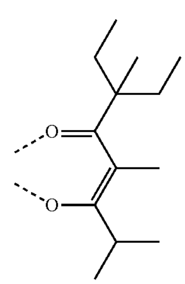

-continued
$L_{b241}$
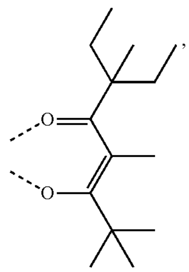
$L_{b242}$
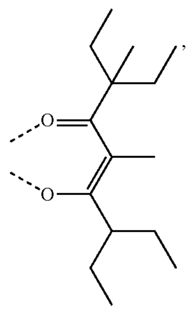
$L_{b243}$
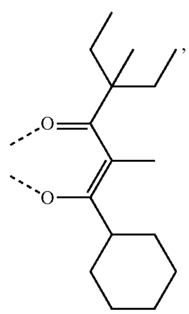
$L_{b244}$
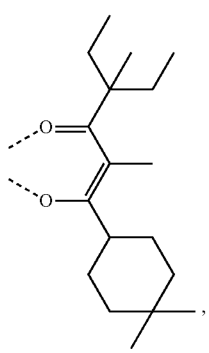
$L_{b245}$
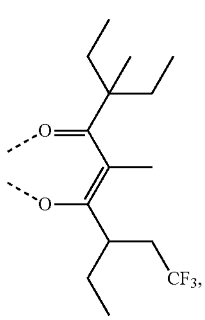
-continued
$L_{b246}$
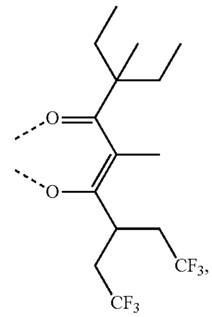
$L_{b247}$
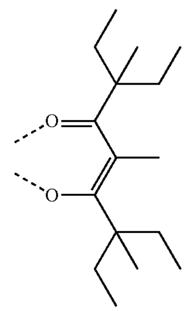
$L_{b248}$
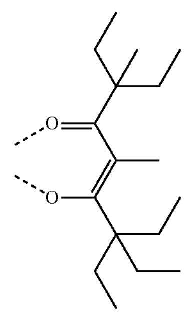
$L_{b249}$
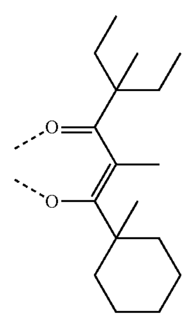
$L_{b250}$
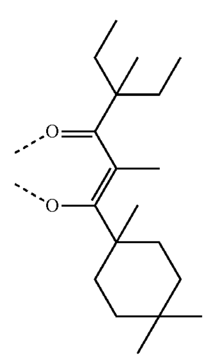

$L_{b251}$
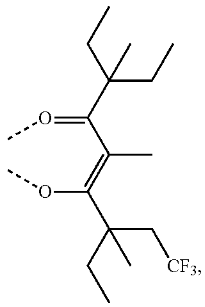
$L_{b252}$
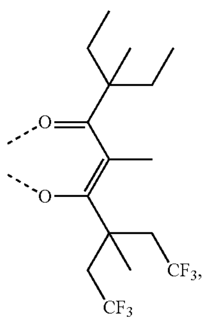
$L_{b253}$
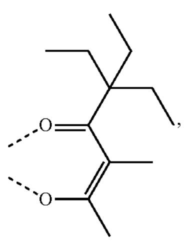
$L_{b254}$
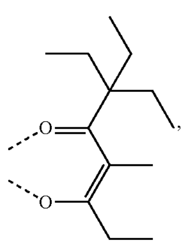
$L_{b255}$
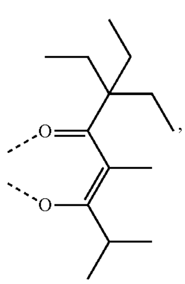
$L_{b256}$
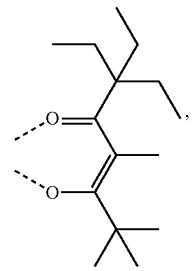
$L_{b257}$
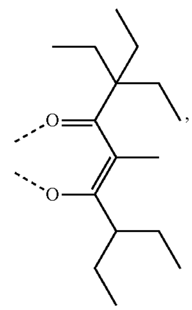
$L_{b258}$
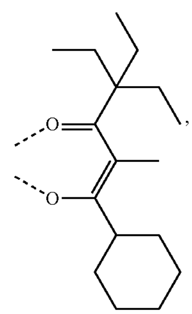
$L_{b259}$
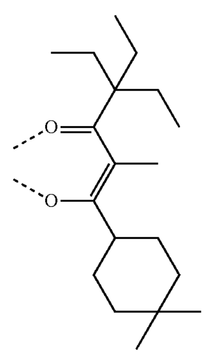
$L_{b260}$
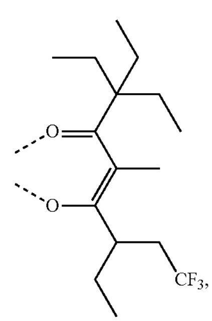

$L_{b261}$
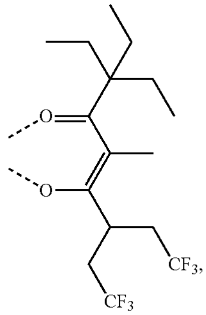
$L_{b262}$
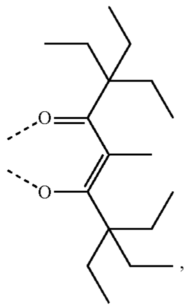
$L_{b263}$
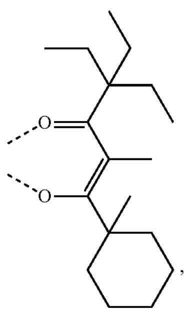
$L_{b264}$
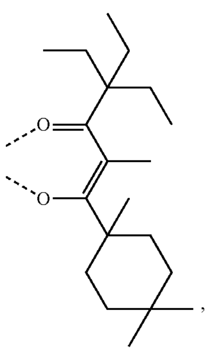
$L_{b265}$
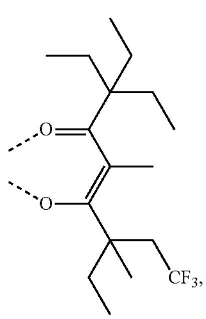
$L_{b266}$
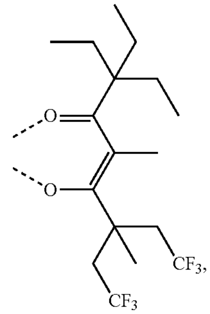
$L_{b267}$
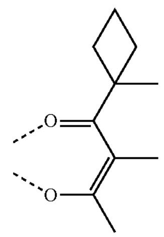
$L_{b268}$
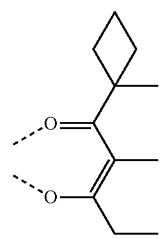
$L_{b269}$
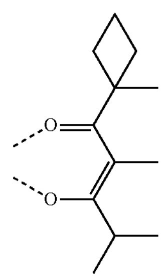
$L_{b270}$
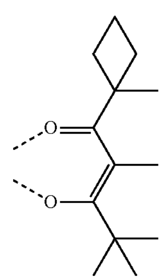

$L_{b271}$
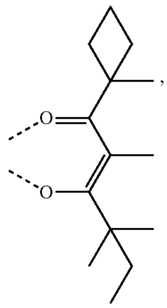
$L_{b272}$
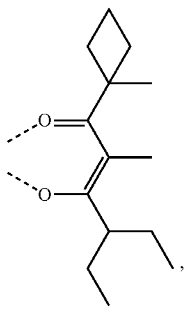
$L_{b273}$
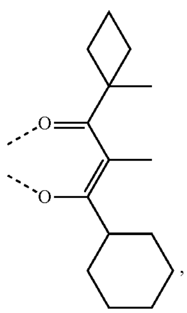
$L_{b274}$
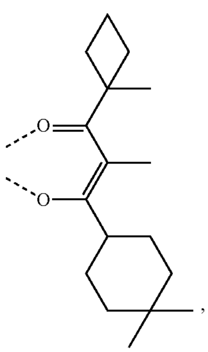
$L_{b275}$
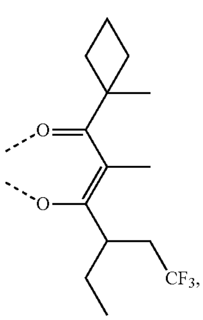
$L_{b276}$
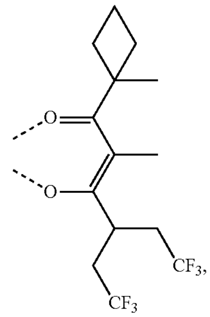
$L_{b277}$
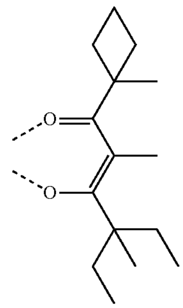
$L_{b278}$
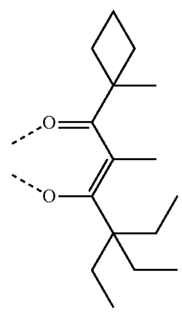
$L_{b279}$
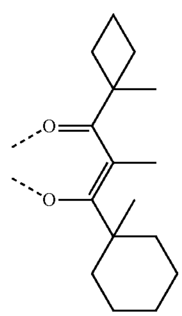
$L_{b280}$
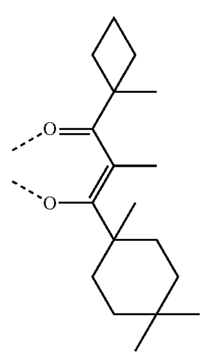

-continued
$L_{b281}$
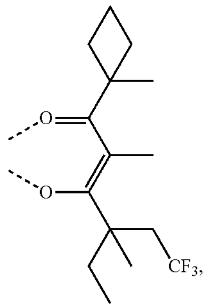
$L_{b282}$
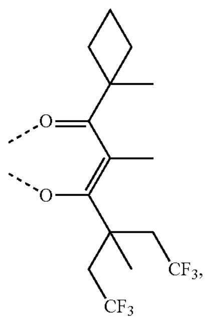
$L_{b283}$
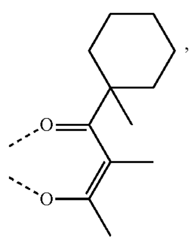
$L_{b284}$
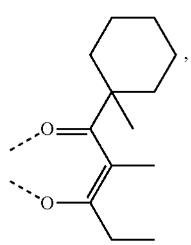
$L_{b285}$
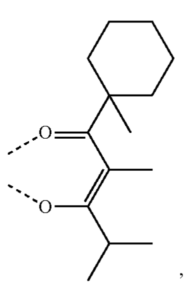
-continued
$L_{b286}$
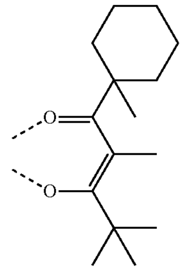
$L_{b287}$
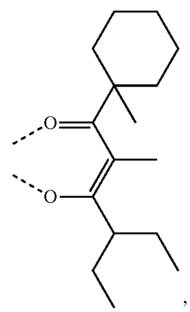
$L_{b288}$
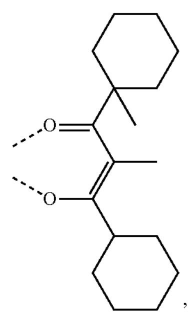
$L_{b289}$
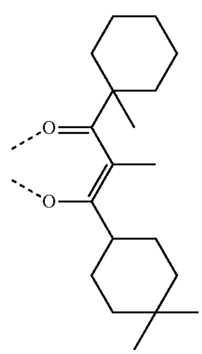
$L_{b290}$
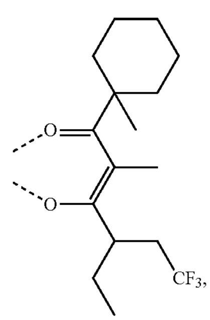

-continued
$L_{b291}$
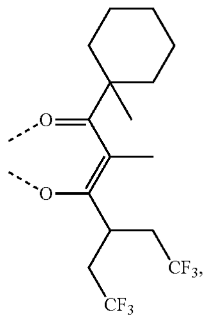
$L_{b292}$
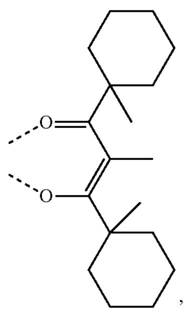
$L_{b293}$
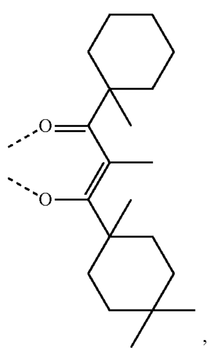
$L_{b294}$
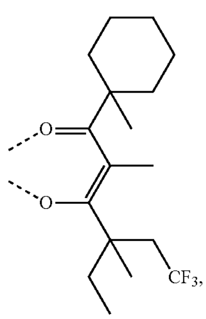
$L_{b295}$
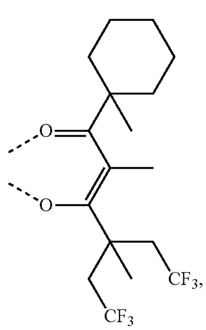
-continued
$L_{b296}$
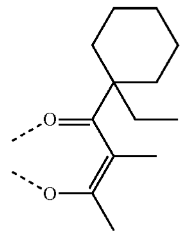
$L_{b297}$
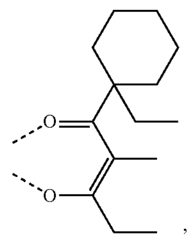
$L_{b298}$
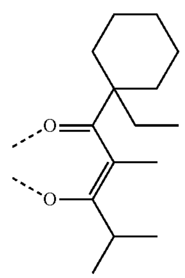
$L_{b299}$
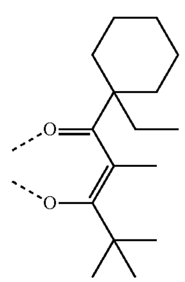
$L_{b300}$
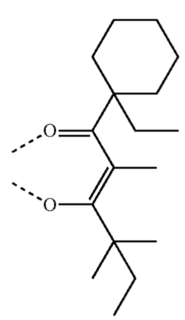

-continued
$L_{b301}$
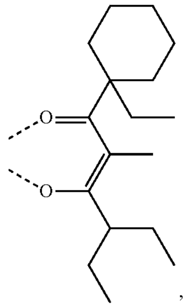
$L_{b302}$
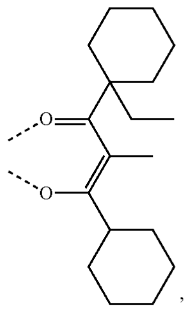
$L_{b303}$
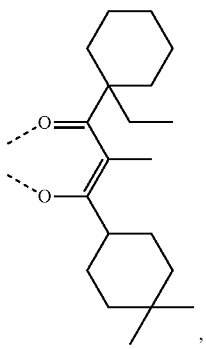
$L_{b304}$
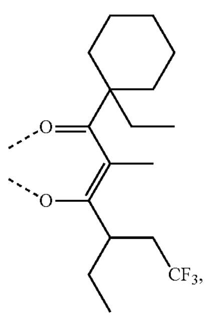
$L_{b305}$
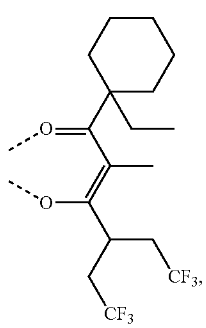
-continued
$L_{b306}$
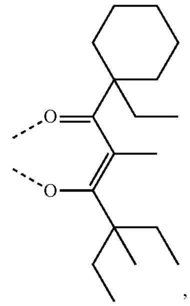
$L_{b307}$
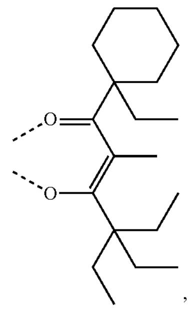
$L_{b308}$
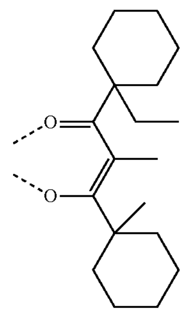
$L_{b309}$
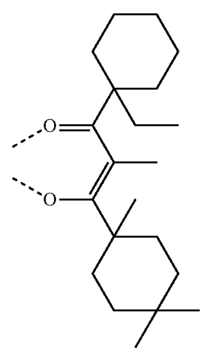
$L_{b310}$
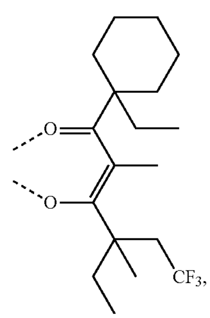

-continued
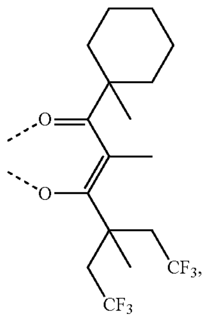
$L_{b311}$
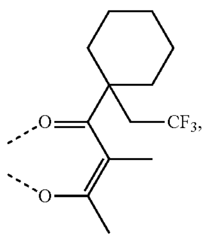
$L_{b312}$
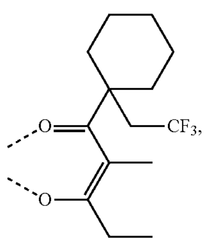
$L_{b313}$
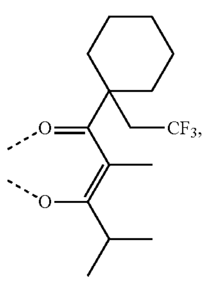
$L_{b314}$
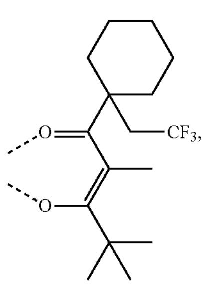
$L_{b315}$
-continued
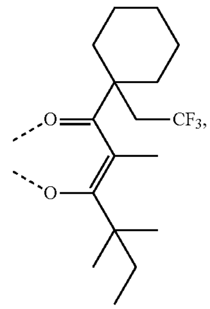
$L_{b316}$
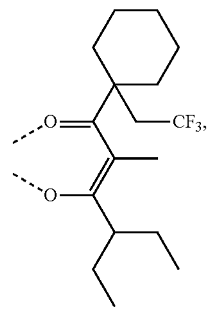
$L_{b317}$
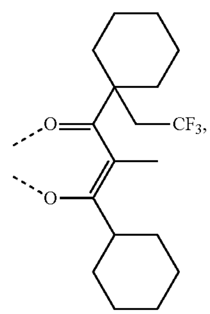
$L_{b318}$
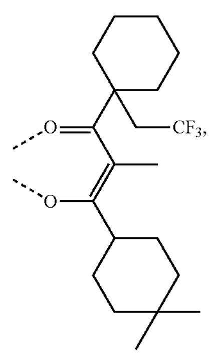
$L_{b319}$
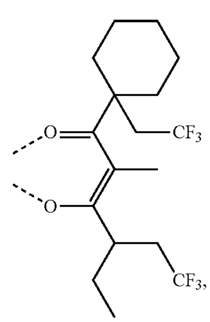
$L_{b320}$ -continued
$L_{b321}$
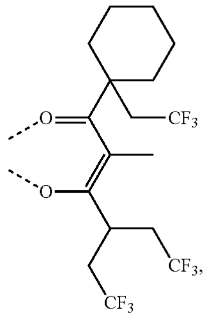
$L_{b322}$
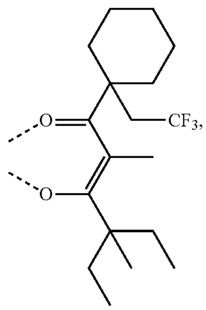
$L_{b323}$
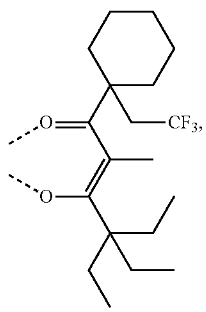
$L_{b324}$
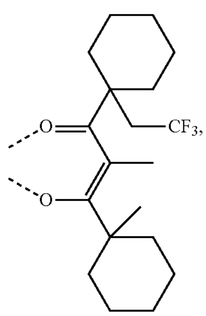
$L_{b325}$
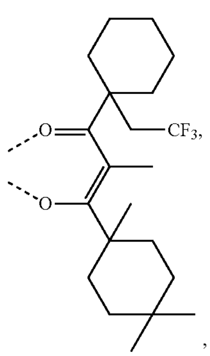
$L_{b326}$
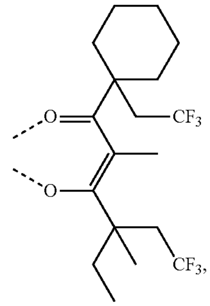
$L_{b327}$
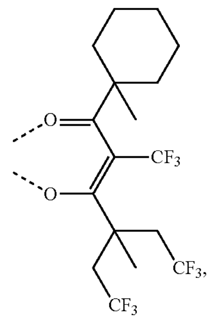
$L_{b328}$
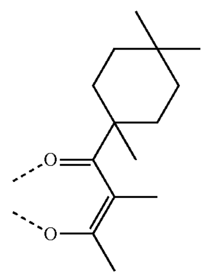
$L_{b329}$
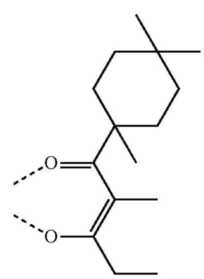
$L_{b330}$
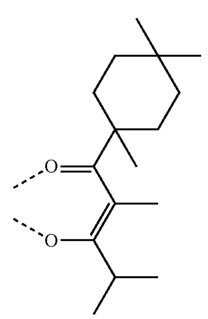

-continued
L$_{b331}$
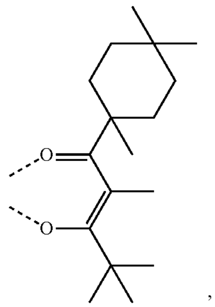
L$_{b332}$
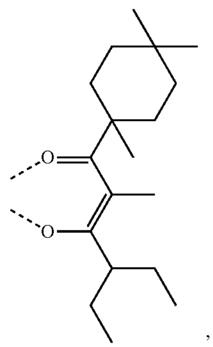
L$_{b333}$
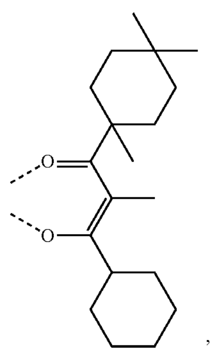
L$_{b334}$
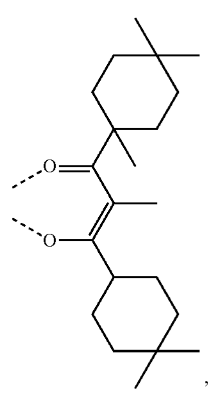
-continued
L$_{b335}$
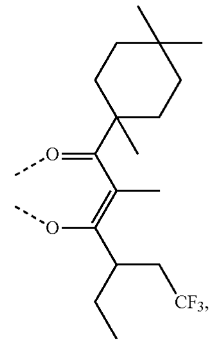
L$_{b336}$
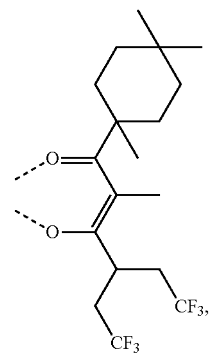
L$_{b337}$
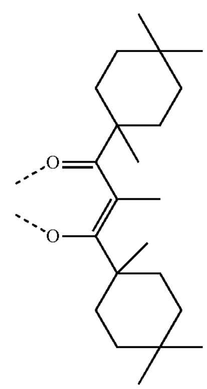
L$_{b338}$
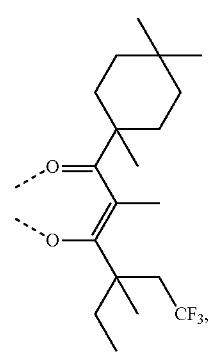

-continued
$L_{b339}$
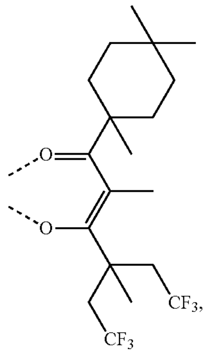
$L_{b340}$
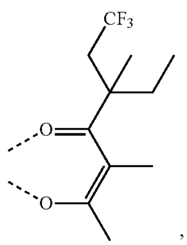
$L_{b341}$
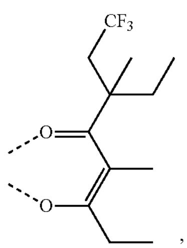
$L_{b342}$
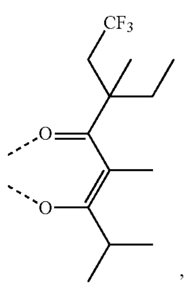
$L_{b343}$
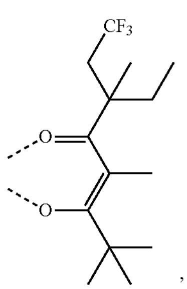
-continued
$L_{b344}$
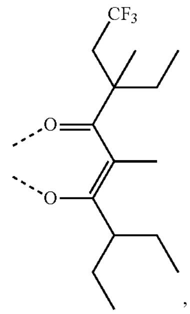
$L_{b345}$
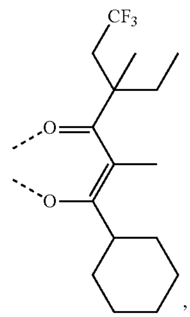
$L_{b346}$
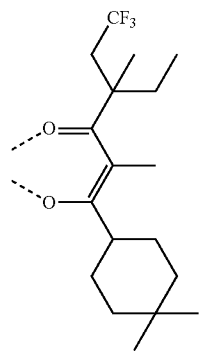
$L_{b347}$
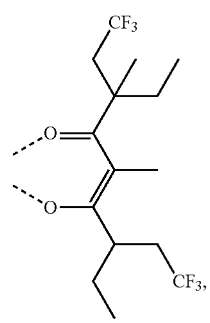
$L_{b348}$
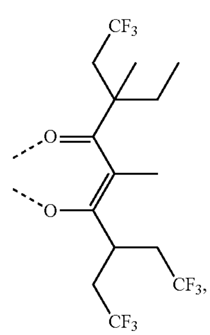

$L_{b349}$
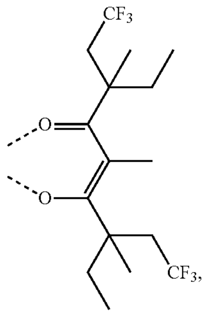
$L_{b350}$
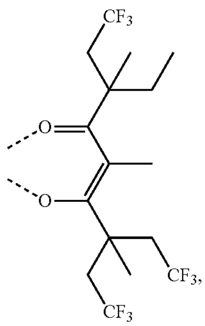
$L_{b351}$
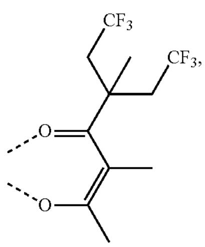
$L_{b352}$
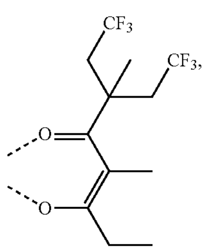
$L_{b353}$
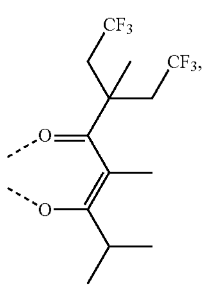
$L_{b354}$
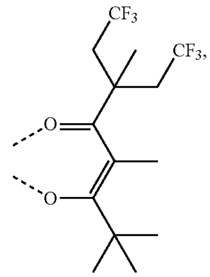
$L_{b355}$
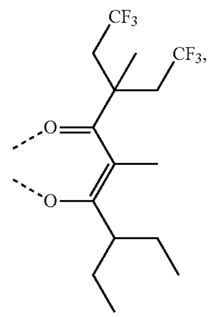
$L_{b356}$
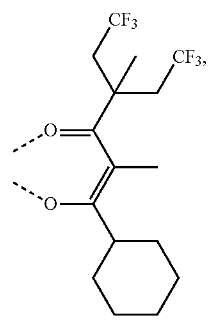
$L_{b357}$
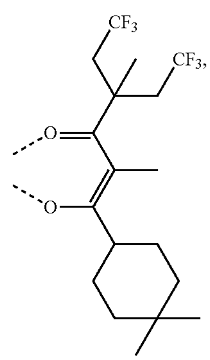
$L_{b358}$
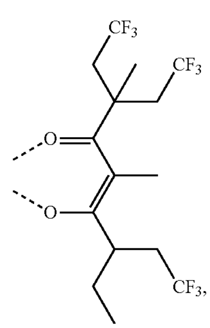

-continued
$L_{b359}$
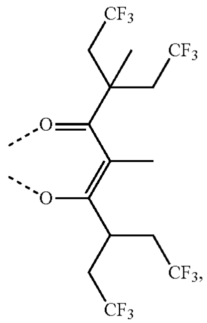
$L_{b360}$
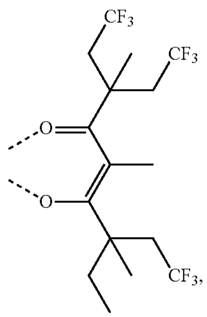
$L_{b361}$
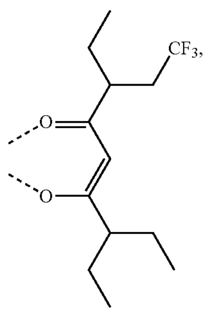
$L_{b362}$
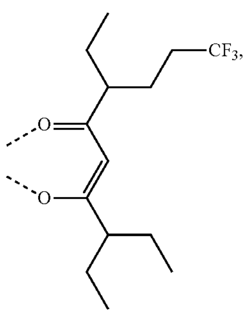
$L_{b363}$
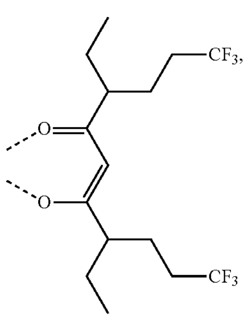
-continued
$L_{b364}$
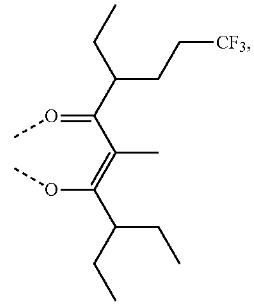
and
$L_{b365}$
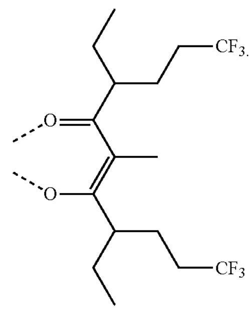
11. The metal complex of claim 10, wherein hydrogen in the first ligand $L_a$ and/or the second ligand $L_b$ may be partially or completely substituted by deuterium.
12. The metal complex of claim 11, wherein the third ligand $L_c$ is each independently selected from a group consisting of:
$L_{c1}$
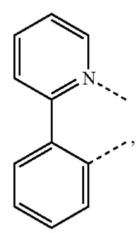
$L_{c2}$
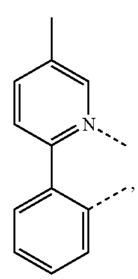

-continued
$L_{c3}$
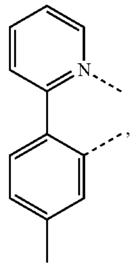
$L_{c4}$
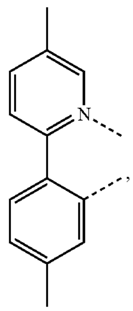
$L_{c5}$
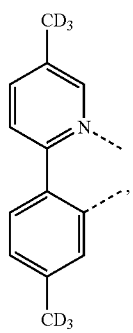
$L_{c6}$
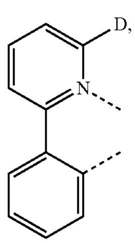
$L_{c7}$
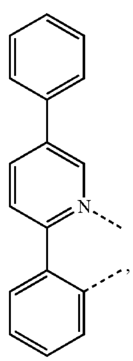
-continued
$L_{c8}$
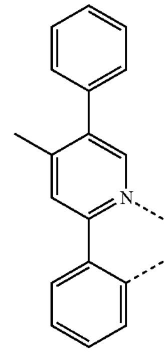
$L_{c9}$
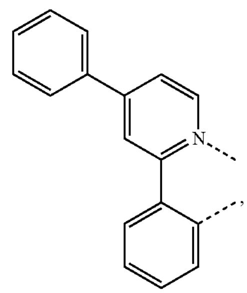
$L_{c10}$
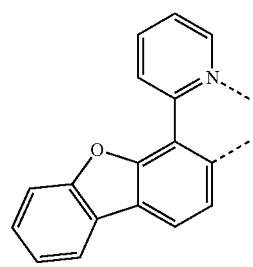
$L_{c11}$
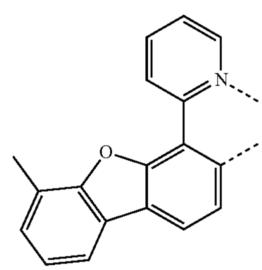
$L_{c12}$
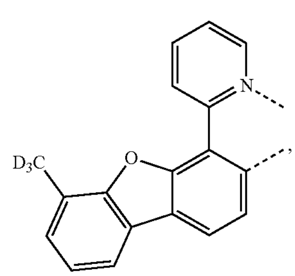

$L_{c13}$
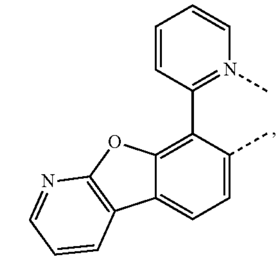
$L_{c14}$
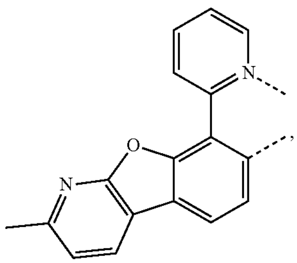
$L_{c15}$
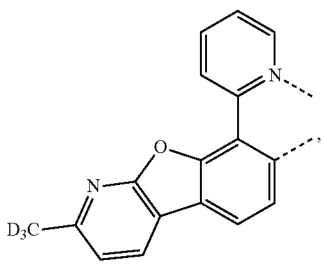
$L_{c16}$
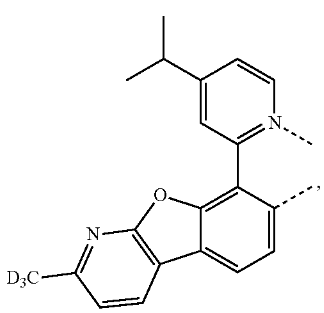
$L_{c17}$
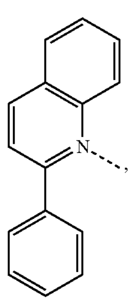
$L_{c18}$
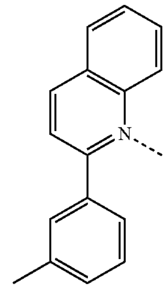
$L_{c19}$
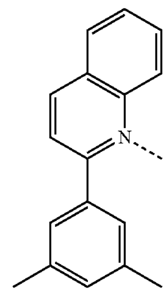
$L_{c20}$
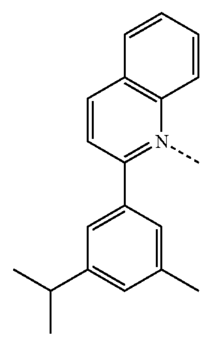
$L_{c21}$
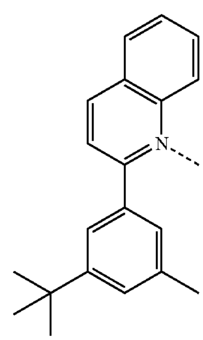
$L_{c22}$
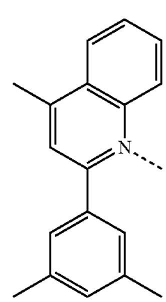

-continued
$L_{c23}$
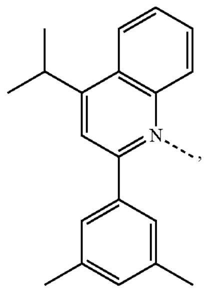
$L_{c24}$
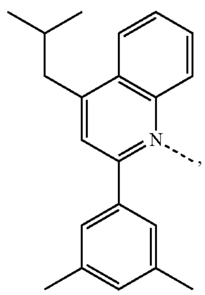
$L_{c25}$
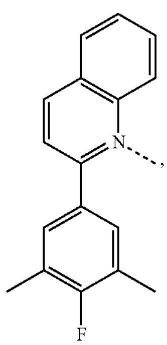
$L_{c26}$
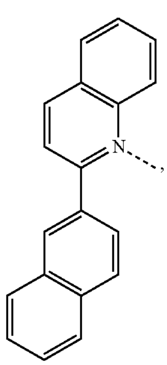
-continued
$L_{c27}$
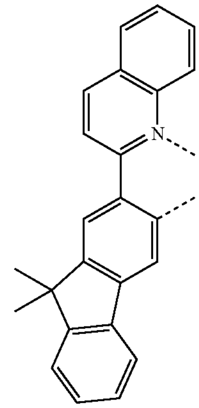
$L_{c28}$
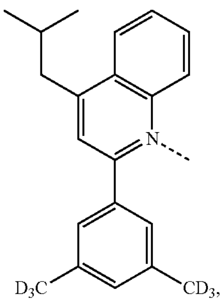
$L_{c29}$
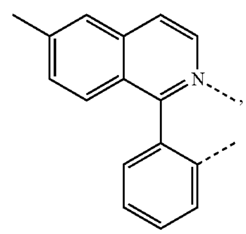
$L_{c30}$
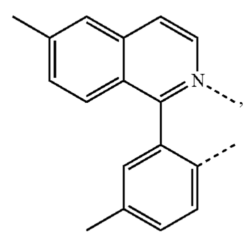
$L_{c31}$
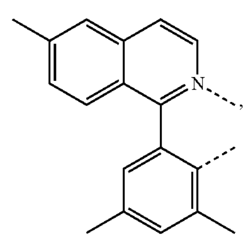

-continued
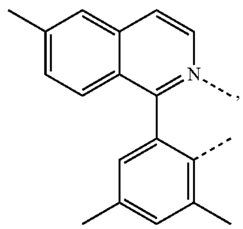
$L_{c32}$
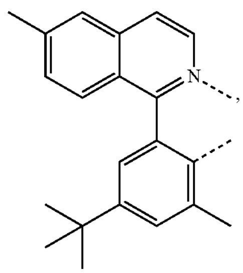
$L_{c33}$
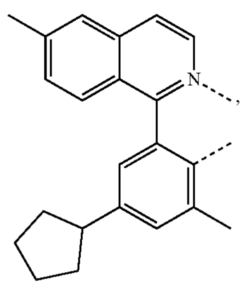
$L_{c34}$
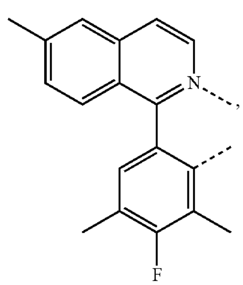
$L_{c35}$
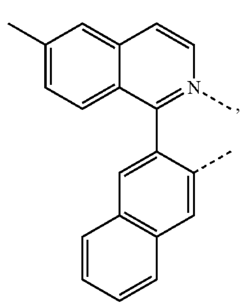
$L_{c36}$
-continued
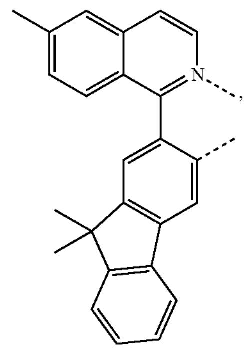
$L_{c37}$
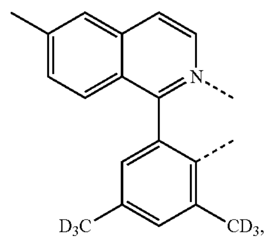
$L_{c38}$
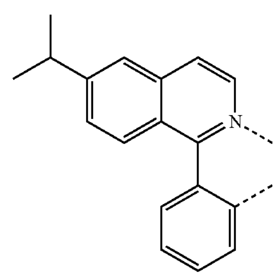
$L_{c39}$
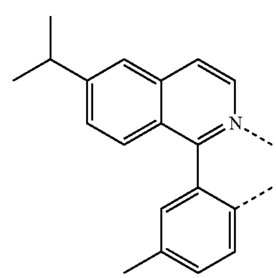
$L_{c40}$
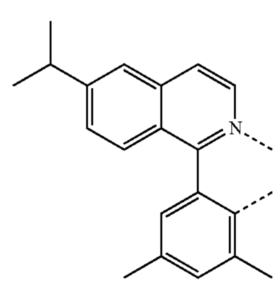
$L_{c41}$ $L_{c42}$
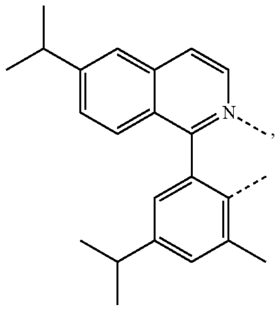
$L_{c43}$
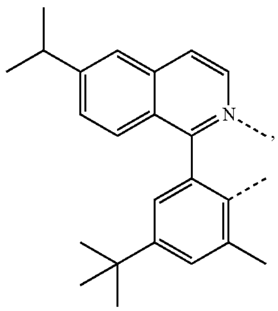
$L_{c44}$
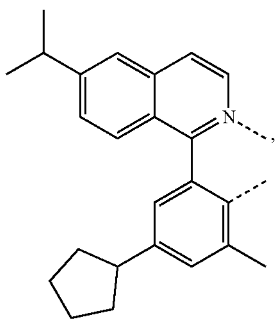
$L_{c45}$
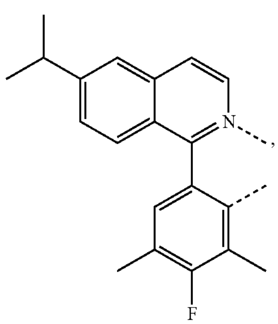
$L_{c46}$
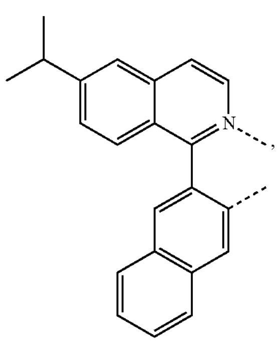
$L_{c47}$
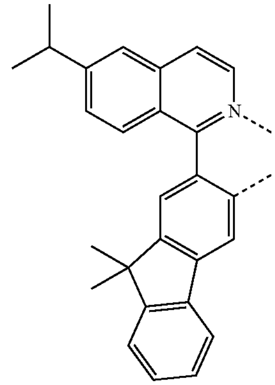
$L_{c48}$
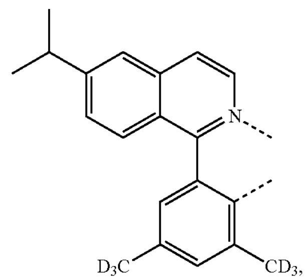
$L_{c49}$
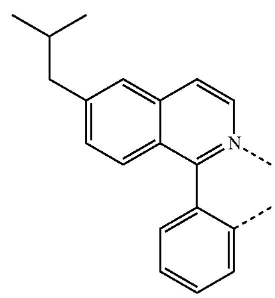
$L_{c50}$
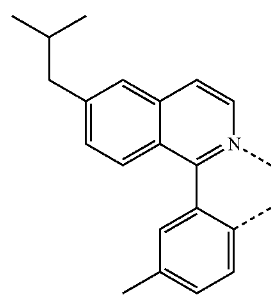
$L_{c51}$
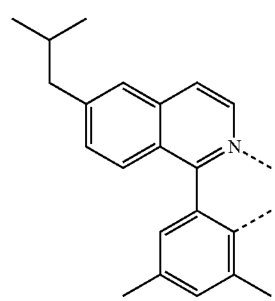

-continued
$L_{c52}$
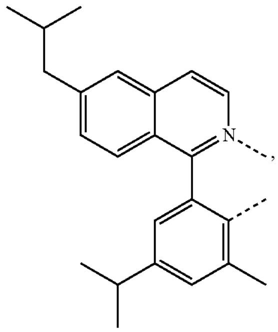
$L_{c53}$
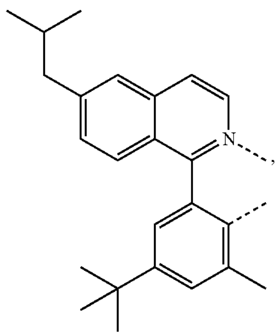
$L_{c54}$
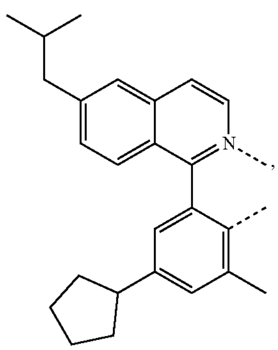
$L_{c55}$
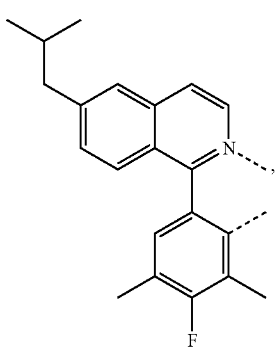
-continued
$L_{c56}$
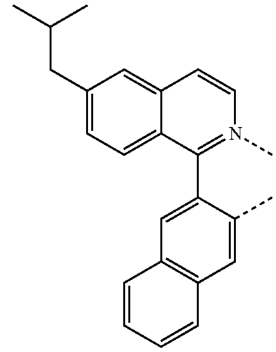
$L_{c57}$
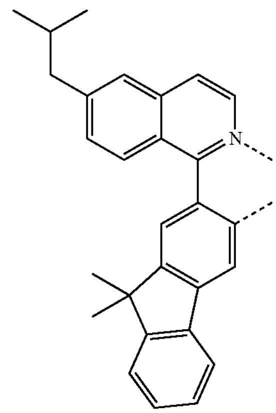
$L_{c58}$
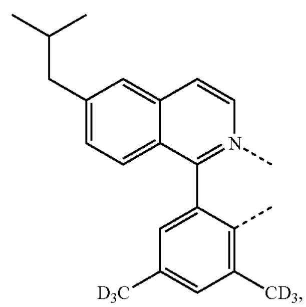
$L_{c59}$
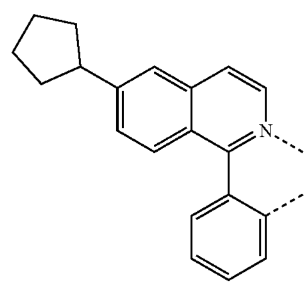
$L_{c60}$
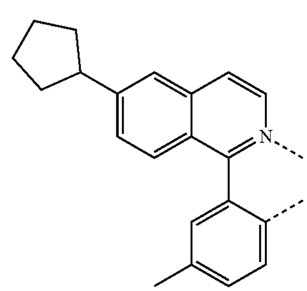

-continued
$L_{c61}$
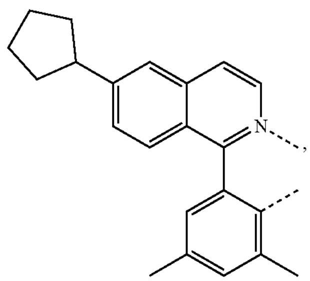
$L_{c62}$
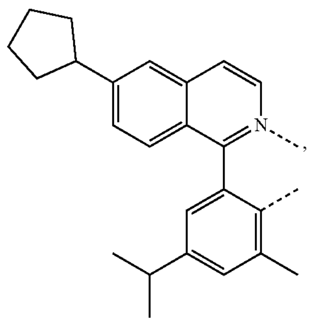
$L_{c63}$
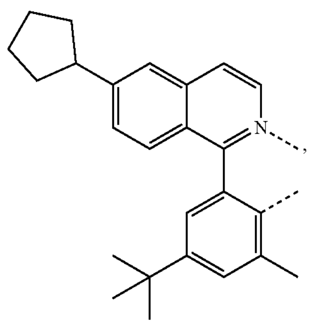
$L_{c64}$
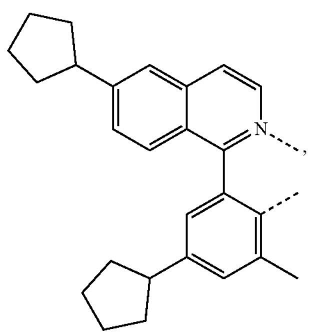
$L_{c65}$
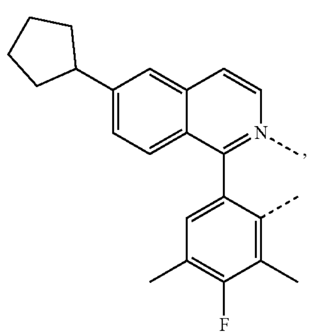
-continued
$L_{c66}$
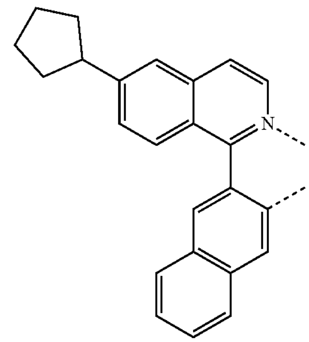
$L_{c67}$
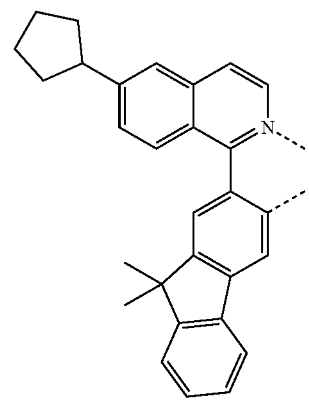
$L_{c68}$
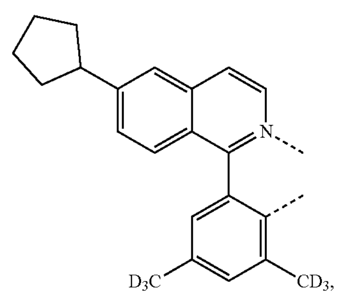
$L_{c69}$
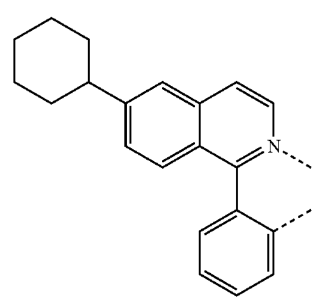
$L_{c70}$
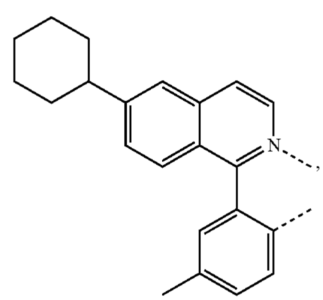

-continued
$L_{c71}$
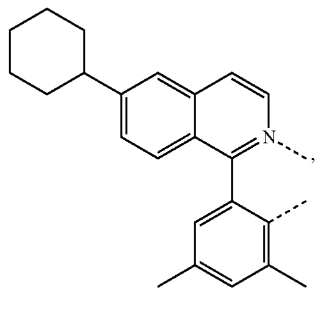
$L_{c72}$
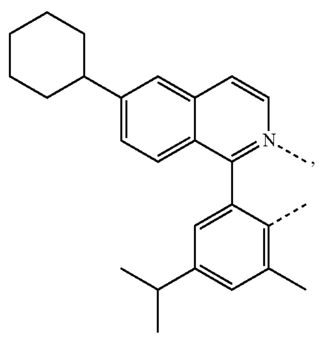
$L_{c73}$
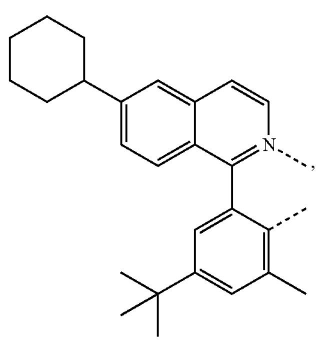
$L_{c74}$
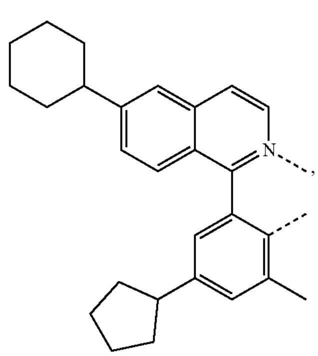
-continued
$L_{c75}$
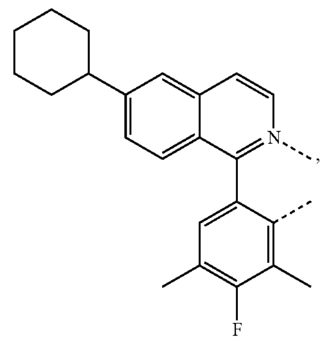
$L_{c76}$
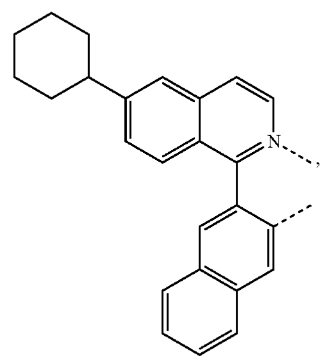
$L_{c77}$
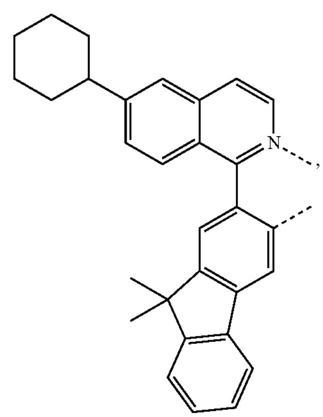
$L_{c78}$
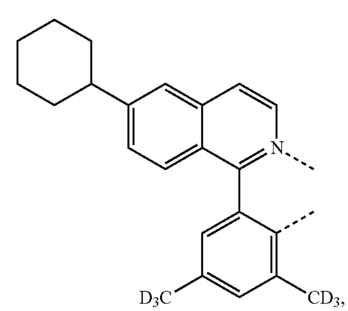

-continued
$L_{c79}$
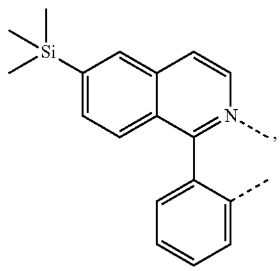
$L_{c80}$
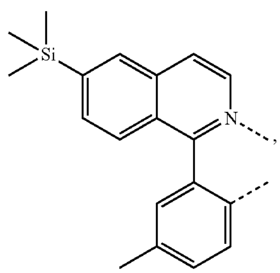
$L_{c81}$
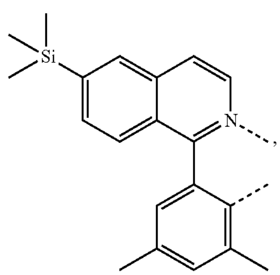
$L_{c82}$
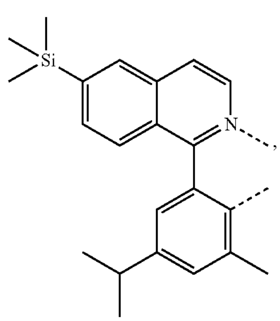
$L_{c83}$
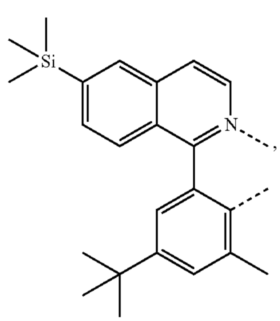
-continued
$L_{c84}$
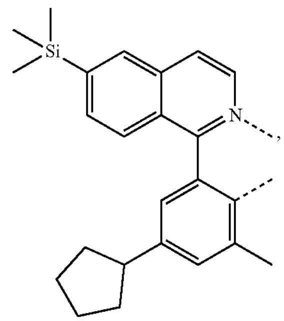
$L_{c85}$
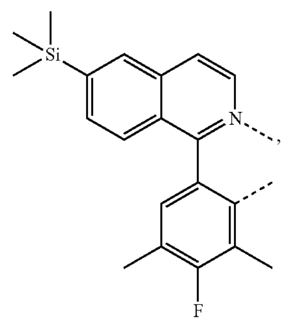
$L_{c86}$
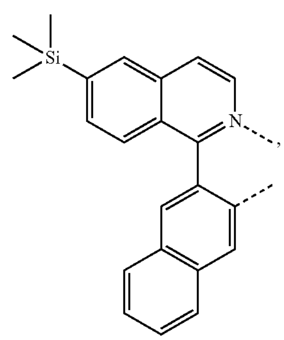
$L_{c87}$
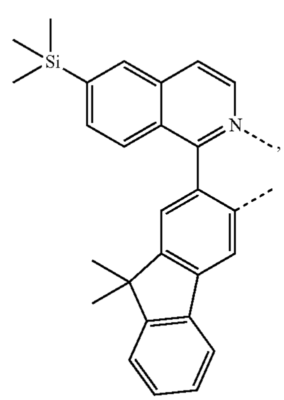

-continued
$L_{c88}$
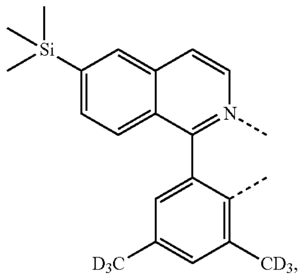
$L_{c89}$
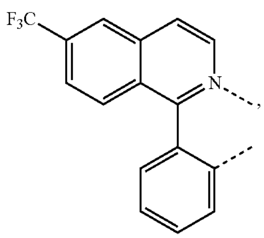
$L_{c90}$
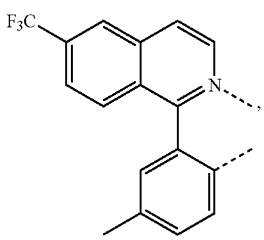
$L_{c91}$
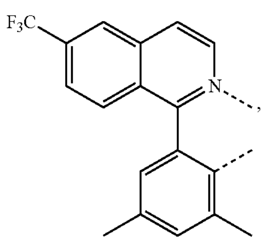
$L_{c92}$
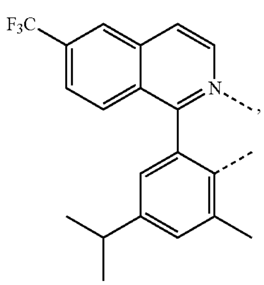
$L_{c93}$
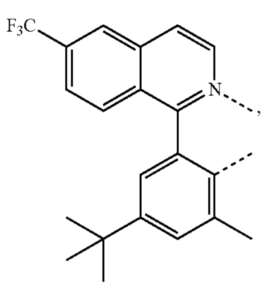
-continued
$L_{c94}$
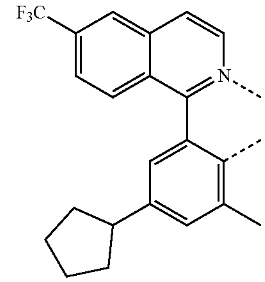
$L_{c95}$
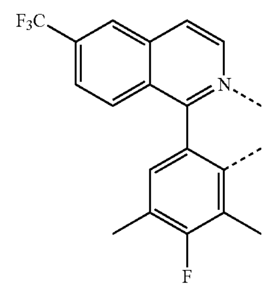
$L_{c96}$
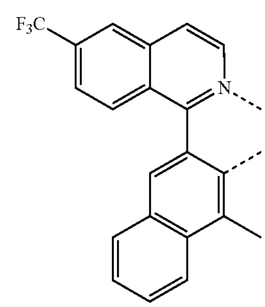
$L_{c97}$
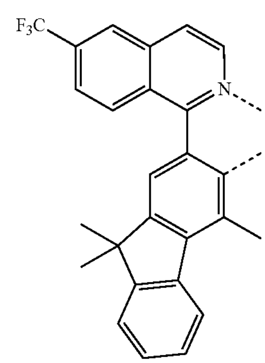
$L_{c98}$
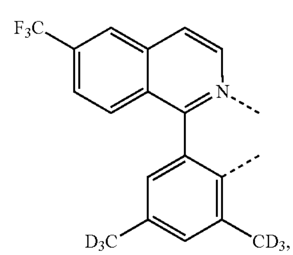

-continued
$L_{c99}$
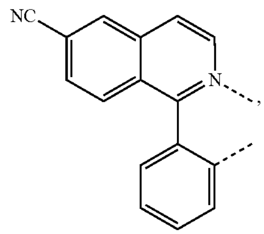
$L_{c100}$
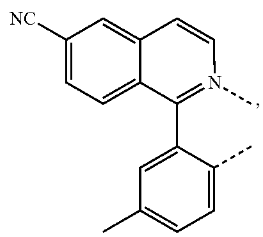
$L_{c101}$
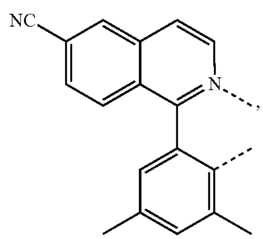
$L_{c102}$
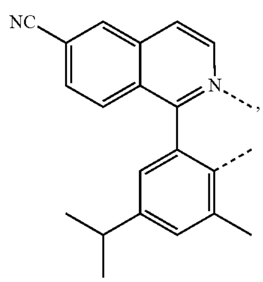
$L_{c103}$
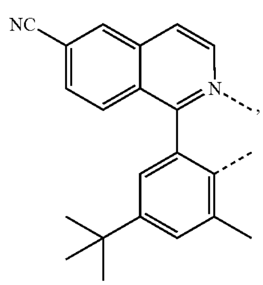
$L_{c104}$
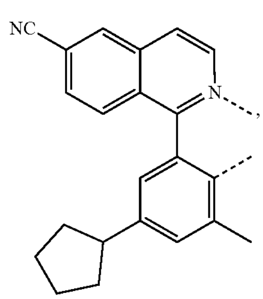
-continued
$L_{c105}$
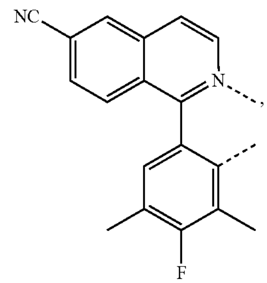
$L_{c106}$
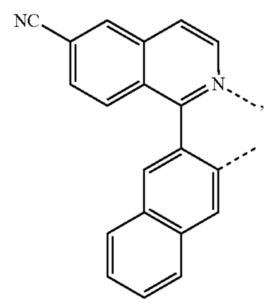
$L_{c107}$
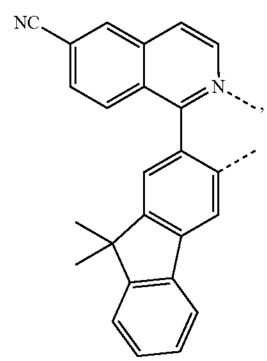
$L_{c108}$
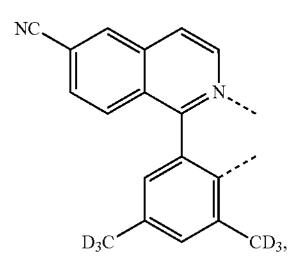
$L_{c109}$
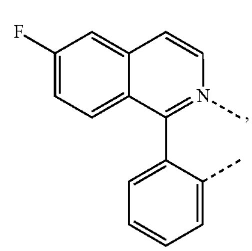

-continued
$L_{c110}$
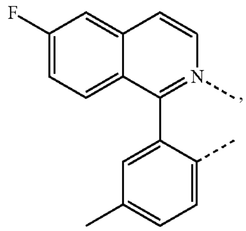
$L_{c111}$
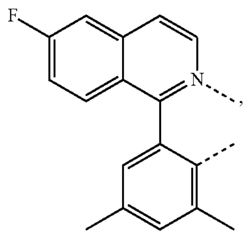
$L_{c112}$
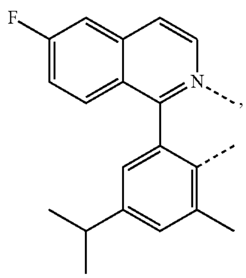
$L_{c113}$
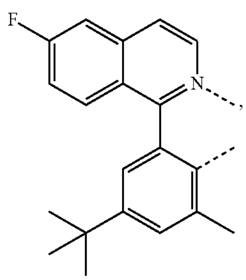
$L_{c114}$
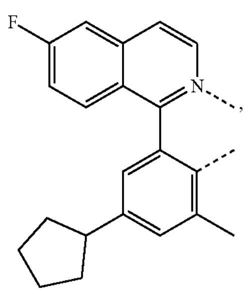
$L_{c115}$
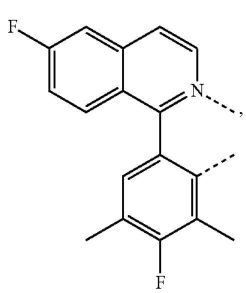
-continued
$L_{c116}$
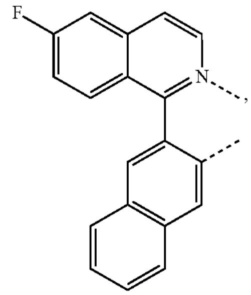
$L_{c117}$
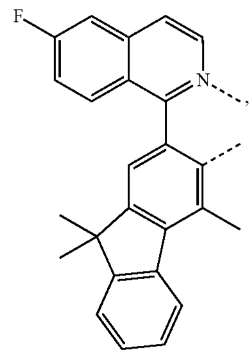
and
$L_{c118}$
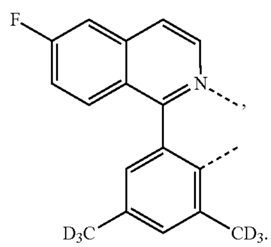
13. The metal complex of claim 12, wherein the metal complex is $Ir(L_a)_2(L_b)$ or $Ir(L_a)(L_b)(L_c)$; preferably, the metal complex is selected from a group consisting of:
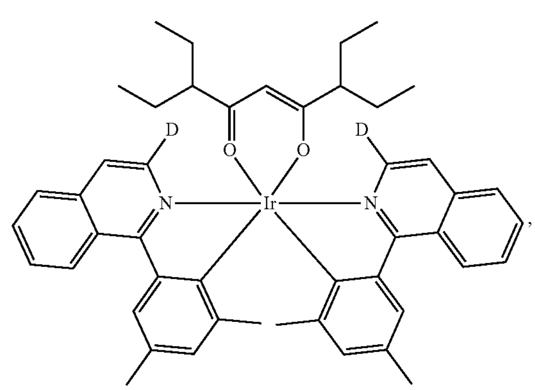
$Ir(L_{a3})_2(L_{b31})$

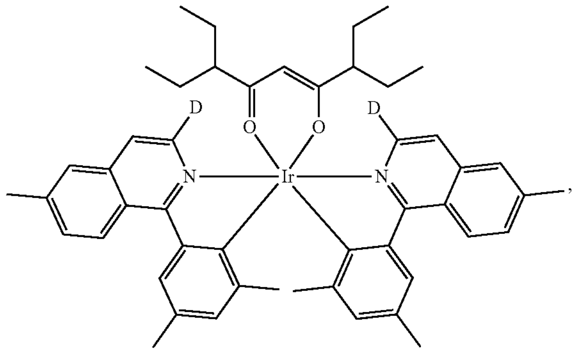
$Ir(L_{a44})_2(L_{b31})$
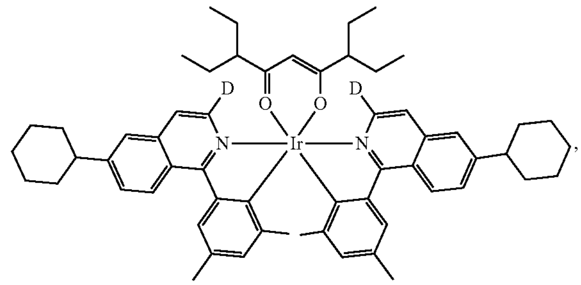
$Ir(L_{a372})_2(L_{b31})$
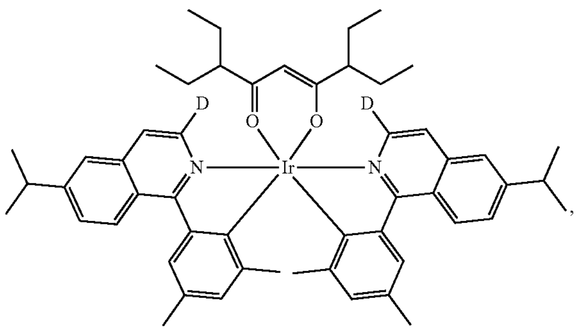
$Ir(L_{a126})_2(L_{b31})$
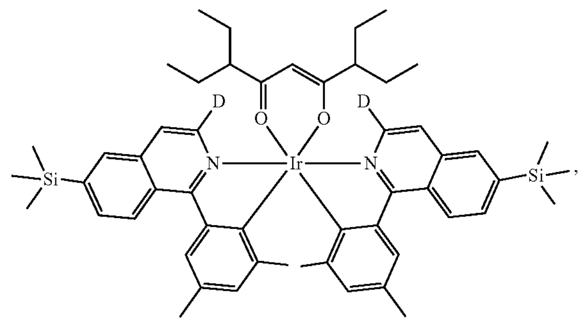
$Ir(L_{a659})_2(L_{b31})$
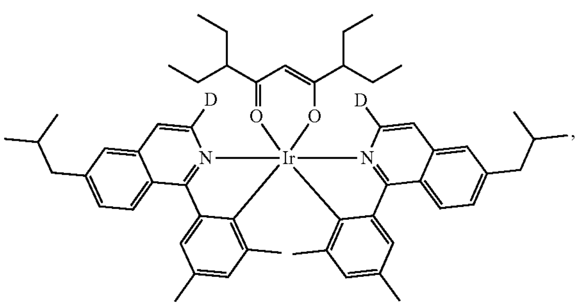
$Ir(L_{a167})_2(L_{b31})$
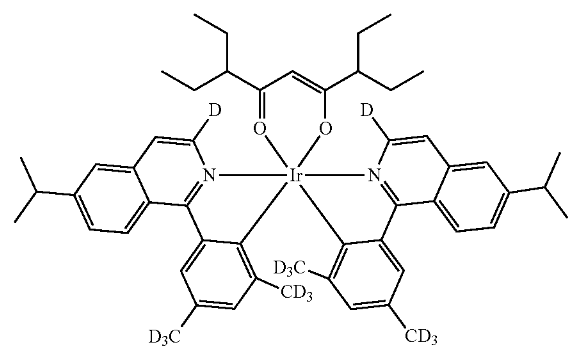
$Ir(L_{a159})_2(L_{b31})$
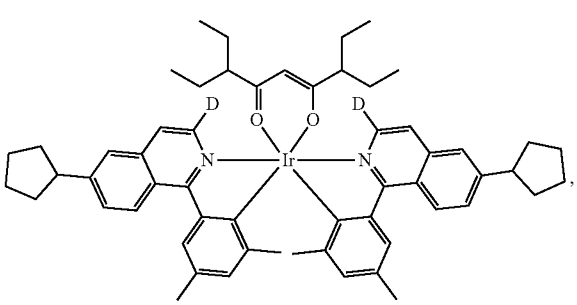
$Ir(L_{a331})_2(L_{b31})$
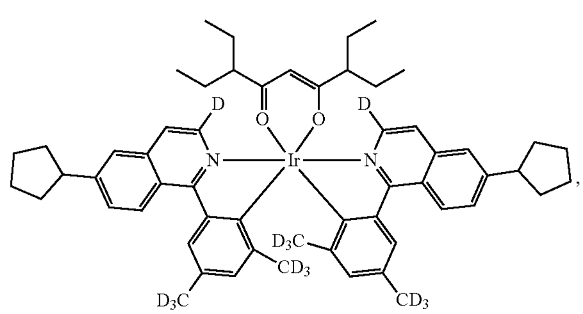
$Ir(L_{a364})_2(L_{b31})$

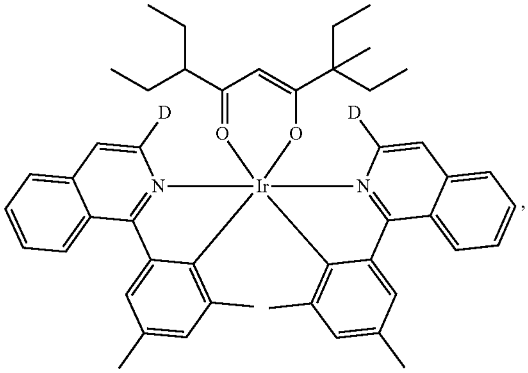
$Ir(L_{a3})_2(L_{b101})$
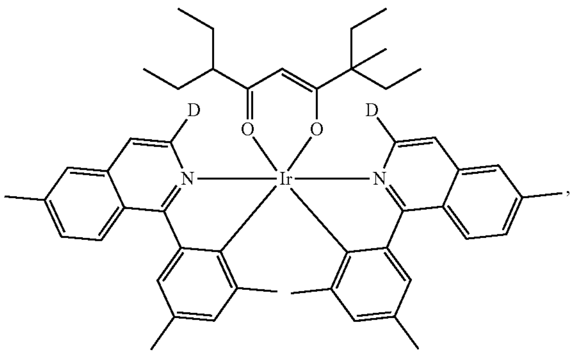
$Ir(L_{a44})_2(L_{b101})$
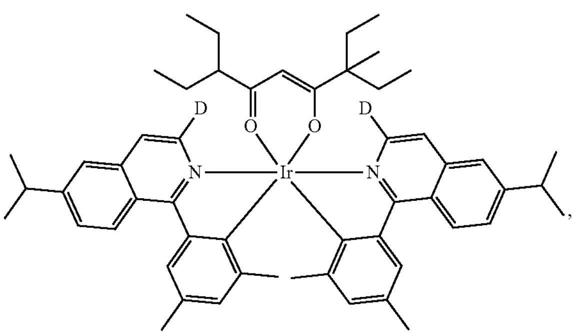
$Ir(L_{a126})_2(L_{b101})$
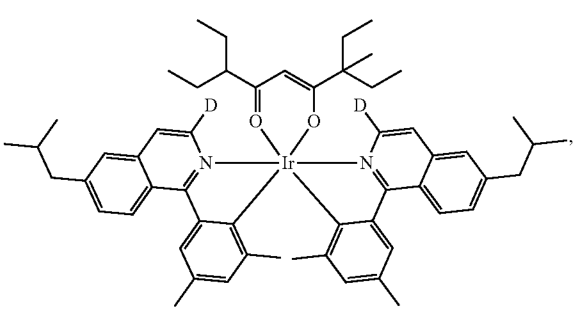
$Ir(L_{a167})_2(L_{b101})$
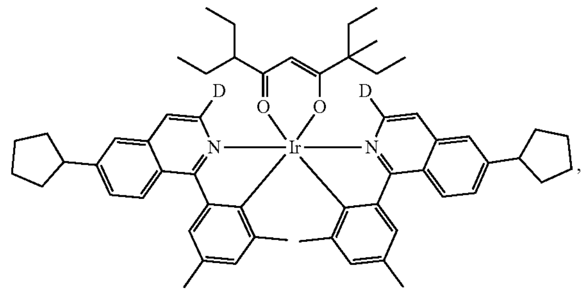
$Ir(L_{a331})_2(L_{b101})$
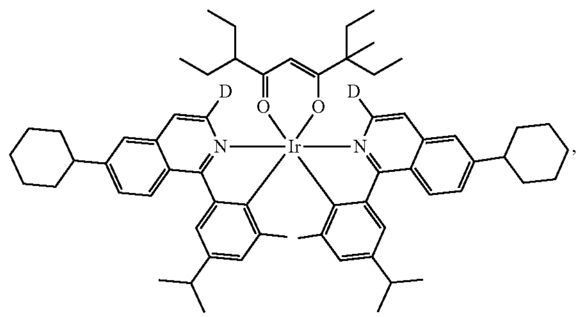
$Ir(L_{a372})_2(L_{b101})$
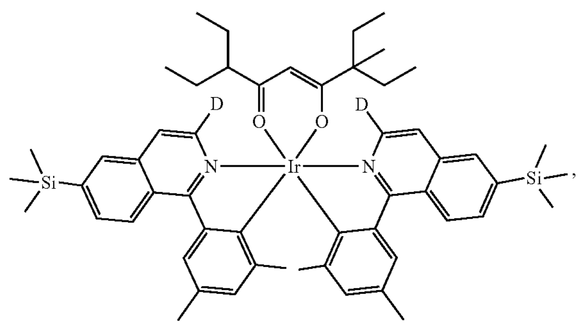
$Ir(L_{a659})_2(L_{b101})$
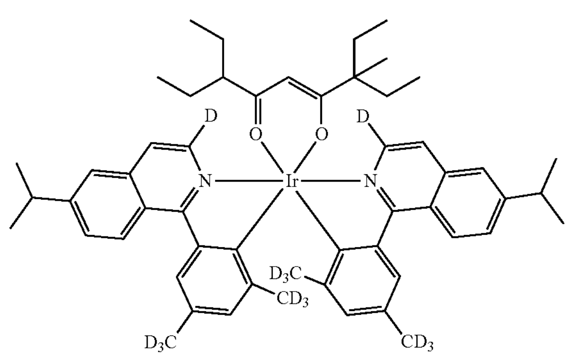
$Ir(L_{a159})_2(L_{b101})$ -continued
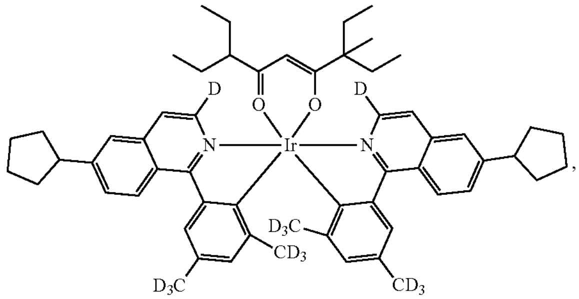
$Ir(L_{a364})_2(L_{b101})$
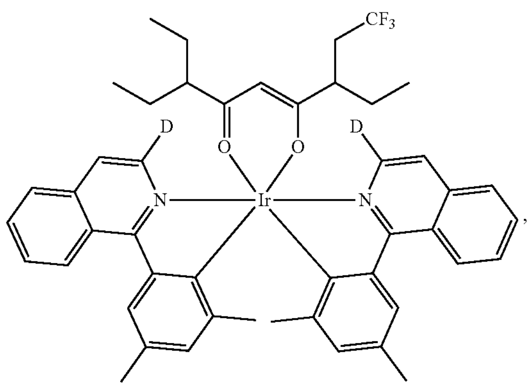
$Ir(L_{a3})_2(L_{b361})$
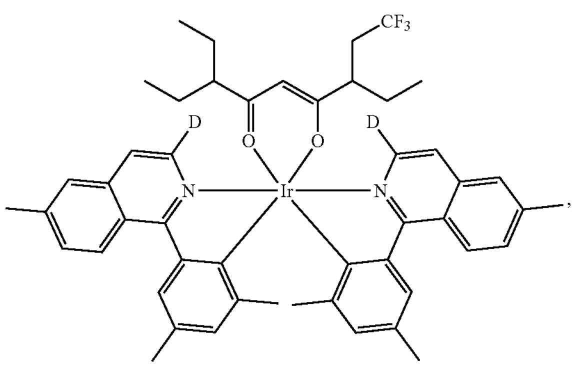
$Ir(L_{a44})_2(L_{b361})$
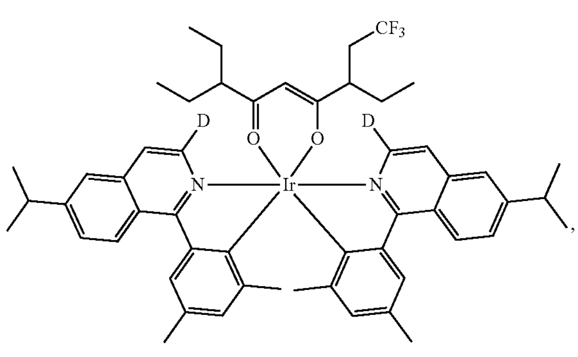
$Ir(L_{a126})_2(L_{b361})$
-continued
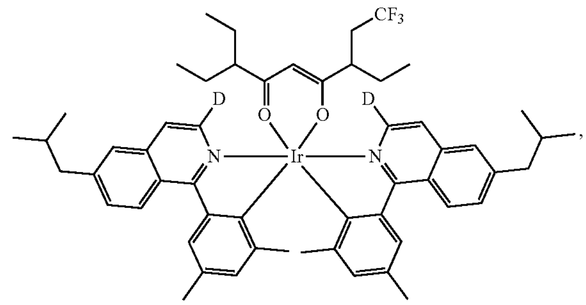
$Ir(L_{a167})_2(L_{b361})$
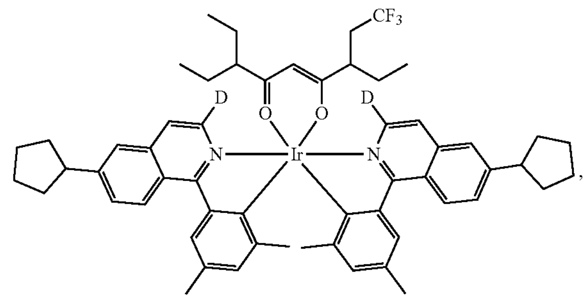
$Ir(L_{a331})_2(L_{b361})$
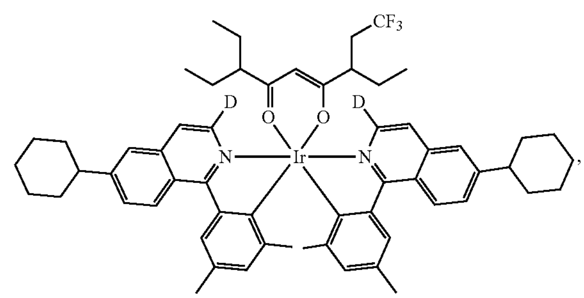
$Ir(L_{a372})_2(L_{b361})$
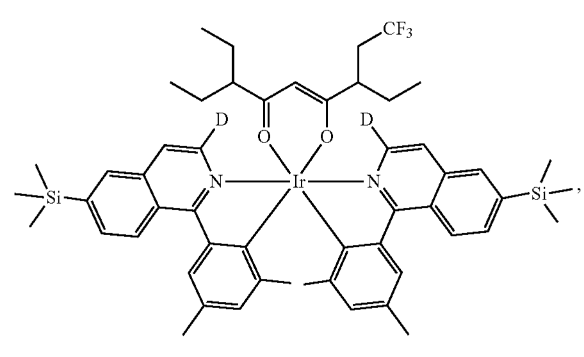
$Ir(L_{a659})_2(L_{b361})$ -continued
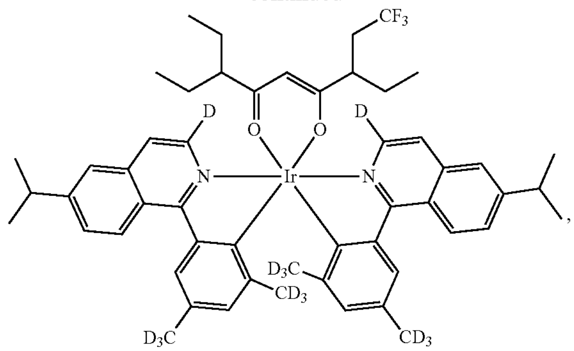
$Ir(L_{a159})_2(L_{b361})$
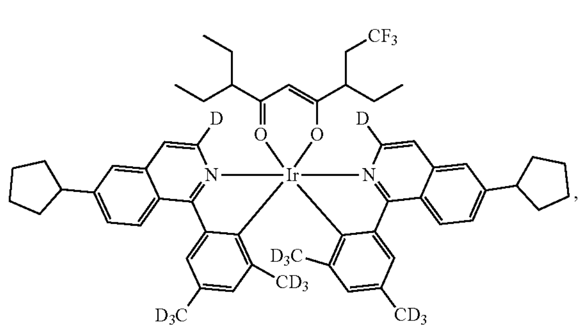
$Ir(L_{a364})_2(L_{b361})$
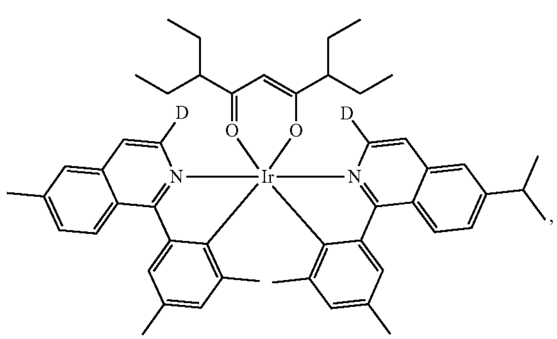
$Ir(L_{a44})(L_{a126})(L_{b31})$
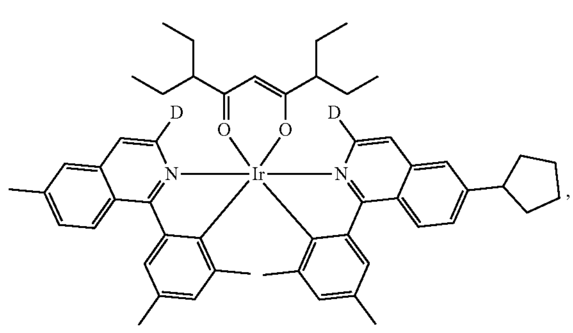
$Ir(L_{a44})(L_{a331})(L_{b31})$
-continued
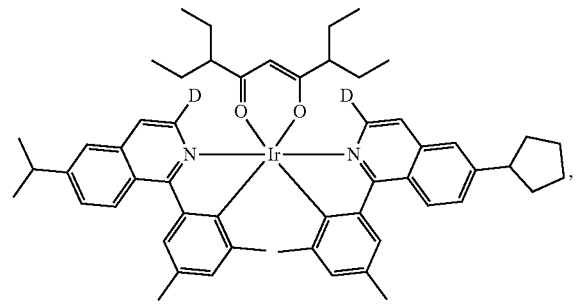
$Ir(L_{a126})(L_{a331})(L_{b31})$
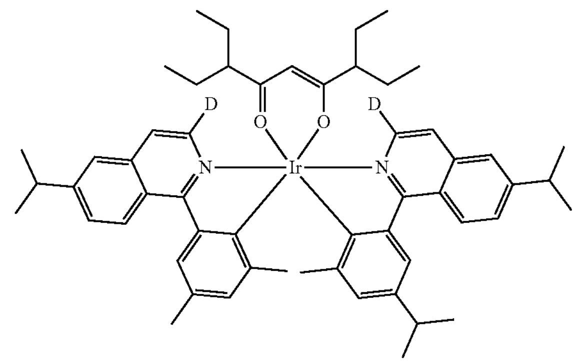
$Ir(L_{a126})(L_{a130})(L_{b31})$
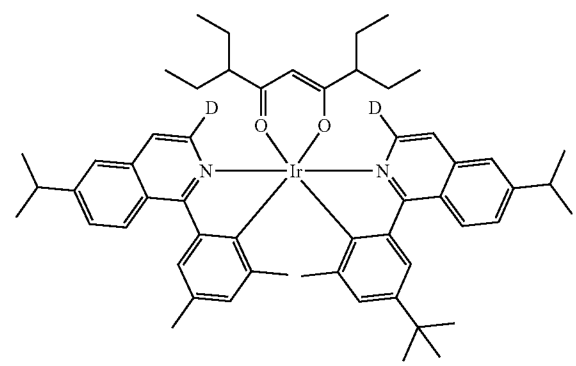
$Ir(L_{a126})(L_{a133})(L_{b31})$
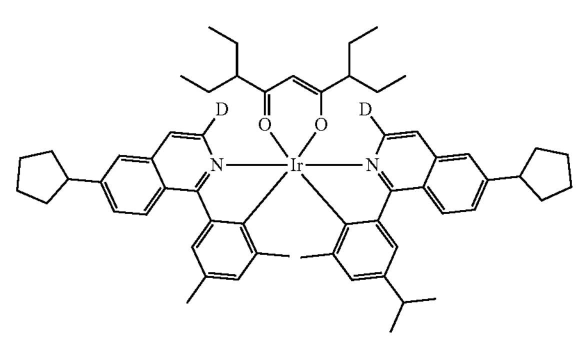
$Ir(L_{a331})(L_{a335})(L_{b31})$ -continued
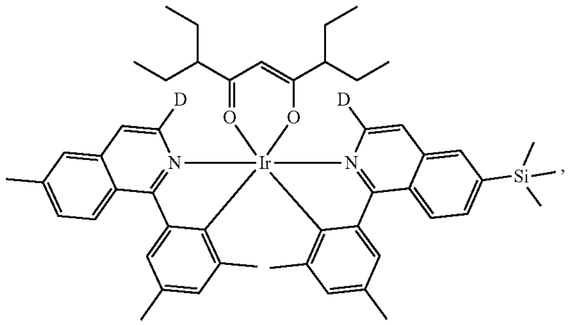
Ir($L_{a44}$)($L_{a659}$)($L_{b31}$)
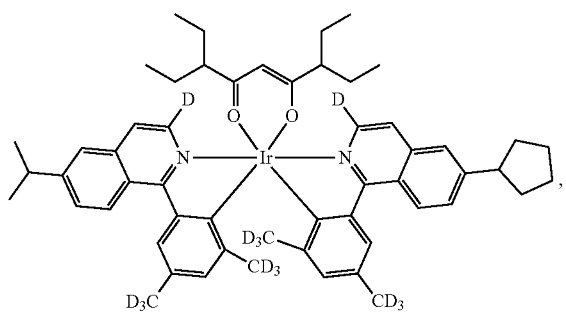
Ir($L_{a159}$)($L_{a364}$)($L_{b31}$)
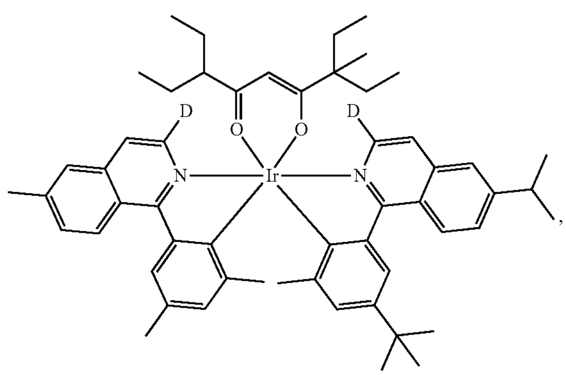
Ir($L_{a44}$)($L_{a126}$)($L_{b101}$)
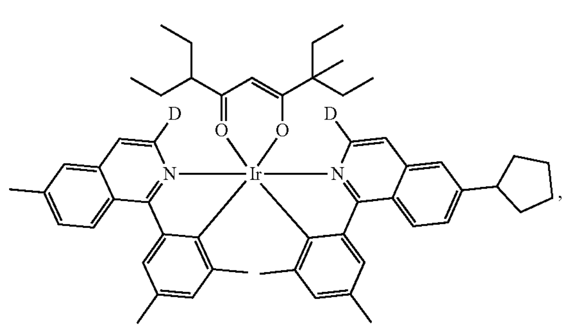
Ir($L_{a44}$)($L_{a331}$)($L_{b101}$)
-continued
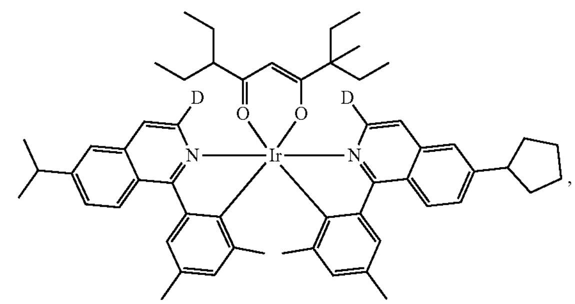
Ir($L_{a126}$)($L_{a331}$)($L_{b101}$)
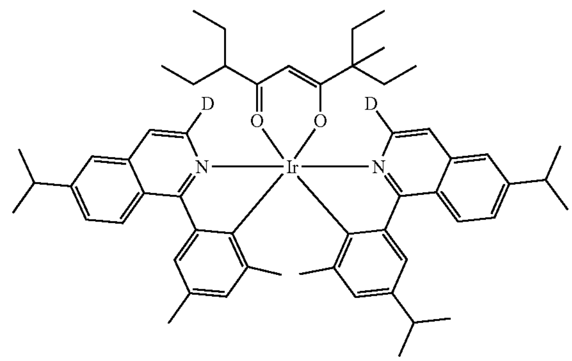
Ir($L_{a126}$)($L_{a130}$)($L_{b101}$)
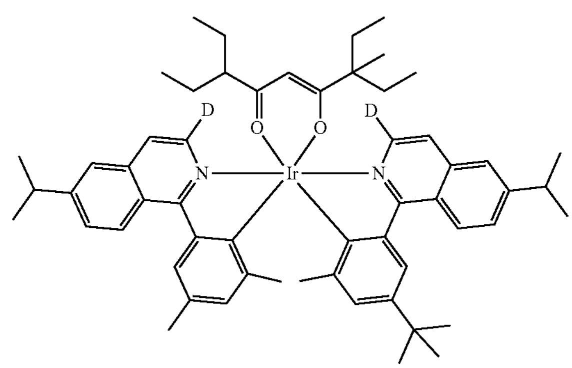
Ir($L_{a126}$)($L_{a133}$)($L_{b101}$)
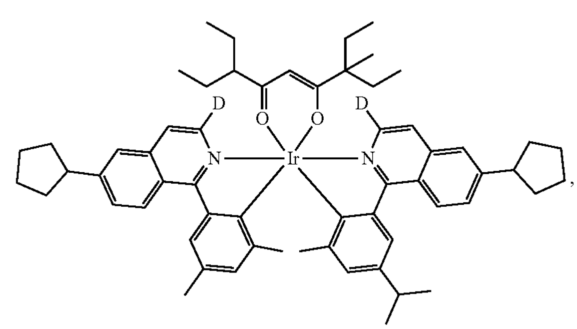
Ir($L_{a331}$)($L_{a335}$)($L_{b101}$)

-continued
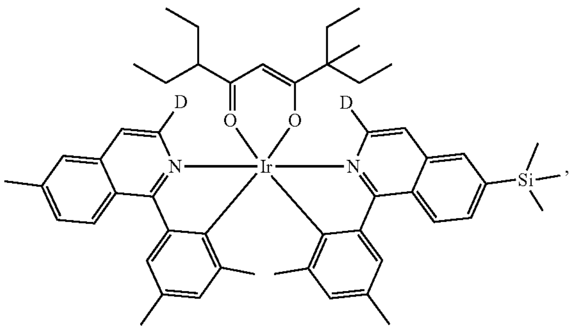
Ir($L_{a44}$)($L_{a659}$)($L_{b101}$)
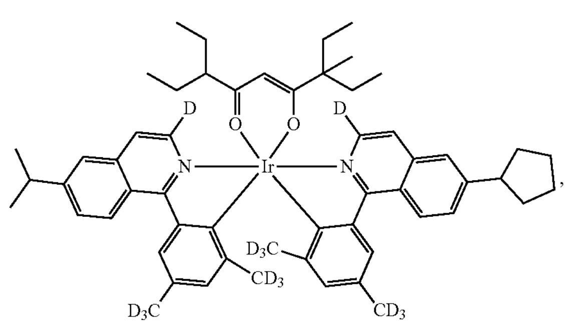
Ir($L_{a159}$)($L_{a364}$)($L_{b101}$)
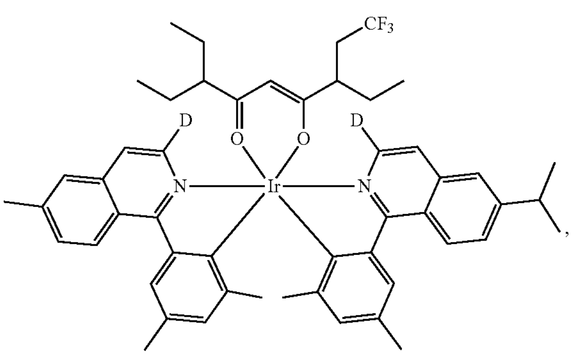
Ir($L_{a44}$)($L_{a126}$)($L_{b361}$)
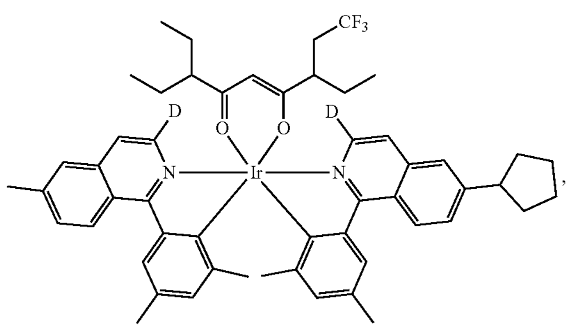
Ir($L_{a44}$)($L_{a331}$)($L_{b361}$)
-continued
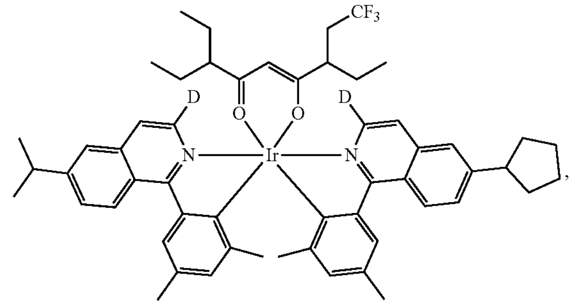
Ir($L_{a126}$)($L_{a331}$)($L_{b361}$)
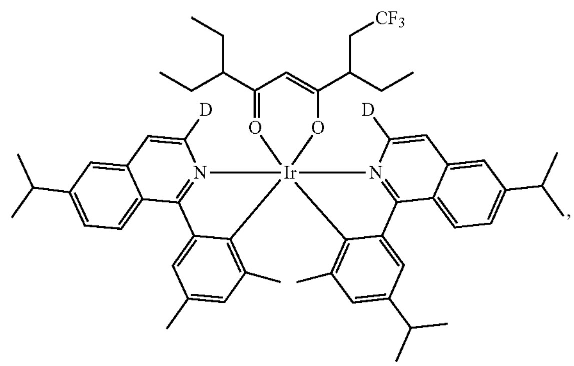
Ir($L_{a126}$)($L_{a130}$)($L_{b361}$)
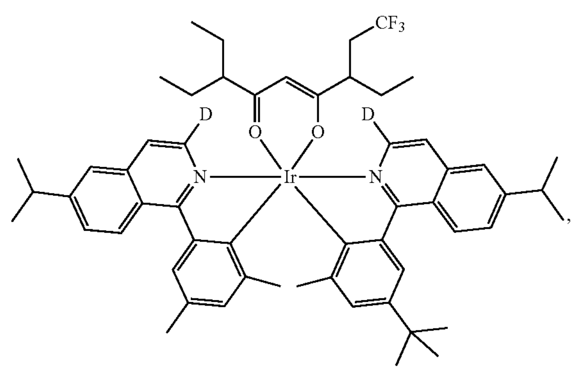
Ir($L_{a126}$)($L_{a133}$)($L_{b361}$)
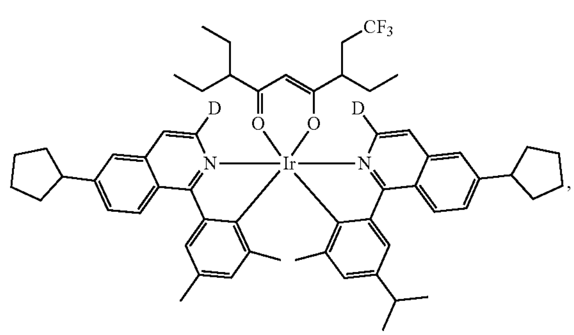
Ir($L_{a331}$)($L_{a335}$)($L_{b361}$)

-continued
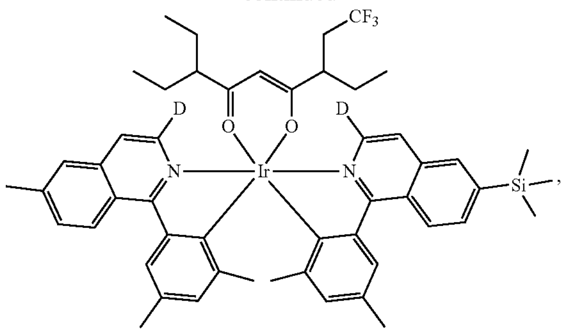
Ir($L_{a44}$)($L_{a659}$)($L_{b361}$)
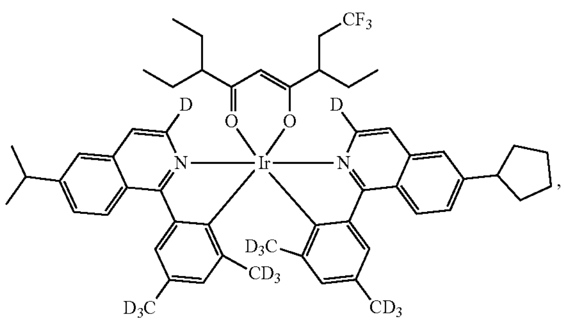
Ir($L_{a159}$)($L_{a364}$)($L_{b361}$)
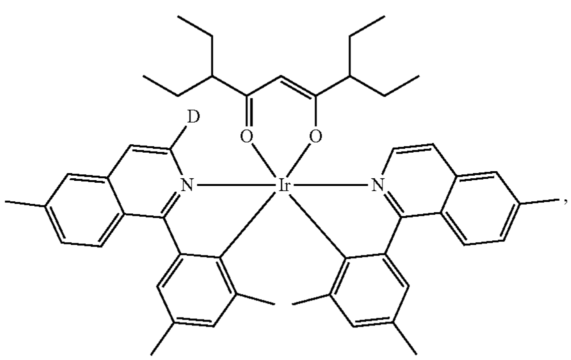
Ir($L_{a44}$)($L_{b31}$)($L_{c31}$)
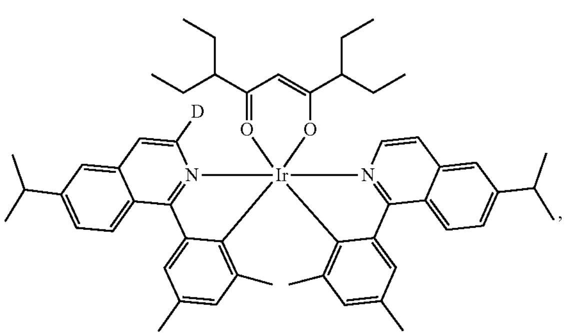
Ir($L_{a126}$)($L_{b31}$)($L_{c41}$)
-continued
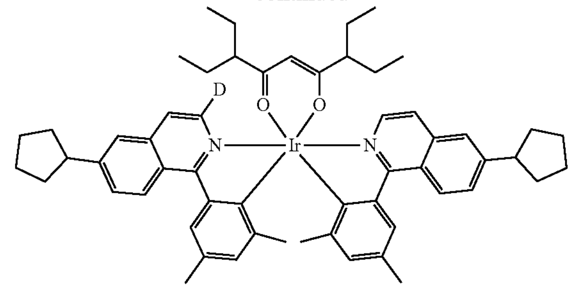
Ir($L_{a331}$)($L_{b31}$)($L_{c61}$)
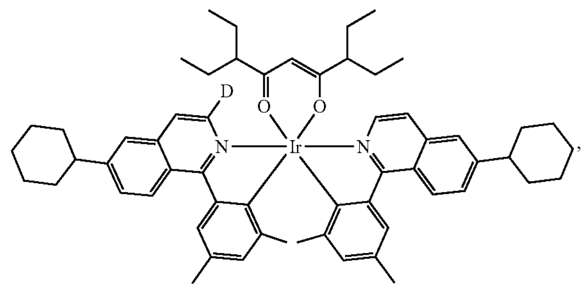
Ir($L_{a372}$)($L_{b31}$)($L_{c71}$)
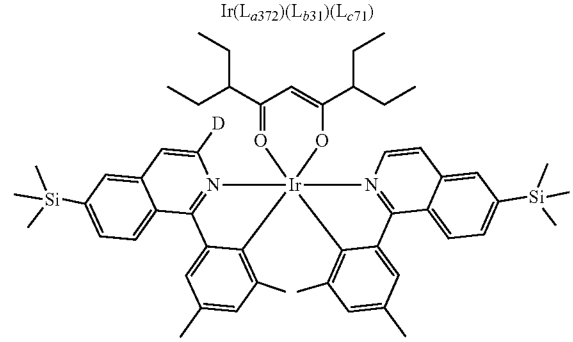
Ir($L_{a659}$)($L_{b31}$)($L_{c81}$)
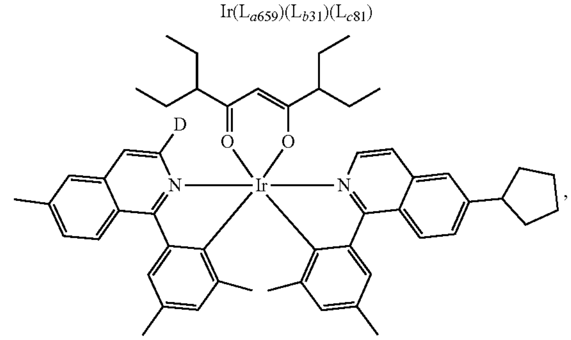
Ir($L_{a44}$)($L_{b31}$)($L_{c61}$)
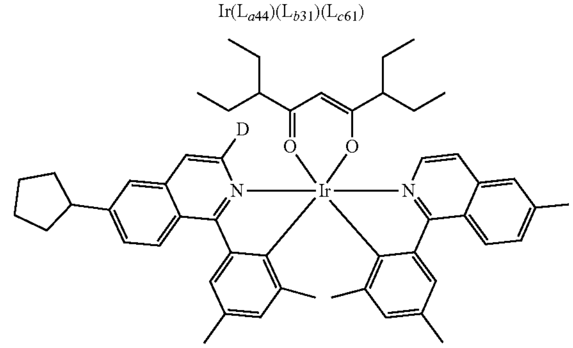
Ir($L_{a331}$)($L_{b31}$)($L_{c31}$)

-continued
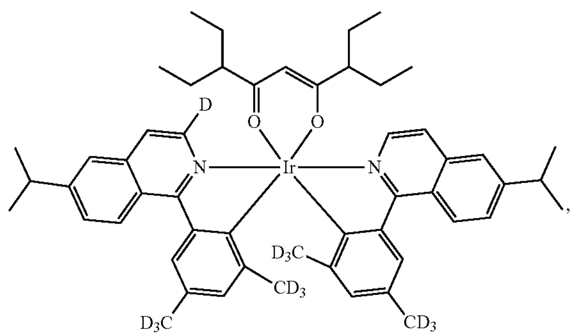
$Ir(L_{a159})(L_{b31})(L_{c48})$
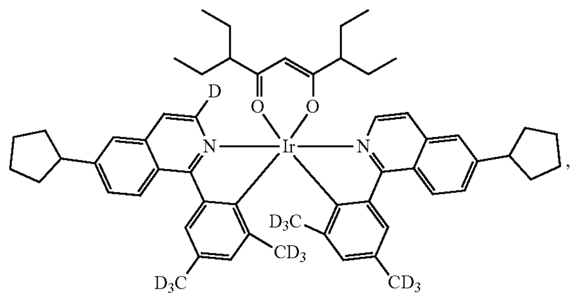
$Ir(L_{a364})(L_{b31})(L_{c68})$
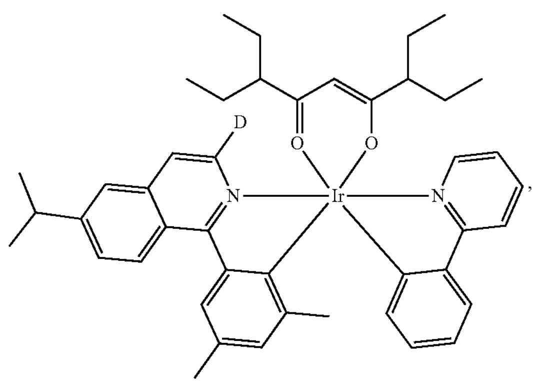
$Ir(L_{a126})(L_{b31})(L_{c1})$
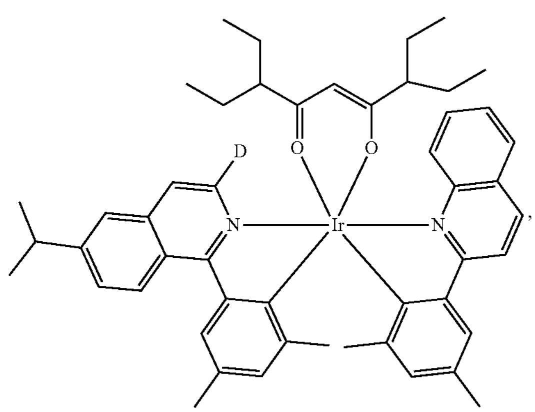
$Ir(L_{a126})(L_{b31})(L_{c19})$
-continued
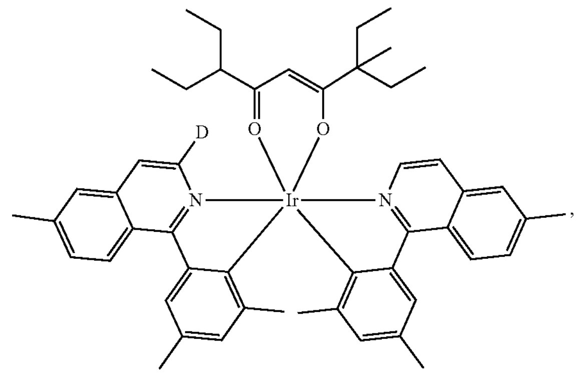
$Ir(L_{a44})(L_{b101})(L_{c31})$
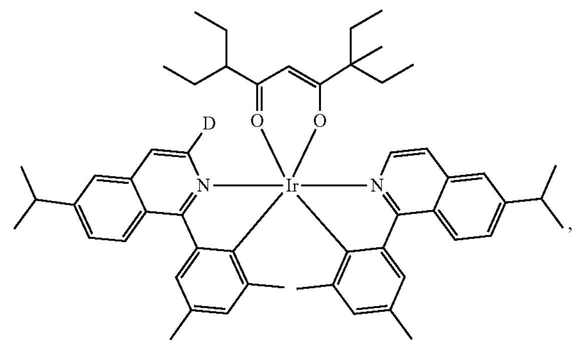
$Ir(L_{a126})(L_{b101})(L_{c41})$
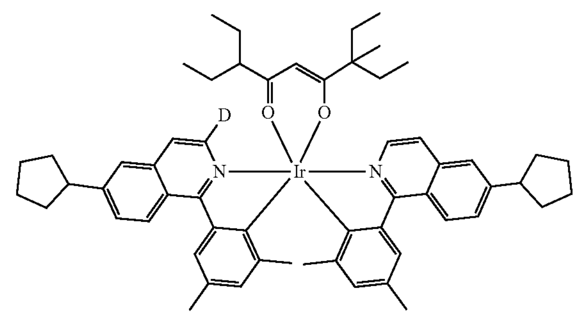
$Ir(L_{a331})(L_{b101})(L_{c61})$
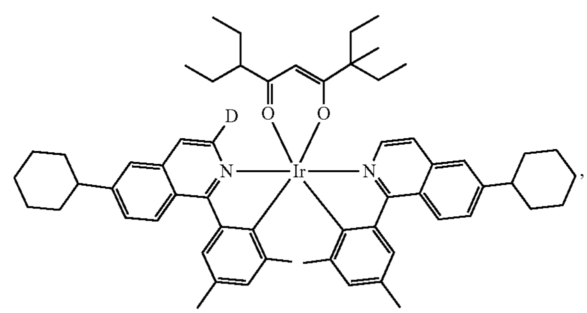
$Ir(L_{a372})(L_{b101})(L_{c71})$

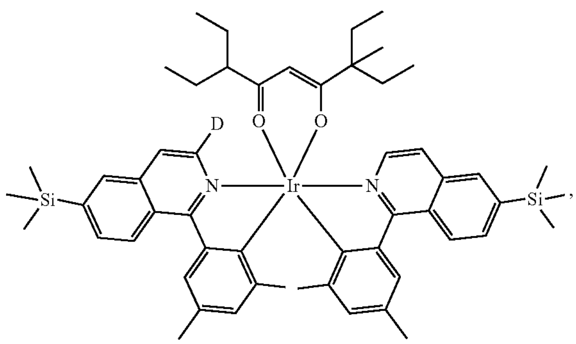
$Ir(L_{a659})(L_{b101})(L_{c81})$
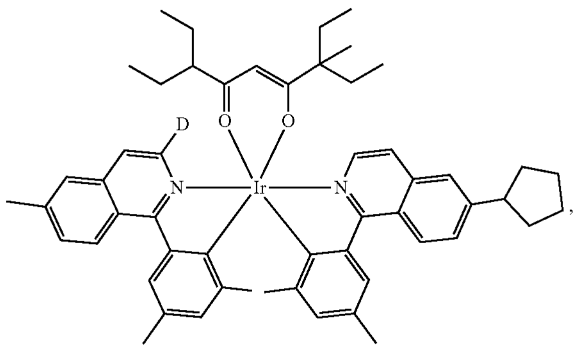
$Ir(L_{a44})(L_{b101})(L_{c61})$
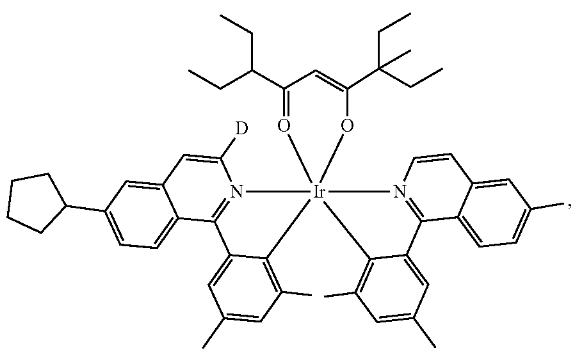
$Ir(L_{a331})(L_{b101})(L_{c31})$
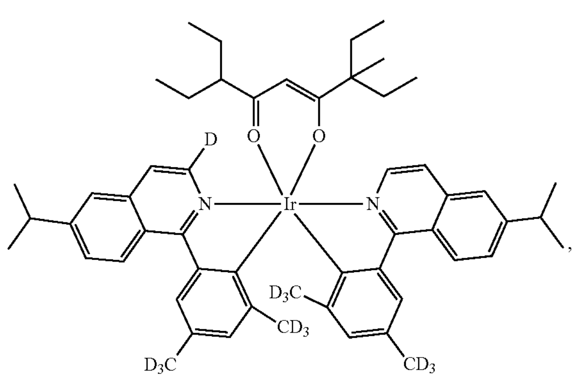
$Ir(L_{a159})(L_{b101})(L_{c48})$
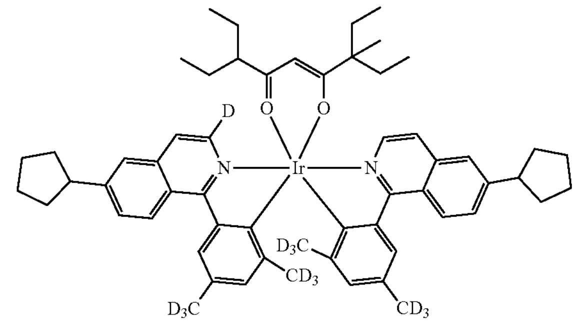
$Ir(L_{a364})(L_{b101})(L_{c68})$
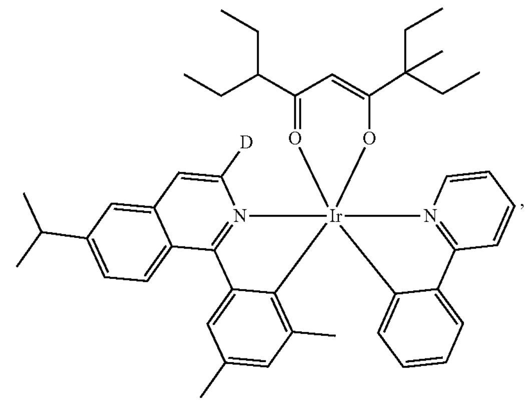
$Ir(L_{a126})(L_{b101})(L_{c1})$
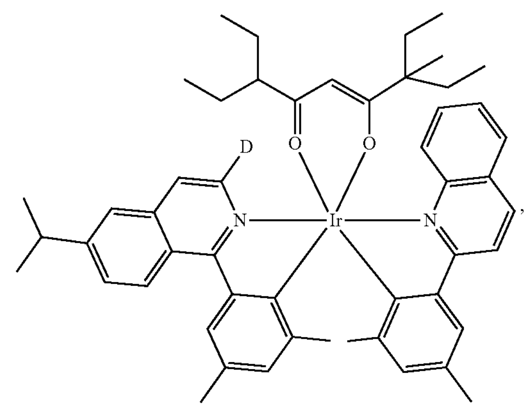
$Ir(L_{a126})(L_{b101})(L_{c19})$
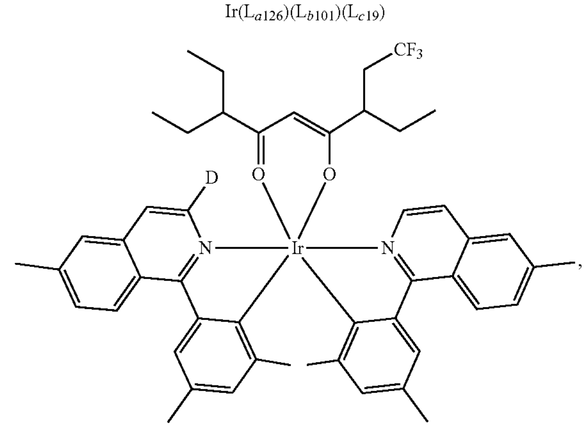
$Ir(L_{a44})(L_{b361})(L_{c31})$ -continued
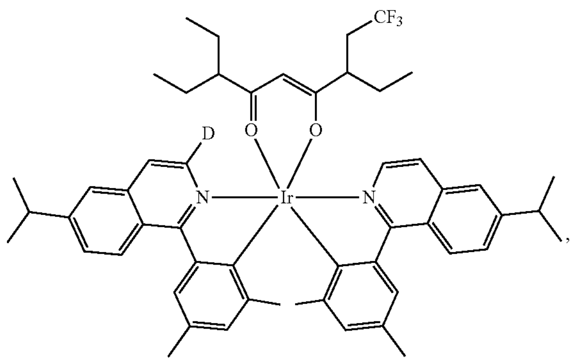
Ir($L_{a126}$)($L_{b361}$)($L_{c41}$)
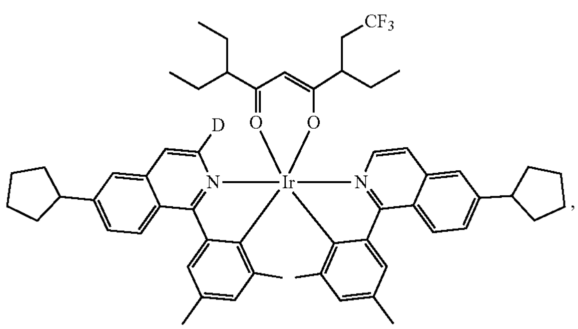
Ir($L_{a331}$)($L_{b361}$)($L_{c61}$)
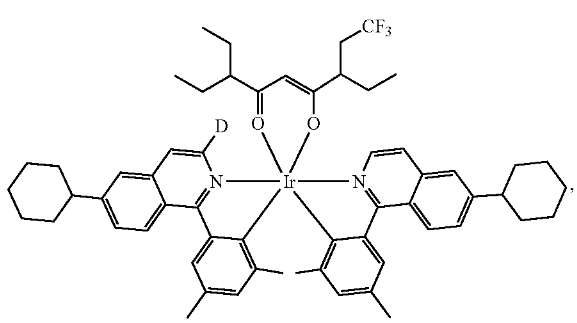
Ir($L_{a372}$)($L_{b361}$)($L_{c71}$)
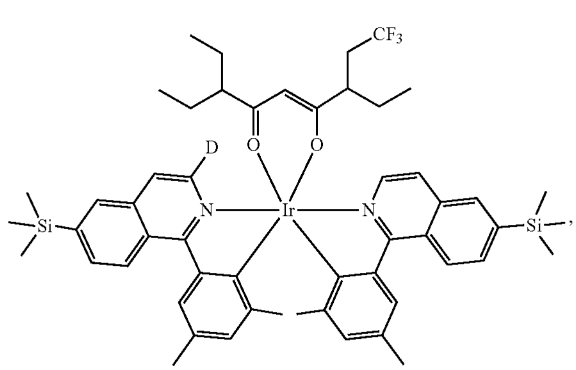
Ir($L_{a659}$)($L_{b361}$)($L_{c81}$)
-continued
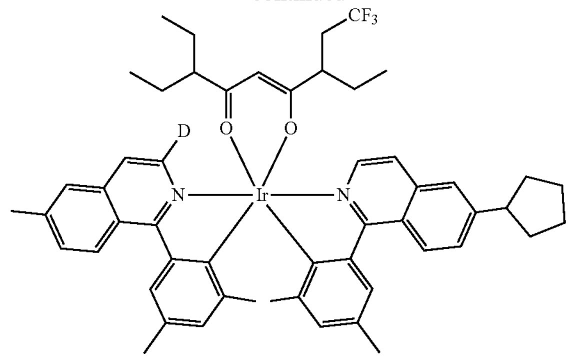
Ir($L_{a44}$)($L_{b361}$)($L_{c61}$)
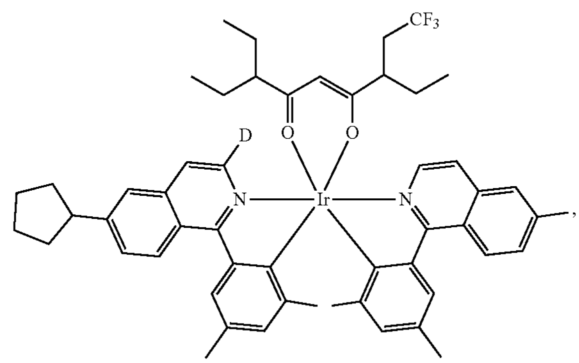
Ir($L_{a331}$)($L_{b361}$)($L_{c31}$)
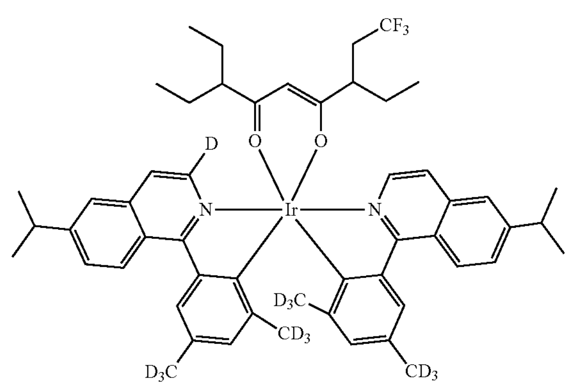
Ir($L_{a159}$)($L_{b361}$)($L_{c48}$)
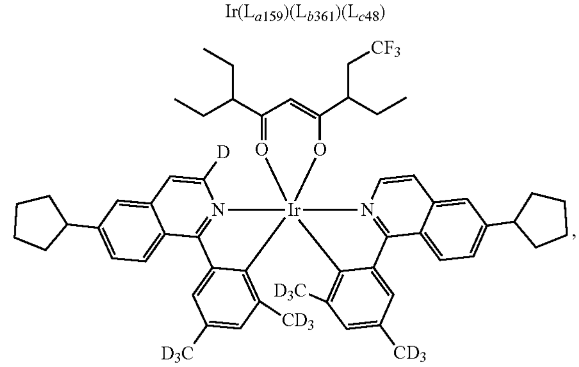
Ir($L_{a364}$)($L_{b361}$)($L_{c68}$)

-continued

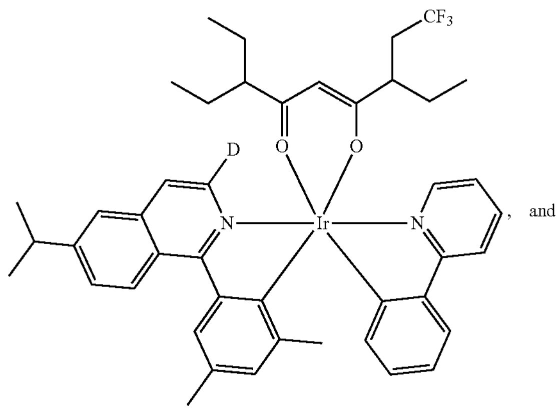

$Ir(L_{a126})(L_{b361})(L_{c1})$

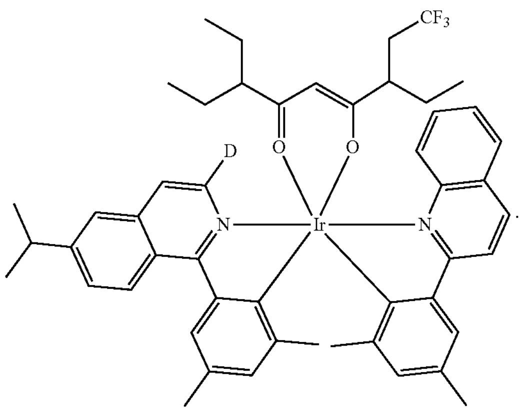

$Ir(L_{a126})(L_{b361})(L_{c19})$

14. The metal complex of claim 1, wherein in the Formula 2, $R_t$ to $R_z$ are each independently selected from a group consisting of: hydrogen, deuterium, halogen, substituted or unsubstituted alkyl group having 1 to 20 carbon atoms, substituted or unsubstituted cycloalkyl group having 3 to 20 ring carbon atoms, and combinations thereof; preferably, $R_t$ is selected from hydrogen, deuterium or methyl group, $R_u$ to $R_z$ are each independently selected from hydrogen, deuterium, fluorine, methyl group, ethyl group, propyl group, cyclobutyl group, cyclopentyl group, cyclohexyl group, 3-methylbutyl group, 3-ethylpentyl group, trifluoromethyl group, and combinations thereof.

15. The metal complex of claim 1, wherein the third ligand $L_c$ is selected from any one of the following structures:

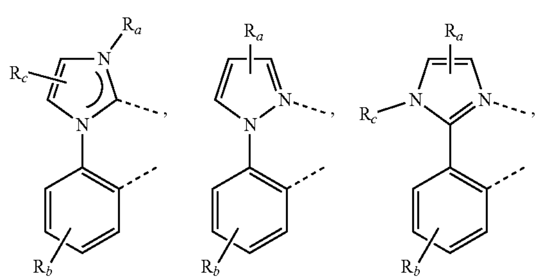

-continued

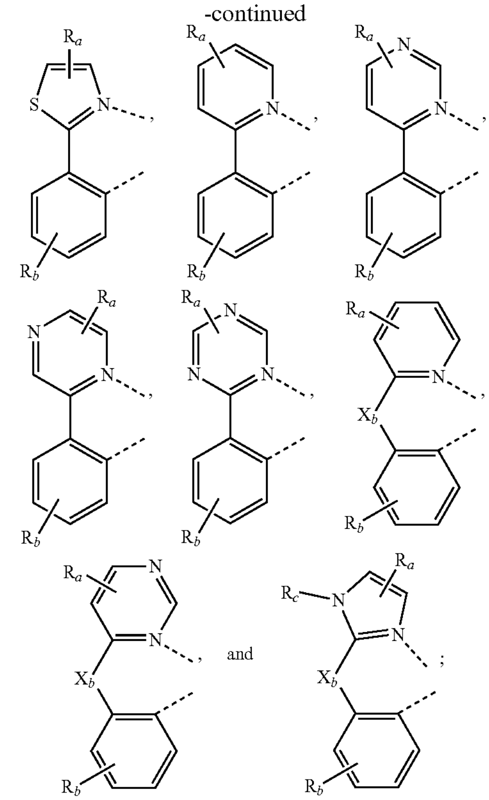

wherein $R_a$, $R_b$ and $R_c$ represent mono substitution, multiple substitutions or non-substitution;

$X_b$ is selected from a group consisting of: O, S, Se, $NR_{N1}$ and $CR_{C1}R_{C2}$;

$R_a$, $R_b$, $R_c$, $R_{N1}$, $R_{C1}$ and $R_{C2}$ are each independently selected from a group consisting of: hydrogen, deuterium, halogen, substituted or unsubstituted alkyl group having 1 to 20 carbon atoms, substituted or unsubstituted cycloalkyl group having 3 to 20 ring carbon atoms, substituted or unsubstituted heteroalkyl group having 1 to 20 carbon atoms, substituted or unsubstituted aralkyl group having 7 to 30 carbon atoms, substituted or unsubstituted alkoxy group having 1 to 20 carbon atoms, substituted or unsubstituted aryloxy group having 6 to 30 carbon atoms, substituted or unsubstituted alkenyl group having 2 to 20 carbon atoms, substituted or unsubstituted aryl group having 6 to 30 carbon atoms, substituted or unsubstituted heteroaryl group having 3 to 30 carbon atoms, substituted or unsubstituted alkylsilyl group having 3 to 20 carbon atoms, substituted or unsubstituted arylsilyl group having 6 to 20 carbon atoms, substituted or unsubstituted amino group having 0 to 20 carbon atoms, an acyl group, a carbonyl group, a carboxylic acid group, an ester group, a cyano group, an isocyano group, a thio group, a sulfinyl group, a sulfonyl group, a phosphino group, and combinations thereof;

in the structure of $L_c$ adjacent substituents can be optionally joined to form a ring.

16. An electroluminescent device, comprising:

an anode, a cathode, and an organic layer disposed between the anode and the cathode, wherein the organic layer comprises the metal complex of claim 1.

17. The device of claim 16, wherein the device emits red light or white light.

18. The device of claim 16, wherein the organic layer is a light-emitting layer, and the metal complex is a light-emitting material; preferably, wherein the organic layer further comprises a host material; more preferably, the host material comprises at least one chemical group selected from a group consisting of: benzene, pyridine, pyrimidine, triazine, carbazole, azacarbazole, indolocarbazole, dibenzothiophene, aza-dibenzothiophene, dibenzofuran, azadibenzofuran, dibenzoselenophene, triphenylene, azatriphenylene, fluorene, silafluorene, naphthalene, quinoline, isoquinoline, quinazoline, quinoxaline, phenanthrene and azaphenanthrene, and combinations thereof.

19. A compound formulation, comprising the metal complex of claim 1.

* * * * *